United States Patent [19]
Uzawa et al.

[11] Patent Number: 5,822,389
[45] Date of Patent: Oct. 13, 1998

[54] ALIGNMENT APPARATUS AND SOR X-RAY EXPOSURE APPARATUS HAVING SAME

[75] Inventors: Shunichi Uzawa, Tokyo; Takao Kariya, Hino; Makoto Higomura, Yokohama; Nobutoshi Mizusawa, Yamato; Ryuichi Ebinuma, Kawasaki; Kohji Uda, Yokohama; Kunitaka Ozawa, Isehara; Mitsuaki Amemiya, Atsugi; Eiji Sakamoto, Sagamihara; Naoto Abe, Isehara; Kenji Saitoh, Yokohama, all of Japan

[73] Assignee: Canon Kabushiki Kaisha, Tokyo, Japan

[21] Appl. No.: 464,038

[22] Filed: Jun. 5, 1995

Related U.S. Application Data

[62] Division of Ser. No. 441,641, May 15, 1995, Pat. No. 5,524,131, which is a continuation of Ser. No. 153,288, Nov. 17, 1993, abandoned, which is a continuation of Ser. No. 879,445, May 1, 1992, abandoned, which is a continuation of Ser. No. 264,791, Oct. 31, 1988, abandoned.

[30]    Foreign Application Priority Data

Oct. 6, 1988    [JP]    Japan .................................. 63-252991

[51] Int. Cl.$^6$ ..................................................... G21K 5/00
[52] U.S. Cl. ............................................. 378/34; 378/210
[58] Field of Search ................................................. 378/34

[56]           References Cited

U.S. PATENT DOCUMENTS

| | | | |
|---|---|---|---|
| 4,408,338 | 10/1983 | Grobman | 378/34 |
| 4,516,253 | 5/1985 | Novak | 378/34 |
| 4,525,852 | 7/1985 | Rosenberg | 378/34 |
| 4,617,681 | 10/1986 | LaFiandra et al. | 378/34 |
| 4,669,867 | 6/1987 | Uda et al. | 355/53 |
| 4,676,630 | 6/1987 | Matsushita et al. | 355/53 |
| 4,748,477 | 5/1988 | Isohata et al. | 355/53 |
| 4,749,867 | 6/1988 | Matsushita et al. | 250/442.1 |
| 4,777,641 | 10/1988 | Inagaki et al. | 378/34 |
| 4,803,712 | 2/1989 | Kembo et al. | 378/34 |
| 4,803,713 | 2/1989 | Fujii | 378/34 |
| 4,825,453 | 4/1989 | Kembo et al. | 378/34 |
| 4,830,498 | 5/1989 | Nishimoto et al. | 356/400 |
| 5,164,974 | 11/1992 | Kariya et al. | 378/34 |

FOREIGN PATENT DOCUMENTS

| | | |
|---|---|---|
| 0083394 | 7/1983 | European Pat. Off. . |
| 0109193 | 5/1984 | European Pat. Off. . |
| 0238416 | 9/1987 | European Pat. Off. . |
| 0357425 | 3/1990 | European Pat. Off. . |
| 60-55624 | 3/1985 | Japan . |
| 60-198726 | 10/1985 | Japan . |
| 2155201 | 9/1985 | United Kingdom . |

OTHER PUBLICATIONS

Hayasaka, et al., "A Step–and–Repeat X–Ray Exposure System for 0.5 μm Pattern Replication," Journal of Vacuum Science & Technology, vol. B3, No. 6, Nov.–Dec./1985, pp. 1581 through 1586.

Patent Abstracts of Japan, Kokai No. 60–7722, vol. 9, No. 118, May /1985.

*Primary Examiner*—Craig E. Church
*Attorney, Agent, or Firm*—Fitzpatrick, Cella, Harper & Scinto

[57]           ABSTRACT

A synchrotron exposure includes a synchrotron radiation source for generating a synchrotron radiation beam, and exposure unit having a mask stage for holding a mask and a wafer stage for holding a waver, a beam port for directing the radiation beam to the exposure unit, a mirror unit having a mirror for reflecting the radiation beam, a pre-alignment system for aligning the wafer relative to the wafer stage, a fine-alignment system for aligning the wafer held by the wafer stage relative to the mask held by the mask stage, a mask storage apparatus for storing the mask, a wafer storage apparatus for storing the wafer, a mask conveying apparatus for conveying the mask between the mask storage apparatus and the mask stage and a wafer conveying apparatus for conveying a wafer between the wafer storage apparatus and the wafer stage.

5 Claims, 80 Drawing Sheets

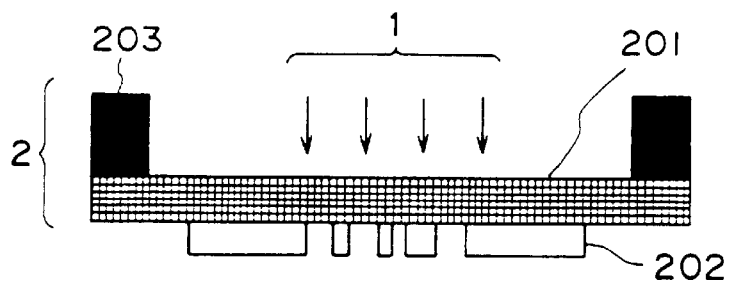
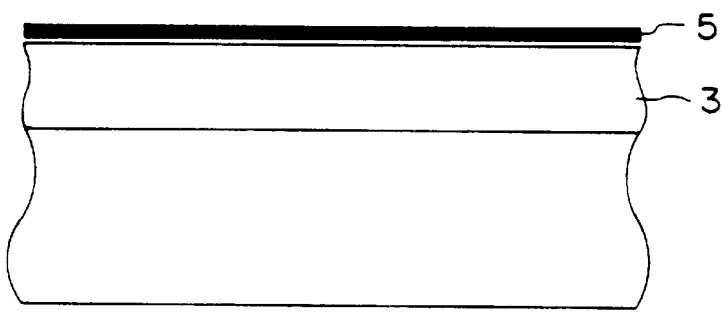
FIG. 2
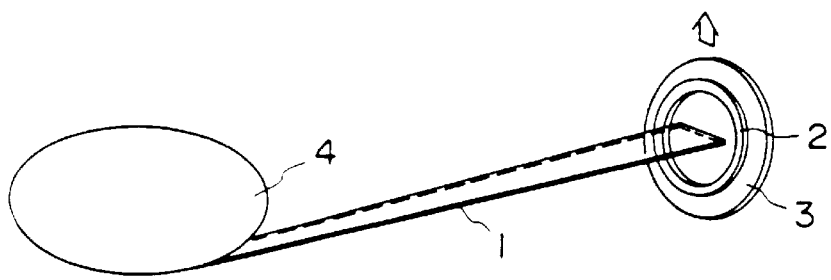
FIG. 3A
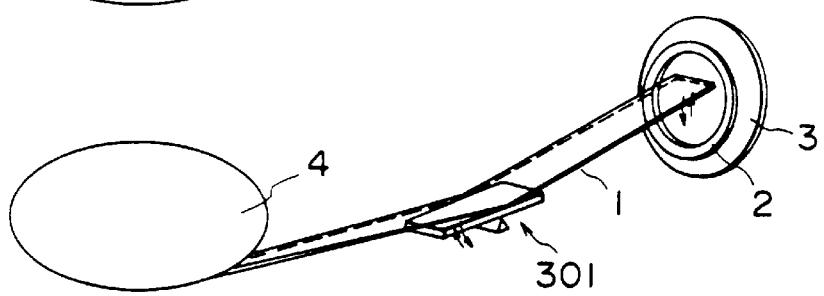
FIG. 3B
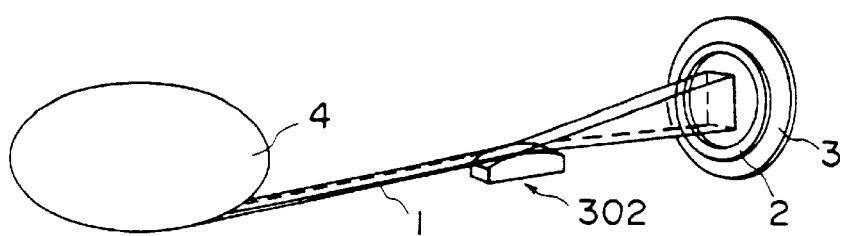
FIG. 3C

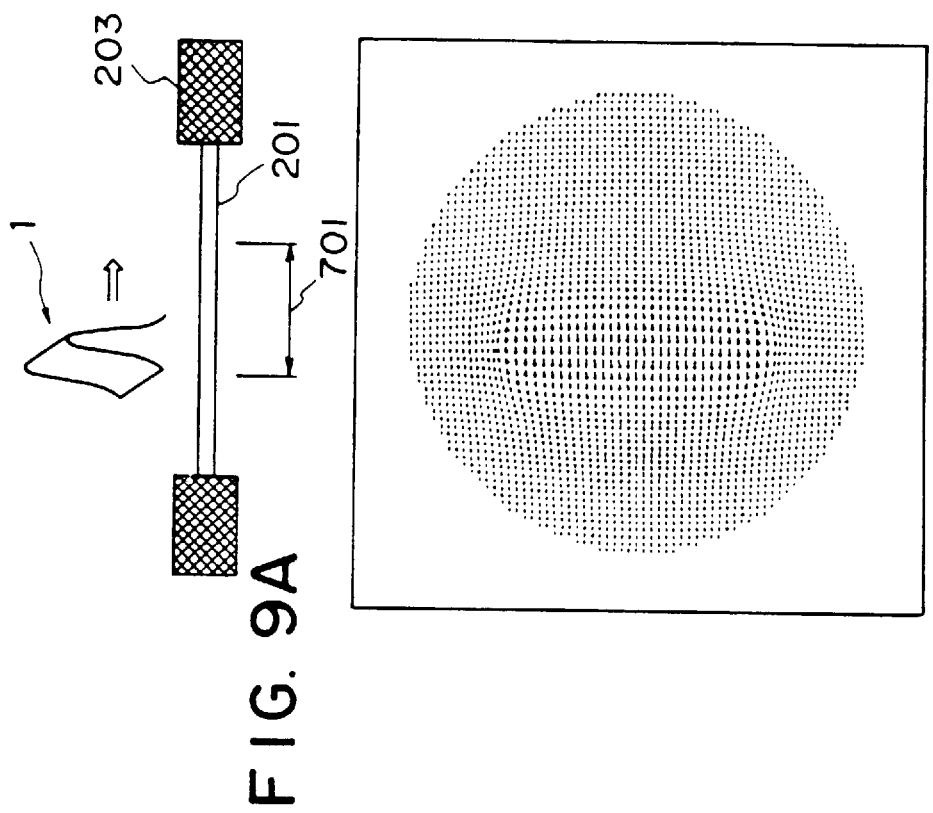
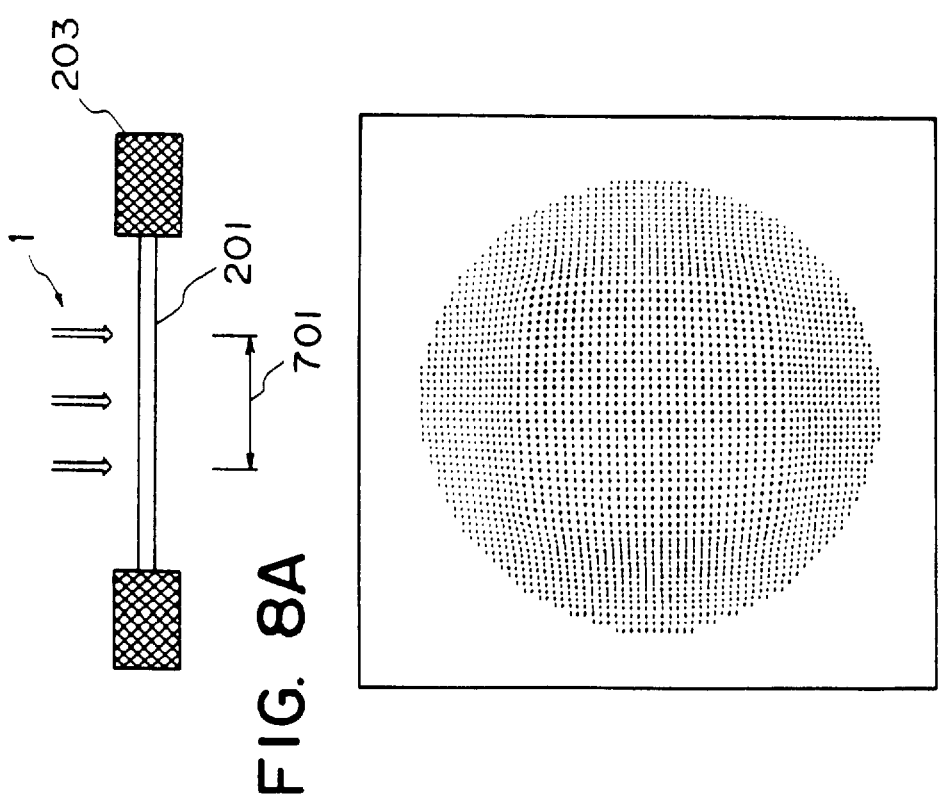

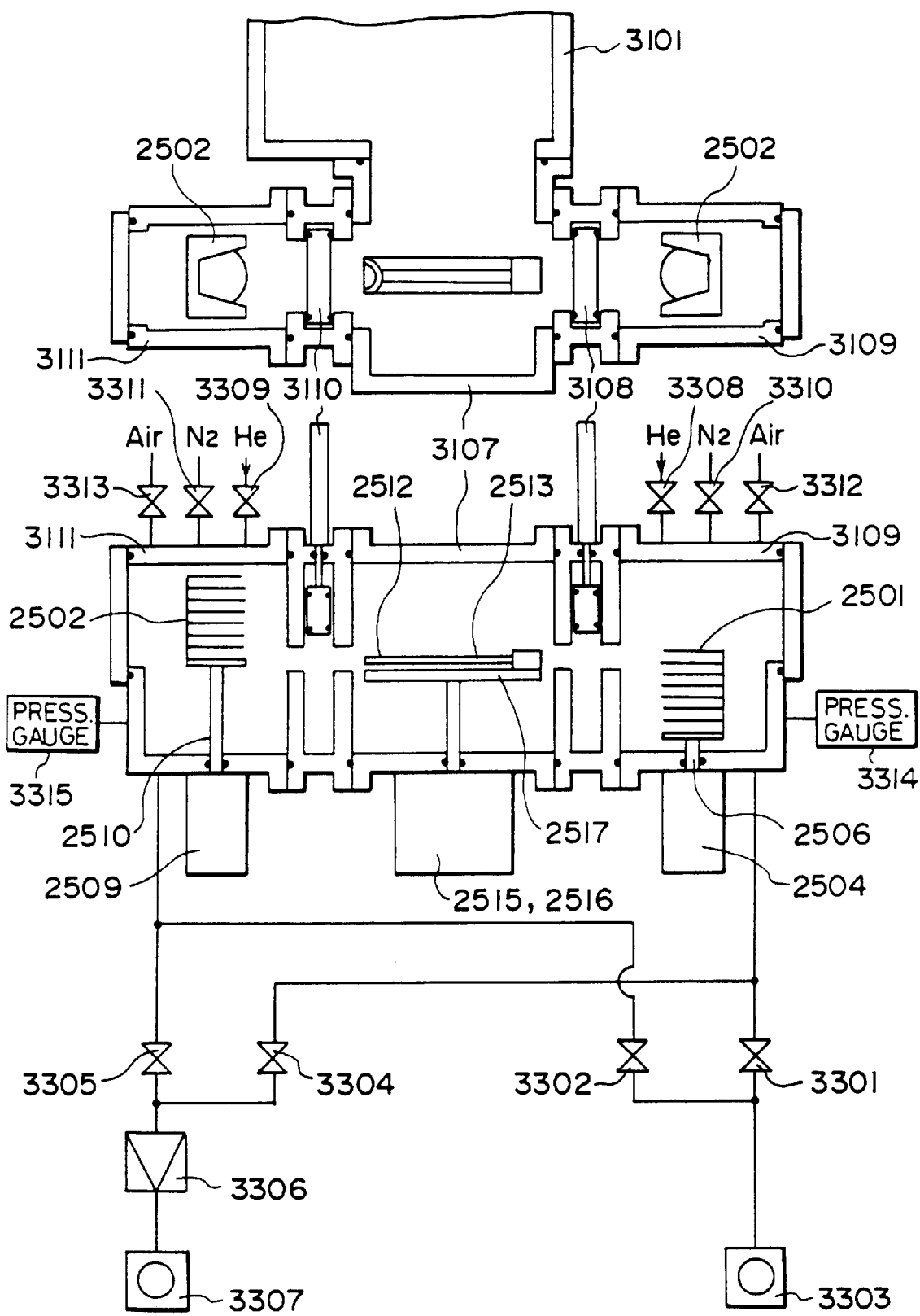
F I G. 33

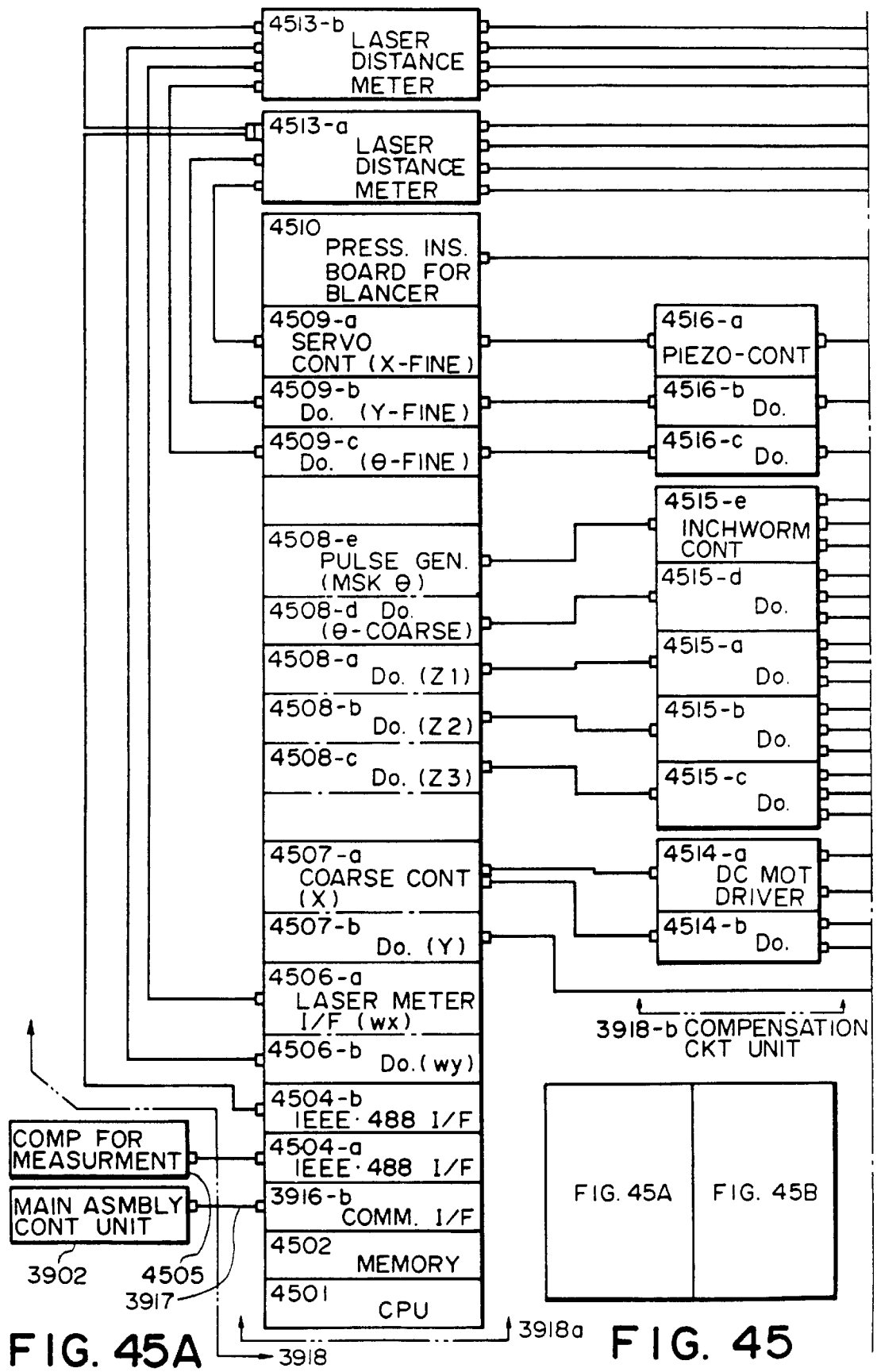

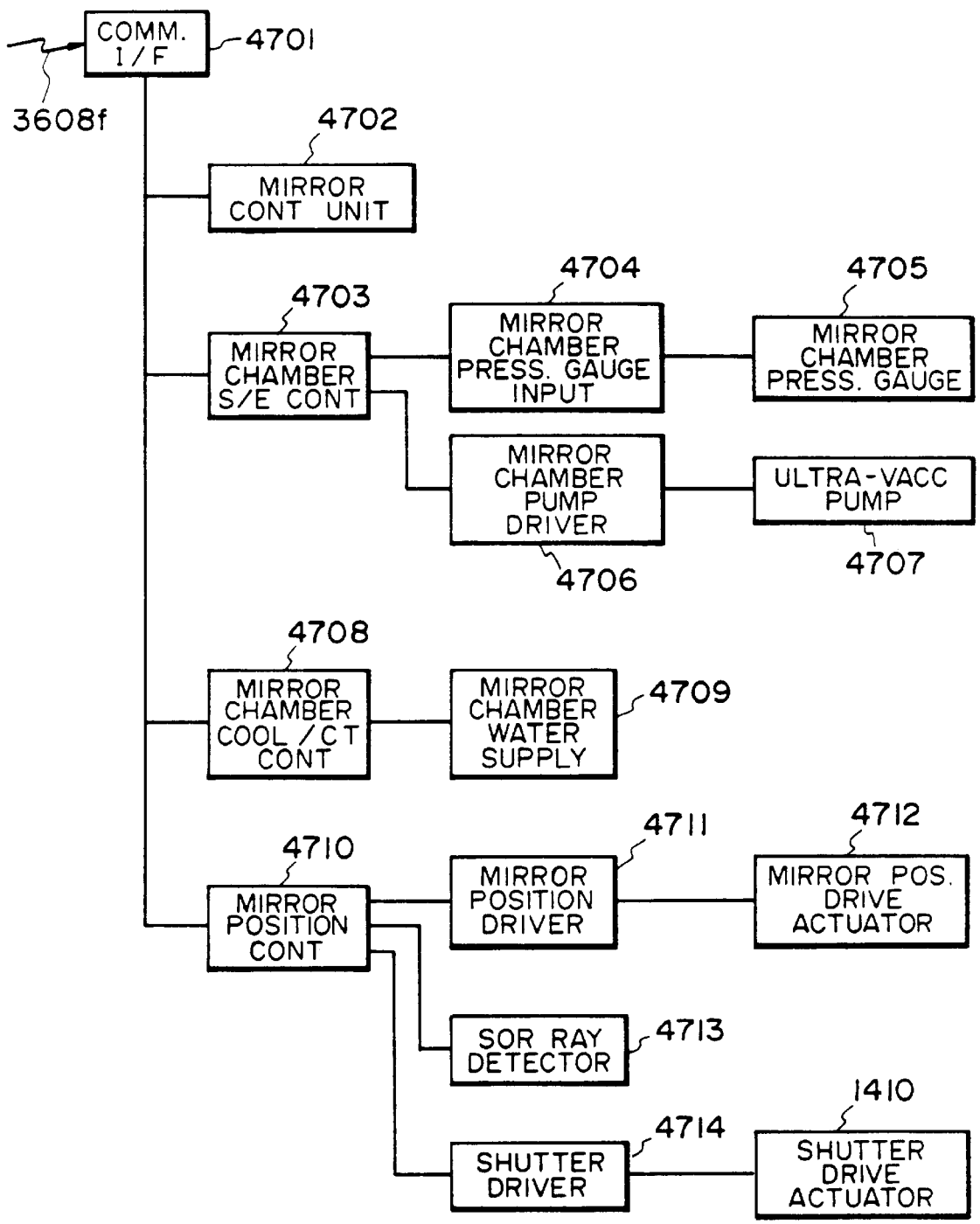
F I G. 47

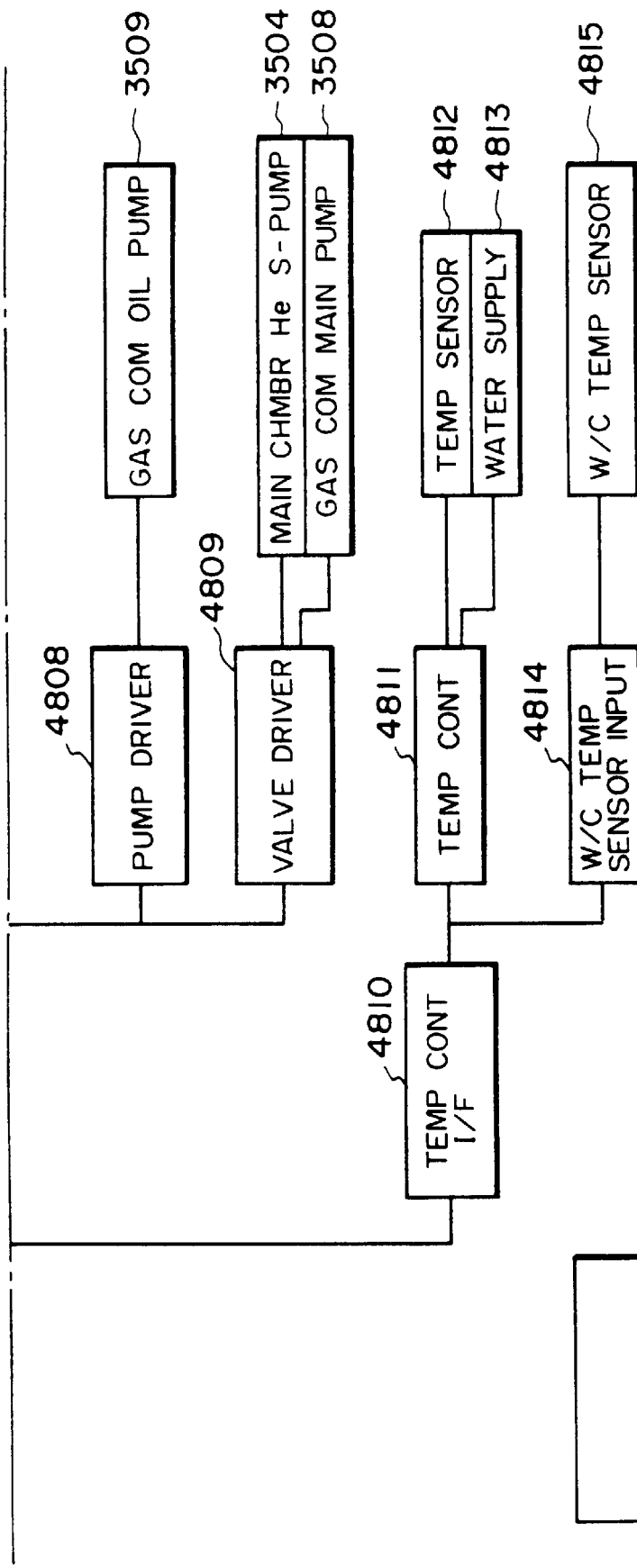

| FIG. 49A | FIG. 49B | FIG. 49C |

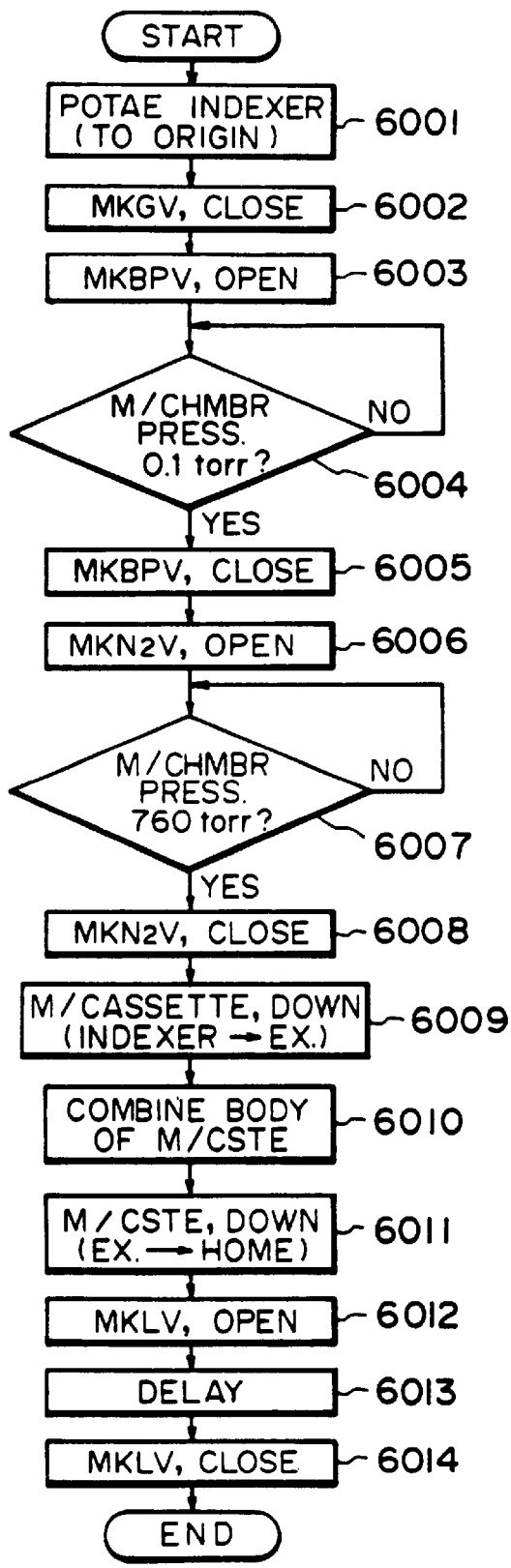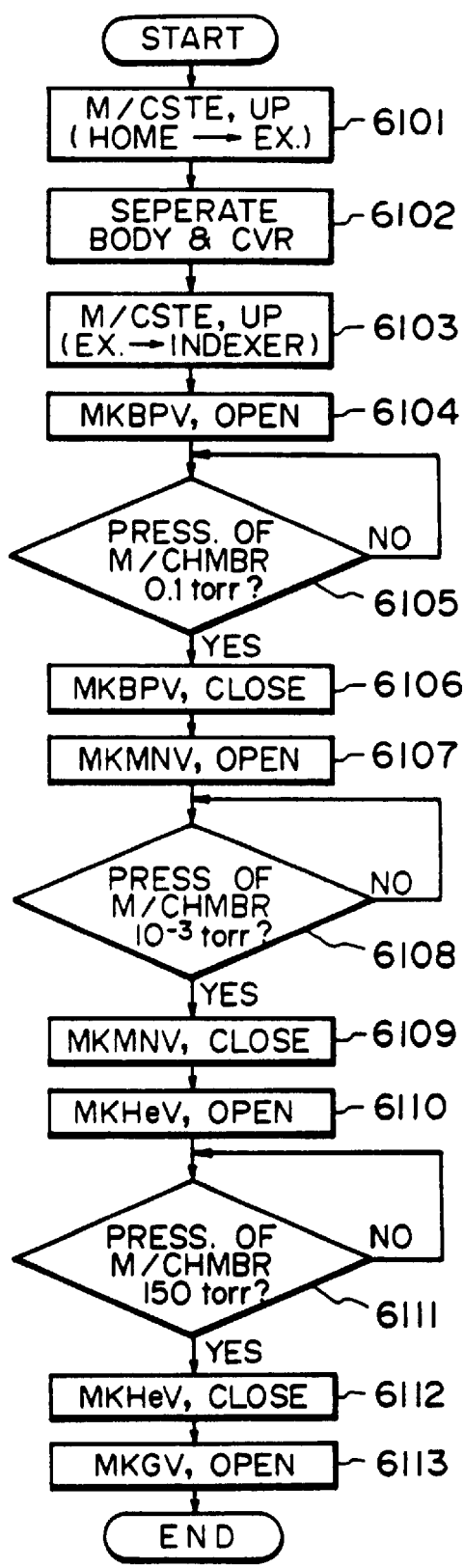
FIG. 60                    FIG. 61

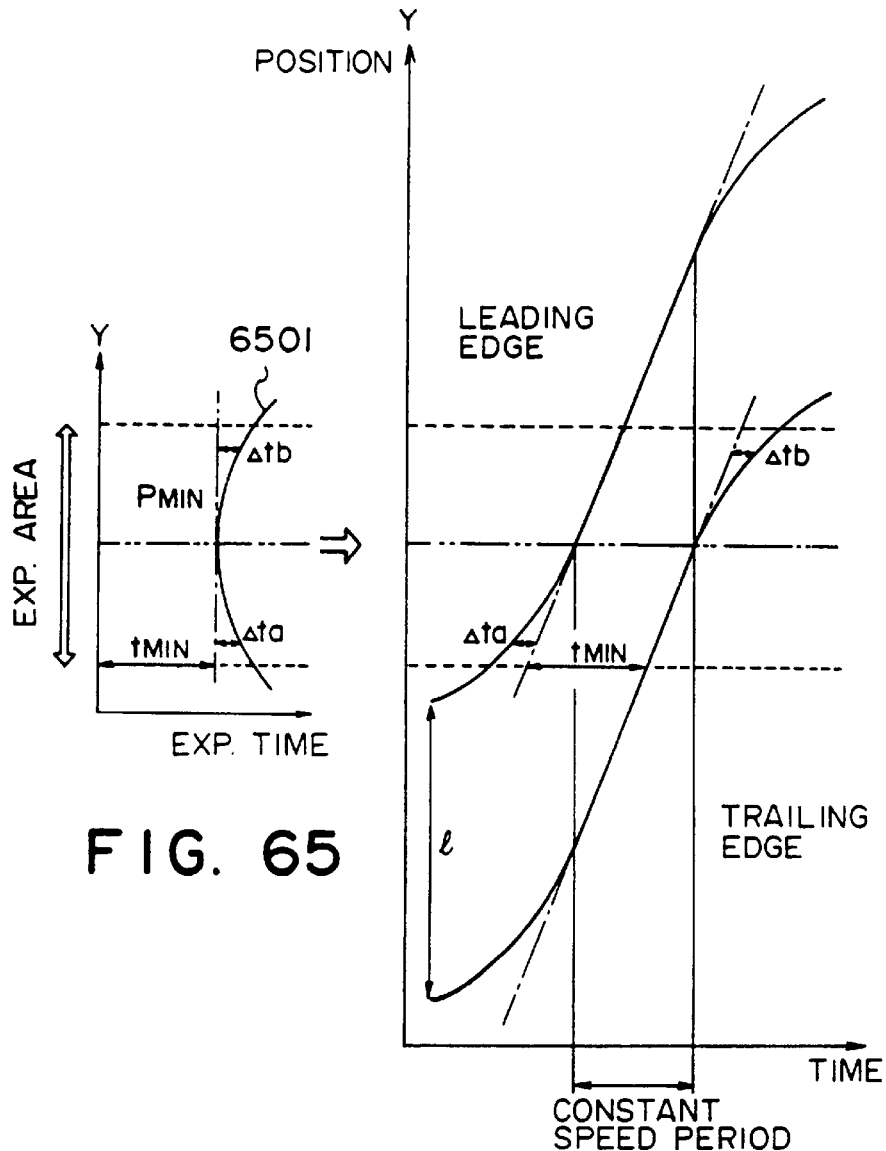
FIG. 65
FIG. 66
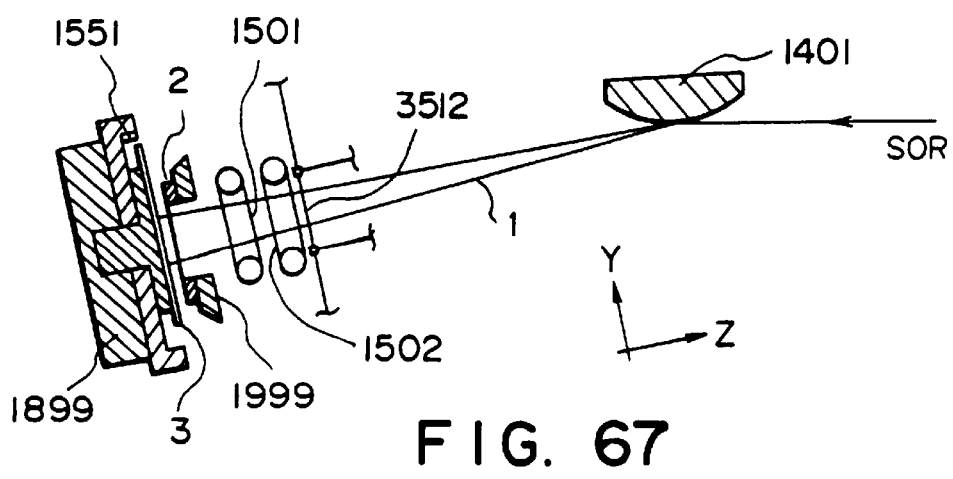
FIG. 67

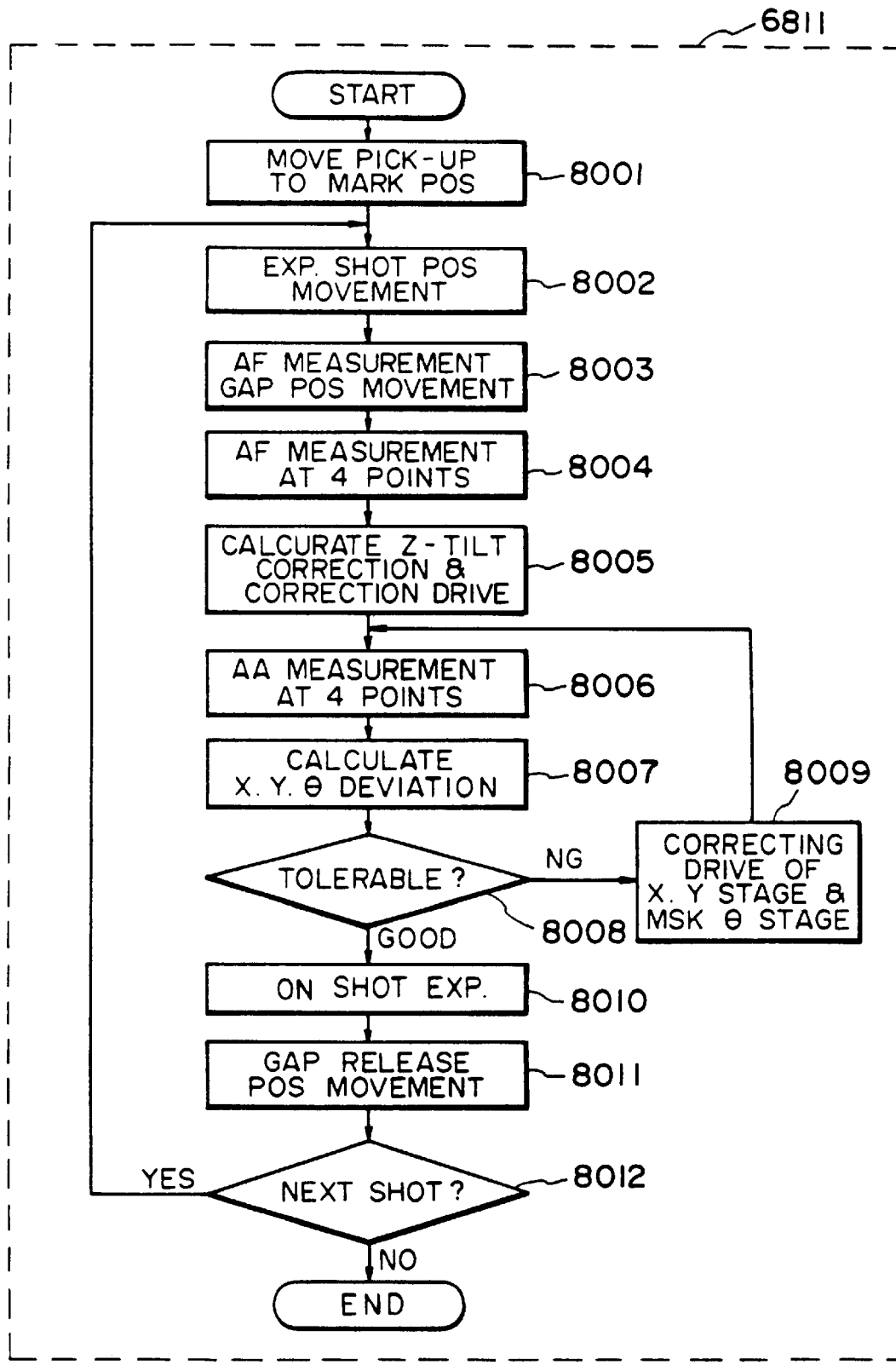
F I G. 80

ALIGNMENT APPARATUS AND SOR X-RAY EXPOSURE APPARATUS HAVING SAME

This application is a division of prior pending application, Ser. No. 08/441,641 filed May 15, 1995, now U.S. Pat. No. 5,524,131 which application is a continuation of prior application, Ser. No. 08/153,288 filed Nov. 17, 1993, which application is a continuation of prior application, Ser. No. 07/879,445 filed May 1, 1992, which application is a continuation of prior application, Ser. No. 07/264,791 filed Oct. 31, 1988, all now abandoned.

FIELD OF THE INVENTION AND RELATED ART

The present invention relates to an alignment apparatus for aligning a mask having a semiconductor chip pattern and a semiconductor wafer in a predetermined positional relationship, more particularly to a semiconductor chip manufacturing SOR (synchrotron orbital radiation) X-ray exposure apparatus wherein after the mask and the semiconductor wafer are aligned, a resist on the semiconductor wafer is exposed to the orbital radiation rays (SOR X-rays) in the form of a pattern corresponding to the pattern of the semiconductor chip on the mask.

Lithography using X-rays for semiconductor chip manufacturing has been noted as a fine lithographic technique to realize high density semiconductor chips and was proposed by Spears and Smith in "Electron Lett. Vol. 8, No. 4: P.102, 1972" in 1972. Since, however, there has not been a small size and high power X-ray source, it has been difficult to install a semiconductor chip manufacturing X-ray exposure apparatus using X-ray lithography in the semiconductor manufacturing plant. In addition, it has not met the needs for mass-production, because of low throughput and the like.

Recently, however, a very small size SOR ring has been developed, capable of providing high power X-rays with the use of a normal conductor or super conductor magnet. Therefore, the X-ray source is no longer a major problem.

Referring first to FIG. 2, in the X-ray exposure apparatus, pattern exposure is effected in a so-called proximity exposure method. The mask 2 comprises a substrate 201 having a thickness of several microns with high X-ray transmissibility, an absorber material 202 having a high X-ray absorptivity formed into a pattern to be printed on the wafer and a supporting frame 203 for supporting the substrate 201. The mask 2 is opposed to the wafer 3, which is the workpiece, with a predetermined gap (approximately several tens of microns) with precision and stability. The X-rays 1 are applied to the semiconductor wafer 3 through the mask 2, so that the resist 5 applied on the wafer 3 is exposed to the pattern determined by the absorber material 202, by which the pattern is transferred onto the wafer 3.

As for the pattern transfer process, there have been proposed a scanning exposure system shown in FIG. 3A, scanning mirror exposure system shown in FIG. 3B and a whole surface exposure system shown in. FIG. 3C. The scanning exposure system and the whole surface exposure system have been proposed in "J. Vac.

Sci. Technol. Bl (4) 1984, p.1271" and in "IBM Research Report RC 8220, 1980", respectively.

Referring to FIG. 3A, the scanning exposure system is such that after the mask 2 and the wafer 3 are aligned in a predetermined positional relation, the mask 2 and the wafer 3 are moved as a unit in a direction indicated by an arrow relative to the X-rays 1 in the form of a sheet beam produced by the SOR source 4 to transfer the pattern of the mask 2 onto a predetermined area of the wafer 3.

In the scanning mirror exposure system shown in FIG. 3B, after the mask 2 and the wafer 3 are aligned in a predetermined relation, a mirror 301 disposed between the SOR source 4 and the mask 2 is swung in the direction indicated by an arrow to scan the exposure area (the entire area of the mask pattern to be transferred) with the X-rays 1 from the SOR source 4, thus transferring the pattern.

In the whole surface exposure system shown in FIG. 3C, a mirror 302 having a convex reflecting surface is disposed between the SOR source 4 and the mask 2 to diverge the X-rays 1 from the SOR source 4. The diverged X-rays 1 are projected simultaneously onto the entire exposure area. In this manner, the mask pattern is transferred onto the wafer 2 after alignment therebetween.

E. S. Piller proposes in "JT Applied Physics, Vol. 47, No. 12, p. 5450" that the mask 2 and the wafer 3 are disposed within a predetermined closed ambience in an X-ray exposure apparatus, and then the pattern exposure is carried out. It is also proposed therein that the mask 2 and the wafer 3 are disposed in a He gas ambience from the standpoint of temperature. Furthermore, common inventors have proposed in Japanese Laid-Open Patent Application Publication 178625/1985 that in an X-ray exposure apparatus using an X-ray tube, a state apparatus, mask and wafer transportation apparatus, an alignment apparatus or the like are disposed in a plurality of closed ambiences.

Referring to FIGS. 4A and 4B, the apparatus disclosed in the above-mentioned Japanese Laid-Open Patent Application will be described. The wafer is contained in a cassette, which is contained in turn in a wafer loading cassette accommodating chamber 402. The exposed wafers are contained in a cassette in a wafer unloading cassette accommodating chamber 403. The mask having a pattern to be transferred is contained in a cassette, which is in turn contained in a mask cassette accommodating chamber 404.

The mask and the wafer are aligned with each other by an electron beam device 411 shown in FIG. 4B in the main chamber 401, and thereafter they are shifted as a unit into an illumination chamber 405, where the pattern exposure is effected with the use of the radiation source, that is, the X-ray rube 410. Between the chambers, shut-off valves are disposed between respective chambers to maintain the ambiences thereof independently from each other, although FIG. 4B shows only the shut off valve 409 between the illumination chamber 405 and the main chamber 401.

An SOR X-ray exposure apparatus is proposed in "Proceeding of SPIE, Vol. 448, 1983, p. 104", for example. FIG. 5 shows this apparatus schematically. This apparatus includes a so-called vertical stage which is movable in the vertical direction. The pattern exposure to the X-rays 1 is performed with the mask 2 and the wafer 3 being supported on the stage.

SUMMARY OF THE INVENTION

Taking as an example, a dynamic random access memory, which will hereinafter be called "DRAM" is recently a standard of the density of the semiconductor chip or device, 64 MB DRAM requires the line width of 0.3–0.4 micron, and more than 100 MB DRAM requires 0.25 microns of line width, and therefore, an exposure apparatus capable of pattern transfer of this dimension. However, no exposure apparatus capable of such a fine pattern exposure as not more than 0.25 micron has been made practical. In order to accomplish such an exposure apparatus, it is necessary to establish (1) ambience control for stably maintaining the mask and the wafer, (2) removal of contamination such as dust, (3) X-ray exposure for uniformly exposing the pattern transfer area, (4) an alignment with precision on the order of 1/100 micron and the resolution on the order of 1/1000 micron and others.

Accordingly, it is a principal object of the present invention to provide an exposure apparatus which executes key processes in the semiconductor device manufacturing, capable of manufacturing semiconductor devices of 64 MB or higher density.

It is another object of the present invention to provide an SOR X-ray exposure apparatus which uses X-rays from the SOR source and which can transfer a fine pattern on the mask onto a resist on a semiconductor wafer.

It is a further object of the present invention to satisfy the requirements of the above-described (1)–(4) to accomplish a practical X-ray exposure apparatus.

In order to realize manufacturing of the semiconductor devices having a pattern including lines of approximately 0.25 microns width, very high precision is required for the exposure apparatus.

Table 1 shows various factors of the registration accuracy which is the major item of accuracy required for the semiconductor exposure apparatus and allocations thereof.

TABLE 1

(unit: micron)

| Items | Reg. Precision |
| --- | --- |
| Mask manufacturing error | 0.025 |
| Wafer processing error | 0.025 |
| Stage accuracy | 0.025 |
| Alignment accuracy | 0.025 |
| Optical system | 0.025 |
| Other errors in exp. apparatus | 0.025 |
| Registration accuracy | 0.06 |

The "other errors in the exposure apparatus" in the above Table contains deformation or strains of the mask and the wafer due to heat. As will be understood from Table 1, the deformation of the mask and the wafer permitted in the exposure apparatus, the deformation permitted during the exposure, are 0.01 micron at maximum.

Referring to FIGS. 6A and 6B, aspects of a typical SOR source 4 will be described. In FIG. 6A, the SOR source 4 is schematically shown as an orbit of electrons. The X-rays 1 are produced by brmsstrahlung of electrons accelerated to an extent of a relativistic velocity. The X-rays thus produced have a power profile which is Gaussian, in the vertical direction V with a divergence angle of several mRad. at maximum and with substantial uniformity in the horizontal direction H over a length open to the orbit of the electrons. The profile is generally trapezoidal. This profile is the one detected by an X-ray detector 1551 shown in FIG. 15 for example, at an exposure position where the mask and the wafer are present during exposure.

A wavelength used in the SOR X-ray lithography according to the present invention is within a range of 5–15 angstroms. The electron energy accelerated to the relativistic velocity is approximately 0.5–1.0 GeV. FIG. 6B shows spectral strength characteristics for the respective wavelengths at various points on a path of the exposure beam, more particularly, a position immediately before the mirror, the position immediately after the mirror, a surface of the Be window, a mask surface and a resist surface in the order from the SOR source 4, when the X-ray exposure apparatus is constituted by disposing the mirror for reflecting the X-rays and the Be window between the SOR source 4 and the mask. It is understood from this FIG. 5–15 angstrom wavelength range is preferable in SOR X-ray lithography. From the same, it is understood that the SOR has continuous spectral characteristics.

FIG. 7A shows a mask using inorganic material for the substrate 201, and FIG. 7B shows the same using organic film. In FIG. 7A, the substrate 201 joined to the frame 203 is constituted by a silicon wafer, and a silicon nitride, for example, is laminated in thin film in a pattern area 701 in which an absorber material pattern is to be formed. Or, the silicon wafer is laminated by etching. In this case, the thickness of the substrate in the pattern area 701 is approximately 2 microns. In the example of FIG. 7B, an organic film having a thickness of 20–10 microns is bonded to the frame 203. An example of the material of the organic film, there is polyimide.

Referring back to FIG. 2 showing the proximity exposure system, the distance between the mask and the wafer during the exposure, which will hereinafter be called "proximity gap", is approximately 10–50 microns.

Table 2 shows temperature rise of the silicon nitride mask of FIG. 7A and a polyimide mask of FIG. 7B when the ambience in the space between the mask and the wafer is vacuum, air or He.

TABLE 2

(Unit: degree)

| Ambient Medium | Silicon Nitride Mask | Polyimide Mask |
| --- | --- | --- |
| Vacuum | §60 | §60 |
| Air | 1.17 | 1.18 |
| He | 0.343 | 0.351 |

The data of the above Table is on the basis of the X-ray power of 120 mW/cm on the mask surface and on the thermal emissivity of 0.5 in the vacuum. In view of the facts that the sensitivity of the resist material at present is approximately several tens mJoule—one hundred mJoule/cm$^2$ and that the transmissivity of the mask substrate to the X-rays is approximately 50%, the above data are appropriate. As will be apparent from the Table, in order to prevent thermal strain, it is preferable that the space between the mask and the wafer is filled with He gas. Therefore, in the present invention, the alignment between the mask and the wafer and subsequent pattern exposure are performed while the mask and the wafer are within a He ambience chamber. By containing the mask and the wafer in the chamber, the problems of contamination, such as dust, can be solved. Further, in the apparatus of the present invention, the temperature, pressure and purity of the gas functioning as a thermal conduction medium in the chamber are controlled with high precision so as to stabilize the X-ray transmissivity in this ambience, as in a vacuum.

Referring to FIGS. 8A, 8B, 9A and 9B, the differences between the whole surface exposure system and the scanning exposure system (scanning mirror exposure system) will be described. FIG. 8A illustrates the whole surface exposure system wherein the X-rays 1 are applied simultaneously to the entirety of the pattern area 701. FIG. 8B illustrates strains of the mask resulting from this system. FIG. 9A illustrates the scanning exposure system wherein the X-rays 1 in the form of a sheet beam scan the pattern area 701 sequentially. FIG. 9B shows the mask strains or deformations resulting from this system. The X-rays produced from the SOR have a very small divergence in the vertical direction, and therefore, the half peak width of the X-ray power profile is only approximately 10 mm even if the exposure position is away from the SOR emitting point by a distance of 10 m. Therefore, in order to reduce the exposure period of the scanning exposure system (the same in the scanning mirror exposure system) to such an extent as being comparable to that of the whole surface exposure system, the strength of the X-ray applied to the mask should be several times that of the whole surface exposure system. This increases the mask strain.

Table 3 shows the temperature rise and the mask deformation in the whole surface exposure system as compared with those in the scanning mirror exposure system.

TABLE 3

(Unit: degree, micron)

| Exposure System | Silicon Nitride Mask | | Polyimide Mask | |
|---|---|---|---|---|
| | Temp. Rise | Max. Strain | Temp. Rise | Max. Strain |
| Scanning Mirror | | | | |
| 0.5 Hz | 1.34 | 0.016 | 1.40 | 0.094 |
| 8 Hz | 1.22 | 0.015 | 1.22 | 0.082 |
| 1000 Hz | 0.343 | 0.0084 | 0.351 | 0.046 |
| Whole Surface Exp. | 0.343 | 0.0084 | 0.351 | 0.046 |

The data of this Table are based on the material of the wafer chuck 1807 (FIG. 18) being alumina (Al) having a thickness of 0.5 mm under the condition that the back surface temperature is constant. With respect to the scanning mirror exposure system, the mirror swing is taken as a parameter.

As will be understood from the above Table, the mask strain can be made under the tolerable level (0.01 micron) only by the whole surface exposure system and the scanning mirror exposure system, the latter being possible only when the mirror is swung at a high frequency. Also, it is understood that a usual polyimide film is not usable as a mask substrate. However, in consideration of the situation wherein the mirror 301 (FIG. 3B) is located in a high vacuum ambience of approximately $10^{-9}$ Torr., it is very difficult to realize that the mirror is swung at a high frequency over several tens of Hertz. Further, the difficulty is more significant in the scanning exposure system wherein the mask and the wafer are moved together.

Therefore, the present invention employs the whole surface exposure system.

In the exposure apparatus, the accuracy of the pattern line width is required to be 5–10% of the minimum width of the line to be transferred. In the exposure apparatus capable of exposing 0.25 micron of the minimum line width, the pattern line width accuracy is 0.012 micron. This means that the uniformity of the X-ray illuminance over the entire exposure area (pattern area 701) or the uniformity of the amount of the exposure over the entire exposure area is required to be approximately ±2.5%. On the other hand, the strength profile of the SOR X-rays, as described hereinbefore, is in the form of the Gaussian function in the vertical plane, and therefore, it is not easy to profile the uniformity of approximately ±2.5% in the amount of the exposure over the entire exposure area in the whole surface exposure system. If the illuminance is made uniform over the entire exposure area, it cannot be avoided to use only the central portion of the Gaussian distribution, with the result that the efficiency of the X-ray energy is low. The present invention, adopts the exposure system shown in FIGS. 10A and 10B so as to solve those problems. In this system, the X-rays from the emitting point 1001 in the SOR source are incident on the X-ray mirror 1002 at a low glancing angle, and the X-rays diverged by the mirror 1002 are applied on the mask. The mirror 1002 is designed such that the minimum illuminance of the X-ray strength profile in the exposure area is maximum under the set conditions of the exposure apparatus.

FIG. 11 shows the X-ray strength profile in the exposure area in this example. As will be understood, the illuminance area is significantly different at the central area and the marginal areas of the exposure area. In this system, the illumination distribution can include ±10% difference in the exposure area. However, in the exposure system, the non-uniformity of the illuminance is corrected by the shutter mechanism 1003 during the exposure, so that the uniform exposure is effected over the entire exposure area.

The shutter mechanism will be briefly described in conjunction with FIG. 10B. A steel belt 1009 is trained between a driving drum 1009 and an idler drum 1001 and is provided with a rectangular aperture 1012 having a leading edge 1004 and a trailing edge 1005. The Y axis is perpendicular to the optical axis of the SOR X-ray and is substantially vertical. A t-axis represents time. A curve 1006 indicates movement of the leading edge 1004, and a curve 1007 indicates the movement of the trailing edge 1005. The shutter mechanism drives the driving drum 1009 so that the exposure period ΔT(y) at each point on the Y axis is different corresponding to the illuminance profile shown in FIG. 11, by which the amount of exposure (=exposure period×illuminance) is uniform over the entirety of the exposure area.

In the exposure apparatus (FIG. 5) disclosed in the above-mentioned "Proceeding of SPIE, Vol. 448, 1983, p. 104", the path of the X-ray from SOR source is once stopped by a Be window, and thereafter, the wafer is exposed to the X-ray through the wafer in the air.

FIG. 12 shows the dependency of the thermal conductivity to pressure for air and He. It will be understood from this Figure that air has a lower thermal conductivity than He under the same pressure. Therefore, in consideration of the strain of the mask described with respect to Tables 2 and 3, it is difficult to achieve the object of the present invention by exposure in air. In consideration of this, the present invention adopts exposure in the closed He ambience for which the temperature, pressure and purity are controlled with high precision. In addition, in order to meet the SOR X-ray source, the conveying mechanism and the exposure stage are of vertical type, and the mask and the wafer are conveyed within a completely closed ambience. By this, in the SOR X-ray exposure apparatus, a high throughput and reduction of influence by particles (dust) and contamination are achieved.

Furthermore, in the present invention, a wafer stage is controlled in 6 axes (X, Y, Z, Θ (=ωz, ωx, ωy)), and the mask stage is controlled in the Θ axis only, so as to achieve the high accuracy of the mask stage, in view of (1) that the optical axis of the X-ray from the SOR source hardly changes, (2) that the accuracy of the mask is sufficient as described hereinbefore and (3) that in the SOR X-ray exposure, the stability in the relation between the optical axis of the X-ray from the SOR source and the mask is most important.

In the present invention, the mask stage is rotatable about the Θ direction in order to align the orientation of the mask with the movement direction in X and Y axes of the wafer which is step-and-repeat-exposed. In order to accomplish this mask alignment with great precision, a reference mark is provided on the wafer stage, and the mask alignment is effected using the reference mark.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 illustrates X-ray proximity exposure.

FIGS. 3A, 3B and 3C are perspective views illustrating various types of exposure systems.

FIG. 8A is a sectional view of a mask for illustration of thermal strain.

FIG. 8B is a sectional view of a mask for illustration of thermal strain of a mask.

FIG. 9A is a top plan view of a mask showing thermal strain distribution corresponding to FIG. 8A.

FIG. 9B is a top plan view of a mask illustrating thermal strain distribution of a mask.

FIG. 33 is a schematic view illustrating a wafer load locking mechanism.

FIG. 47 is a block diagram of a mirror control system.

FIG. 60 is a flow chart for a mask cassette taking out operation.

FIG. 61 is a flow chart for a mask cassette setting operation.

FIG. 65 is a graph of exposure area vs. exposure period of time in an example.

FIG. 66 is a graph illustrating shutter speed and control data setting.

FIG. 67 is a schematic view illustrating the shutter system.

FIG. 80 is a flow chart illustrating a step-and-repeat exposure.

DETAILED DESCRIPTION OF THE PREFERRED EMBODIMENTS

Referring back to FIG. 1 which shows the general arrangement of the exposure apparatus according to an embodiment of the present invention, an electron accelerator or an electron accumulating ring which will hereinafter be called "SOR ring" 4 produces SOR rays, and the electron orbit is horizontal. In the illustrated example, only one SOR ray emitting port is shown, but two or more of them may be provided. A mirror unit 101 is disposed between the SOR ring 4 and an exposure unit 102, and it contains an X-ray mirror 1401, which will be described in detail in conjunction with FIG. 14, to change divergence of the SOR rays to a desired extent. The X-ray mirror 1401 is in a vacuum of approximately $1 \times 10^{-8}$–$1 \times 10^{-10}$ Torr. A beam duct 120 connects the SOR ring 4 and the mirror unit 101 while keeping the vacuum at approximately $1 \times 10^{-8}$–$1 \times 10^{-10}$ Torr.

Figure 13:
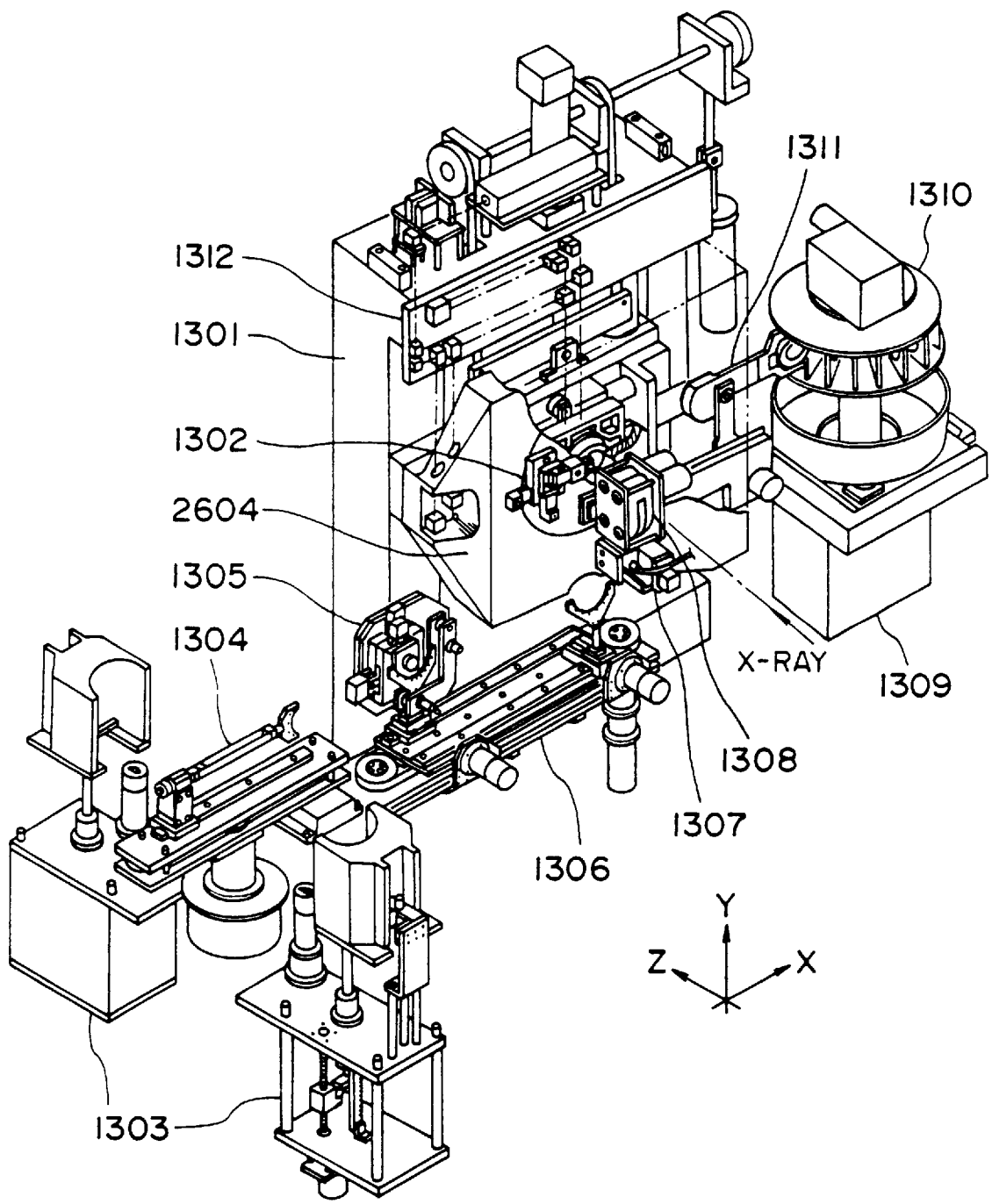
FIG. 13 is a perspective view of an exposure unit according to an embodiment of the present invention.

The exposure unit 102 is contained in a main chamber 3101 which will be described in conjunction with FIG. 31. The main chamber 3101 is filled with a highly pure He gas having a purity of not less than approximately 99.99%. As shown in FIG. 13, in this ambience, there are contained a stage apparatus 1301 for carrying and/or holding a mask 2 and a wafer 3, a measuring optical system 1312 for determining the stage position, a prealignment system 1307 for measuring a relative positional deviation between the wafer 3 and the mask 2 for preliminary alignment thereof, a fine alignment system 1302, an exposure shutter apparatus 1308 for providing the wafer 3 with a proper X-ray exposure amount, a wafer supplying and taking up apparatus 1303 for supplying and taking up wafers, an injector 1304 for conveying the wafer 3, a wafer traverser 1306, an orientation flat detecting stage 1305 for aligning crystalline orientation of the wafer 3, a mask accommodating apparatus 1301 for accommodating masks 2, a mask cassette loader 1309 for loading and unloading the mask 3 relative to the mask cassette 1310, a mask conveying apparatus 1311 for transferring the mask 3 between the mask cassette 1310 and a mask Θ stage 1999 which will be described in conjunction with FIG. 19, and other auxiliary apparatuses. The main chamber is fixed on a vibration suppressing base 8405, as will be shown in FIG. 84. The vibration suppressing base 8401 has three air suspensions 8402, 8403 and 8404 fixed thereto, and one end of each of the air suspensions 8402–8404 are fixed to the vibration suppressing base 8401. The vibration suppressing base 8401 is a rigid assembly for supporting the vibration suppressing base 8405 and the main chamber. The vibration suppressing base 8401 has a fluid bearing (not shown) mounted thereto, the fluid bearing being effective to supply air to lift the base by pressure from the floor. The fluid bearing provides a reduced frictional resistance relative to the floor during the adjustment of the entire exposure unit setting, and therefore, it makes fine positional setting possible.

Figure 35:
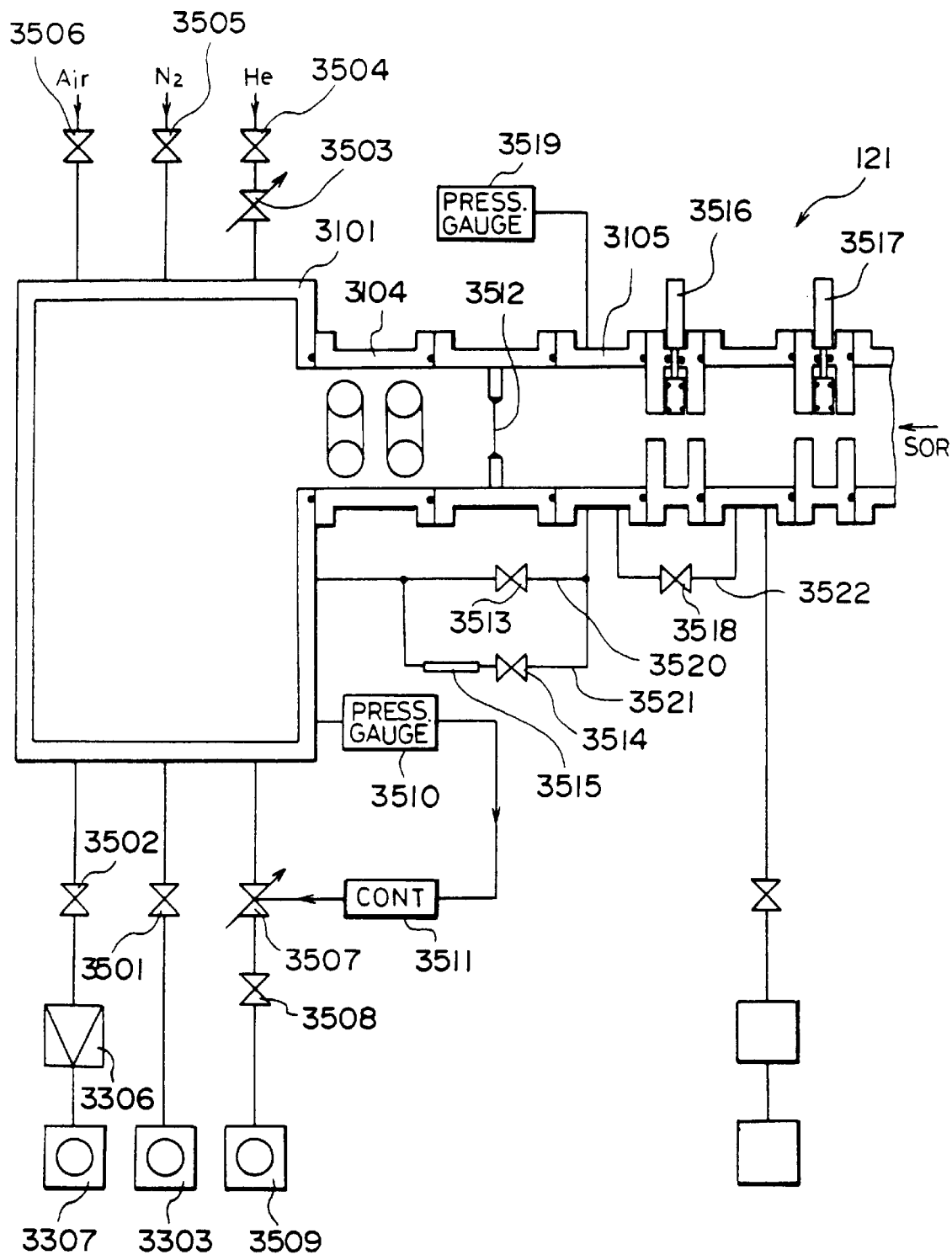
FIG. 35 is a schematic view illustrating a gas supply and discharging system for pressure and purity control and for mirror port.

Between the mirror unit 101 and the exposure unit 102, the beam duct 121 is disposed, in which shut-off valves 3516 and 3517 and a Be window 3512 as shown in FIG. 35, and to which each of the units 101 and 102 are connected in a manner in which sealing is possible. The beam duct 121 is supported on the floor through a supporting frame 123. The inside of the beam duct 121 is kept under vacuum condition of approximately $1 \times 10^{-6}$–$1 \times 10^{-10}$ Torr by a vacuum pump disposed between the mirror unit 101 and Be window 3512.

An electric control unit 103 functions to control the mirror unit 101, the exposure unit 102, a constant temperature maintaining unit 104, a discharging unit 105, a supply control unit 106 and as an input board for operation, and also serves for supplying and receiving coordination signals with the SOR ring 4 and for supplying and receiving safety signals in connection with an inlet door of the operation room. The constant temperature maintaining unit 104 is effective to supply heated fluid to heat generating parts such as the mirror unit 101, the exposure unit 102 or the like to absorb the heat from those parts to keep the temperature thereof constant. The discharging unit 105 discharges fluid in the exposure unit, and controls the mirror unit 101 and the discharge pump 122. The supply control unit 106 controls high pressure air, N2 and He gases used in the mirror unit 101 or in the exposure unit 102.

As briefly described in the foregoing, the exposure apparatus according to this embodiment includes various constituent units. The advantageous effect provided by the unit structure will be described. In an exposure method using the X-rays provided by the SOR ring 4, a role of the X-ray mirror 1401 for controlling divergence of the X-rays is important as will be described hereinafter in more detail. It will be difficult to achieve the exposure by SOR X-ray without the X-ray mirror 1401.

The role thereof includes selection of the wavelength appropriate for the exposure, reduction of the distance between the SOR ring 4 and the exposure unit 102 by creating appropriate X-ray strength distribution and appropriate X-rays. By the selection of the wavelength, the contrast of the mask 2 can be assured, and by creating an appropriate X-ray strength distribution, the exposure system is not changed in dimensions by heat. By controlling the divergence angle, the distance between the SOR ring 4 and the exposure unit 102 can be made practical. In summary, by use of the X-ray mirror 1401, a practical SOR exposure system can be provided.

The influence to the exposure system by the SOR ring 4 in the exposure system using the SOR rays, will be considered. Generally, the outside dimension of the SOR ring 4 is approximately two to several tens of meters, and the weight thereof is several tens to 300 ton. Therefore, the exposure system is required to be relatively freely movable toward the emitting direction of the SOR rays. Around the SOR ring 4, a radiation blocking wall having a thickness of approximately several tens of centimeters is disposed.

It is considered in the exposure system that the wall should be conveniently near the SOR ring 4, since it is then remote from floating radiation. In the SOR rings presently available, the positions of the wall is widely different, in one of which the wall is very close to the SOR ring and in another of which it is away by as many as several meters. Therefore, it is preferable in the exposure system that it is usable irrespective of whether the wall is between the SOR ring 4 and the mirror unit 101 or between the mirror unit 101 and the exposure unit 102. In view of those, it has been found that the image exposure system can be made practicable by constituting various parts of the apparatus as the mirror unit, the exposure unit, the electric control unit or the like. In the foregoing, the general arrangement of the exposure system using the SOR rays is generally described.

The description will now be made as to each of the units in some detail.

The mirror unit 101 has to be directly connected to the SOR ring 4, and therefore, it has a vacuum system independent from that of the exposure unit 102. The unit in its entirety is required to be aligned relative to the SOR rays in six axis directions (X, Y, z, Θ, ωx, and ωy). In order to allow the entire mirror unit 101 to be movable in the X and Z directions, a fluid bearing is used at the bottom of the unit. The movement in the Y direction and the rotational motions about the X, Y and Z axes are effected by a mirror position- or pose adjusting apparatus 1406 (FIG. 14) directly contacted to the X-ray mirror 1401. The X-ray mirror 1401 which receives the SOR rays directly is prevented from thermal deformation by supplying a liquid medium having a constant temperature adjacent thereto. Between the X-ray mirror 1401 and the SOR ring 4, an aperture 1409 (FIG. 14) is provided so as to avoid the possible damage by unnecessary X-ray application.

The exposure unit 102 is required to be aligned in the six axes similar to the case of the mirror unit 101, relative to the SOR optical axes of the SOR ring 4 and the mirror unit 101. To achieve this, a fluid bearing is provided at the bottom of the unit so as to make easier movement of the exposure unit 102 in the X and Z directions and the rotation ((ωy) about the Y axis. The rotational motion (ωx, 0) about the X and Z axes and the motion in the Y direction are effected by controlling pressure of the air suspension 8402, 8403 and 8404 shown in FIG. 84.

Since the exposure unit 102 receives the SOR rays, the problems arising from the SOR rays are to be solved. If the inside of the main chamber 3101 (FIG. 31) among the constituent elements of the exposure unit 102 can be made vacuum, the problems will be reduced, but it is not preferable to adopt the vacuum main chamber 3101 so as to deal with the heat of mask, which will be described hereinafter. Therefore, in this embodiment, the main chamber is filled with He (H is possible) which absorbs a low percentage of the SOR rays, particularly, X-rays. This necessitates an introduction of an X-ray inlet window to separate the vacuum ambience and the He ambience. As for the material for the window, Be is appropriate. The X-ray absorption by the He and the Be reduces the exposure energy, and therefore, the absorption should be minimized. Therefore, it is preferable that the pressure of the He gas is minimized and that the thickness of the Be window is minimized. The pressure of He is determined in consideration of the thermal conduction property and distance through which the X-rays pass.

For the reasons which will be described hereinafter, the pressure of He is 100–200 Torr, and the purity is 99.99%. The thickness of the Be window is determined in consideration of the He pressure and the structure therearound. The thickness thereof can be approximately 20 microns when the gas control system and discharging system, which will be described hereinafter, are used. The distance through which the X-rays pass is preferably not less than 30 cm. In order to maintain the purity of He, it is preferable to discharge the main chamber 3101 to the extent of the vacuum of approximately $1-10^{-4}$ Torr, and then He is introduced. The amount of contamination gases introduced into the main chamber 3101 is minimized, and it is preferable to provide a supply control unit so as to maintain the purity of He gas against the leakage of s the contamination gases.

The description will be made as to means for providing the precisions. The exposure system is generally required to be capable of exposing 30 mm×30 mm area of the wafer. A thermal expansion coefficient of an ordinary silicon wafer is approximately $4\times10^{-6}$° C. Therefore, the dimensional change per 1° C. in 30 mm length is 0.12 micron. Since, in the exposure system, it is desired that the change is not more than 0.001–0.01 micron, the temperature change at the position where the wafer 3 is present is to be maintained within 0.01°–0.1° C. This requirement is achieved in the present invention by flowing a constant temperature fluid to the portion where the wafer is present or the portion where the dimensional change should be controlled. In the exposure system, the mask pattern is transferred to a predetermined position of the wafer, and the reproduction accuracy of the positioning relative to each other is desired to be 0.02–0.05 micron. In order to accomplish this, the mask and wafer are mechanically strongly fixed and guided together, but the mechanical rigidity therebetween is limited. The positional deviation therebetween results from temperature change of the associated members and deformation by external vibrations thereof.

Figure 84:
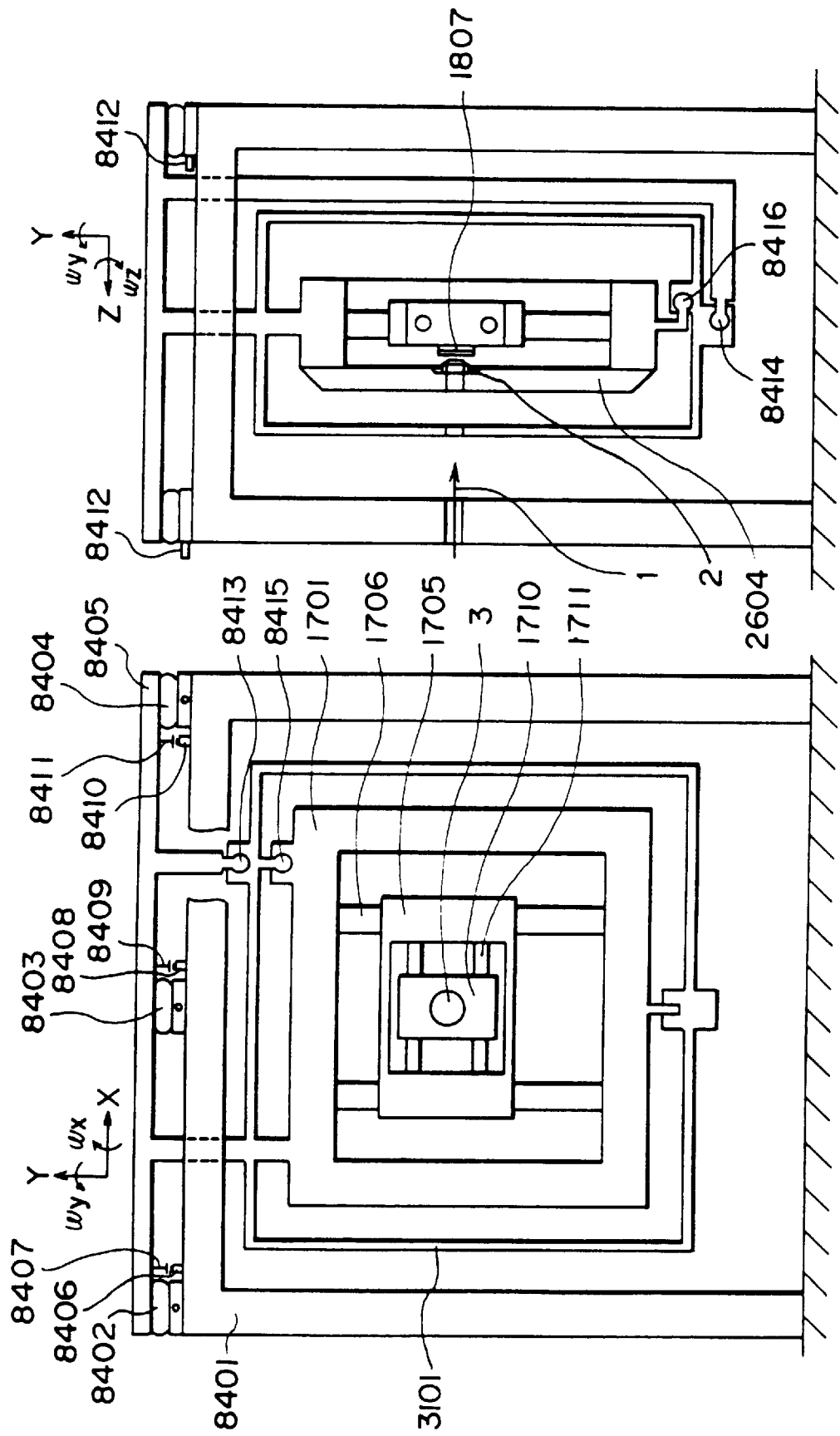
FIG. 84A and 84B are front and side sectional views of the exposure unit.
Figure 85:
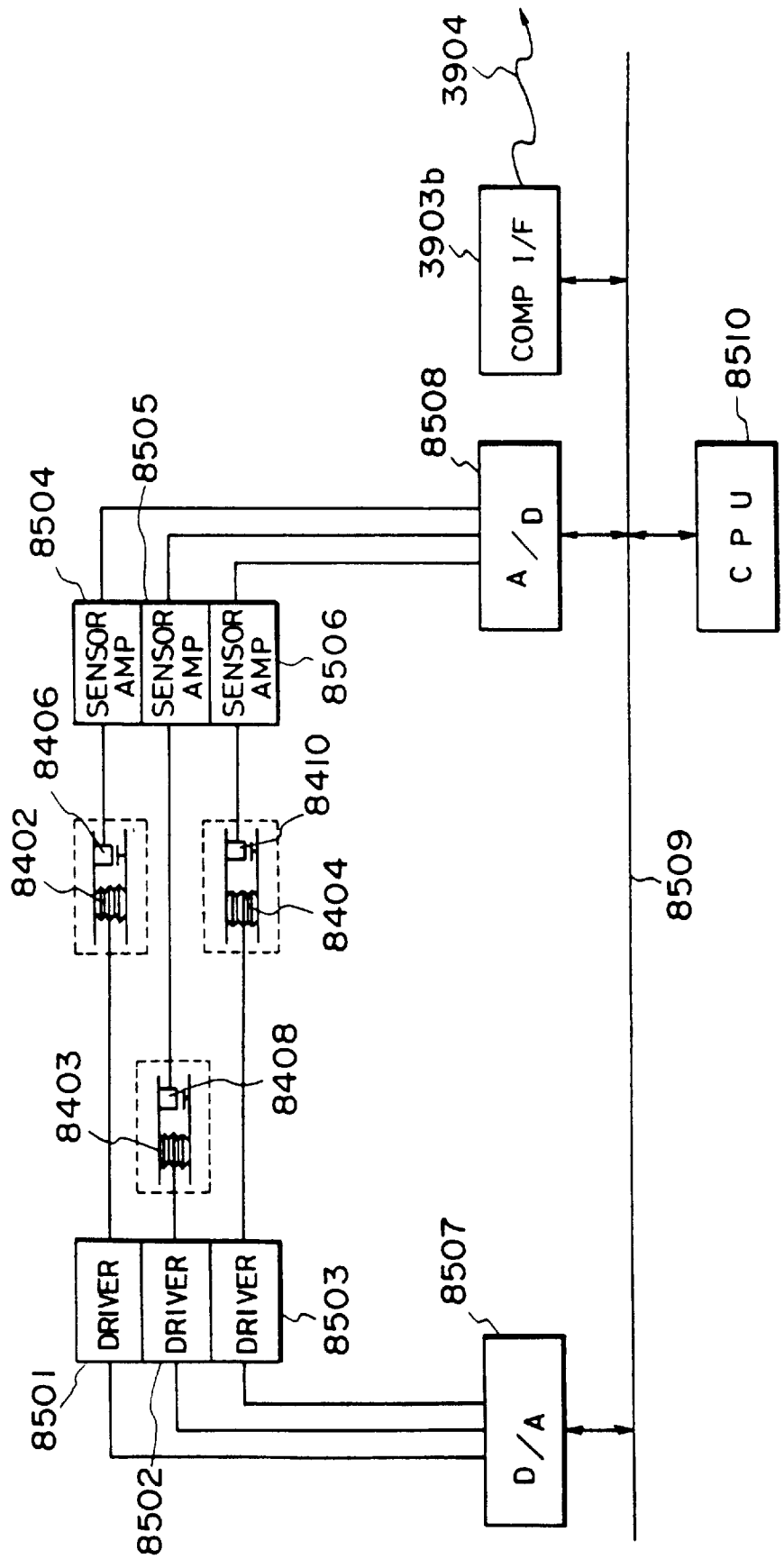
FIG. 85 is a block diagram for a control of a vibration suppressing system.

The temperature change is suppressed by the above-mentioned constant temperature maintaining means, and the influence of the external vibration is prevented via a structure by which the transmission of the vibration is shut by the air suspensions 8402–8404 mounted between the vibration suppressing base 8405 and the vibration suppressing frame 8401 shown in FIG. 84. Between the X-ray duct 121 and the exposure unit 102, there is a soft material portion such as bellows to prevent transmission of the vibration from the duct 121 to the exposure unit 102. The means for obtaining the precisions have been described above.

In the foregoing, the general arrangement of the exposure system using the SOR rays, particularly the X-rays, have been briefly described.

Detailed description of the exposure system according to this embodiment of the present invention will now be described.

Referring to FIG. 13, there is shown an internal structure of the exposure unit, the portions downstream of the Be window 3512 (FIG. 35) with respect to the travelling direction of the SOR rays.

The exposure unit 102 to align the pattern on the mask 2 to be transferred is aligned with a predetermined position of the resist on the wafer 3, to transfer it on the wafer 3 using the X-rays. The pattern is in a 30 mm×30 mm area, whereas the wafer has a diameter of several tens of mm to several hundreds of mm, and therefore, the exposure of the wafer is effected in a step-and-repeat manner wherein one wafer is covered by a plurality of exposures. The precision of the alignment between the mask 2 and the wafer 3 is 0.01–0.05 micron, and of course, the smaller the better. Since the transfer pattern of one mask is transferred a plurality of times at different areas of the wafer, the pattern of the mask is not permitted to have contamination or other defects. From this standpoint, the time period used for other than the exposure, such as the alignment between the mask 2 and the wafer 3, should be minimized. Therefore, what should be considered in the exposure unit is that it is provided with means for precisely conveying the mask 2 and the wafer 3, which does not produce contamination and which does not waste time.

The internal structure of the exposure unit 102 is determined in consideration of the above. A stage 1301 is provided to hold wafer 3 and the mask 2 and align them, and therefore, it is an important element of the exposure unit 101. The stage 1301 is vertical so as to hold the wafer 3 perpendicular to the optical axis of the SOR rays and the wafer 3 is moved in three dimensions (X, Y, Z) with positioning resolution of not more than 0.01 micron. The stage is guided by a fluid bearing and an elastic linkage so as to minimize the heat generation, vibration generation and contamination. The constant temperature fluid is supplied to the neighborhood of a driving means, fluid bearing guides or the like where temperature change can occur, so as to prevent temperature change of the structural element associated. The stage 1301 is provided with other constituent sub-units and the rigidity between the mask and the wafer is such that the minimum characteristic frequency is 200–300 Hz.

A fine alignment system 1302 serves to detect the positional relation between the wafer 3 and the mask 2. The fine alignment system 1032 comprises an optical system (which will be described hereinafter in detail) for detecting the positional relation between the wafer 3 and the mask 2 in three dimensions (X, Y, Z) and means for moving the optical system. The fine alignment system 1302 is disposed around the periphery of the exposure X rays so as not to block the exposure X-rays. Also, it is mounted to the stage 1301. The fine alignment system 1302 is on the stage 1301, and is close to the mask 2, and therefore, the constant temperature fluid is supplied to the neighborhood of the heat generating parts such as the illumination source for the fine alignment, the electric circuit and actuators to prevent the temperature change.

A prealignment system 1307 is to determine the position of the wafer 3 introduced thereinto, relative to the stage 1301. The prealignment system determines the position of the wafer 3 relative to the stage 1301 in the six axes (X, Y, Z, Θ, ωx, ωy), by which the operating period of the fine alignment system 1302 can be shortened. On the basis of the results of the measurement by the prealignment system 1307, the stage 1301 is controlled so that the wafer 3 does not abut the mask 2.

The system 1307 is on the top surface of the stage 1301, and therefore, the constant temperature current is supplied to the heating generating parts so as to avoid the temperature change during the operation of this system. The light source is a significant heat generating part, and it is relatively quickly consumed, and therefore, it is disposed outside the main chamber 3101 for the purpose of easy exchange of the light source for prealignment and for minimizing the influence of the heat generation. Using optical fibers, only a required specter is introduced into the system.

An exposure shut apparatus 1308 is to control the exposure energy by allowing and stopping passage of the X-rays. In this exposure system, the X-rays emitted from the SOR ring 4 are reformed into an appropriate shape by the mirror 1401 (FIG. 14), and as described hereinbefore, the efficiency of the SOR rays is higher when there is no non-uniformity of the strength of the energy in the Y axis direction resulting from the nature of the SOR ray radiation. In order to eliminate the non-uniformity in the Y direction, the exposure shutter apparatus 1308 is to effectively operate.

To meet those requirements, the shutter is in the form of a focal plane shutter. When the shutter apparatus 1308 operates, the wafer 3 and the mask 2 have been positionally aligned in precision on the order of 0.01 micron, and therefore, vibration should be minimized. In consideration of this, the shutter films (steel belts 1513 and 1517 in FIG. 15) are in the form of endless strips, by which the vibration due to eccentric weight is minimized. It is mounted to the wall of the main chamber 1301, by which the influence to the precision in the alignment between the mask 2 and the wafer 3 is minimized.

In this apparatus 1308, the constant temperature fluid is supplied to the portion where the heat is produced to suppress the temperature change.

An orientation flat detecting stage 1305 serves mainly to determine the orientation of crystalline of the wafer 3 being conveyed and the center of the wafer 3 and to determine the wafer 3 rotation and to position the wafer 3 center in place relative to the stage apparatus 1301. The detecting stage 1305 comprises a plurality of linearly movable stages in the X and Y directions, a rotating stage on one of the aforementioned stages and an optical system for measuring the dimension of the wafer at its ends. The rotating stage is provided with means for attracting and holding the wafer 3. In the detecting stage 1305, the relative positional relation with the above-described stage 1301 is important, and therefore, it is directly mounted to the stage 1301. To the heat generating parts such as a driving actuator, the constant temperature fluid is supplied to prevent the temperature change.

A wafer traverser 1306 functions mainly to convey the wafer 3 from the orientation flat detecting stage 1305 to the stage 1301 and in the opposite direction. The wafer traverser 1306 moves in the Z direction on the orientation flat detecting stage 1305 and at the wafer transferring position of the stage 1301 and also moves in the X direction from the orientation flat detecting stage 1305. A plurality of wafer hands are provided to supply and take up the wafers, exclusively. They are moved in the opposite directions along the X axis. Each hand of the wafer traverser 1306 is required to stop at a predetermined position on the stage 1301, and therefore, it is directly mounted to a member of the stage 1301. The heat generating parts such as a driving actuator or the like is supplied with the constant temperature fluid so as to prevent the temperature change thereof.

An injector 1304 has a main function to dispense the wafer 3 from and accommodate it into a wafer carrier of a wafer supply and take up apparatus 1303 and to supply the wafer 3 to or remove it from the orientation flat detecting stage 1305. The injector 1304 is capable of moving a wafer supporting surface of a wafer hand between the horizontal position and vertical position, and the hand is movable in the X (or Z) direction, and is movable about the Y axis. The injector 1304 is mounted to the wall of the chamber 3101. The heat generating elements of the injector 1304 is supplied with constant temperature water to prevent temperature change.

A wafer supplying and taking up elevator 1303 serves mainly to step a wafer carrier containing or not containing the wafers 3 in the X-axis direction to supply or collect the wafers. The wafer elevator 1303 is mounted to a chamber isolated by a gate valve, which will be described hereinafter. A driving station thereof is disposed in the air from the stand point of contamination prevention.

Figure 17:
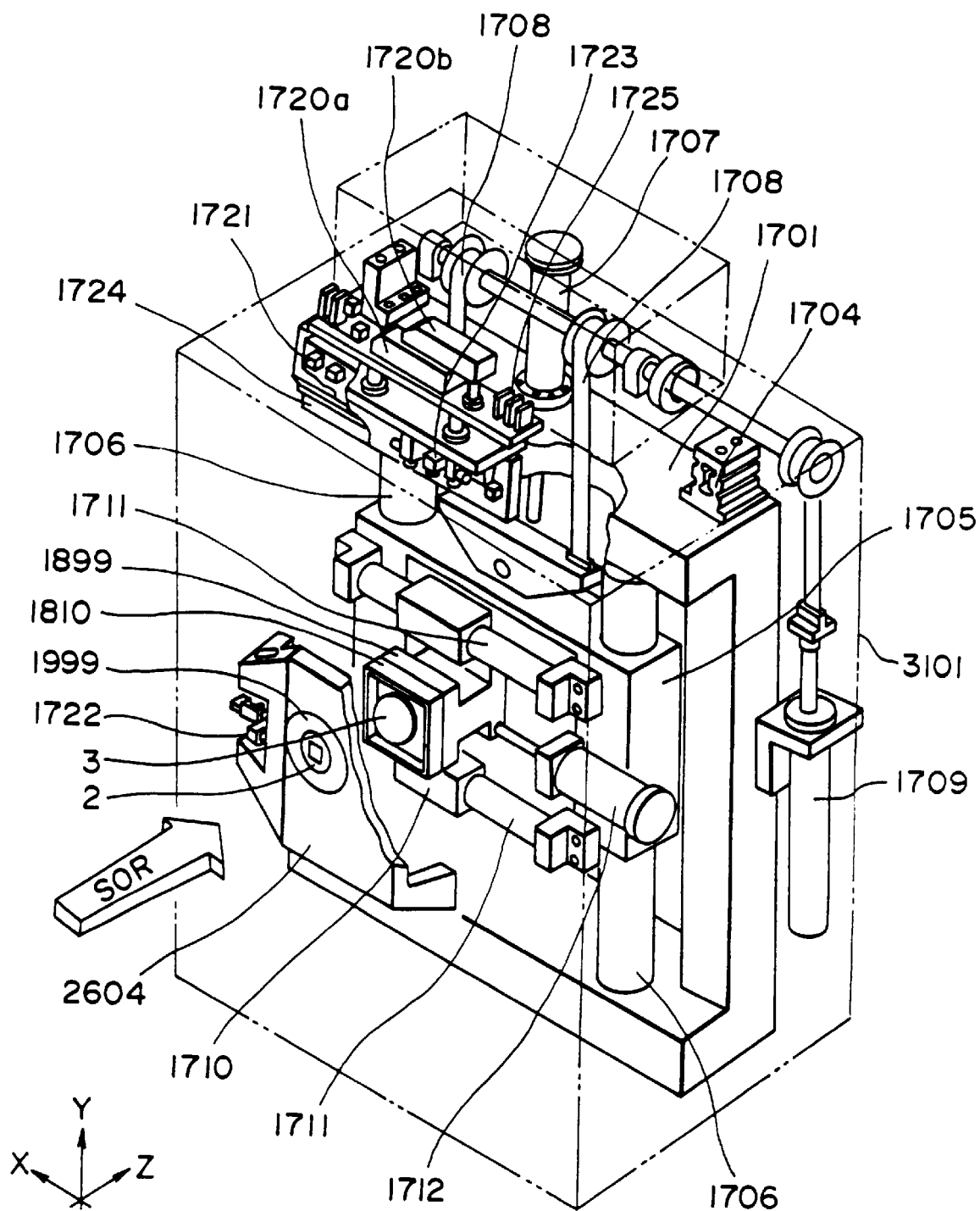
FIG. 17 is a perspective view illustrating a stage.
Figure 19:
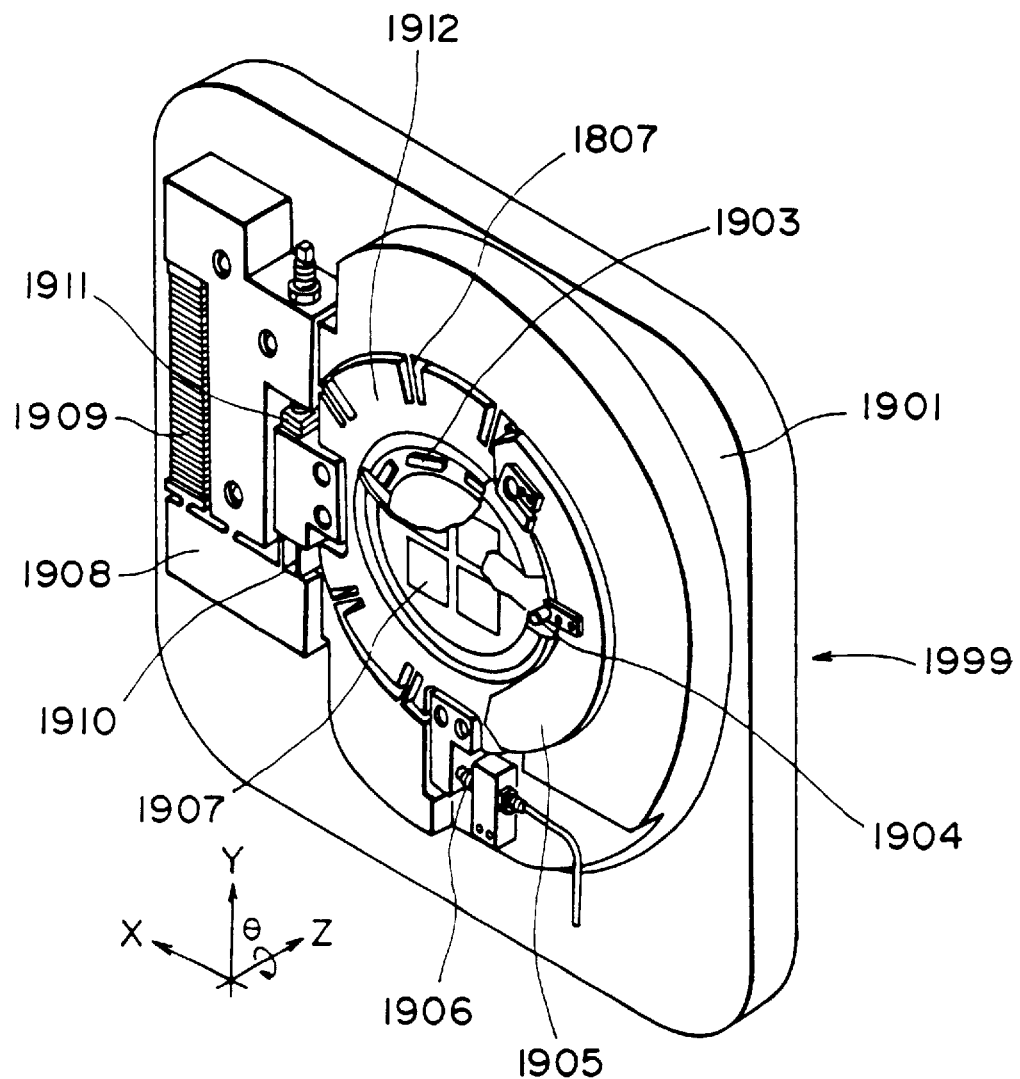
FIG. 19 is a perspective view of a mask stage.

A mask cassette 1310 is an accommodating chamber for accommodating 20 masks. The mask cassette 1301 is hermetically sealed so as to prevent the mask from contacting the air. A mask cassette loader 1309 has main functions to hold the mask cassette 1310, to open or close the mask cassette 1310 and to set a selected mask to a position for the mask conveying apparatus 1311 to receive it. The mask cassette loader 1309 is directly mounted to a container isolated by a gate valve, which will be described hereinafter. The main function of the mask conveying apparatus 1311 is to convey the mask 2 between the mask cassette 1310 and a mask chuck 1903 (FIG. 19). Since the mask 2 is fragile, consideration is paid so as not to produce shock, not to produce contamination by swinging movement or the like, and particularly not to impart a mechanical deformation to the mask 2 when it is set on the mask chuck 1903. The most important point to meet those requirements is a very accurate track of the hand for holding the mask 2. The hand is rotatable about a Z-axis on a table movable in the X direction. At the rotational stopping positions in the clockwise and counterclockwise direction, it is abutted to stop pins at a constant pressure. As regards the X-axis direction, the correct track of motion is provided by an optical position detection and employing a driving system capable of correct movement track. A measurement optical system 1312 has a major function of measuring a position of a wafer fine movement stage 1899 (FIG. 19). The measurement optical system 1312 includes an interference device using a laser beam source in the form of a Mickelson interferometer having a reference point on a main frame 1701 (FIG. 17).

The laser source and the photoreceptor of the measurement optical system 1312 are disposed outside the main chamber. The in-between optical window is hermetically mounted to the main chamber 3101. The laser source and the photoreceptor are mounted directly to the main frame 1701, by which the optical axis is prevented from mechanical deformation. In the foregoing, the subordinate units of the exposure unit 102 are explained.

The subunits will be further explained. The pattern of the mask 2 is transferred onto the wafer 3 at a position behind the mask Θ stage 1999 of the stage 1301 in the Z direction. In this system, the highest precision is desired at the transfer position. What is important is the relative positional relation between the mask and the wafer 3 which should be with minimum positional error. There are various factors for the alignment error, but among them, the stability of the measurement optical system 1312 should be established. The transfer position is so disposed as not to be adjacent the center of the Y axis guiding shaft of the stage 1301, since the rigidity of the stage is enhanced. In consideration of this, the transfer position-is located above the movable range of the stage 1301 in the Y direction. By doing so, the distance from the interferometer of the measurement optical system 1312 and the stage position measuring mirror can be reduced, and therefore, the influence of the ambience in the chamber to the measurement accuracy can be reduced. The movement distance of the stage in the Y direction is longer than that in the X direction, in consideration of the fact that counter balance or moment balance can be easily used in the Y direction.

Therefore, the shape of the stage apparatus 1301 is such that it is longer in the Y direction, and the measurement optical system 1312 is disposed on the top surface of the frame 1701 (FIG. 17) in the Y direction. The transfer position is disposed at the topmost possible position in the Figure. With such an arrangement, the number of movable parts above the mask 2 and the wafer 3 is reduced, so that the problem of contamination falling is eliminated. Also, the mask conveying apparatus 1311, the orientation flat detecting stage 1305, the injector 1304, the wafer traverser 1305 or the like are necessarily disposed at a lower side in the Figure of the transfer position, and therefore, the transfer position is protected from dust produced by those subunits.

In this Figure, there are shown an automatic alignment frame 2604 which connects the main frame 1701, the mask Θ stage 1999 and the fine alignment system 1302.

Figure 14:
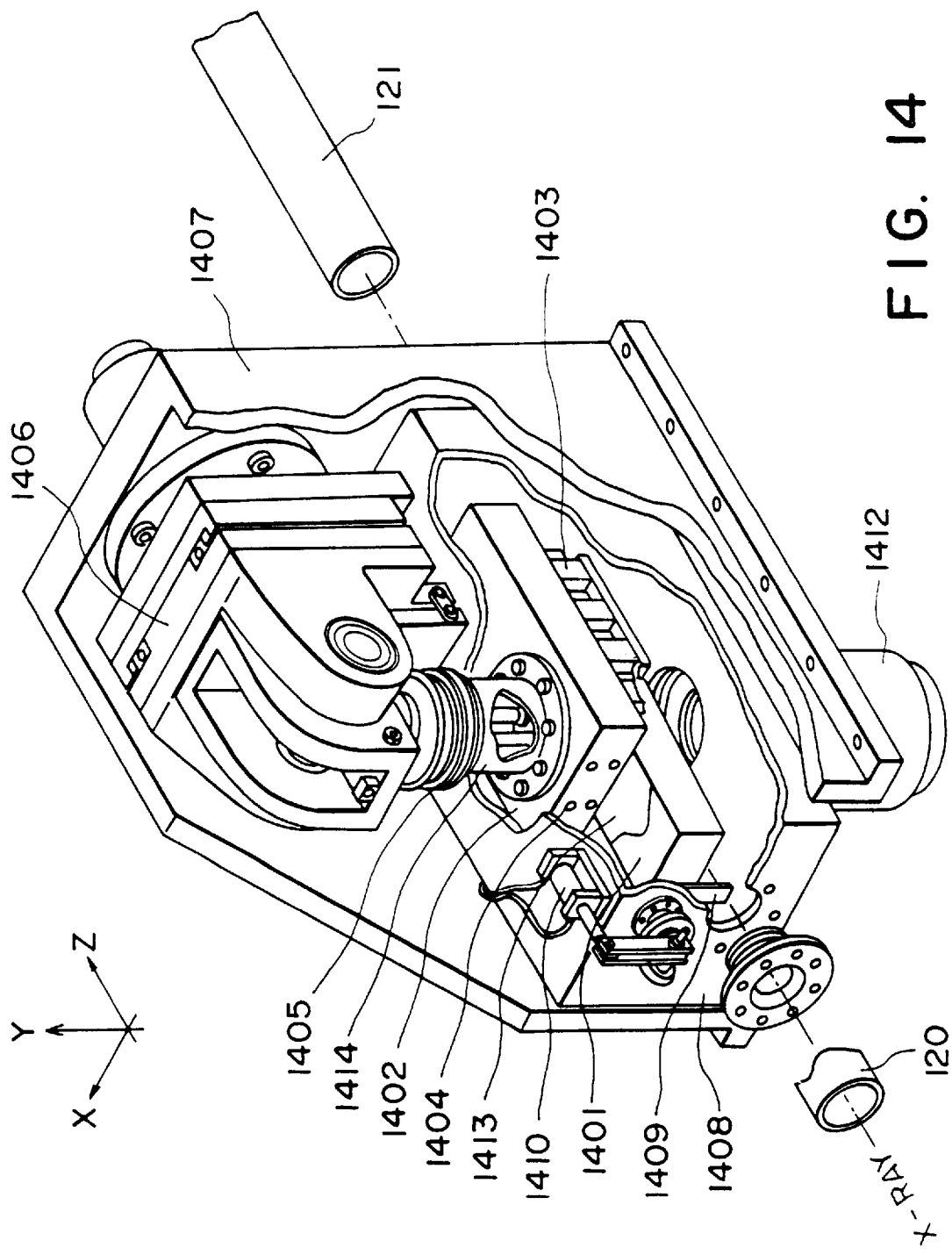
FIG. 14 is a perspective view of an X-ray mirror unit.

Referring to FIG. 14, there is shown an example of a part of the illumination optical system for enlarging the SOR rays in the vertical direction and for projecting the expanded rays to the entirety of the exposure area simultaneously. The X-ray mirror has a convex cylindrical reflecting surface for diverging the SOR rays. The reflecting surface is made of SiC or SiO2 or Au Pr or the like film on the SiO2. The reflecting surface is processed with very high precision to provide a sufficiently large reflection index for the wavelength region of the X-rays usable for the exposure. The mirror unit includes a mirror base 1402 for supporting the X-ray mirror 1401, a liquid medium passage 1404 formed in the mirror base 1402. In the passage 1404, a temperature controlled liquid medium is circulated. The SOR rays are partly absorbed by the reflecting surface of the X-ray mirror 1401, and the absorbed energy becomes heat.

A thermal connecting member made of indium thin film or the like is disposed between the back surface of the X-ray mirror 1401 and the mirror supporting surface of the mirror base 1402 and is cross-contacted to the respective surfaces.

By this, the thermal resistance from the X-ray mirror 1401 to the mirror base 1402 is reduced to promote thermal conduction of the heat produced by the absorption of the SOR ray to the liquid medium circulating in the passage 1404, thus suppressing the temperature rise of the X-ray mirror 1401.

The mirror unit includes a mirror supporting member which urges the X-ray mirror 1401 to the mirror base 1402. A supporting member supports the mirror base 1402. The supporting member 1414 includes a pipe connected to the liquid medium passage 1404 in the mirror base 1402. A bellows 1405 made of metal is connected to a vacuum chamber 1408 at one side and is connected to the supporting member 1414 at the opposite side. A pose adjusting apparatus 1406 serves to adjust the pose of the X-ray mirror 1401 in plural latitudes and is securely fixed to the supporting member 1414. The bellows 1405 accommodate the relative displacement between the vacuum chamber 1408 and the supporting member 1414 when the mirror pose adjusting apparatus 1406 moves and adjusts the X-ray mirror 1401. A frame 1407 rigidly supports the mirror pose adjusting apparatus 1406. The vacuum chamber 1408 and the frame 1407 are independently fixed to an unshown base, and therefore, the deformation of the vacuum chamber 1408 attributable to the changes in the temperature for the ambient pressure does not influence the pose or position of the X-ray mirror 1401. Therefore, the rigidity of the vacuum chamber 1408 can be decreased to permit reduction of the weight. A discharge port 1411 is connected with a discharge pump 1412 for maintaining a high vacuum in the vacuum chamber 1408. A shutter 1409 is provided so that the X-ray mirror 1401 does not receive the SOR rays when it is not necessary, by which time period when the X-ray mirror 1401 is dosed with the SOR rays. The reduction of the time period is contributable to reduce the damage of the X-ray mirror 1401 by the radiation.

Figure 10A:
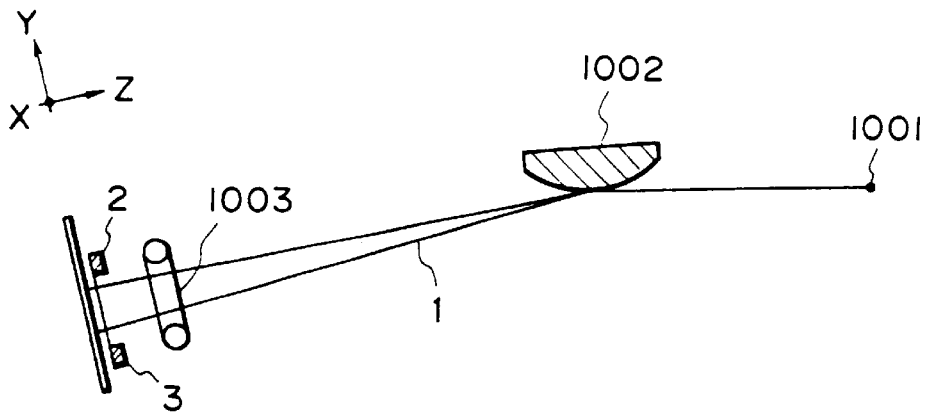
FIG. 10A illustrates the exposure apparatus according to the present invention, schematically.
Figure 10B:
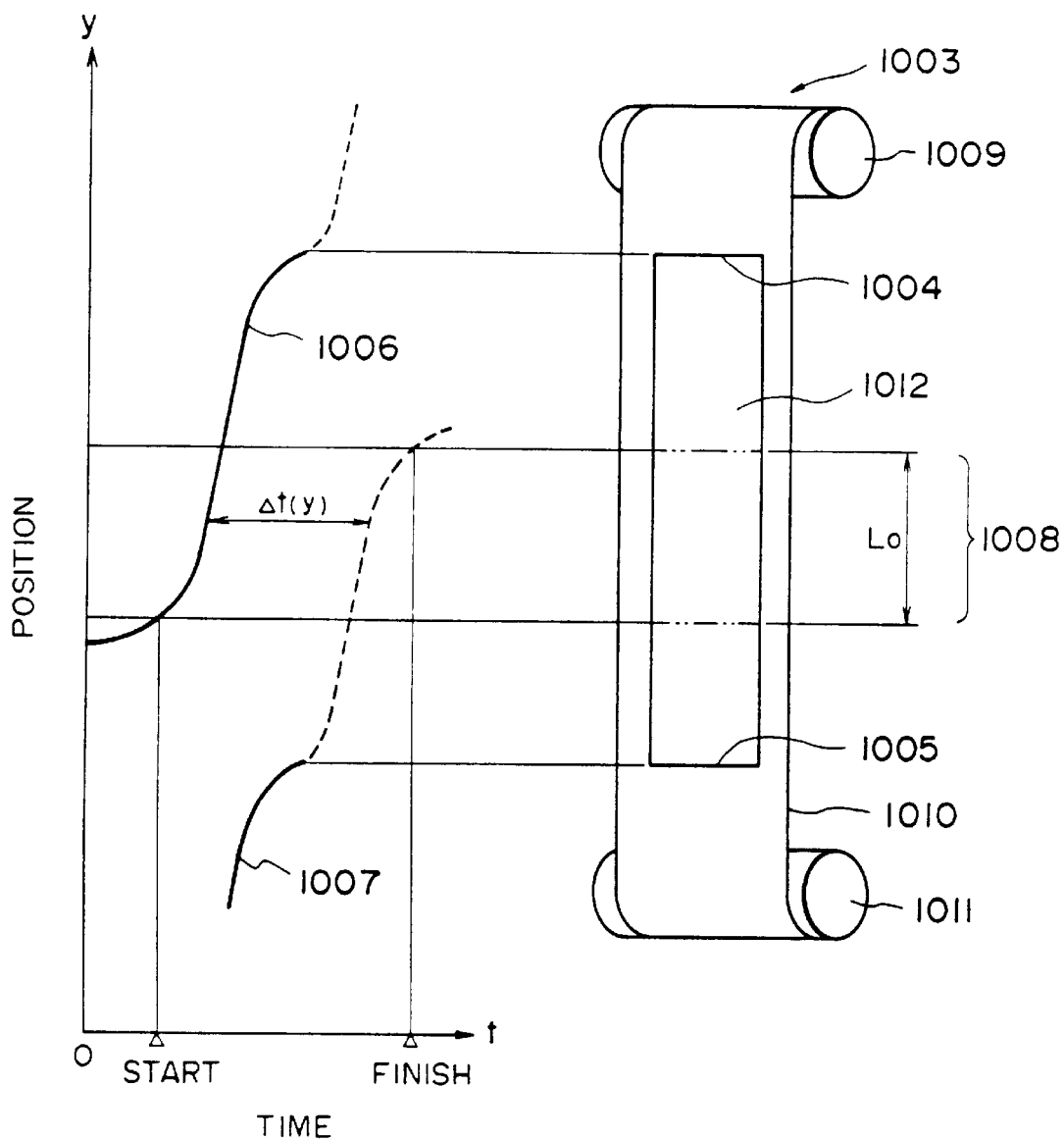
FIG. 10B is an illustration of a shutter.
Figure 11:
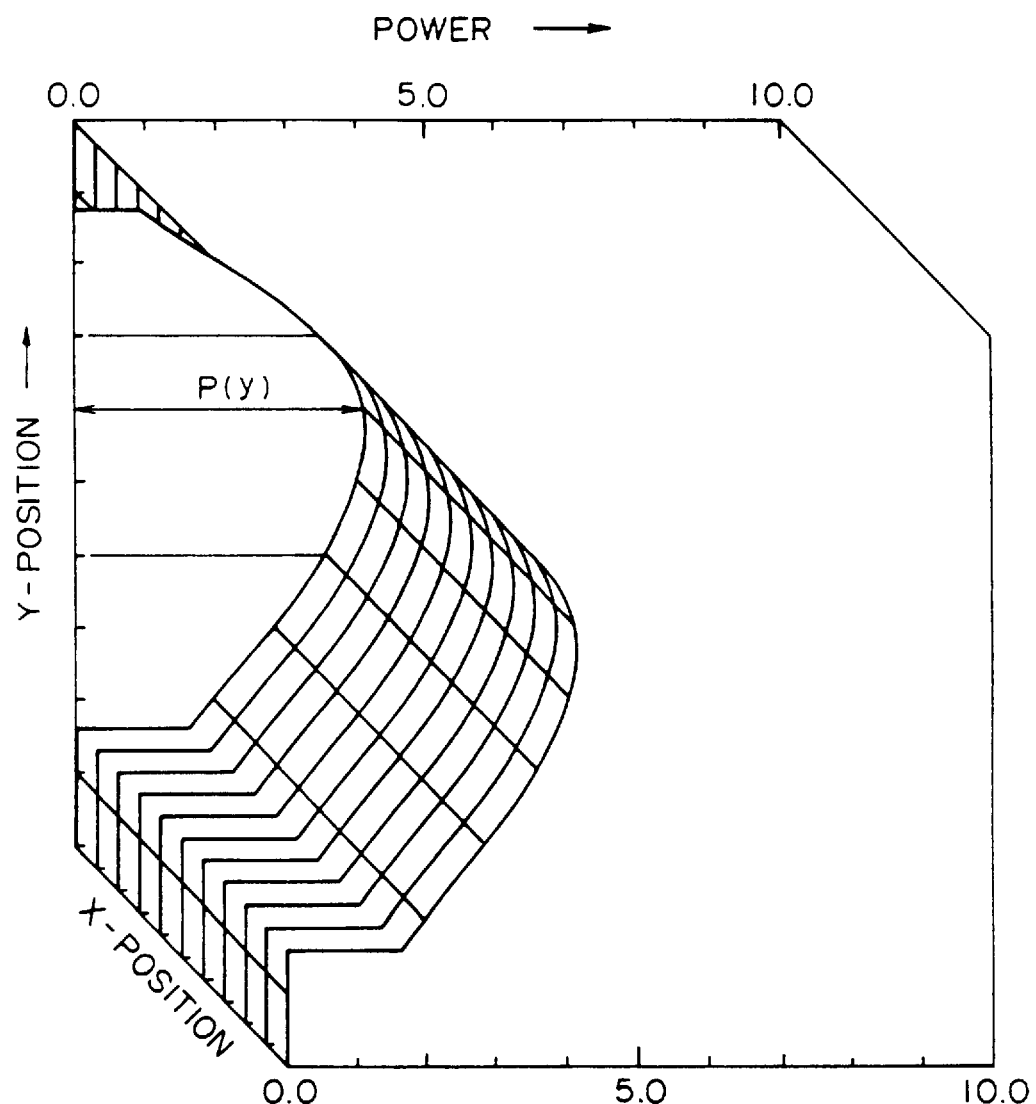
FIG. 11 is a graph showing an X-ray strength profile in an exposure area in an exposure apparatus according to the present invention.
Figure 12:
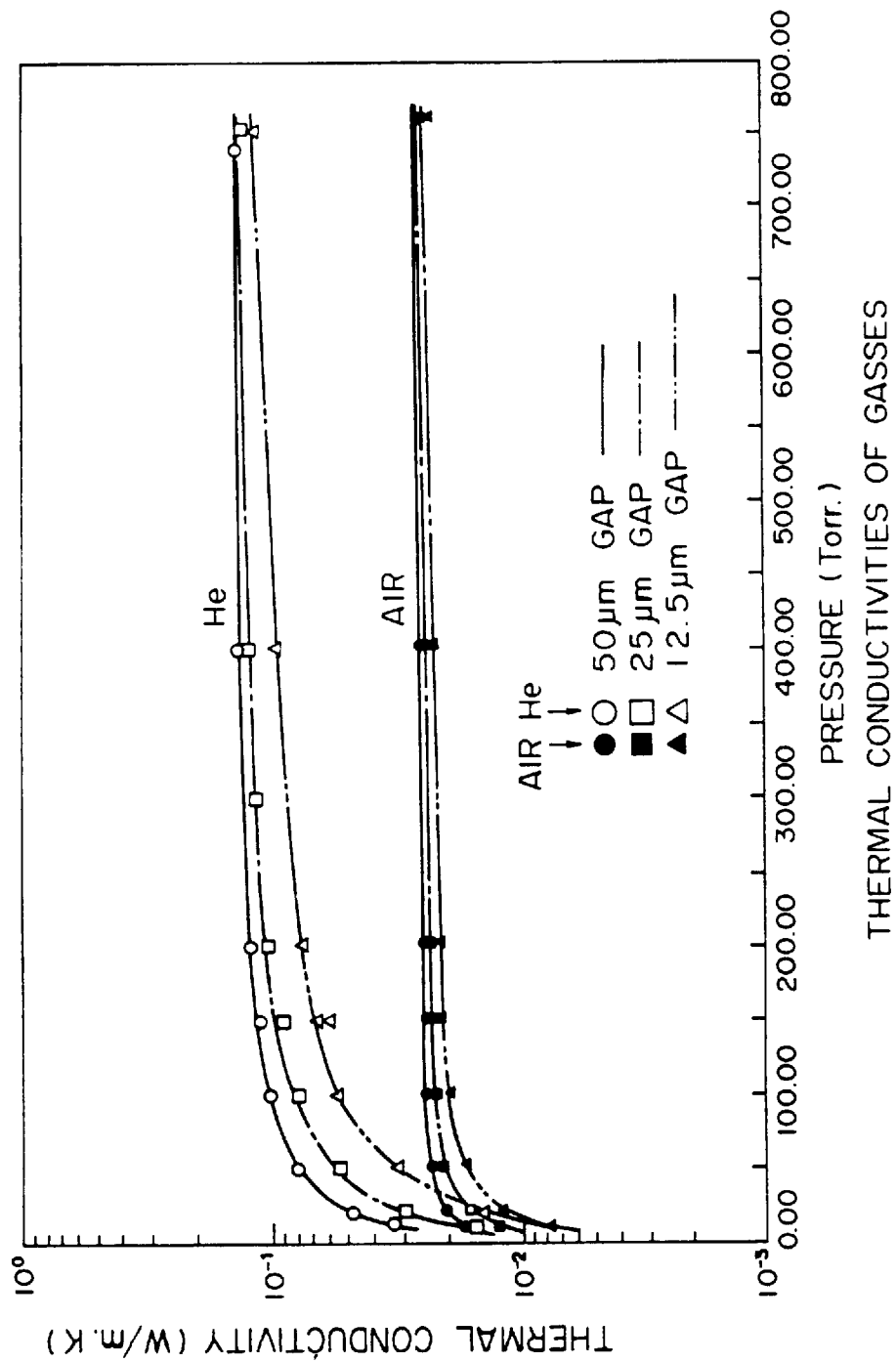
FIG. 12 is a graph of thermal conductivities of gases vs. pressure.

The X-ray mirror 1401 is supported with its reflecting surface facing down, and the axis of the cylindrical reflecting surface is horizontal as shown in FIG. 10A, and the central axis of the SOR rays is at an angle of 10 mrad–30 mrad relative to the reflecting surface.

The description will be made with respect to the exposure shut apparatus 1304. As described briefly thereinbefore, the shutter includes not only the function of controlling the exposure period in accordance with the source strength change and the difference of the sensitivity resulting from the material of the resist, but also the function of the local exposure period in accordance with the spectral properties and the strength distribution, in the Y direction, of the SOR X-rays 1 reflected by the X-ray mirror 1401. In addition, it is contributable to provide a uniform energy absorption over the entire exposure area of the resist.

Figure 15:
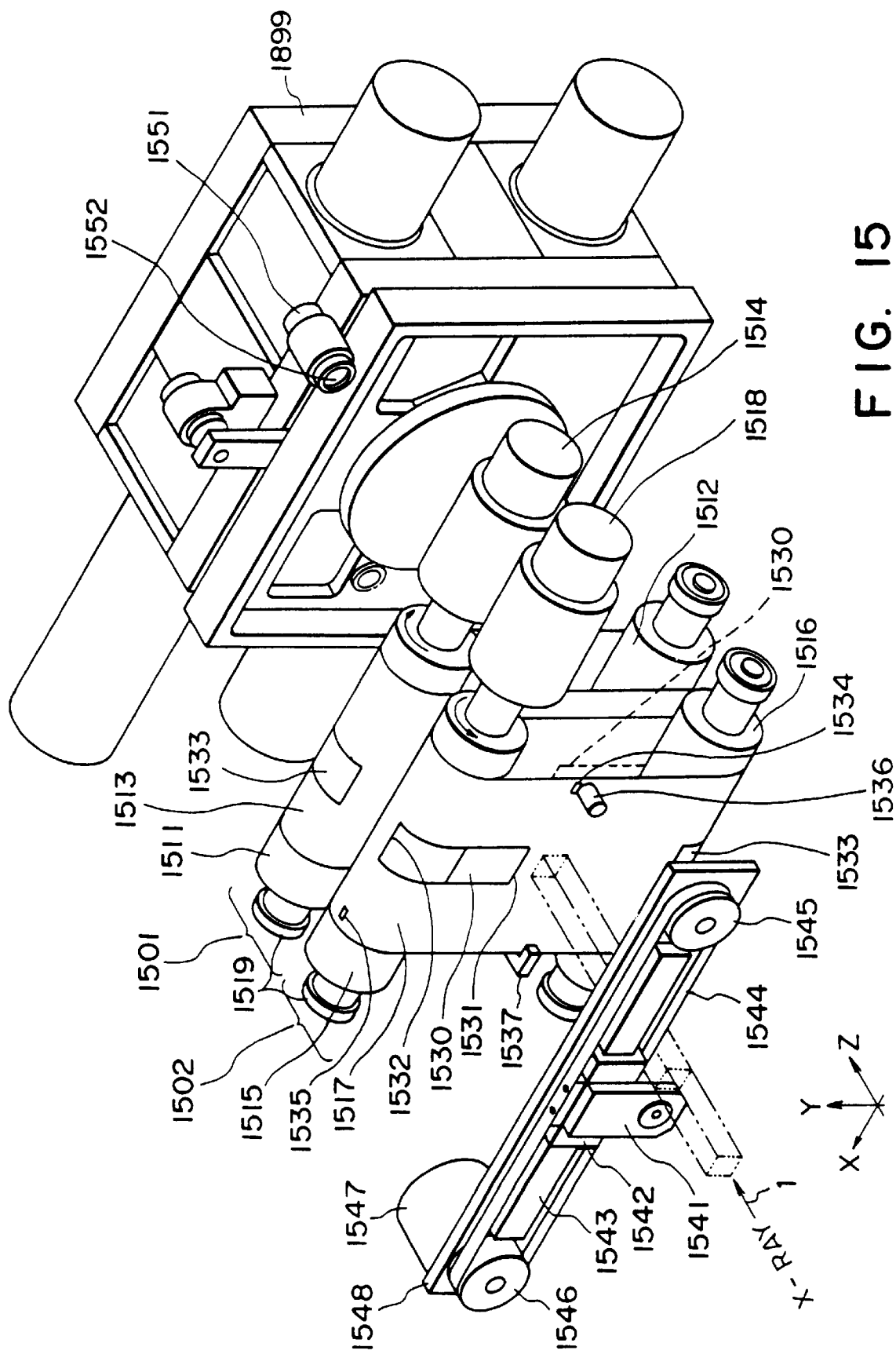
FIG. 15 is a perspective view of an exposure unit and a shutter unit.
Figure 16:
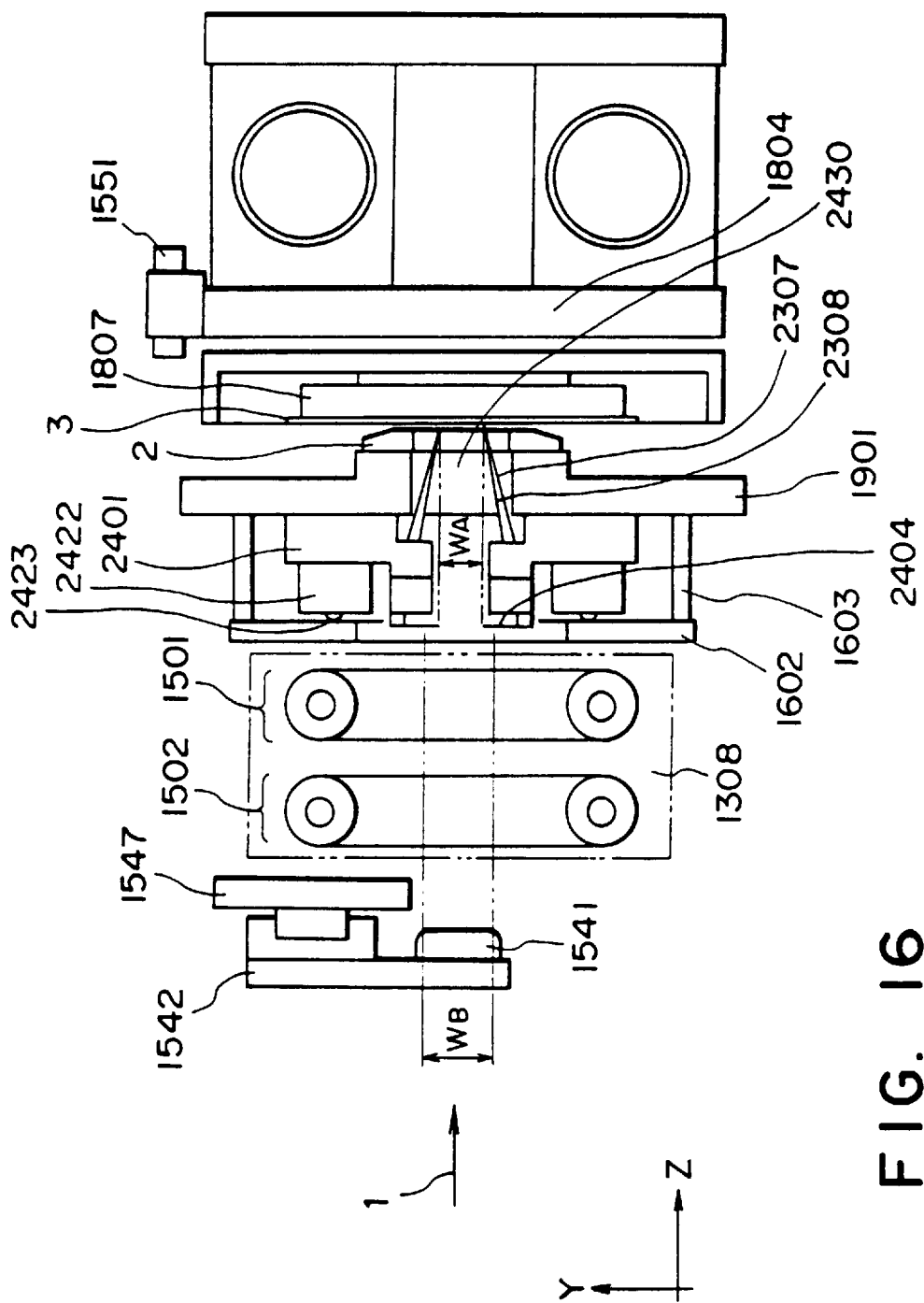
FIG. 16 is a side view illustrating an arrangement of the exposure and shutter units.

FIG. 15 shows various elements of the exposure shutter apparatus 1308 in a perspective view. FIG. 16 is a sectional view to show the mask 3, the fine alignment system 1302 disposed between the wafer and the exposure shutter apparatus 1308, which are omitted in FIG. 15, thus illustrating the arrangements thereof in the direction of the axis of the X-rays.

In this embodiment, the exposure shutter 1308 comprises two similar units, i.e., a main shutter unit 1501 and an auxiliary shutter unit 1502. As shown in FIG. 15, the X-rays 1 which is the exposure beam, as shown in FIG. 15, is blocked by the steel belt 1517 made of stainless steel during a non-exposure period. However, during the exposure period, the X-rays pass through a rectangular opening formed in the steel belt 1517 Which functions as a forward exposure aperture 1530 and through the backward exposure aperture 1533 moved to the position substantially corresponding to the forward aperture 1530 and reach the backward main shutter unit 1501. The steel belt 1513 of the main shutter unit 1501 is provided, similar to the steel belt 1517 of the auxiliary shutter limit 1502, with two openings, i.e. a forward exposure aperture 1503 and the backward exposure aperture 1533. The function of controlling the local exposure period in the Y direction is accomplished by making different, at a different Y direction position, the time period from reaching the leading edge 1531 of the aperture 1530 of the main shutter unit 1501 to passing the trailing edge 1532 thereof so that the amount of energy absorption by the resist at each point in the Y direction is constant and optimum.

The steel belt 1517 is stretched between the driving drum 1515 driven by the actuator unit 1518 and the idler drum 1516, and the inside of the steel belt 1515 is driven by the driving drum 1515 through friction. The driving drum 1515 is crowned by which the central portion of the drum has a larger diameter than that of the marginal portions by 50–100 microns so as to stabilize the movement of the steel belt 1517 without rolling. Adjacent opposite ends of the steel belt 1517, small rectangular openings are formed, one of which is a timing aperture 1534, and the other of which is a position detecting aperture 1535. They are cooperated with a timing sensor 1536 and with a photointerruptor 1537, respectively, to produce a starting signal to permit an actuator unit 1518 to be actuated in a predetermined driving pattern and to detect whether the SOR X-rays are blocked or transmitted. The actuator unit 1518 comprises a motor and an aluminum alloy casing which hermetically contains the motor. The aluminum alloy casing is provided with a water passage, by which the heat produced by the motor is carried outside the chamber through unshown piping. The casing is also effective to prevent the oil used in the motor or the particles produced by the bearing and various contacts from scattering into the exposure ambience.

The mechanical structure of the main shutter unit 1501 is the same as that of the auxiliary shutter unit 1502, and therefore, detailed description is omitted for simplicity.

An X-ray detector is mounted to the fine movement stage 1804 (FIG. 18) when the two shutter units 1501 and 1502 are maintained opened, and a Y coarse movement stage 1705 (FIG. 17) is driven to scanningly move in the Y direction in the exposure area the X-ray detector 1511, so that the strength profile of the X-ray can be measured. On the basis of the data obtained, a driving table for driving the actuator unit 1514 is produced, and the correcting drive to provide the constant energy absorption of the resist in the exposure area can be effected.

An X-ray illuminometer is fixed on the carriage 1542 movable in the X direction perpendicular to the axis of the X-rays and normally, is maintained at a stand-by position away from the exposure area or exposure view angle. It is moved to a predetermined position in the exposure area only during the measuring operation to measure the strength of the X-rays. The carriage 1542 is moved and positioned by a driving system constituted by a steel belt 1544, a driving pulley 1546, an idler pulley 1545 and an actuator unit 1547.

FIG. 16 shows the arrangements of the auxiliary shutter unit 1502, the main shutter unit 1501, the X-ray detector 1551 and the X-ray illuminometer 1541 in the X-ray axis direction. The main shutter unit 1501 is disposed close to the fine alignment system 1302 which will be described in detail hereinafter.

FIG. 17 shows a general arrangement of the mask-wafer alignment stage, and more particularly, the stage apparatus 1301 and the measurement optical system 1312. A main frame 1701 which is the base of the entire stage, and the Y coarse movement stage 1705 is guided using static pressure in a pair of Y coarse movement guide bars 1706 mounted to the main frame 1701, thus allowing vertical movement. The Y coarse stage 1705 is connected with a balancing cylinder 1709 mounted to the main chamber 3101, through a pair of balancing belts 1708 to balance the weight of the Y coarse stage. The Y coarse stage 1705 is driven and positioned by a Y driving cylinder 1707 which is electrically driven, the cylinder 1707 being mounted to the main frame 1701.

Further, X coarse stage 1710 is guided through static pressure on a pair of X coarse movement guide bars 1711 mounted on the Y coarse stage 1705 to permit horizontal movement. The X coarse stage 1710 is driven and positioned by X driving cylinder 1712 which is electrically driven, the X coarse stage 1710 being mounted on the Y coarse stage 1705. On the X coarse stage 1710, a wafer fine movement stage 1899 for finely positioning the wafer 3 and a laser distance measuring mirror 1810 are mounted.

On an automatic alignment frame 2604 mounted to the main frame 1701, a mask Θ stage 1999 is mounted. The main frame 1701 is connected to the main chamber 3101 through a frame connector 1704, and the entire stage is accommodated in the main chamber 3101.

The laser interferometer for distance measuring will be described. It is supported on the upper portion of the main frame 1701. A laser beam emitted from-the laser heads 1720a and 1720b disposed outside the main chamber 3101 is divided into X and Y directions by a distributor unit 1721. One of them is directed to an X axis interferometer unit 1722 mounted to the automatic alignment frame 2604 and is reflected by a distance measuring mirror 1810 and is received by a receiver 1725a to measure the position of the wafer fine movement stage 1899 in the X direction. The other beam is directed to a Y axis interferometer unit 1723 mounted to the main frame 1701 and is reflected to be incident on the distance measurement mirror 1810 and is reflected thereby. It is then incident on a receiver 1725b to detect the position of the wafer fine movement stage 1899 in the Y direction.

Figure 18:
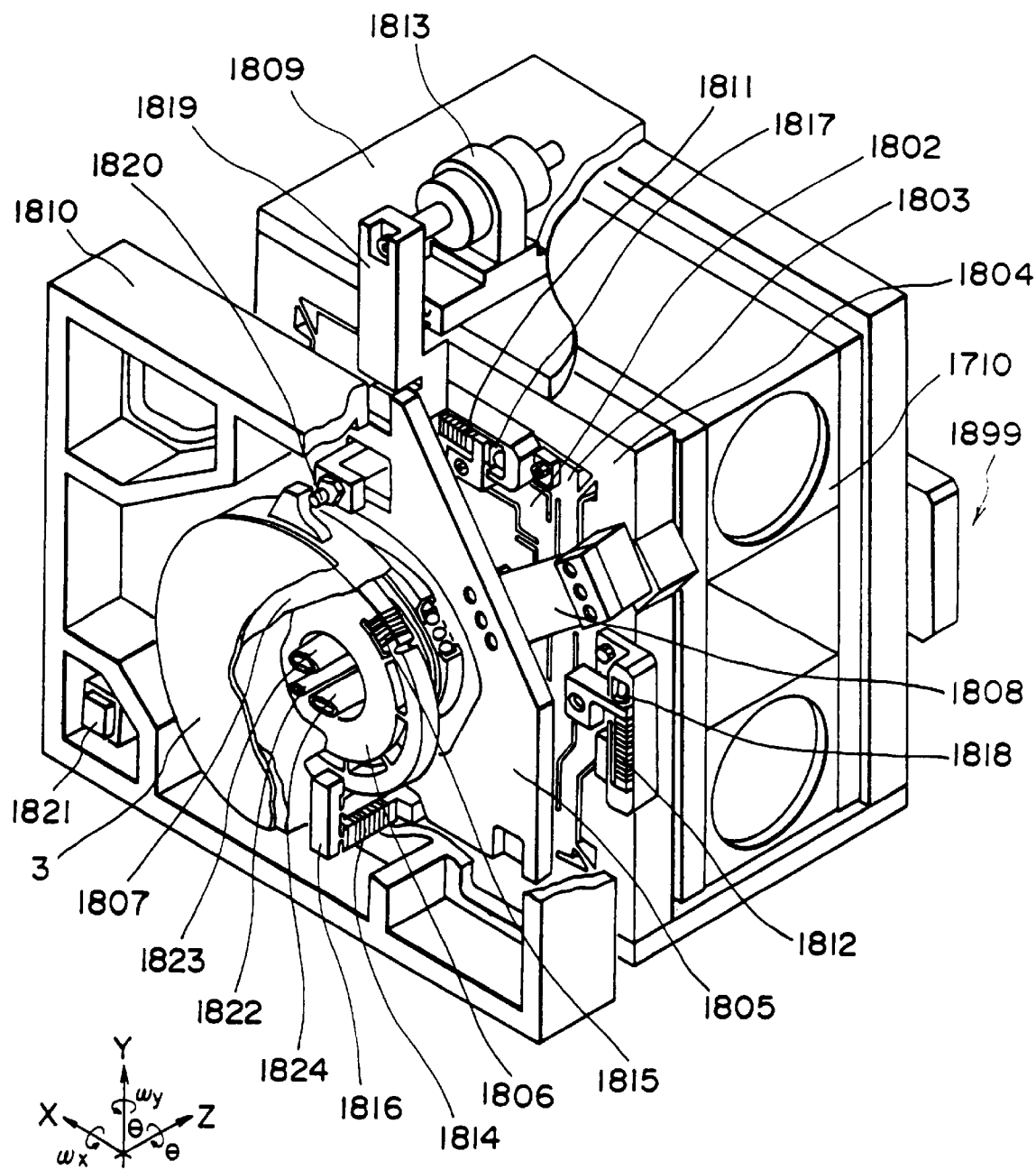
FIG. 18 is a perspective view of a fine wafer stage.

FIG. 18 illustrates the structure of the wafer fine movement stage 1899 for positioning the wafer with high precision. The wafer fine movement stage 1899 is mounted on the X coarse stage 1710 shown in FIG. 17. The fine stage 1899 comprises a Y fine stage 1802, an X fine stage 1803 and a Θ fine stage 1804 which are supported by leaf springs in the Y, X and Θ directions and which are finely movable in the X, Y and Θ directions. In order to increase the rigidity, the X coarse movement stage 1710 is sandwiched in the Z direction by the same shaped members which are connected by a connecting plate 1809. The Y fine stage 1802 is driven in the Y direction by Y-driving piezoelectric elements (not shown), and the X fine stage 1803 is driven in the X direction by X-driving piezoelectric elements 1811. Similarly, the Θ fine stage 1804 is driven in the Θ direction by a Θ driving piezoelectric element 1812. For each of the axes, Y fine movement damper (not shown), X fine movement damper 1817 and Θ fine movement damper 1818 are provided to quickly attenuate the vibration.

A Z tilting stage 1805 is supported on the Θ fine movement stage 1804 by three Z supporting leaf springs 1808 so that it is flexible in the Z, ωx, and ωy directions, but rigid in the other directions.

The Z tilting stage 1805 is such that three points thereof are independently driven in the Z direction by three Z tilt driving inch worms 1813 and Z tilt driving lever 1319 (only one of them is shown for each). The amount of movement is detected by a displacement sensor 1820 for Z tilt control, and it is correctly positioned in the Z, ωx and ωy directions.

A Θ coarse movement stage 1806 is supported to the Z tilt stage 1805 through a bearing means and is driven by two Θ coarse movement inch worm crampers 1816, (only one is shown), two piezoelectric elements 1814 for a coarse movement inch worm crampers (only one is shown) and one piezoelectric element 1815 for Θ coarse inch worm pusher piezo-elements 1815. To the Θ coarse stage 1806, a wafer chuck 1807 is detachably mounted, and to the wafer chuck 1807, a wafer chuck temperature control pipe 1823 is connected which is supplied with a constant temperature fluid for the purpose of temperature control and is connected with a wafer chuck temperature control pipe 1824 through which the constant temperature fluid is discharged. Also, a vacuum chuck pipe 1822 for vacuum-chucking the wafer 3 is connected thereto.

The mirrors 1810 for distance measurement is mounted to the Z tilt stage 1805 to measure movement amount in the X, Y, ω, ωx, ωy directions through laser distance measurement and angle measurement systems. On the distance measurement mirror 1810, a coordinates reference mark 1821 is provided which functions as a mechanical point of origin.

FIG. 19 illustrates the structure of the mask stage 1999. It comprises a mask Θ stage base functioning as a base for the stage 1999. Radially arranged leaf springs 1902 are effective to support the mask 2 rotatable in the rotational direction in the plane (Θ direction), but rigidly in the other directions relative to the mask Θ stage base 1901. A mask chuck 1903 serves to detachably mount the mask 2. Designated by reference numerals 1904 and 1905 are positioning pins for mechanically positioning the-mask 2 and V block for positioning the mask 2. The Θ stage further includes a displacement sensor 1906 for a relative rotational angle of the mask 2 relative to the mask Θ stage base 1901 on the basis of a linear displacement in the circumferential direction approximately, piezoelectric elements 1901 for driving the mask Θ stage 1999, a lever mechanism 1908 for expanding the displacement provided by the piezoelectric elements 1909, a resilient coupling 1910 to minimize transmission of the displacement expanded by the lever mechanism 1908 to other than the circumferential direction, and a damper 1911 for attenuating the vibration of the mask Θ stage 1999.

Figure 20:
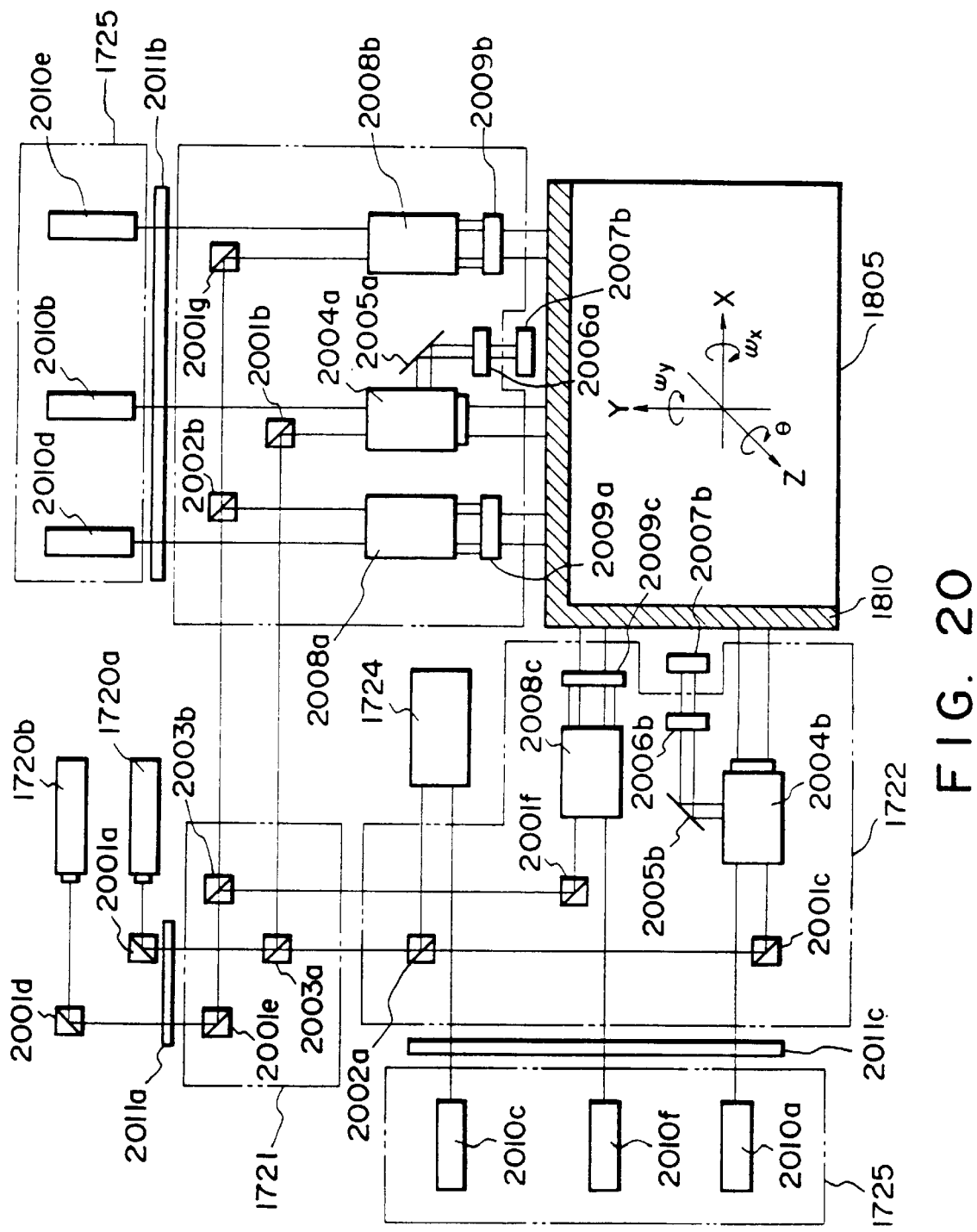
FIG. 20 is a top plan view illustrating an arrangement of a distance measuring laser optical system.

FIG. 20 shows the interferometer optical system for the distance measurement which is effective with reference to the exposure center axis (the optical axis of the SOR X-rays) the pose and position of the wafer fine movement stage 1899 in five dimensions other than in the direction of the gap between the mask 2 and the wafer 3 (Z direction), more particularly, it is effective to measure the positions in the X and Y directions and the poses (angular component) in the ω, ωx and ωy directions. It is also effective to measure the variation of the laser wavelength due to the pressure and the temperature in the main chamber 3101.

In the laser interferometer optical system, the number of the laser heads 1720 (a), (b) may be theoretically one, but since the output power of the laser is not enough, two heads are used, and they are respectively for distance measurement and angle measurement. The measurement range in the angle measurement is approximately $10^3$ pulses and the range in the distance measurement is approximately $10^8$ pulses, and the change in the laser wavelength is on the order of $10^{-6}$. Therefore, the measurement error 25 in the angle measurement system is $10^{-3}$ pulse at maximum, which is negligible. However, in the distance measurement system, the maximum error is on the order of $10^2$, and therefore, the wavelength correction is effected in the distance measurement system only. To accomplish this, a wavelength compensator 1724 is in the optical path of the distance measurement system.

The laser heads 1720a and 1720b and the receiver unit 1725 are in the air. In order to maintain the sealing of the main chamber 3101, it is fixed to the main frame 1701 by a correcting rod sealed by bellows or the like. The laser beam is introduced into and emitted out of the main chamber 3101 through glass windows 2011a, 2011b and 2011c mounted in the main chamber 3101.

The X axis interferometer unit 1722, Y axis interferometer unit 1723 and the wavelength compensator 1724 are in the main chamber 3101 and are fixed to the main frame 1701. The X axis interferometer unit 1722 comprises an optical path splitting unit 1721 for splitting the laser beam from the laser head 1720 into X and Y directions, a plain mirror interferometer 2004b for measuring the X axis position of the Z tilting stage 1805, differential interferometer 2008c functioning as an angle measuring interferometer for measuring the rotational component ωy about the Y axis and a half mirror 2002a for splitting the beam to the wavelength compensator 1724 for correcting on the basis of the laser wavelength. Similarly, the Y axis interferometer unit comprises a plain mirror interferometer 2004a for measuring the Y direction position, a differential interferometer 2008a for measuring the rotational component Θ about the Z axis, and a differential interferometer 2008b for measuring the rotational component ωx about the X axis.

The basic operations will be described for the distance measurement system and the angle measuring system, respectively. First, the distance measurement system will be dealt with. The laser beam emitted from the distance measurement laser head 1720a is bent by the bender 2001a into the Y direction, and is introduced into the chamber 3101 through the glass window 2001a. Thereafter, it is split out into the X direction by the half mirror 2003a (33%) in the optical path splitting unit 1721, and the laser beam is bent by the bender 2001b into the Y direction and is incident on the plain mirror interferometer 2004a for measuring the Y axis position. The plain mirror interferometer 2004a is provided with a bending mirror 2005a and λ/4 plate 2006a so that the measurement can be made as to the relative position between the distance measurement mirror 1810 mounted to the Z axis tilting stage 1805 which is the object of the measurement and the reference mirror 2007a fixedly mounted to the automatic alignment frame 2604 adjacent the mask 3. The interfered light is directed through the glass window 2001b and is incident on the receiver 2010b which converts the light signal into an electric signal.

The beam not split out by the 33% half mirror 2003a is split by a 50% half mirror 2002a into a beam toward a wavelength compensator 1724 which is, for example, model 7056 available from Zygo and a beam into the bender 2001c. For the compensator 1724, a receiver 2010c is provided. The X axis distance measurement system is similar to the Y-distance measurement system and includes a plain mirror interferometer 2004b, mirrors 2005b and 2007b, λ/4 plate 2006b and a receiver 2010a.

Figure 21:
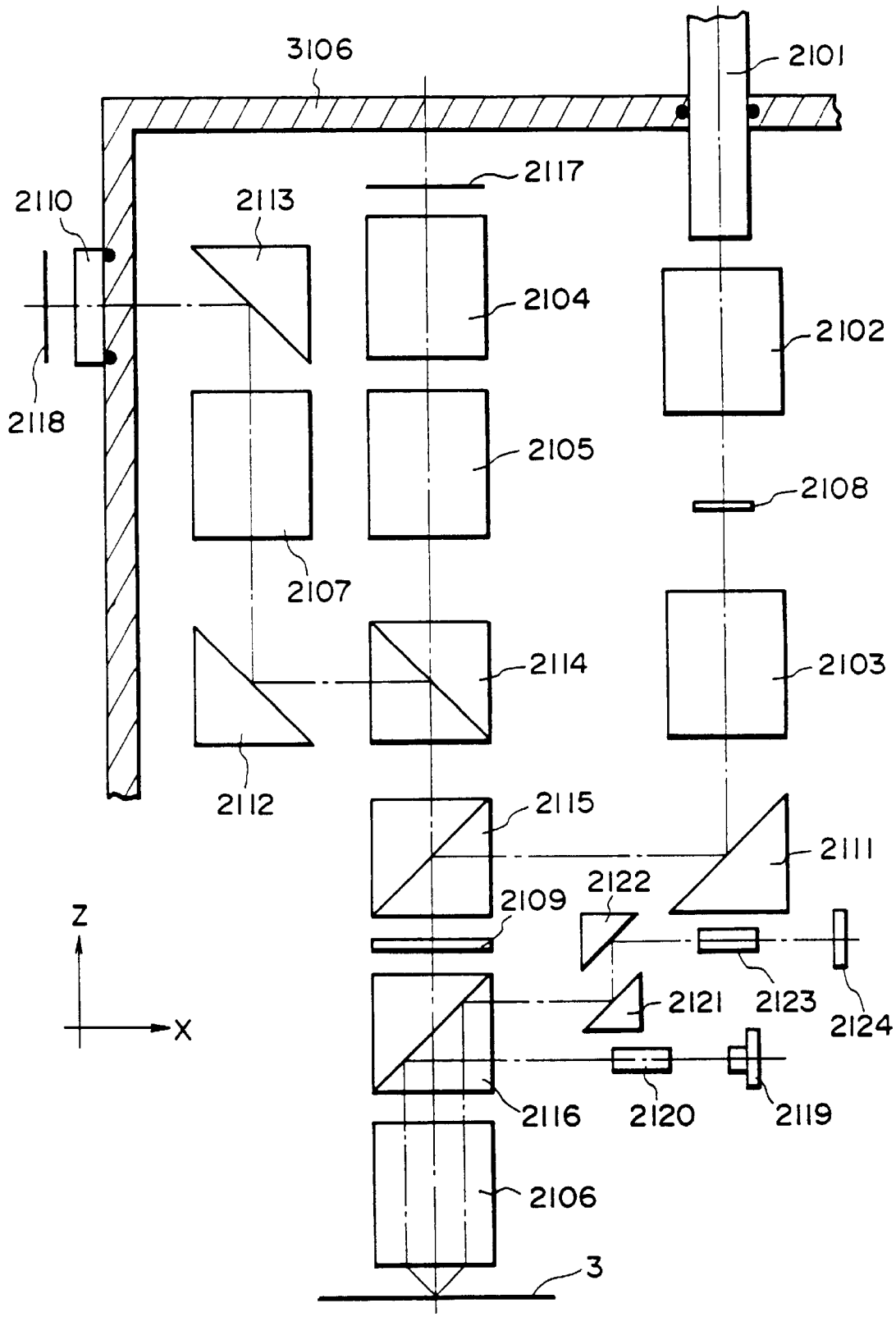
FIG. 21 shows an optical arrangement of a prealignment system.

The angle measurement system will be described. The laser beam emitted from the angle measurement laser head 1720b is bent into the Y axis direction by the bender 2001d and introduced into the main chamber 3101 through the glass window 2001a. The beam directed by the bender 2001e and split into the Y direction by a 33% half mirror 2003b is incident on the differential interferometer 2008c for angle measurement in the ωy direction by the bender 2001f. The interferometer 2008c measures an angle formed between the distance measurement mirror 1810 and a reference mirror 2009c for angle measurement which is fixed on the X axis interferometer unit 1722. As an example, DPMI (model 7015) available from Zygo is usable. The interfered light is received by a receiver 2010f through the glass window 2001c. The beam passing through the half mirror 2003b is split into two beams by a half mirror 2002b and a bender 2001g, and is used for measuring in the Θ and ωx directions using the interferometer 2008a and 2008b, reference mirrors 2009a and 2009b for angle measurement and the receiver 2010d and 2010e. Referring to FIG. 21, automatic prealignment and automatic prefocusing systems will be described. The functions of the prealignment systems are generally divided into detection of the wafer 3 position in the X and Y directions (automatic prealignment) and detection of the Z direction position of the wafer 3 (automatic prefocusing). The optical systems for those automatic prealignment and automatic prefocusing systems will be described. The automatic prealignment system makes it possible to detect the positions of the wafer 3 in the X and Y directions prior to the alignment by the fine alignment system 1302, in order to reduce the load placed on the fine alignment system 1302, and it also 20 makes it possible to observe the alignment marks on the wafer 3 if some error occurs during an alignment operation by the fine alignment system 1302.

The automatic prefocusing system functions to detect the Z direction position of the wafer 3 so as to place the wafer 3 into the depth of focus of the automatic prealignment system, and also functions to make it possible to correct the Z direction position of the wafer 3 when moving the wafer to the fine automatic alignment position.

Referring to FIG. 21, designated by a reference 2101 is a light guide which functions to guide the light from an unshown light source (halogen lamp for example), by which an end surface thereof at a condenser lens 2102 side is a second light source. The condenser lens 2102 serves to concentrate the light from the secondary source onto the aperture stop 2108. A pupil imaging lens 2103 is effective to form an image of the aperture stop 2108 on an entrance pupil (not shown) of an objective lens 2106 by way of a bending mirror 2111 and a polarization beam splitter 2115 (reflection side), through λ/4 plate 2109 and a dichroic mirror prism 2116. The aperture stop 2108 may be an aperture stop for a light view field or for a dark viewfield. The light emitted from the light guide 2101 is randomly polarized, and therefore, the combination of the polarization beam splitter 2115 and the λ/4 plate 2109 suppresses the light quantity loss under 50%. However, if the amount of light is enough, a half mirror can be used, in which case the light amount loss will be beyond 75%.

The dichroic mirror prism 2116 makes possible introduction of the automatic prefocusing optical system, the reflecting surface thereof is constituted by multi-layer film so that the P, S polarized light of 400–700 mm is transmitted, while S polarized light of 780–840 mm is reflected. The objective lens 2101 constitutes a telecentric optical system in relation to the entrance pupil position described above. The system described above constitute an illumination system.

The image on the wafer 3 is transmitted through the objective lens 2106, the dichroic mirror prism 2116, λ/4 plate 2109 and a polarization beam splitter 2115 and is split out by the half mirror prism 2114. And the transmitted light is imaged on a black and white camera sensor 2117 through low magnification and unit magnification relay lenses 2105 and 2104. It is preferable that the optical system from the objective lens 2106 to the relay lens 2105 is a focal, since then the tolerance of the relative positions is increased and the influence of the-ghost due to the reflection by the intermediate prism is reduced. By providing the relay lenses 2105 and 2104 and by once imaging in the ambience between those lenses, an aperture stop can be used to block the direct light in the dark field observation. On the other hand, the light reflected by the half mirror 2114 is reflected by the bending mirror 2112, and is image on a color camera sensor 2118 through a high magnification relay lens 2107 and a bending mirror 2113 and through a window 2110 durable to vacuum. Those constitute an imaging optical system.

Designated by a reference 2119 is a semiconductor laser (LD) producing a laser having a wavelength of approximately 780–840 nm, and the laser beam is collimated by a collimator lens 2120. Generally, the beam is linearly polarized, and can be reflected by a dichroic mirror 2116 with the polarization wave front aligned. It is transmitted through an objective lens 2106, is reflected by the wafer 3 and is transmitted again through the objective lens 2106, and reflected by the dichroic mirror 2116, and thereafter is directed to a sensor 2124 by way of bending mirrors 2121 and 2122 and through a light receiving lens 2123. As for the sensor 2124, a linear (one dimensional) PSD (position detector) is used, for example.

Those elements form an automatic focusing system, and the principle and system for the automatic focusing may be that disclosed in Japanese Patent Application Publication 5144/1987.

Figure 22:
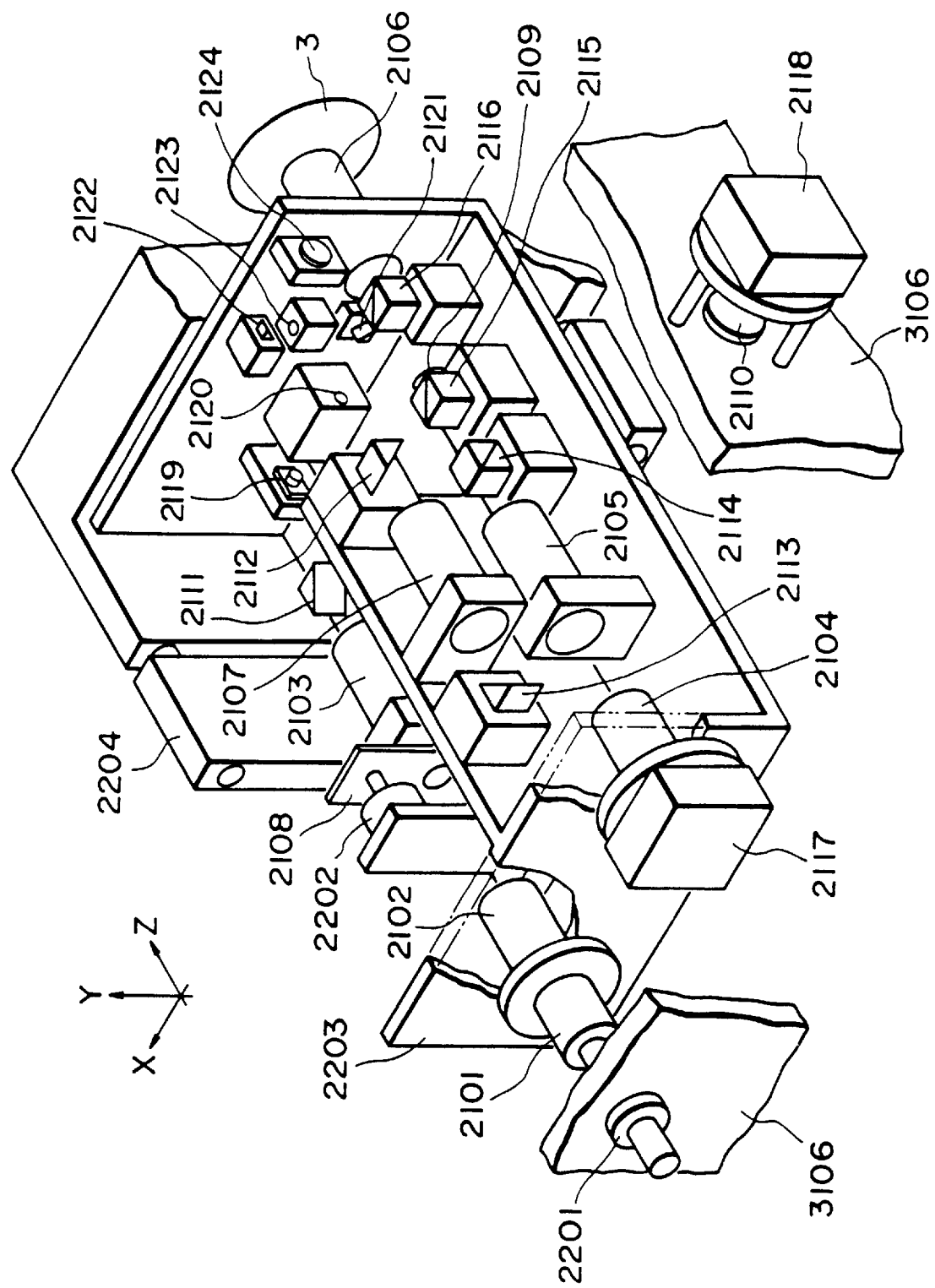
FIG. 22 is a perspective view of the prealignment system.

FIG. 22 shows an appearance of the prealignment system 1307. The prealignment system 1307 is accommodated in the automatic prealignment chamber 3106, as shown in this Figure. The optical system described with FIG. 22 is fixed on a metal block and is mounted to an automatic prealignment base 2203. The automatic prealignment base 2203 is supported on a mounting angle 2204, which in turn is fixed to the automatic alignment frame 2604 (FIG. 13).

An optical fiber 2101 for guiding light from the halogen lamp is introduced into the automatic prealignment chamber 3106 by an optical fiber field through unit 2201. A vacuum durable window 2110 is hermetically mounted to the automatic prealignment chamber 3106 by an unshown o-ring. A color camera 2118 is mounted to the automatic prealignment chamber 3106.

Next, the fine alignment system 1302 will be described. The alignment system for measuring the position of the wafer 3 filled on the wafer chuck 1807 has been called prealignment system 1307. On the other hand, the alignment system to finally align the mask 2 and the wafer 3 prior to the exposure is called "fine alignment system" (1302). The function of the fine alignment system 1302 includes detection of the gap between the membrane of the mask 2 and the wafer 3 surface (AF (automatic focusing) function) as well as the above-described detection of the deviation between the pattern on the mask 2 and the pattern on the wafer 3 in the planes thereof in the X, Y, Θ directions.

Figure 24:
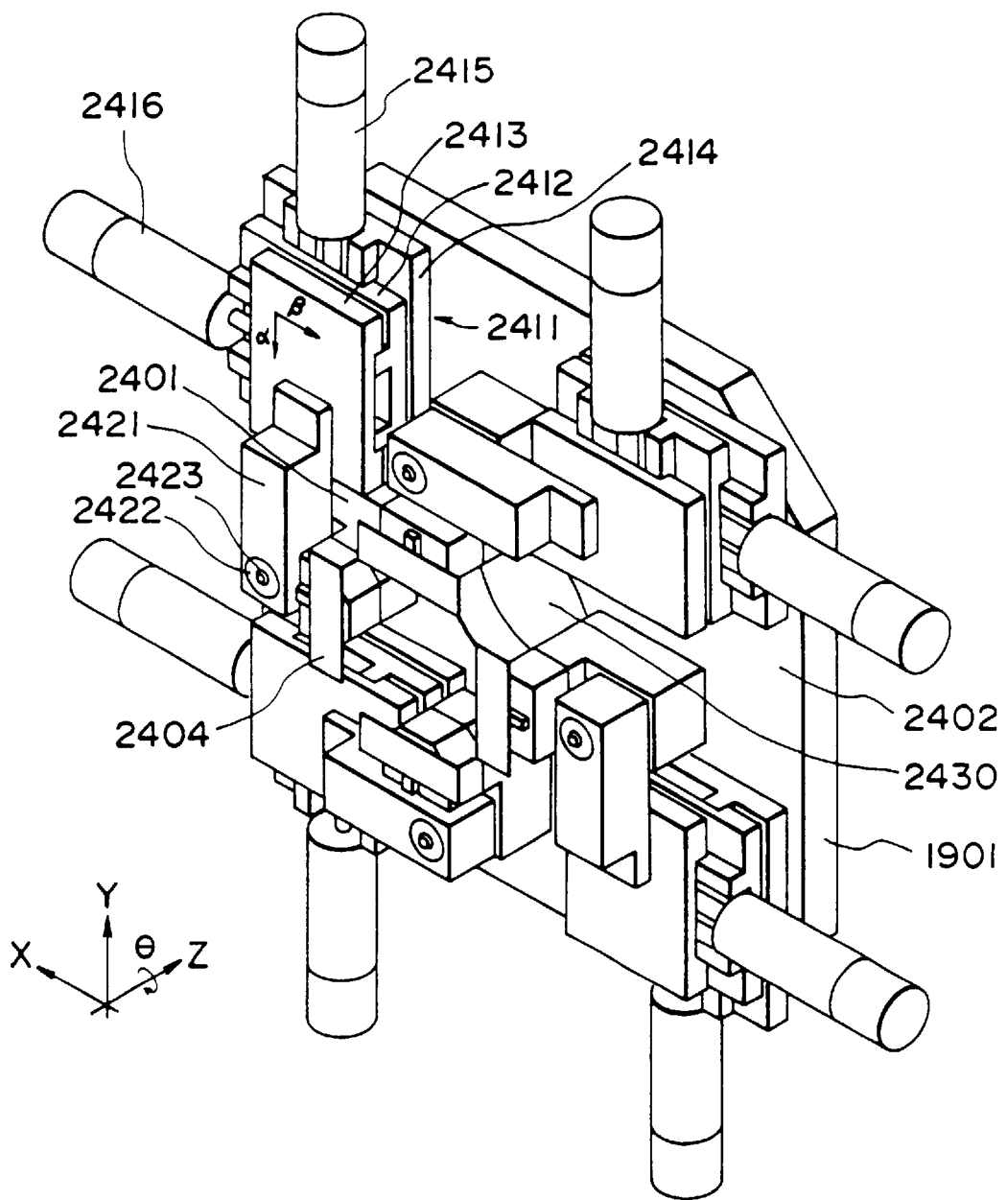
FIG. 24 is a perspective view of a fine automatic alignment unit.

FIG. 24 schematically shows, in perspective view, the fine alignment system 1302, which is disposed across the mask Θ stage base 1901 shown in FIG. 19 from the mask chuck 1903, and as shown in FIG. 16, it is interposed between the mask Θ stage base 1901 and the exposure shutter apparatus 1308.

The fine alignment system 1302 is structurally divided generally into a pickup device 2401 for detecting the gap and the deviation in the planes between the mask 2 and the wafer 3 and a pickup stage 2411 for moving the pickup 2401 to the positions of the alignment marks for the purpose of the alignment.

Figure 23:
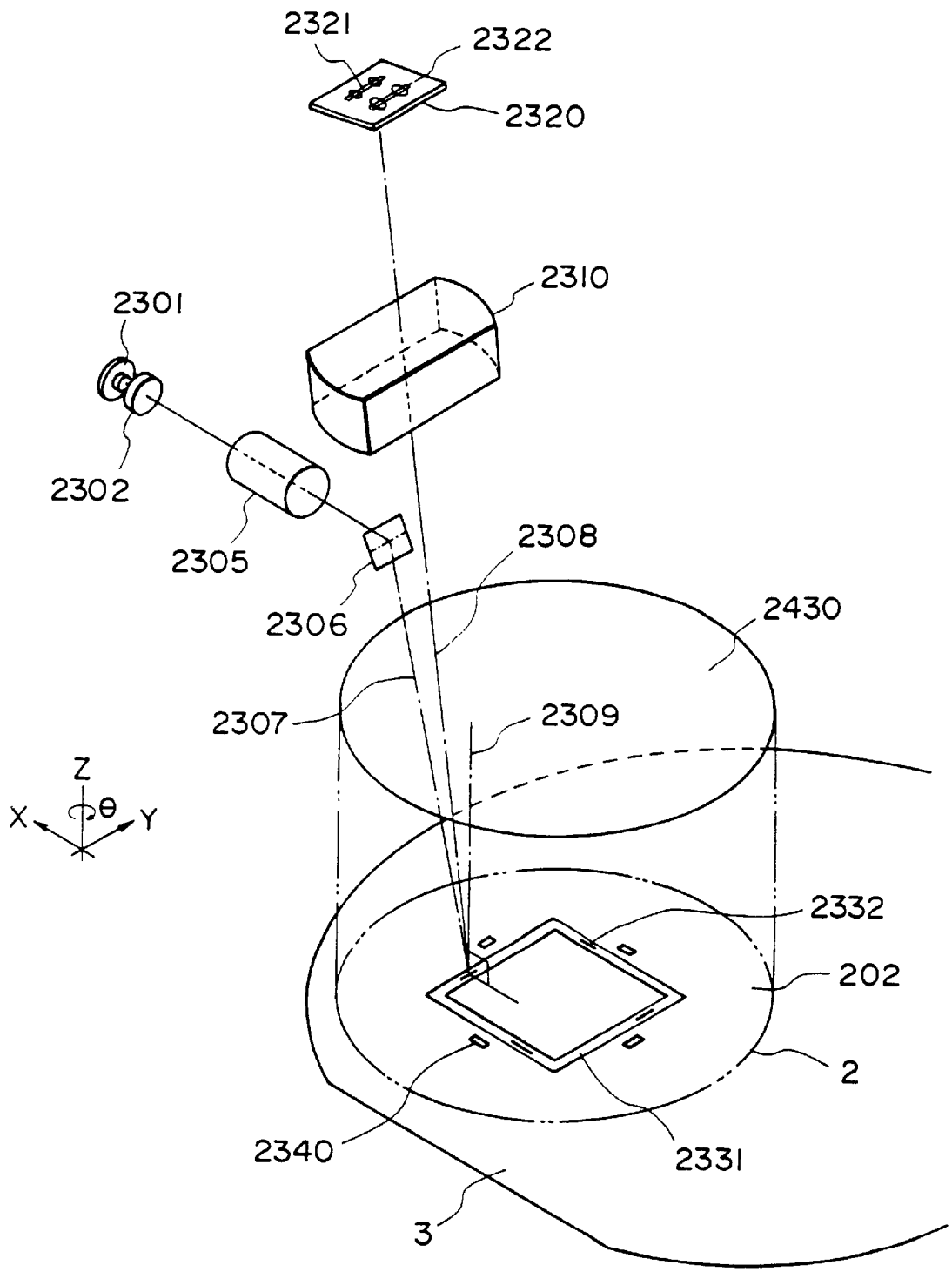
FIG. 23 is a perspective view illustrating optical elements in a pickup station.

Referring to FIG. 23 the pickup device 2401 will be described. FIG. 23 shows the major 1C components in the pickup 2401. A semiconductor laser 2301 is a light source for an alignment beam and is fixed on an unshown metal base having pipes for temperature control. The beam emitted from the semiconductor laser 2301 with a certain divergence angle is reformed into a collimated beam by a collimator lens 2302 and is further formed by a beam condensing lens 2305 to provide a surface wave on the mask 2 and to provide a beam waist. A bending mirror 2306 directs, through an exposure hole 2430 onto the surface of the mask 2, the beam 2307 from the beam condensing lens 2305 which is disposed parallel with the pickup reference surface 2402 (FIG. 24) for the convenience of arrangement. The beam refracted and reflected by the alignment marks 2332 on the mask 2 and the wafer 3 is once imaged in the ambience within the exposure hole 2430 and is reimaged on a two line sensor 2320 by the relay lens 2310, the two line sensor 2320 being disposed at the opposite side of the relay lens 2310 to the imaging point, symmetrically. The two line sensor 2320 has a substrate, on which two line sensors are provided, one of which is an automatic alignment system 2321 for detecting the deviation of the alignment mark 2332, and the other of which is an automatic focus sensor 2322 for detecting the gap.

As shown in FIG. 23, the beam 2307 projected onto the alignment mark 2332 and the beam 2308 imaged on the two line sensor 2320 are at a certain angle with respect to the optical axis 2309 of the X-rays 1. The pickup 2401 is disposed so as to look inclined at the alignment mark so that interference is avoided between the X-rays 1, as the exposure beam, and the pickup 2401. The relation among the pickup 2401, the beam 2308 to be received, the projecting beam 2307 and the X-rays 1 is shown in FIG. 15, too. By this arrangement, the pickup 2401 can be fixed during the alignment operation and the exposure operation. If the pickup 2401 and the X-rays 1 are interfered during alignment, the pickup 2401 is required to be retracted from the exposure hole 2430 which results in decrease of the throughput due to the movement and positioning of the pickup 2401.

By one pickup, a deviation in one direction of one of the alignment marks 2332 and a gap at one point is detected, and therefore, in order to detect the amount and direction of the deviation in the plane of the alignment mark 2332 and the rotational deviation of the alignment mark 2332 itself or the tilt of the wafer 3 relative to the mask 2, measurements by three pickups are required at minimum. In this embodiment, four pickup devices are employed and are disposed with 90 degree phase difference so as to correspond to the alignment marks 2332 formed in four scribe lines 2331 enclosing the exposure pattern. FIG. 24 shows that the four pickup devices 2401 are disposed enclosing the exposure hole 2430.

Now, description will be made as to the pickup stage 2411 for performing the other function, that is, to move and position the pickup 2401 in accordance with the position of the alignment mark.

The pickup stage 2411 is of a two axis type. More particularly, two assemblies provided with linear movement guides are overlaid with the movement directions deviated by 90 degrees, and they are driven by independent actuators in the respective axes. As for the actuator, a motor is ordinarily used, and the rotational motion of the motor is converted into a linear movement through a transmission mechanism including a screw rod and a nut or the like. In FIG. 24, the axis along which the pickup 2401 is moved perpendicularly to the exposure hole 2430 is called "β axis", and the axis along which it is tangentially moved is called "α axis". The pickup stage 2411 has a three layered structure including a fixed stage 2414 for securely fixing the pickup stage 2411 to the mask e stage base 1901 and an a direction positioning stage 2412 driven by an actuator unit 2415 in the α direction, a β direction positioning stage 2413 driven by a β direction actuator unit 2416. In this embodiment, a cross roller guide is employed which is rigid in the linear guide. The movement strokes in the α and β directions are such as to permit movement of the projecting beam 2307 relative to any alignment mark in the scribe lines from the minimum view angle to the maximum view angle. The actuator units 2415 and 2416 in the α and β directions are hermetically sealed by an aluminum alloy casing enclosing a DC motor, a rotary encoder and a reduction mechanism, and similar to the actuator unit for the exposure shot apparatus 1308, the heat generated by the motor and the reduction mechanism is carried outside the chamber through unshown pipes.

To the β positioning stage 2413 which is the top most of the pickup stage 2411, a pickup supporting member 2421 for connecting the pickup device 2410 and the pickup stage 2411 is mounted. The pickup supporting member 2421 supports the bottom surface of the pickup device 2401 so that it is away from the pickup reference surface 2402 by approximately 100 microns. With the floated state, the pickup stage 2411 is moved and positioned, but during the alignment measurement, the pickup 2401 is contacted and fixed on the pickup reference surface 2402. To accomplish this, the pickup supporting member 2421 has less rigidity in the Z axis direction (the optical axis of the X-rays), α axis and the β axis than the other axes to provide flexibility. The contact and the fixing between the pickup device 2401 and the pickup reference surface 2402 are achieved by urging to the top plate 1602 (FIG. 16) a push rod 2423 of a cramper unit 2422 built in the pickup supporting member 2421, and bending the pickup supporting member 2421 in the X-ray axis direction by the reaction force. The top plate 1602, as shown in FIG. 16, is mounted to the mask Θ stage base 1901 through posts 1603. In this embodiment, the push rod 2423 is driven by pneumatic pressure, and each of the cramper units 2422 is connected with four pipes (total four).

The cramping and releasing operations are performed by shutting and opening one valve disposed in one manifold connected to the four pipes. The pickup reference surface 2402 to which the pickup 2401 is contacted and fixed is manufactured with high precision with respect to the flatness and parallelism with the back surface to which the mask 2 is held. The accuracy of the pose of the pickup device 2401 relative to the mask during measurement operation, is dependent on the precision. In this embodiment, the flatness is within 2 microns. By contacting the pickup 2401 to the pickup reference surface 2402, the precision of the pose is as high as twice the precision of a general high accuracy guiding mechanism.

As described in the foregoing, the fine alignment system 1302 is used for detecting the deviation between the mask 2 and the wafer 3, but, in addition, it is used for measuring the position of the mask 2 set on the mask chuck 1807 and the inclination of the pattern relative to a reference axis. The mask alignment will be described.

The X-ray exposure apparatus in this embodiment is generally of a stepper type, wherein a pattern corresponding to one or more chips is taken as a unit, and the pattern is stepped and projected onto the wafer surface to cover the entirety thereof. If, in an exposure apparatus of this type, the axis of movement of the pattern, that is, the coordinate axis of the stage apparatus 1301 is inclined with respect to the axis of the pattern itself, the pattern is printed with the angle relative to the alignment line, so that the reference edge of the pattern is not aligned with the alignment line. At this time, when a next pattern is to be aligned with the thus exposed wafer, no particular problem arises when the area of one exposure is the same as the previous exposure. However, when a whole surface exposure apparatus, for example, is used wherein the entire surface of the wafer is exposed at one time, the mask for such a whole surface exposure has a pattern corresponding to the entire surface of the wafer, wherein the orientations of the respective chip patterns are aligned with the column and line directions of the entire mask pattern. Therefore, such a mask pattern cannot be aligned with high precision with the wafer which has been exposed by inclined stepping movement. In some cases, alignment is impossible. At the time of the first alignment between a mask 2 and the wafer 3 after the mask 2 is newly set, the mask 2 is only mechanically chucked by the mask chuck 1807, and therefore, the mask 2 is relatively greatly deviated from a correct position, so that even if the wafer 3 is moved to a designed position, the alignment marks on the mask; 2 and the wafer 3 are significantly deviated to such an extent that alignment signals cannot be obtained. It is considered in order to solve this problem that the deviation detectable area is expanded, but the detecting area and the detecting resolution are contradictory, generally, and therefore, it is not preferable to expand the detectable area in the apparatus of this case which requires high accuracy alignment.

In order to practically solve those problems, the mask alignment is effective. A mask alignment system is proposed in Japanese Laid-Open Patent Application 89417/1984, for example, wherein a reference mark fixed to a reduction projection lens for projecting a mask pattern is used. However, in this embodiment, the reference mark is disposed on a stage 1899 (FIG. 18) which is movable in a direction with which the axis of the mask pattern is to be aligned, and the deviation between the reference mark and the alignment mark 2340 on the mask 2 is detected using the pickup device 2401 in the same manner as in the fine alignment.

This will be further described. In FIG. 18, the coordinate reference mark, which is a mechanical point of origin in this embodiment, is shown by a reference numeral 1821, as described hereinbefore. The coordinate reference mark 1821 is constituted by a plurality of marks. One of the marks is the mask alignment reference mark 1821. The reference mark 1821 is provided for each of the four pickup devices 2401, but they are disposed so as to be deemed as one mark, functionally. The reference mark 1821, as described hereinbefore, is disposed on a distance measurement mirror 1810 fixed on the Z tilt stage 1805, similar to the wafer chuck 1807. Therefore, the reference mark 1821 can be deemed as one point movable along a coordinate axis of the stage 1301, which provides an alignment direction of the pattern to be printed on the wafer 3. Therefore, the mask rotation alignment can be accomplished by driving the mask Θ plate 1912 on which the mask 2 is chucked so that the pattern axis of the mask 2 is parallel to a line connecting two points provided by moving the reference mark 1821 along the coordinate axis.

The inclination of the line connecting the two points and the mask pattern axis 2, can be obtained by a deviation between the reference mark 1821 and the two mask alignment marks 2340 disposed on the mask 2 with a predetermined distance in the direction perpendicular to the line connecting the two points, and the pitch of the two mask alignment marks 2340.

Referring back to FIG. 23, the mask alignment mark 2340 on the mask 2 will be described. In this Figure, the substrate 202 of the mask 2 is depicted by chain lines as being opposed to the wafer 3 with a small gap. The four marks 2340 disposed outside the scribe lines 2331 enclosing the circuit pattern of the substrate 202 are mask alignment marks. The positions of the mask alignment marks 2340 may be arbitrary from a theoretical standpoint if the position of the marks relative to the pattern are correctly known. In this embodiment, however, the four marks are disposed such that the opposing two marks have a symmetry about an associated one of the two pattern axes which are orthogonal to each other and such that they are sufficiently outside the maximum view angle of the pattern. By this, the positions of the alignment marks 2340 can be made constant irrespective of the other factors such as the view angle. As shown in FIGS. 16 and 24, a movable aperture 2404 is disposed on the pickup device 2401 to prevent X-rays 1 from reaching the region outside the scribed line 2331, and therefore, the mask alignment mark 2340 is not transferred onto the wafer 3 by the exposure. Each of the mask alignment mark 2340 and the reference mark 1321 has the pattern similar to the alignment marks 2332 on the mask and the wafer used for the fine alignment, and the deviation between the mask alignment mark 2340 and the reference mark 1821 are detected by the detecting means used during the fine alignment.

As described, according to this embodiment, the axis of the pattern on the mask 2 is directly aligned with the movement direction of the reference mark representing the coordinate axis of the stage apparatus 1301 ruling the column and line direction of the patterns, and therefore, the mask alignment is very precise. In a method wherein an axis to which the pattern is aligned is defined by two points fixed on the apparatus, the adjustment is required to mechanically align with high precision the line defined by the two points to the coordinate axis of the stage apparatus 1301. However, according to the present invention, such an adjustment is not necessary when the reference marks 1821 which are functionally deemed as one point are mounted on the laser distance measuring mirror 1810. This is particularly advantageous in an easy servicing operation in the field.

The structures of the mask alignment mark 2340 and the reference mark 1821 are the same as the alignment mark on the mask and the alignment mark on the wafer, respectively, which are used for fine alignment between the mask and the wafer, and therefore, the deviation in the mask alignment can be measured using the fine alignment system 1302. This eliminates the necessity of detecting means exclusively for the mask alignment, and therefore, the size and the cost can be decreased, and the reliability is increased.

The positions of the mask alignment marks 2304 are made constant irrespective of the size of the pattern on the mask, and therefore, the measuring positions of the pickup devices 2401 can be made constant, and the position of the pickup stages 2411 at which it is stopped at the mask alignment can be made 25 constant irrespective of which mask is used, and therefore, highly precise mechanical positioning is possible. In addition, the control sequence is made simple.

In this embodiment, two additional marks are provided in the manner to enclose the pattern of the mask, in addition to the two mask alignment marks required for detecting the inclination of the pattern axis of the mask relative to the coordinate axis of the stage apparatus 1301. Accordingly, the correct position of the pattern on the mask 2 mechanically chucked in X-Y coordinates as well as the inclination of the pattern axis can be known from the position data from the measurement system for measuring the position of the laser distance measuring mirror 1810 and the deviation of the mask alignment mark from the reference mark.

Figure 25:
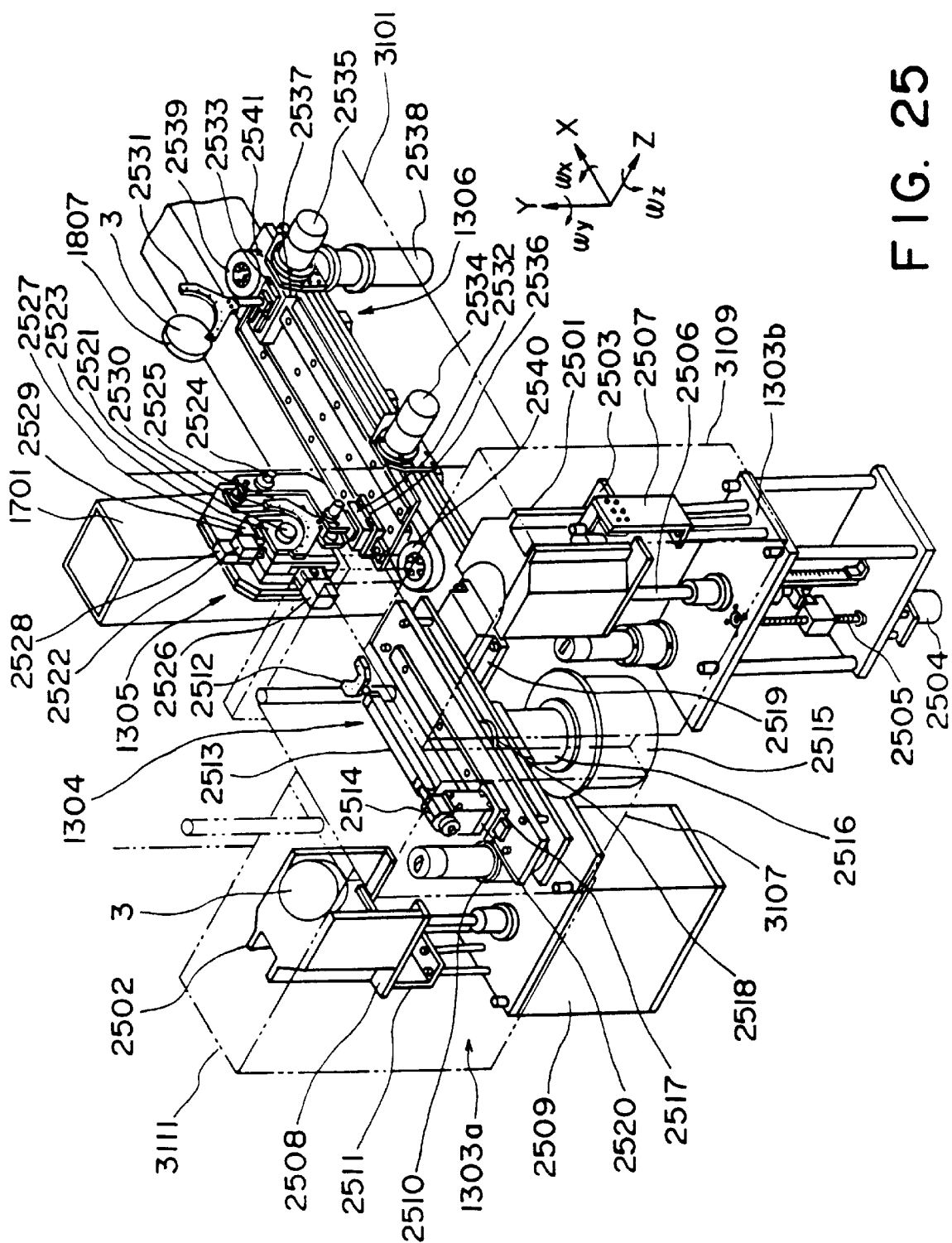
FIG. 25 is a perspective view of a wafer conveying system.

Referring to FIG. 25, there is shown a wafer conveying system. The wafer conveying system comprises four units, i.e., a wafer supply and take up elevator unit 1303, and injector unit 1304, an orientation flat detecting stage unit 1305 and a wafer traverser unit 1306.

The wafer supply and take up elevator 1303 includes a wafer supplying elevator 1303b and the wafer take up or correcting elevator 1303a. The wafer elevator 1303 is cooperative with the injector unit 1304 to pickup the wafers 3 one by one from the supply carrier 2501 and to accommodate them back to the collecting carrier 2502. Since the wafer supply elevator 1303b and the wafer collecting elevator 1303a are made of the same parts, the following description will be made as to the wafer supply elevator 1303b. A supply carrier 2501 accommodating 25 wafers 3, in this embodiment, is placed on a wafer supply carrier table 2503 at a predetermined position. The supply carrier table 2503 is connected with a supply elevator rod 2506 to position the supply carrier 2501 in the Y direction by displacing the supply elevator rod 2506 in the Y direction through a predetermined amount. The Y direction movement of the supply elevator rod 2506 is accomplished by a rectilinear pulse feeding by a supply elevator driving portion 2504 and a supply elevator feeding screw 2505, and the supply wafer detecting portion 2507 detects the presence or absence of the wafer 3 and an erroneous insertion. In the wafer loading chamber 3109 having an inside ambience of He is provided with an unshown unit for sealing the circumference of the supply elevator rod 2506, and the supply elevator driving portion 2504 and the supply elevator feeding screw 2505 are disposed in the air. In the supply elevator driving portion 2504, a water cooling pipe (not shown) is penetrated through a motor supporting member. Similar to the supply elevator 1303b, a collecting elevator 1303a includes a collecting carrier cable 1508, a collecting elevator driving portion 2509, a collecting elevator rod 2510, collecting wafer detecting portion 2511 and a wafer unloading chamber 3111.

The injector 1304 serves to take a wafer 3 out of the supply carrier 2501, to supply it to the orientation flat detecting stage 1305 and to account to date the exposed wafer 3 to the collecting carrier 2502 from the orientation flat detecting stage 1305. The injector 1304 comprises an injector hand 2512 for vacuum attracting the wafer 3, an injector arm 2513 for supporting it and an injector ωx driver 2514 for setting the wafer 3 upstanding (the wafer 3 is taken out horizontally from the supply carrier 2501). The injector hand 2512 is mounted on the injector Z stage 2520. The injector 1304 includes an injector Z driver 2519 when the wafer 3 vacuum chucked on the injector hand 2512 is transferred to and from the orientation flat detecting stage 1305, an injector X stage 2517 for moving the injector hand 2512 in the X direction, an injector X driver 2516 for rotating the injector X driver pulley 2518 to wire-drive it, and an injector ωy driver for directing the injector hand 2512 toward the supply elevator 1303b, the collecting elevator 1303a and the orientation flat detecting stage 1305.

In the wafer injector chamber 3107 maintaining the He ambience, there is a vacuum rotation field through (seal not shown), and the injector X driver and the injector ωy driver are disposed within the air, and the driving power is introduced through the field through into the wafer injector chamber 3107. For each of the drivers for the motor supporting member, an unshown water cooling pipe is penetrated.

The orientation flat detecting stage 1305 has functions of detecting the position of the orientation flat of the wafer 3 supplied from the injector 1304 and orienting it in a predetermined direction and a function as a collecting table when the wafer 3 after exposure is collected by the injector 1304.

The orientation flat detecting stage 1305 includes an orientation flat detecting chuck 2521 for holding the wafer 3 in an upstanding (vertical) state by vacuum, an orientation flat detecting Θ stage 2523 for endlessly rotating in the clockwise and counterclockwise direction, an orientation flat detecting Θ driver for driving it, an orientation flat detecting X stage 2527 for moving it in the X direction, an orientation flat detecting X driver 2526 for driving it, an orientation flat detecting Y stage 2529 movable in the Y direction and an orientation flat detecting Y driver 2528 for driving it. The orientation flat detecting Y stage 2529 is movable in +Y direction where the wafer hand and the wafer 3 are not interfered, which will be described hereinafter, when the wafer 3 is transferred to and from the wafer traverser 1306. A line sensor projection optical system 2524 illuminates an edge of the wafer 3 retained on the orientation flat detecting chuck 2521 to permit detection of the position of the edge in the X direction by the line sensor 2524. While the wafer 3 is rotated in the Θ direction at a constant speed, the detecting operations are performed at predetermined intervals using the line sensor projecting system 2524 and the line sensor 2525. By the calculation sequence which will be described hereinafter, the position of the orientation flat and the deviations of the wafer 3 in the X and Y directions are detected, and thereafter, the direction of the orientation flat is corrected by driving the orientation flat detection Θ stage 2523, whereas the positions of the wafer 3 in the X and Y directions are corrected by driving the orientation flat detecting X stage 2527 and the orientation flat detecting Y stage 2529. The orientation flat detecting stage 1305 is mounted to the main frame 1701, and the entirety thereof is disposed in the He ambience in the main chamber 3101. In the supporting member for each of the motor drivers, a wafer cooling pipe (not shown) is penetrated.

The wafer traverser 1306 has functions of setting the orientation flat on the orientation flat detection stage 1305, of loading the wafer 3 corrected in the X and Y directions to the wafer chuck 1807 and of unloading the exposed wafer 3 from the wafer chuck 1807 to the orientation flat detecting chuck 2521. The wafer traverser 1306 is provided with two hands, i.e., a loading hand 2530 and unloading hand 2531 capable of supporting the wafer 3 vertically by vacuum chucking. The loading hand 2530 is a hand for loading the wafer 3 having been subjected to the orientation flat setting operation, from the orientation flat detecting chuck 2521 to the wafer chuck 1807, and the unloading hand 2531 is effective to unload the wafer after the exposure from the wafer chuck 1807 to the orientation flat detecting chuck 2521. The two hands 2530 and 2531 are mounted on a loading Z stage 2532 and an unloading Z stage 2533. They transfer the wafer 3 by moving them with a traverser $Z_0$ driver 2534 and a traverser Zω driver 2535. The drivers 2534 and 2535 include an electrically actuatable cylinder and a rod movable in the Z direction thereby, and the two drivers 2534 and 2535 are fixed at wafer exchanging positions of the orientation flat detection chuck 2521 and the wafer chuck 2531, respectively. Only when the wafer 3 is transferred, is the rod expanded or contracted, but normally the rod is accommodated in the electrically 25 actuatable cylinder.

The hands 2530 and 2531 are mounted on the loading X stage 2536 and the unloading X stage 2537, and are movable in the X direction to the wafer exchanging positions of the orientation flat detecting chuck 2521 and the wafer chuck 2531, respectively. For the X direction drive, a steel belt 2541 is trained around a traverser driving pulley 2539 and the tension pulley 2540, and the driving power is transmitted from the traverser X driver 2538 to the traverser driving pulley 2539, by which two X stages 2536 and 2537 are belt-driven. The two Z stages 2532 and 2533 during the movement in the X direction, have different strokes to prevent interference between the constituent parts.

The wafer traverser 1306 as a whole is mounted to the main frame 1701, and therefore, is used in the He ambience in the main chamber 1301. In the motor supporting member for each of the drivers of the wafer traverser 1306, an unknown water cooling pipe is penetrated.

Figure 26:
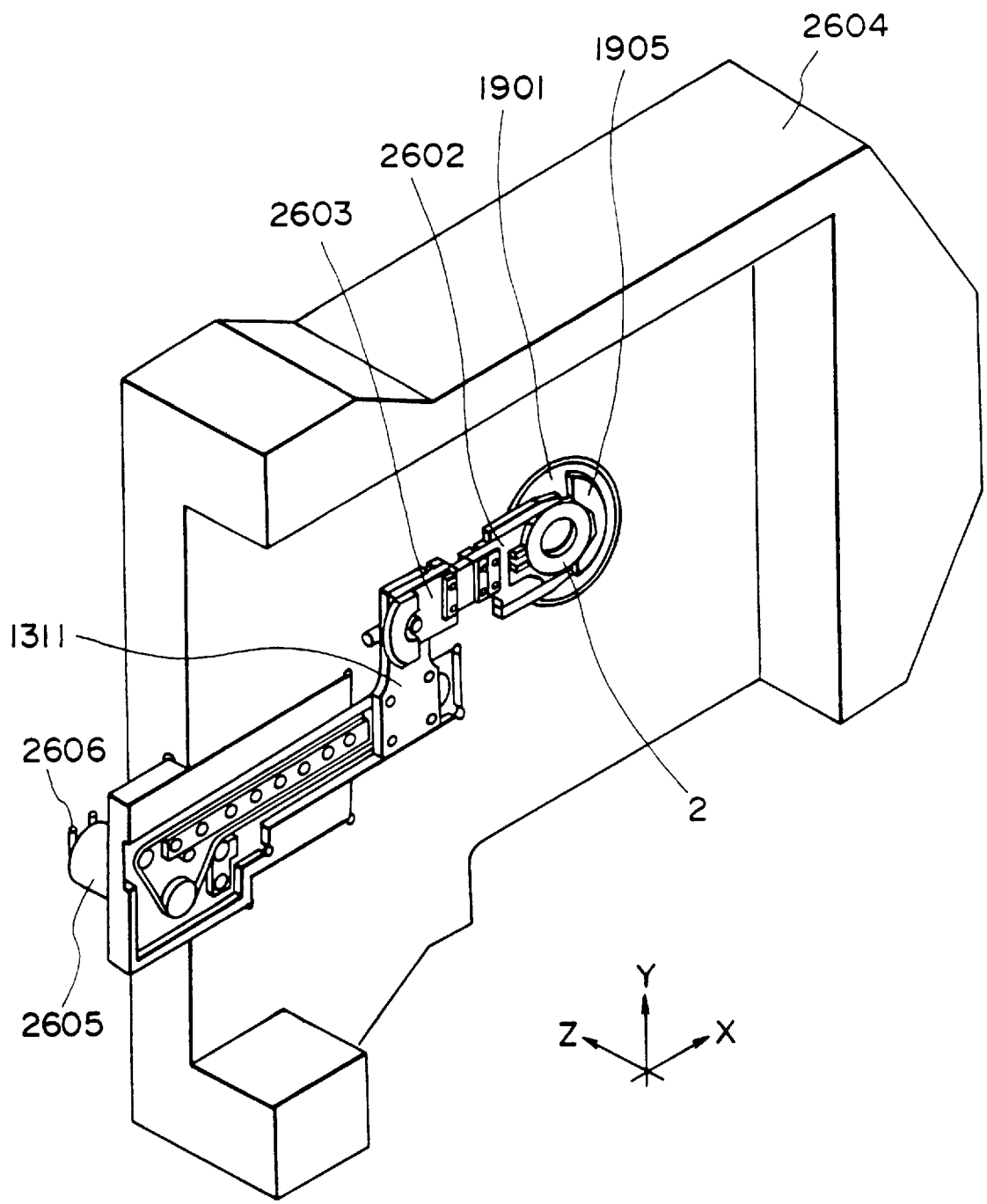
FIG. 26 is a perspective view of a mask conveying system.

FIG. 26 shows a mask conveying apparatus 1311 (FIG. 13). Since the mask conveying apparatus 1311 is disposed between the automatic alignment frame 2604 and the main frame 1701, it is of a flat structure, a transverse unit 2601 is a rectilinearly reciprocable mechanism between the mask Θ stage 1999 and the mask cassette 1310 (FIG. 13). The mask hand 2602 is a robot hand for handling the mask 2. The mask conveying apparatus 1311 is constituted mainly by those two units and an arm unit 2603. The arm unit 2603 includes a mechanism for rotating the mask hand 2602 toward the mask Θ stage 1999 and the mask cassette stage 3001 in the mask cassette 1310 and a mechanism for vertically moving the mask hand 2602 on the mask Θ stage 1999 and on the cassette stage 3001. The traverse motor 2605 for driving the traverse unit 2601 is provided with a water cooling pipe 2606 for removing heat generated by the motor. The positioning of the mask 2 to the mask ω stage 1999 is accomplished by abutting it to a mask positioning V block 1905.

Figure 27:
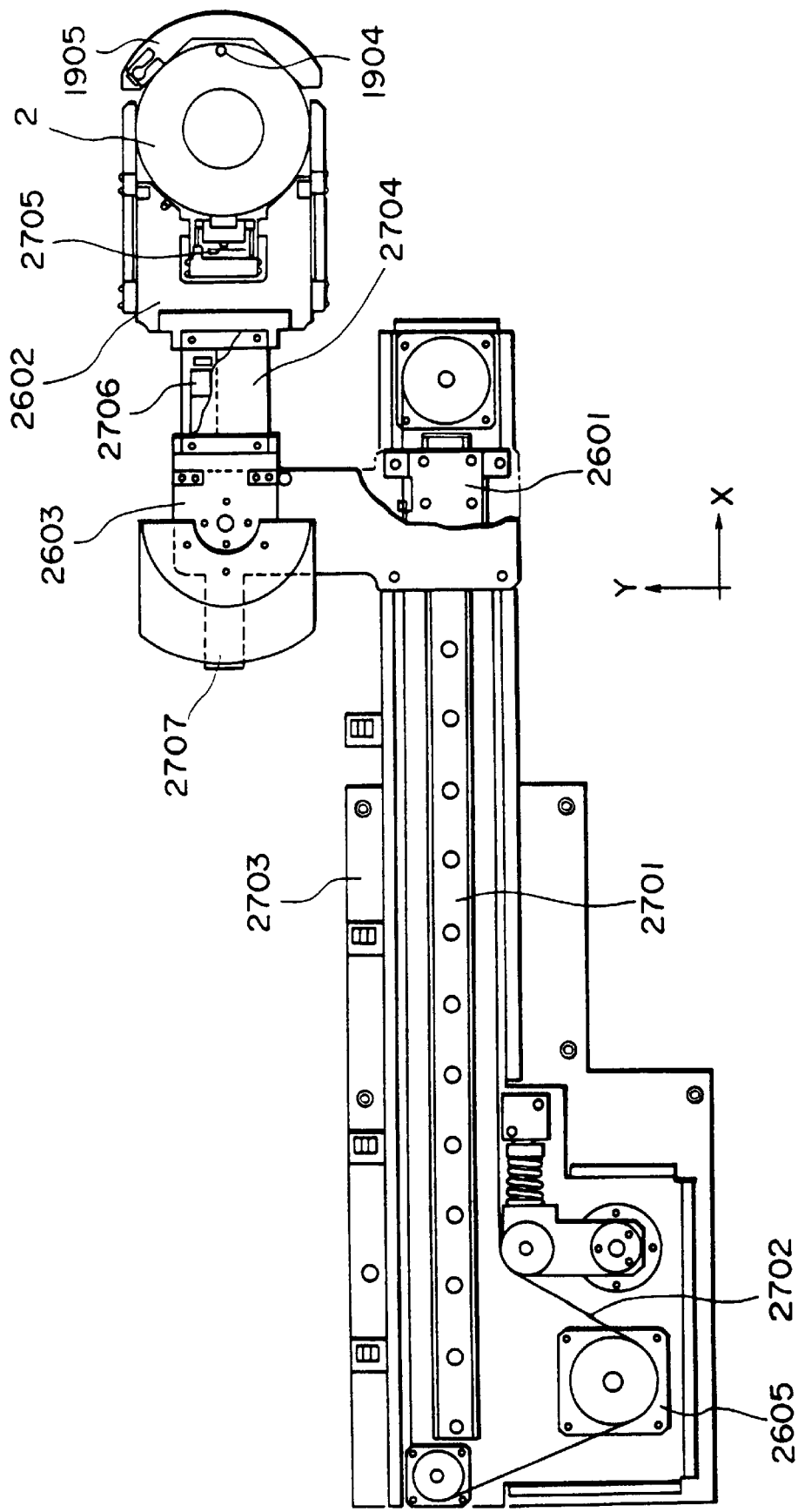
FIG. 27 is a top plan view of a mask conveying station.

FIG. 27 shows in detail the mask conveying apparatus 1311. In this Figure, the traverse unit 2601 is driven by a traverse motor 2605, and is rectilinearly reciprocated along a linear guide 2701. A traverser position detecting sensor 2703 is effective to detect the traverse position. An arm unit 2603 includes a motor 2707 for rotating the arm, unshown gears, a rotational position detecting sensor, a motor 2706 for vertically moving the mask hand 2602, and an unshown eccentric cam and Z position sensor 2704. In this structure, the traverse unit 2601 is controlled in accordance with a detection signal by an abutment sensor 2705 in the mask hand 2602 so that the mask 2 handled by the mask hand 2602 is abutted and positioned 25 to the V block 1905 for positioning the mask in the mask Θ stage 1999.

Figure 28:
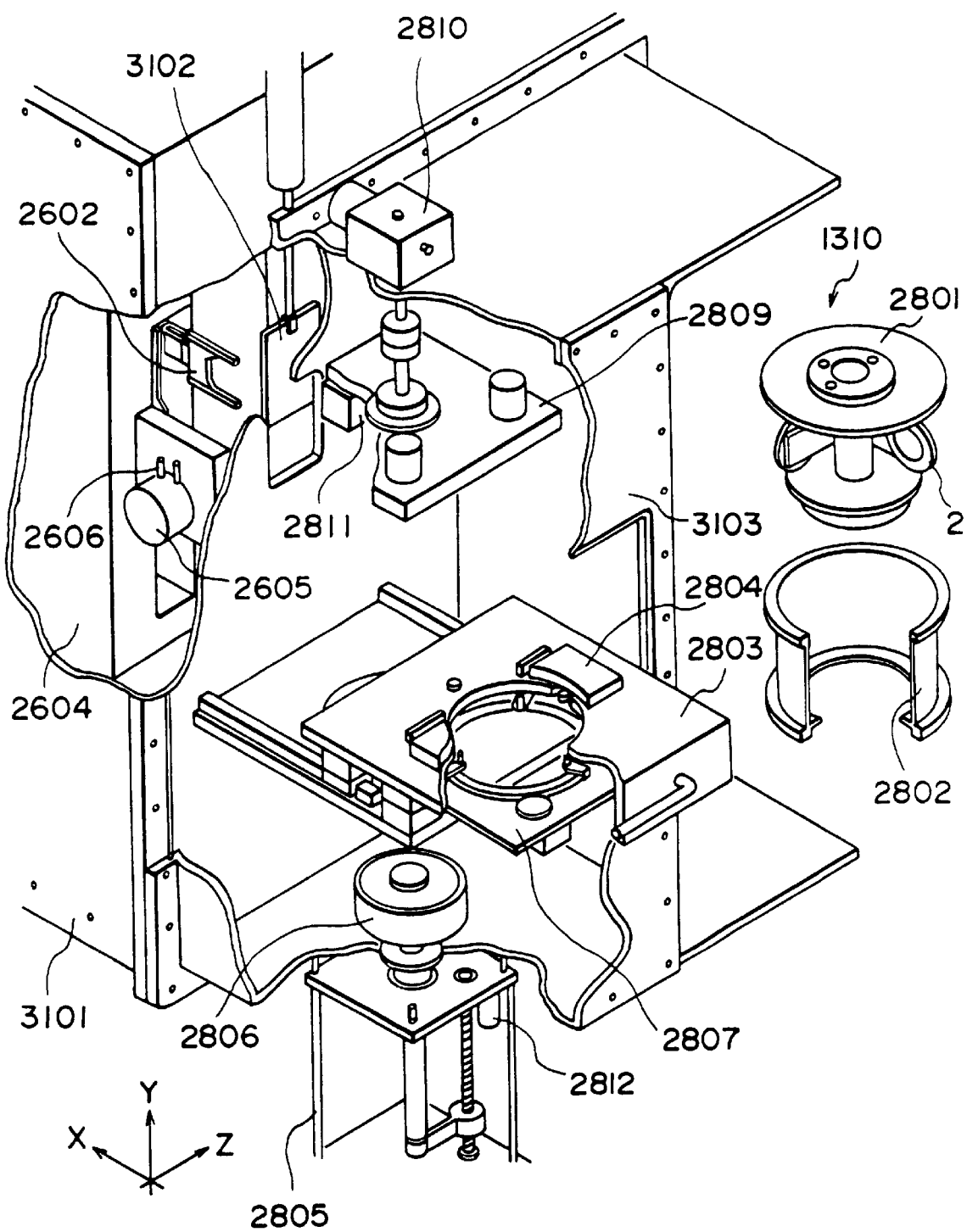
FIG. 28 is a perspective view illustrating a mask cassette loader.

The description will be made as to the loading mechanism for the mask cassette 1310 (FIG. 13) accommodating therein the masks 2. In FIG. 28, designated by reference numeral 2801 is a main assembly of the cassette which accommodates the masks 2 used in this embodiment. The mask cassette includes a cassette cover 2802 for hermetically closing the main apparatus of the cassette 2801. In FIG. 28, the combination of the mask cassette main assembly 2801 and the cassette cover 2802 is called a mask cassette 1310. A table 2803 is provided for an operator to place the mask cassette 1310 containing the masks 2. The table can be drawn out in the direction X in FIG. 28 to overhang from the mask chamber 3103 to improve the operativity. Reference numeral 2804 designates a cover lock unit. In this embodiment, the cover lock unit 2804 cramps from the inside the edges of the cassette cover 2802. This is performed manually by the operator.

A cassette lock unit 2807 serves to drive a cassette locking mechanism which will be described hereinafter in the main assembly of the cassette 2801. In this embodiment, the cassette locking unit 2807 which is a driver for the cassette locking mechanism is in the cassette table 2803, not in the cassette main assembly 2801. Therefore, the driving force is transmitted, only when the cassette main assembly 2801 is on the cassette table 2803. A table 2806 is rotatable to move only the cassette main assembly 2801 to a desired position for mask loading. A mask cassette elevator 2805 is effective to carry and move the cassette main assembly 2801 onto the table 2806, as described above. A cassette elevator motor 2812 provide a driving force which is transmitted through a precision feeding screw, but it is not limiting, and another rectilinear driving mechanism is usable.

The mask cassette 2805 is outside the mask chamber 3103, and a rod is connected to the table 2806 through the field through (seal). The table 2806 is in the mask chamber 3103.

The selection mechanism for the mask 2 in the cassette main assembly 2801 will be described. Designated by a reference numeral 2809 is an indexer base, which is connected to the mask chamber 3103. An indexer 2810 intermittently rotates the main assembly of the cassette 2801. An output shaft of the indexer 2810 is introduced into the mask chamber 3103 through the field through. A connecting unit 2811 is a unit for supplying electric power to a cassette stage 3001 for the main assembly 2801 of the cassette in this embodiment. The cassette stage 3001 magnetically attracts the mask 2, and therefore, electric power is required to energize the magnetic circuit. The apparatus of this embodiment does not have any power source in the main assembly of the cassette 2801, and therefore, a connecting unit 2811 is provided. If an electric power source is provided in the mask cassette main assembly 2801, only a driving signal from the magnetic circuit is transmitted into the main assembly of the cassette 2801. The units described in the foregoing are annexed to the mask chamber 3103, and the mask chamber 3103 and the main chamber 3101 is isolated by a gate valve 3102.

Figure 29:
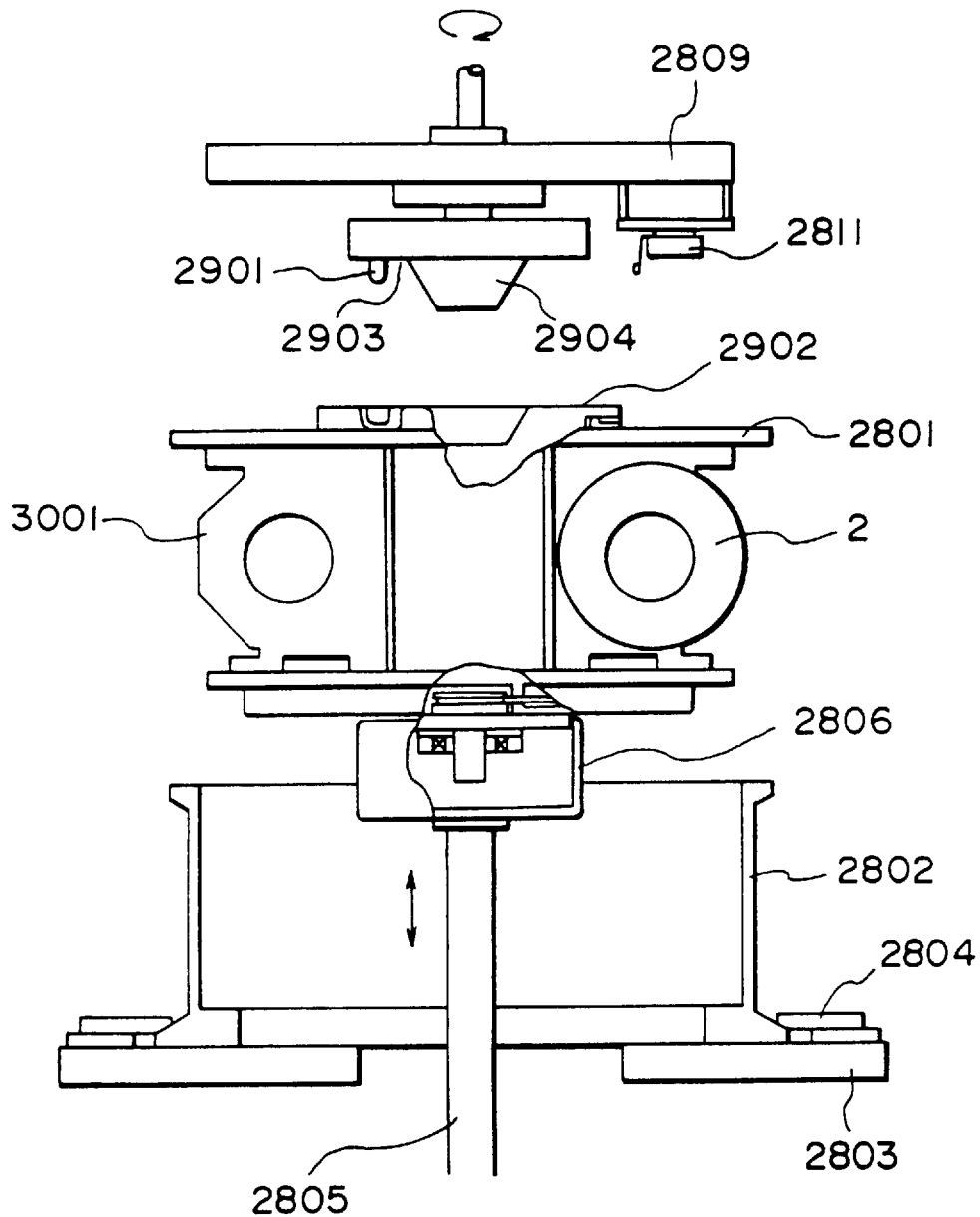
FIG. 29 is a side view of the mask cassette loader illustrating its operation.

Referring to FIG. 29, which shows the state of the parts during cassette loading operation, the positioning system of the mask cassette 1310 will be described. The cassette main assembly 2801 placed on the table 2806 is lifted by the mask cassette elevator 2805. A boss 2904 is provided to correct the axial deviation between the main assembly 2801 and the indexer 2810. Designated by reference numerals 2902 and 2903 are a cassette abutting surface and an indexer abutting surface, respectively. The mask cassette elevator 2805 assures that the cassette abutting surface 2902 is abutted to the indexer abutting surface, and the boss 2904 serves to correct the actual deviation, by which the main assembly 2801 is correctly positioned. A positioning pin 2901 is engaged with associated bore of the main assembly 2801 to index and position in the rotational direction. By the above structure, the mask cassette 1310 is positioned with high precision. In this embodiment, the indexing mechanism is provided at an upper position, but it may be in the table 2806. However, if the rotational indexing mechanism is in the table 2806, the rotational play in the elevator 2805 should be removed with precision.

Figure 30:
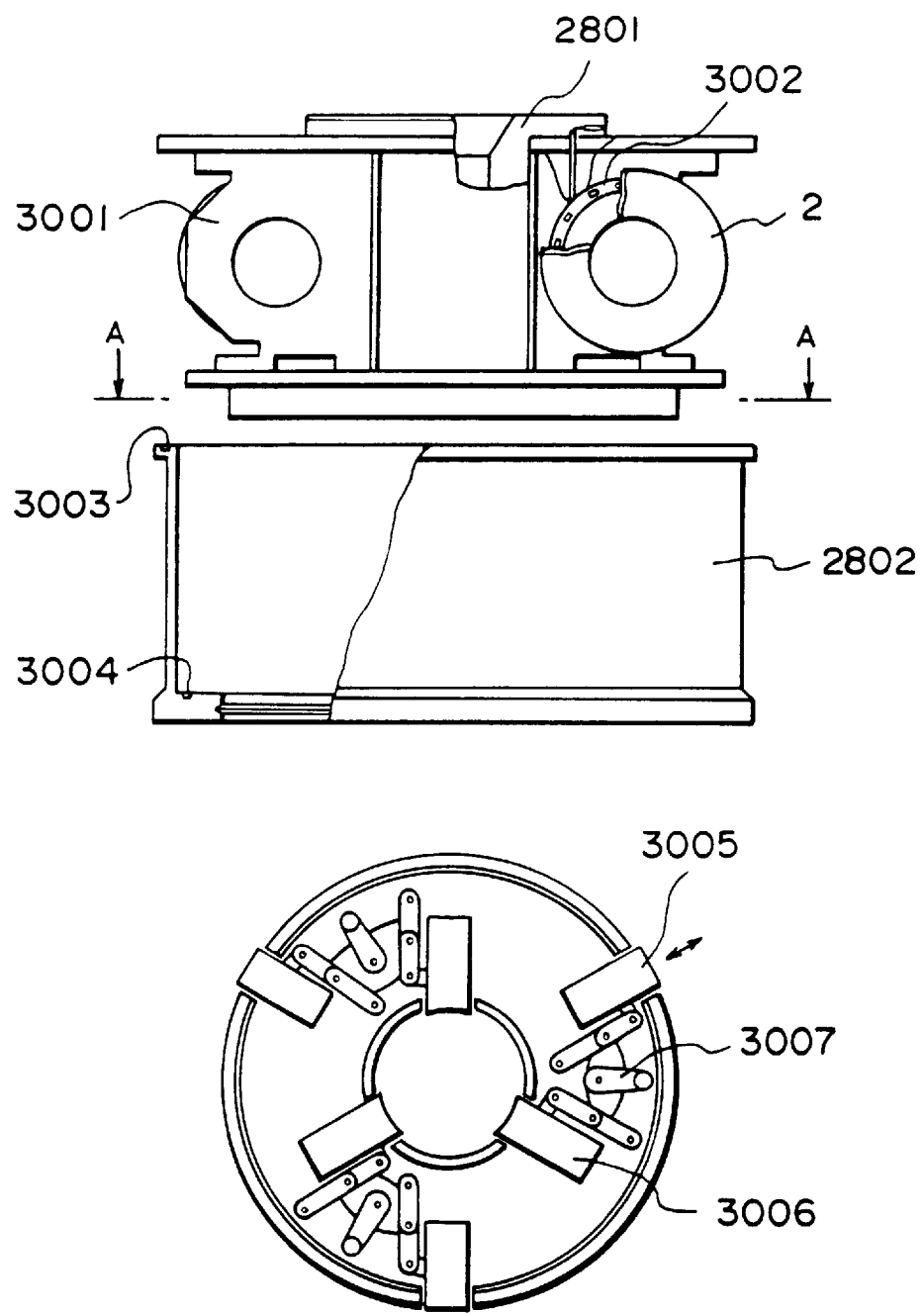
FIG. 30 is a side view of a mask cassette.

Referring to FIG. 30, the mask cassette 1310 will be described. In this Figure, a cassette stage mask chuck is designated by a reference numeral 3002. The chuck 3002 is embedded in the cassette stage 3001, and in this embodiment, since the mask 2 is vertically placed, a magnetic type attraction mechanism is used. The cassette stage 3001 is radially arranged in the main assembly of the cassette 2801.

Seals 3003 and 3004 are mounted to the cassette cover 2802 to seal the main assembly 2801 of the cassette. When the main assembly 2801 and the cassette cover 2802 are connected, the mask cassette is substantially hermetically sealed by the seals 3003 and 3004.

Referring to FIG. 30, there are shown a cover locking pawl 3005, a table Θ locking pawl 3006 and a lever 3007. Three sets of those elements are provided. The lever 3007 is interrelated with the cover locking pawl 3005 and the table locking pawl 3007, and by operating the lever 3007, one of the cover locking pawl 3005 and t he table locking pawl 3006 is projected out of the main assembly 2801. The cover locking pawl 3005 is connected with the cassette cover 2802 and is effective to connect the main assembly 2801 and the cassette cover 2802. The table locking pawl 3006 is connected with the table 2806 and serves to enable stabilized conveyance of the cassette main assembly 2801 when the mask cassette elevator 2805 moves upwardly. The lever 3007 for driving the pawls 3005 and 3006 is driven by a cassette locking unit 2807 provided in the cassette table 2803. Therefore, only when the main assembly 2801 is on the cassette table 2803, the cassette locking unit 2807 can transmit the driving power to the cover 3007.

Figure 31:
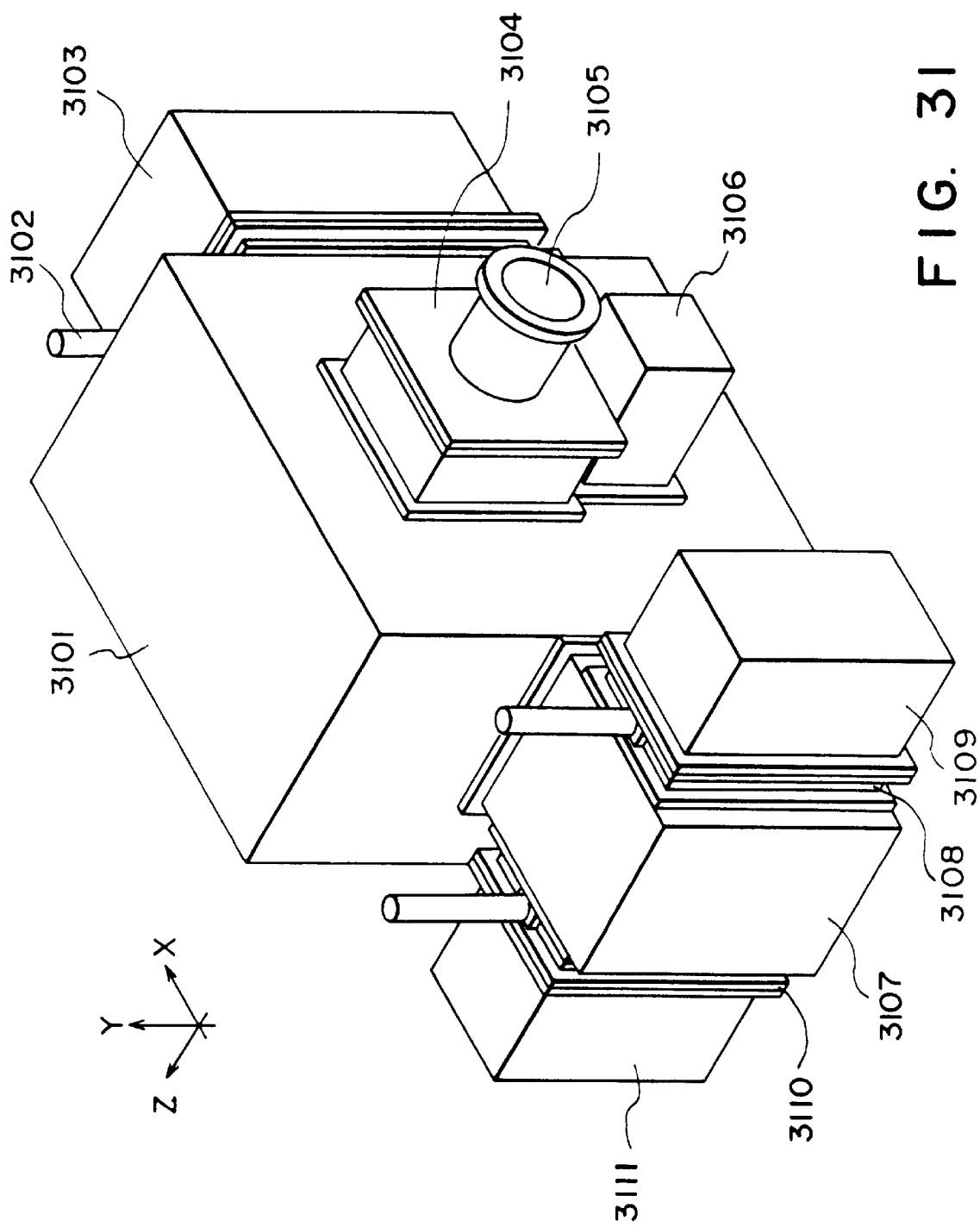
FIG. 31 is a perspective view of the apparatus illustrating chambers.

FIG. 31 shows structures of major chambers in the X-ray exposure apparatus according to this embodiment, wherein the mask 2 and wafer 3 holding mechanisms, the mechanism for aligning them and conveying mechanisms for them are disposed in a He ambience under a predetermined reduced pressure. The structures of the respective chambers will be described in detail. In the main chamber 3101, a main frame 1701, an automatic alignment frame 2604, a stage apparatus 1301 fixed thereto, a measurement optical system 132 for the stage, prealignment and fine alignment systems 1307, 1302, the mask conveying apparatus 1311 and the orientation flat detecting stage 1305 are contained. To the main chamber 3101, the shutter chamber 3104, an automatic prealignment chamber 3106 and a wafer injector chamber 3107 are connected. Also, a mask chamber 3103 is connected through a mask gate valve 3102 which will hereinafter be called "MKGV". The shutter chamber 3104 accommodates the exposure shutter apparatus 1308, and to the chamber 3104 an X-ray mirror port 3105 is connected through the Be window 3512. In the automatic prealignment chamber 3106, the prealignment system 1307 is accommodated. The mask chamber 3103 contains the mask cassette loader 1309 with the exception of the 10 elevator driving unit 2805 and the indexer. In the wafer injector chamber 3107, a wafer traverser 1304 is accommodated except X, ωy driving units 2516 and 2515. To the opposite positions of the wafer traverser 1304, a wafer loading chamber 3109 is connected through a wafer loading gate valve 3108 which will hereinafter be called "WLGV", and a wafer unloading chamber 3111 through a wafer unloading gate valve 3110 which will hereinafter be called "WUGV". In the wafer loading chamber 3109 and the wafer unloading chamber 3111, the orientation flat detection stage 1303 is accommodated except the supply elevator driver 2504 and the collecting elevator driver 2509, respectively. In the X-ray exposure apparatus according to this embodiment, the image exposure is performed in the reduced He ambience. The chamber is once discharged to an extent of a predetermined vacuum, and then the He gas is supplied thereinto to a predetermined pressure suitable for the exposure. In this embodiment, most of the parts including the mask 2 and wafer 3 conveying system are in the same He ambience. It is desirable that the X-ray exposure apparatus of this embodiment satisfy the following:

(1) If the pressure and purity of the He ambience change during exposure, the transmissibility of the X-ray changes with the result of change in the amount of exposure. Therefore, the pressure and the purity in the He ambience during the exposure should be controlled and maintained with precision.

(2) If the entire apparatus is opened to the air when the mask cassette 1310 and/or the wafer carriers 2501 and 2502 are to be exchanged with respective other ones, the throughput remarkably decreases. Therefore, the mask chamber 3103, the wafer loading chamber 3109 and the wafer unloading chamber 3111 in FIG. 31 can desirably be open to air, discharged to vacuum and supplied with the He gas, independently 20 from the main chamber 3101.

(3) The ambience from the SOR which is the ray source to the Be window 3512 through the mirror is ultravacuum, and therefore, the Be window functions as an isolating wall between the ultravacuum and the ambience. From the standpoint of minimizing the absorption of the X-rays, the thickness of the Be window should be minimum. Therefore, an air discharging and gas supplying system is desired to be such that the Be (beryllium) window is not subjected to a pressure difference larger than the difference between the He gas pressure during the exposure and the ultravacuum at the mirror port side, and that no abrupt pressure change occurs.

A system satisfying the above three conditions will be described with FIGS. 32, 33, 34 and 35.

Figure 32:
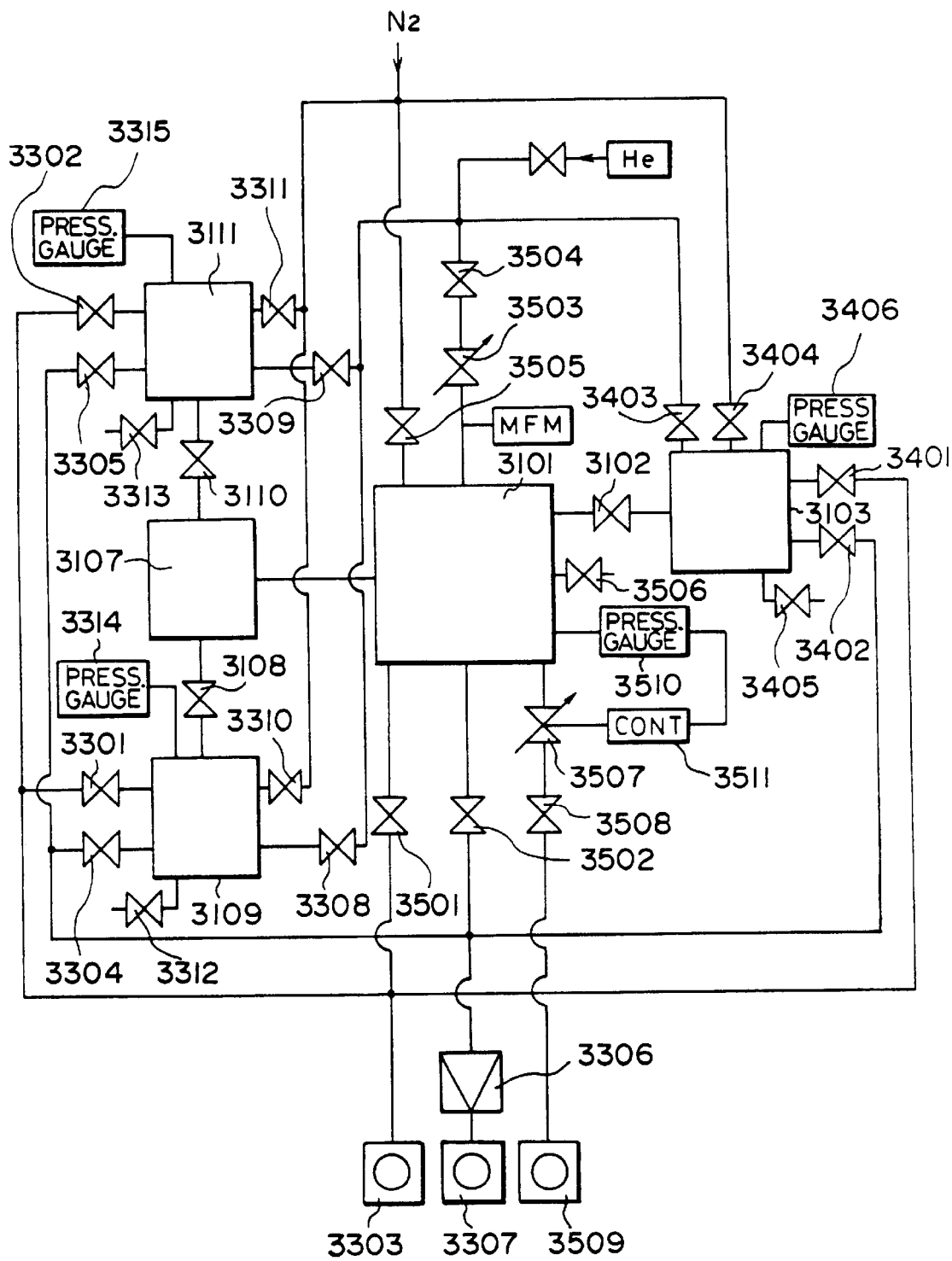
FIG. 32 is a block diagram of a gas supply and discharge system.
Figure 34:
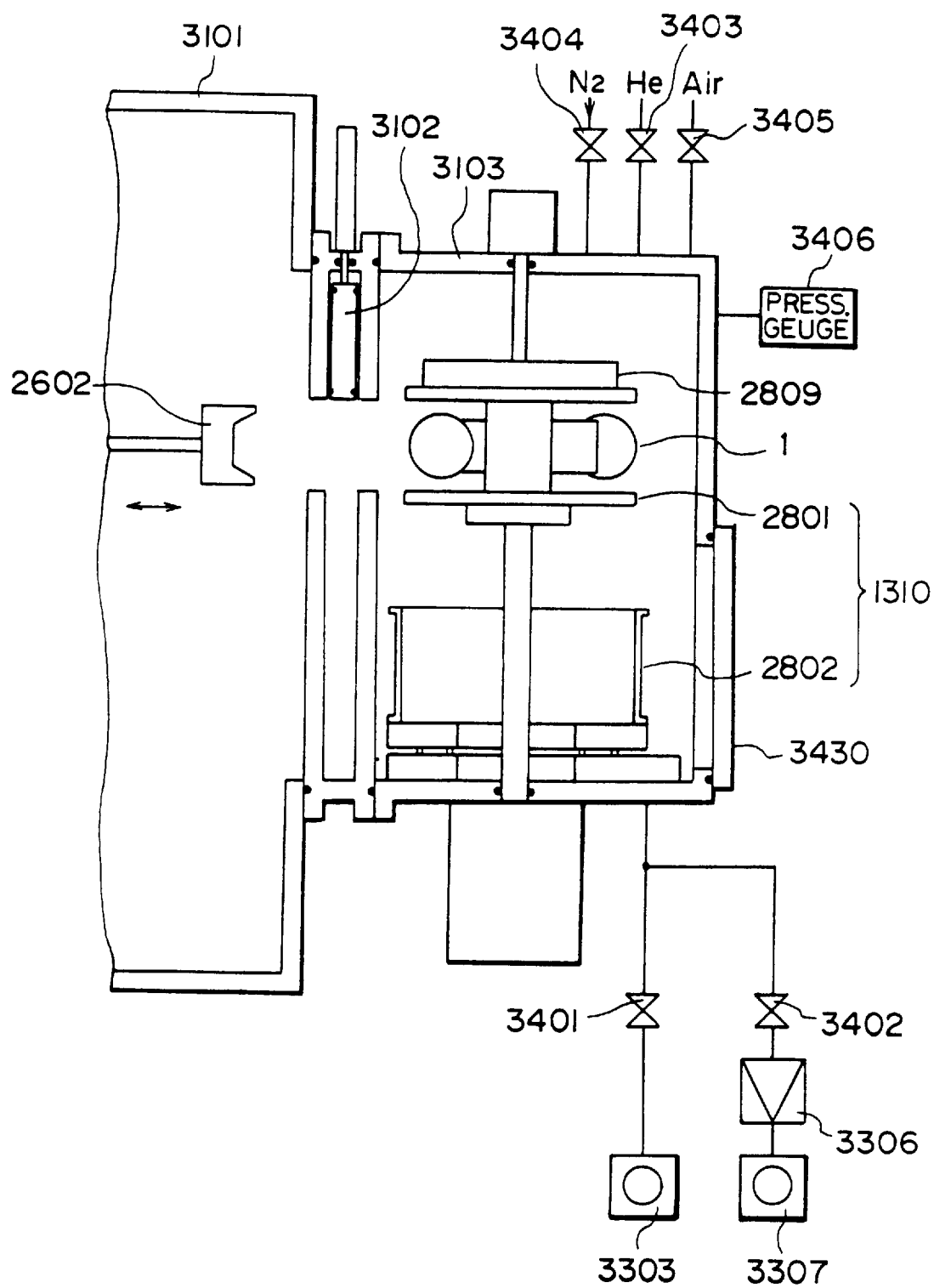
FIG. 34 is a schematic view illustrating a mask load locking mechanism.

FIG. 32 shows a block diagram of the entire system, FIG. 33 details of the wafer load locking portion; FIG. 34 the details of a mask load locking portion; and FIG. 35 details of the Be window and maintenance of pressure and purity in the main chamber.

FIG. 33 shows the details of the wafer load locking mechanism. As has been described in conjunction with FIG. 31, the main chamber 3101 is connected with the wafer injector chamber 3101, and the wafer injector chamber 3107 is connected with the wafer loading chamber 3109 through WUGV 3108 and with a wafer unloading chamber 3111 through the WUGV 3110. In the wafer loading chamber 3109 and the wafer unloading chamber 3111, a wafer supply and take up elevator 1303 is accommodated with the exception of the driving part. The wafer loading chamber 3109 and the wafer unloading chamber 3111 are connected, as the discharging system, with a coarse discharge oil rotation pump which will hereinafter be called "RORP" for coarse discharge to 1–0.1 Torr through a wafer load by-pass valve which will hereinafter be called "WLBPV" 3301 and a wafer unloading by-pass valve which will hereinafter be called "WUBPV" 3302, respectively. Further, they are connected to a main discharge turbo molecular pump which will hereinafter be called "MNTMP" 3306 for discharging to a predetermined degree of vacuum required for exchange with the He gas through a wafer loading main valve which will hereinafter be called "WLMNV" 3304 and a wafer unloading main valve which will hereinafter be called "WUMNV" 3305. Furthermore, the wafer loading chamber 3109 and the wafer unloading chamber 3111 can be supplied, as He, N2 and air supply systems, with He through a wafer loading He inlet valve which will hereinafter be called "WLHeV" 3308 and a wafer unloading He inlet valve which will hereinafter be called "WUHeV" 3309; $N_2$ through a wafer loading $N_2$ inlet valve which will hereinafter be called "WLN$_2$V" 3310 and a wafer 20 unloading $N_2$ inlet valve which will hereinafter be called "WUN$_2$V" 3311; and air through a wafer load leak valve which will hereinafter be called "WLLV" 3312 and wafer unload leak valve which will hereinafter be called "WULV". The wafer loading chamber 3109 and the wafer unloading chamber 3111 are provided respectively with a wafer load pressure gauge 3314 and a wafer unload pressure gauge the pre sense the pressures in the respective chambers. In operation, by closing WLGV 3108 or WUGV 3110, the wafer loading chamber 3109 or the wafer unloading chamber 3111 is isolated from the wafer injector chamber 3107, and therefore, it can be discharged to the vacuum or can be supplied with He, N2 or air, independently from the other chambers.

Accordingly, when, for example, the wafer carrier 2501 is to be exchanged in the wafer load chamber 3109, the WLGV 3108 is closed, and then WLN$_2$V 3310 is opened, and thereafter, $N_2$ is supplied to 760 Torr.

Then, the WLLV 3312 is opened to introduce the air to provide the chamber pressure equivalent to the atmospheric pressure, and the supply carrier 2501 is exchanged. After the exchange, the coarse discharge is effected by the RORP 3303 to 0.1 Torr, for example, and then, a predetermined degree of vacuum is produced by the MNTMP 3306. Subsequently, the WLHeV 3308 is opened to supply the He to a predetermined pressure, and then, the WLGV 3108 is opened. This is the end of exchange. The same applies to the case when the wafer carrier 2502 in the wafer unloading chamber 3111 is exchanged.

As described in the foregoing, upon wafer carrier exchanging operation, the minimum opening to air is sufficient without breaking the entire ambience.

FIG. 34 shows details of a mask load locking mechanism. As described in conjunction with FIG. 31, the main chamber 3101 is connected with a mask chamber 3103 through the MKGV 3102. The mask chamber 3103 contains the mask supply and take up elevator 1309 excluding the indexer 2810 and the elevator 2805. Similar to the description with the wafer load locking mechanism, the mask chamber 3103 is connected, as discharging system, with the RORP 3303 for the coarse discharging from the atmospheric pressure 1–0.1 Torr through a mask by-pass valve which will hereinafter be called "MKBPV" 3401; and with MNTMP 3306 for discharging it to a predetermined vacuum required for the exchange with He through a mask main valve which will hereinafter be called as "MKMNV" 3402. Further, the mask chamber 3103 can be supplied, as He, N2 and air sucking system, with He through a mask He inlet valve which will hereinafter be called as "MKHeV" 3403; with $N_2$ through a mask $N_2$ inlet valve which will hereinafter be called as "MKN2V" 3404; and with air through a mask leak valve which will hereinafter be called "MKLV" 3405.

In operation, when the MKGV 3102 is closed, the mask chamber 3103 is isolated from the main chamber 3101, and can be discharged to vacuum or can be supplied with He, N2 or air independently from the other chambers. Therefore, when the mask cassette 1310 is to be exchanged, the MKGV 3102 is closed, and then the MKN$_2$V 3404 is opened, and $N_2$ is supplied to 760 Torr. Thereafter, the MRLV 3405 is opened to provide the chamber 3103 pressure equivalent to the atmospheric pressure around it. Subsequently, the door 3430 is opened, and the mask cassette 1310 is exchanged. After the exchange the RORP 3303 is coarsely discharged to 0.1 Torr, for example, and thereafter, it is discharged to a predetermined degree of vacuum by the MNTMP 3306. Then, the MKHeV 3403 is opened to supply He to a predetermined pressure, and then, the MKGV 3102 is opened. This is the end of the exchange operation. As will be understood, according to this embodiment, the opening to the air is minimized without breakage of the entire ambience of the apparatus upon the exchange of the mask cassette 1310.

FIG. 35 shows details of the discharge and supply system around the Be window 3512 and the main chamber 3101.

The main chamber 3101 is connected with the RORP 3303 for the coarse vacuum discharging from the atmospheric pressure to 1–0.1 Torr vacuum through a main chamber by-pass valve which will hereinafter be called "MCBPV" 3501, and is also connected with the MNTMP 3306 for discharging it to a degree of vacuum 25 required for exchange with He through a main chamber main valve which will hereinafter be called as "MCMNV" 3502. The main chamber 3101 can be supplied, as supply system, with He through a flow control valve 3503 and a main chamber He inlet valve which will hereinafter be called "MCHeV" 3504; $N_2$ through a main chamber $N_2$ inlet valve which will hereinafter be called "MCN$_2$V" 3505 and air through a main chamber leak valve which will hereinafter be called "MCLV" 3506.

Figure 1:
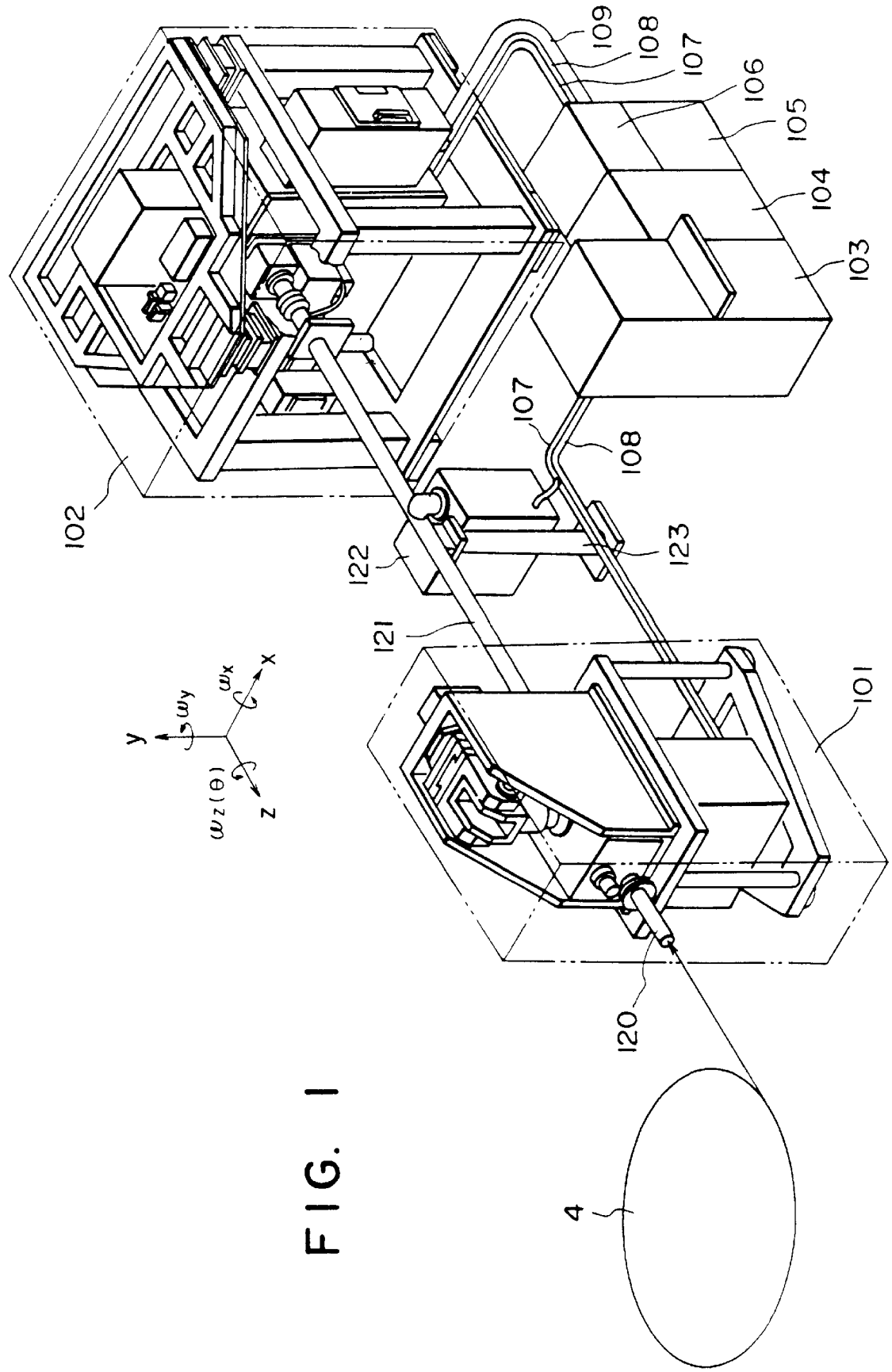
FIG. 1 is a perspective view showing a general arrangement of an exposure apparatus according to an embodiment of the present invention.

Now description will be made as to the pressure and purity control during the exposure. As described hereinbefore, it is desirable to maintain the pressure and purity with precision in order to suppress the change in the X-ray transmissibility resulting from the change of the pressure and purity of the He ambience during the exposure. To accomplish this, according to the present invention, a constant quantity of He gas is continuously supplied to compensate the decrease in the purity of He due to contamination gases leaking into the main chamber 3101, and also, the change in the pressure is suppressed to provide a constant pressure by controlling the degree of opening of the valve. As shown in FIG. 35, the main chamber 310 is connected with, in addition to the two pumps RORP 3303 and MNTMP 3306 for He exchange as described hereinbefore, a gas control oil rotation pump which will hereinafter be called "GCRV" 3509 through a gas content control valve which will hereinafter be called "GCCV" 3507 and a gas content control main valve which will hereinafter be called "GCMNV" 3508, in order to maintain the pressure of the He ambience during the exposure operation. The main chamber 3101 is provided with a main chamber pressure gauge 3510. A gas content controller 3511 is responsive to the signal from the main chamber pressure gauge 3510 to change the opening of the valve GCCV 3507 to maintain a constant pressure in the main chamber 3101. The description will be made as to the suction and discharge system from the Be window 3512 to the mirror port 3105. As shown in FIG. 35, from the main chamber 3101 toward SOR, there are connected a shutter chamber 3104, a Be window 3512, a mirror port 3105, a first mirror port gate valve which will hereinafter be called "first MPGV" 3516, a second mirror port gate valve which will hereinafter be called "second MPGV" 3517 in this order. The second MPGV 3517 is, as shown in FIG. 1, connected to the mirror unit 101 through the beam duct 121. From the standpoint of minimizing the X-ray absorption, the thickness of the Be window 3512 should be as small as possible. As described hereinbefore, in the X-ray exposure apparatus according to this embodiment, the chamber 3101 is filled with a reduced He gas lower than the atmospheric pressure, during the exposure operation.

Therefore, in order to minimize the thickness of the Be window 3512, the pressure difference applied to the Be window 3512 is such that it is not subjected to pressure higher than the reduced He during the exposure. As shown in FIG. 35, in this embodiment, the mirror port 3105 and the main chamber 3101 are connected by a first Be bypass pipe 3520 provided with a first bypass valve which will hereinafter be called "first BeBPV" 3513, so that one side of the Be window 3512 can be communicated with the other side thereof. With this structure, when the main chamber is discharged from the atmospheric pressure condition to the vacuum, and then He is supplied to a predetermined pressure upon starting up Oc the apparatus, or when the apparatuses opening to air for the purpose of maintenance of the main chamber 3101 or the Be widow 3512, the first BeBPV 3513 is opened, by which the vacuum discharging and opening to the air are possible without applying a difference in pressure to the Be window 3512.

During the exposure operation, a pressure is applied only to one side of the Be window 3512, that is, the main chamber 3101 is filled with He under pressure lower than the atmospheric pressure, while the mirror port 3105 is under vacuum, the Be window 3512 is applied with the pressure difference, and therefore, is bent to a quite large extent. If the first BeBPV 3513 is opened, the pressure difference is abruptly removed with the result of great damage to the Be window 3512. To obviate this problem, a second Be bypass pipe 3512 is provided, with a Be conductance pipe 3515 having a large fluid resistivity and a second Be bypass valve which will hereinafter be called "second BeBPV" 3514 to connect one side of the first BeBPV 3513 to the other side thereof in parallel with the first Be bypass pipe 3520.

In FIG. 35, when the differential pressure is removed by communicating both sides of the Be window 3512, the second BeBP 3514 is opened to gradually reduce the pressure difference, and thereafter, the first BeBPV 3513 is opened to completely remove the pressure difference.

As shown in FIG. 35, one side of the first MPGV 3516 is communicated with the other side thereof by a mirror port gate valve bypass pipe 3522 provided with a mirror port bypass valve which will hereinafter be called "MPBPV" 3518. When the exposure operation is not carried out for a long period of time, the first MPGV 3516 is closed, and the valve MPBPV 3518 is opened to maintain the vacuum of the mirror port, and to minimize the influence to the SOR ring due to the break of the Be window 3512 upon an avoidable leakage of the main chamber 3101.

An electric control system according to this embodiment will be described.

Figure 36:
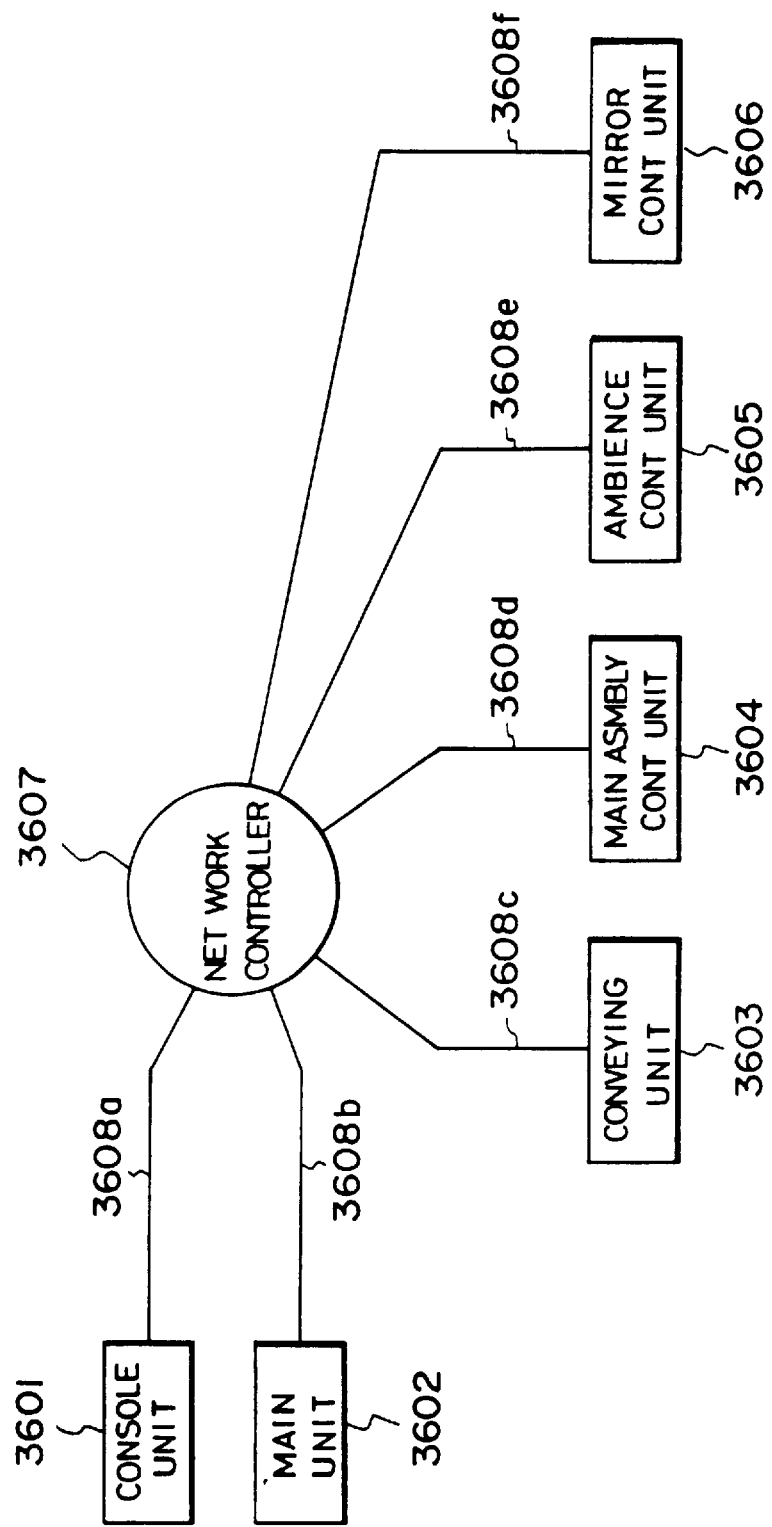
FIG. 36 is a block diagram of the entire control system for the X-ray exposure apparatus.

Referring to FIG. 36, there are shown a console unit 3601 for display, input and accumulation of various controlling information, a main unit 3602 for central control of the sequential operations of the entire exposure apparatus, a conveying unit 3603 for controlling conveyance of the mask 2 and the wafer 3, a main assembly controlling unit 3604 for controlling the alignment and step exposure which are the main function of the exposure apparatus, an ambience control unit for control to provide the temperature, pressure and the gas ambience appropriate to the exposure apparatus, a mirror control unit for controlling the X-ray mirror to apply the X-rays for the exposure onto the mask, a network controller 3607 for relaying and exchanging communication among units and communication passages 3608a–3608f for connecting the units and the network controller 3607.

Figure 37:
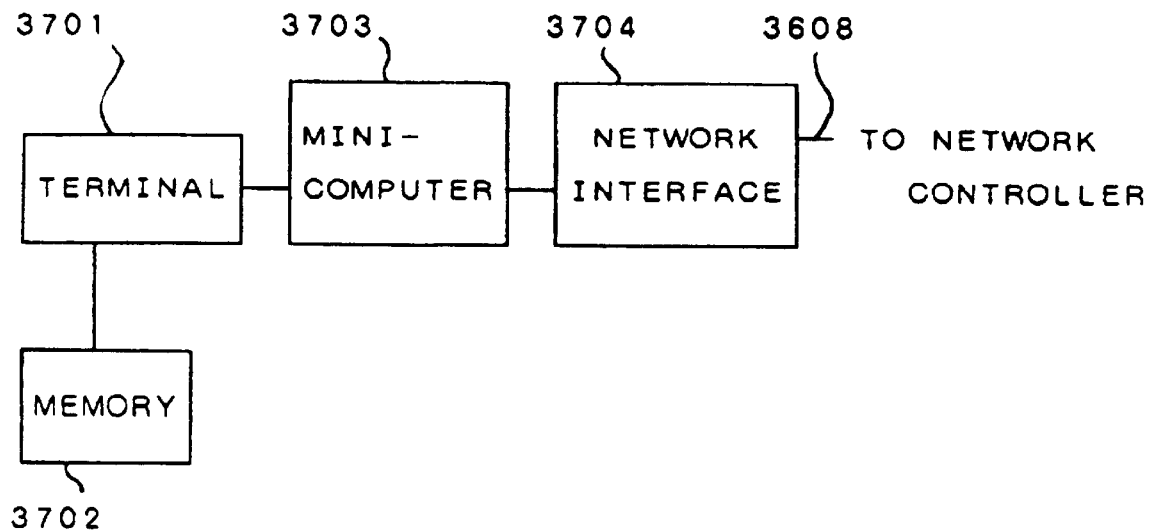
FIG. 37 is a block diagram for a console unit.

FIG. 37 shows details Oc the console unit 3601, which comprises a terminal for displaying and inputting various data associated with control of the exposure apparatus, memory device 3702 for accumulating and storing various states associated with control of the exposure apparatus, a mini-computer (main body) 3707 for central control of the console unit 3601 and a network interface 3704 for communication with the other units through the communication passage 3608a.

Figure 38:
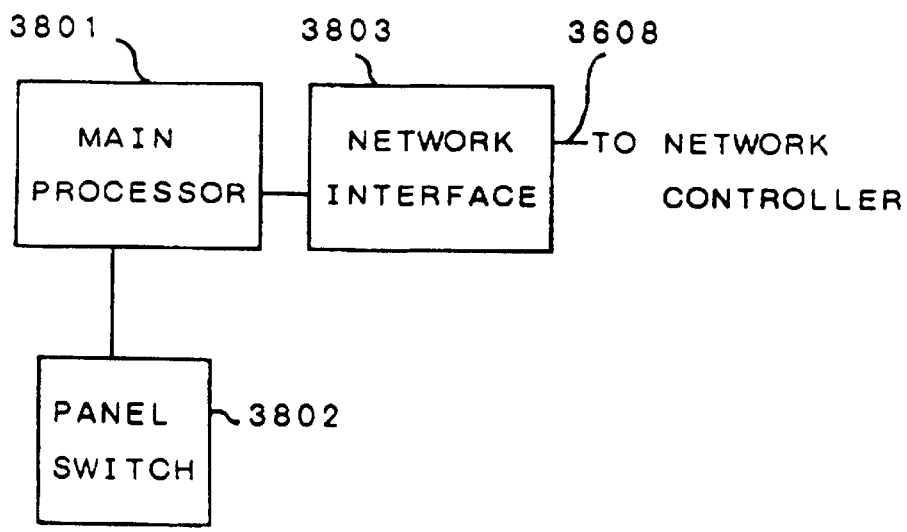
FIG. 38 is a block diagram of a main unit.

FIG. 38 shows details of the main unit 3602, which comprises a main processor 3801 for central control of the main unit 3602, a panel switch 3802 for interface between the exposure apparatus and operator and a network interface 3803 for communication with the other units through the communication passage 3608b.

Figure 39:
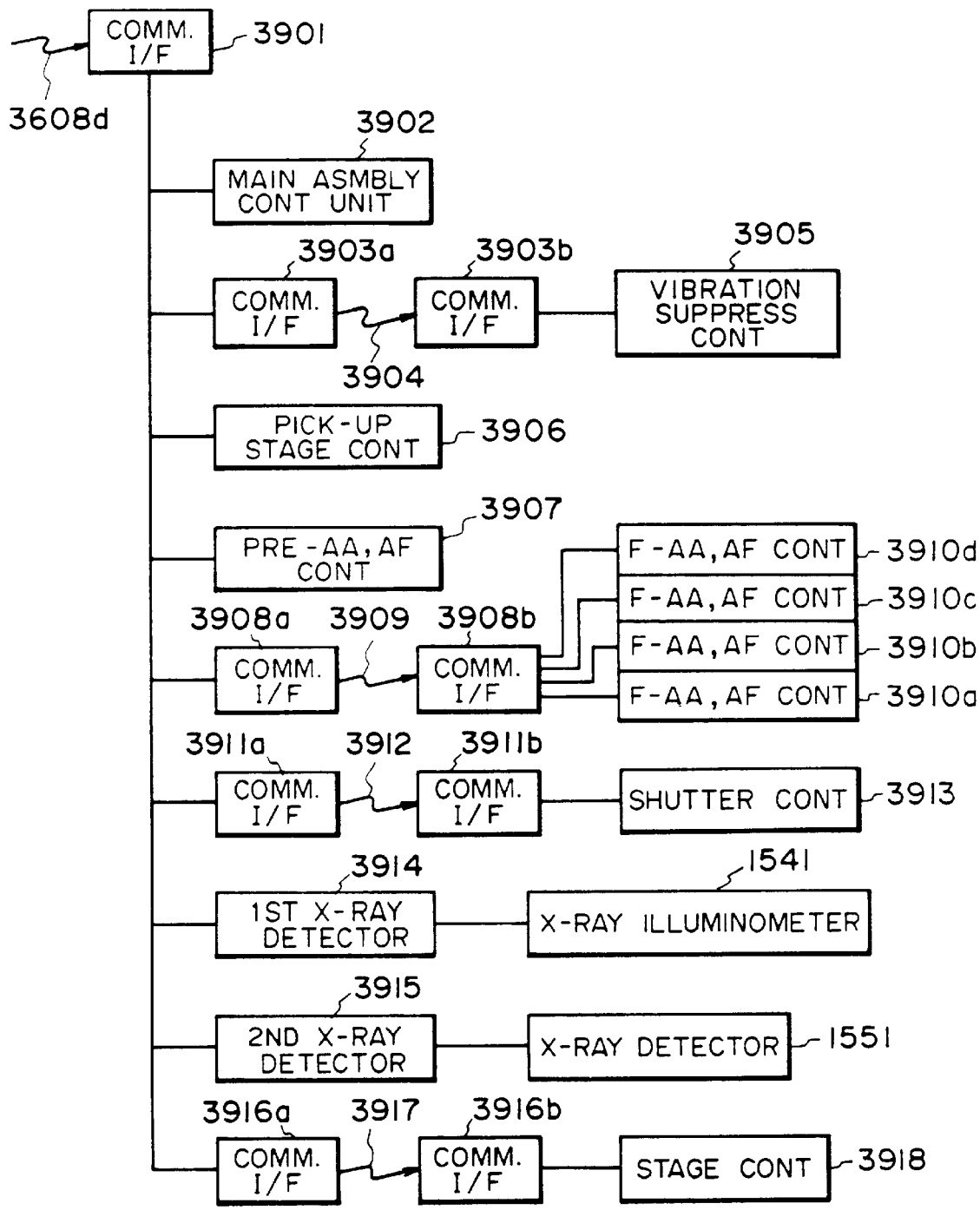
FIG. 39 is a block diagram of a control unit for the main assembly.

FIG. 39 is a block diagram of the control unit 3604. The control unit 3604 includes a pickup stage controlling section 3906 for controlling positioning of the four pickup devices 2401 (FIG. 24) in two axis directions ($\alpha$ axis and $\beta$ axis) in the alignment system, an automatic prealignment and automatic focusing controlling section 3907 for prealignment and prefocusing of the wafer 3, a fine automatic alignment and automatic focusing controlling section 3910a–3910d for providing parallelism and alignment in the plane parallel to the wafer 3 surface and the mask 2 surface, a shutter controlling section 3913 for driving the exposure shutter apparatus 1308 (FIG. 13) in a predetermined corrected driving pattern, a stage controlling section 3918 for controlling and positioning wafer X, Y coarse stages 20 1710 and 1705 (FIG. 17) and a wafer fine stage 1899 (FIG. 18), a first X-ray detecting section 3914 and a second X-ray detecting section 3915. To the control unit 3604, there is connected a vibration suppressing system controlling section 3904 for controlling a constant pose of the exposure unit 102 relative to the X-rays 1. The main assembly control unit 3902 stores a program for predetermined sequential operations, and the above controlling sections are operated under the sequence stored. The control unit 3902 is connected with a higher rank main unit 3602 through a communication passage 3608d and a communication interface 3901 for communication therewith. The vibration suppressing system controlling section 3905 among the controlling sections is provided with a communicating interface 3903b and is communicated through the communication interface 3903 and the communication passage 3904 of the control unit 3902. With those structures, the controlling sections can be operated independently from each other, or in a cascading manner.

This structure is the same as with the communicating interfaces 3908a and 3908b and the communication passage 3909 related to the fine automatic alignment and automatic focusing controlling section 3910, with the communication interfaces 3911a and 3911b and the communication passage 3912 associated with the shutter controlling section 3913 and with the communication interfaces 3916a and 3916b and the communication passage 3917 relating to the stage controlling section 3918.

As regards the transfer of the data relative to the control unit 3902, the drive of each of the four pickup stages 2411 are downloaded in the pickup stage controlling section 3906 and in the automatic prealignment and automatic focusing controlling section 3906. In the automatic prealignment and automatic focusing controlling section 3907, the gap measured by the automatic prefocusing and the central position of the prealignment mark detected by the prealignment system are uploaded to the unit controller 3902. In the fine automatic alignment and automatic focusing sections 3910a–3910d, the deviation ($\Delta$xu, $\Delta$xd, $\Delta$xr, $\Delta$xe), ($\Delta$yu, $\Delta$yd, $\Delta$yy, $\Delta$yl) and the gap (zu, zd, zr, ze) between the mask 2 and the wafer 3 are uploaded. In the shutter controlling section 3913, the shutter driving table is downloaded, and in the stage controlling section 3918, the drive for the axes of the coarse and fine stages and mask stage are downloaded from the control unit 3902.

In the first X-ray detecting section 3914, an output from the X-ray illuminometer 1541 which is one of the constituent elements of the exposure shutter apparatus 1308 is amplified, and the X-ray illuminance is transferred to the control unit 3902. Similarly, in the second X-ray detecting section 3915, the X-ray illuminance measured by the X-ray detector 1551 mounted on the wafer fine stage 1899 is received and amplified and is transferred to the control unit 3902. The vibration suppressing controlling section 3905 produces an emergency signal to the control unit 3902 upon deviation of the pose of the exposure unit 102 beyond a predetermined tolerance.

Referring to FIG. 39 the fine automatic alignment and automatic focusing controlling section 3910a–3910d will be described in detail. Although there are four blocks of the controlling sections 3910a–3910d, they are of the same structure, and therefore, only one block will be described in the following description for simplicity.

Figure 40:
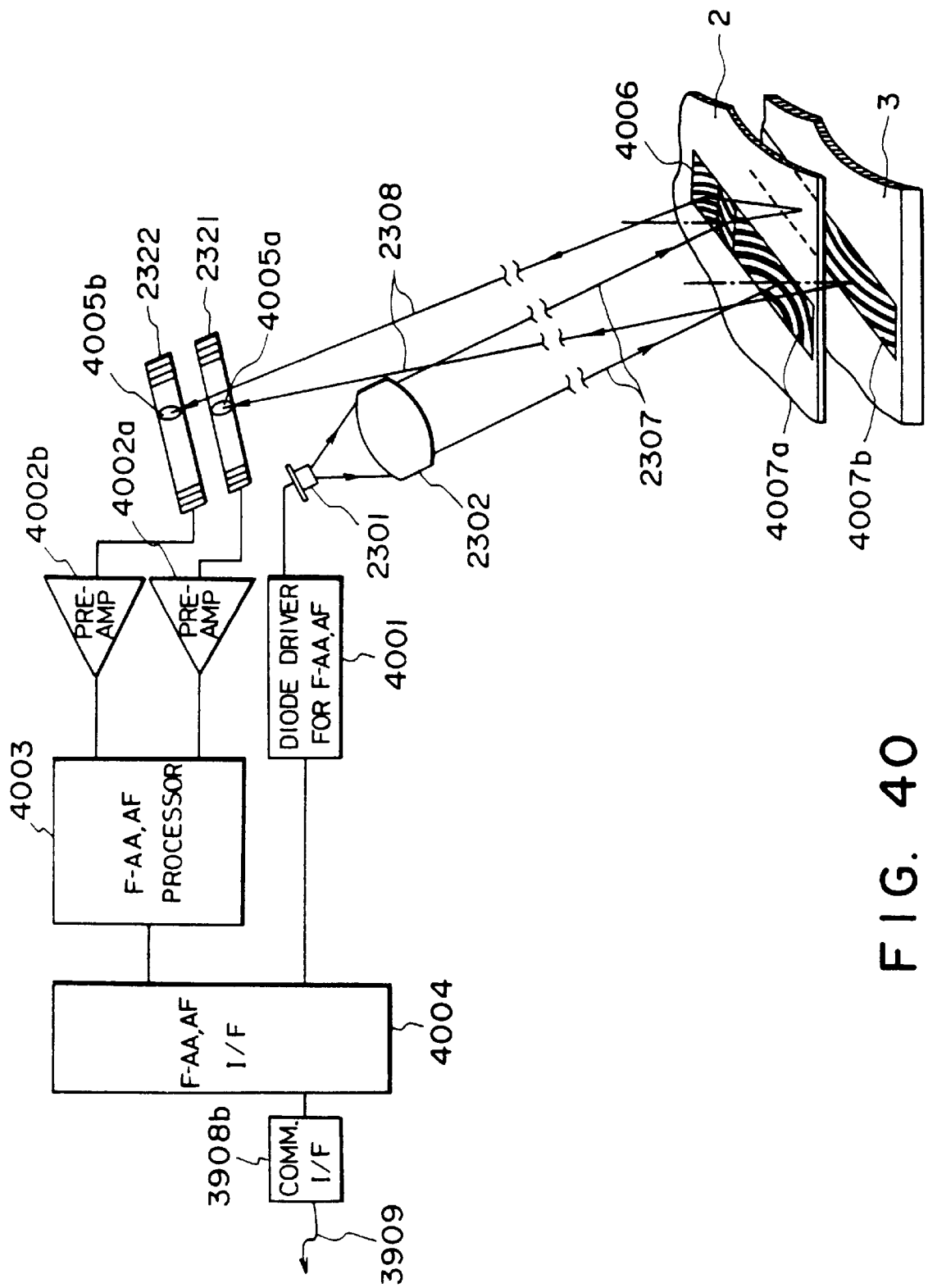
FIG. 40 is a block diagram for fine automatic alignment and fine automatic focusing.
Figure 41:
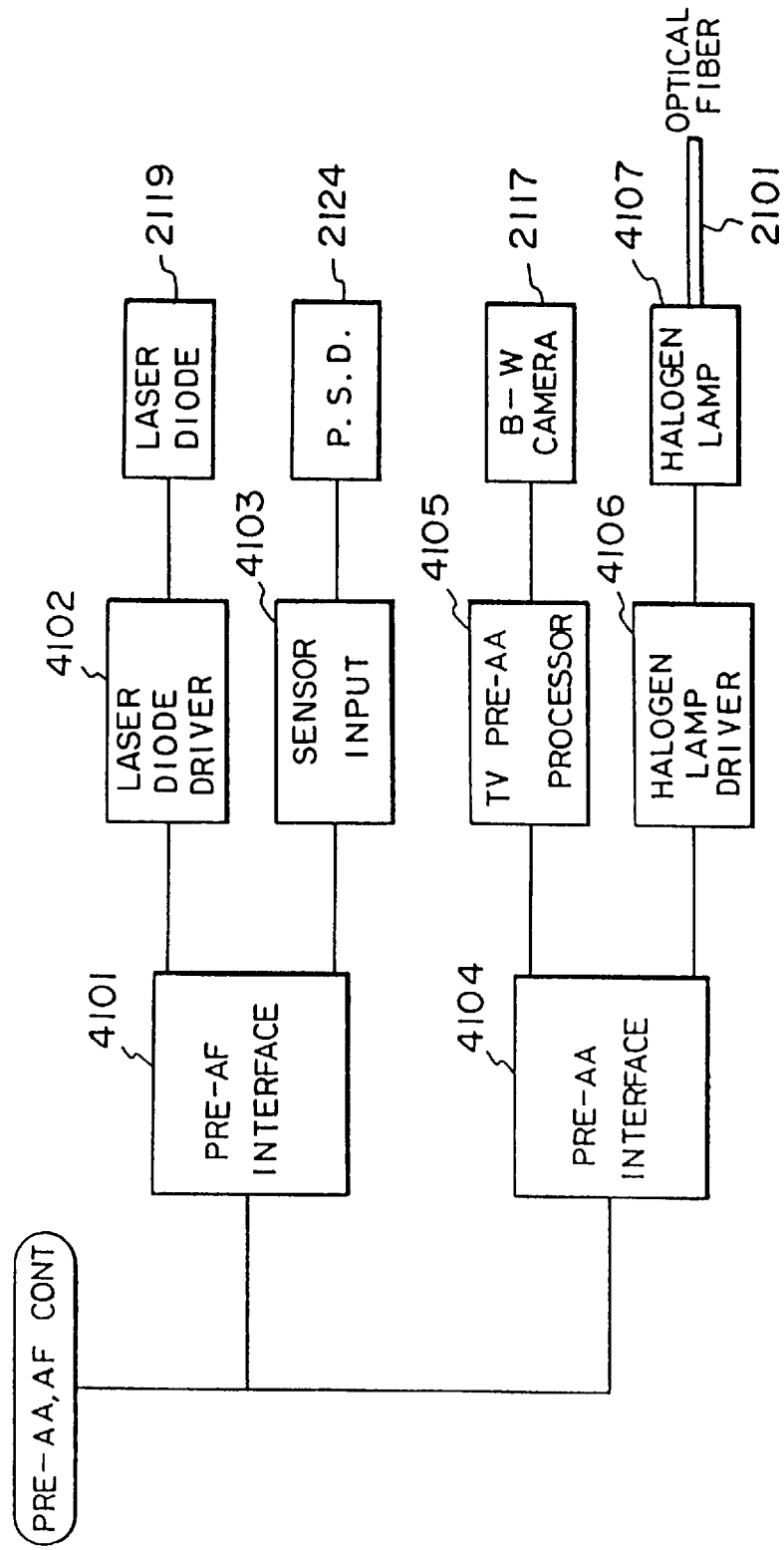
FIG. 41 is a block diagram of an automatic prealignment control system and an automatic pre-focusing system.

FIG. 40 shows the structures of the fine automatic alignment and automatic focusing controlling sections 3910a–3910d, in which the elements shown in FIG. 23 are omitted. In FIG. 40, there are shown a communication path 3909 for communication with the main assembly controlling unit 3902 shown in FIG. 39, a communication interface 3908b for reception of instructions through the communication path 3909 and transmission of alignment information and gap information, and fine alignment and focusing interface 4004 for receiving instructions from the communication interface 3908b, producing signals for alignment measurement and gap measurement and transmitting the alignment information and the gap information to the communication interface 3908b. A fine alignment and focusing laser diode driver 4001 drives the semiconductor laser 2301 by the light output determined by the fine alignment and focusing interface 4004. A semiconductor laser 2301 produces a laser beam 2307 which is collimated by a collimator lens 2302. The mask 2 has thereon an automatic focusing mark formed by gold or the like together with the semiconductor circuit pattern, and a mask alignment mark 4007a formed by gold together with the semiconductor circuit pattern. The mask 3 has thereon a wafer alignment mark 4007b which is formed on the wafer 3 by the previous exposure shot together with the semiconductor circuit pattern. Designated by a reference numeral 2308 is a beam bearing alignment mark information and gap information by an optical system constituted by the mask alignment mark 4007a, a wafer alignment mark 4007b, the automatic focusing mark 4006 and the wafer 3. Designated by 4005a is an automatic alignment spot formed by a beam bearing the alignment information provided by the optical system constituted by the mask alignment 4007a and the wafer alignment mark 4007b. An automatic focusing spot 4005b is formed by a beam 20 bearing gap information provided by an optical system constituted by the mask automatic focusing mark 4006 and the wafer 3. The automatic alignment spot 4005a bearing the alignment information is received by an automatic alignment sensor 2321 which is, for example, a CCD line sensor or the like to receive the spot beam to convert it to an electric signal. The AF spot 4005b bearing the gap information is received by an automatic focusing sensor 2322 which is a CCD or the like line sensor, for example, to receive the spot beam and convert it to an electric signal. The output of the automatic alignment sensor 2321 is amplified by,an preamplifier 4002a, and an output of an automatic focusing sensor is amplified by a preamplifier 4002b. A fine automatic alignment and automatic focusing signal processing station 4003 processes the signals from the preamplifier 4002a to calculate out the alignment information and also processes the output from the preamplifier 4002b to calculate out the gap information.

In FIG. 40, the alignment information (deviation between the mask and the wafer can be determined in this manner) can be obtained in the following manner. The diode driver 4001 drives the semiconductor laser 2301 with the light output set by the fine alignment and focusing interface 4004, the light output being sufficiently large within the limit of non-saturation of the automatic alignment sensor 2321. The beam emitted from the semiconductor laser 2301 is formed into a projection means 2307 after passing through the collimator lens, and is passed through the automatic alignment mark 4007a on the mask 2. It is then reflected by the wafer alignment mark 4007b, and the reflected beam 2308 is incident on the automatic alignment sensor 2321 as an automatic alignment spot 4005a.

The mask automatic alignment mark 4007a and the wafer automatic alignment mark 4007b constitute double grating physical optical elements to form the automatic alignment spot 4005a with enlarged deviation, for example, enlarged by 100 times. The output of the sensor 2321 receiving the spot 4005a is amplified by the preamplifier 4002a and is introduced into the signal processing station 4003. The signal processing station 4003 determines a centroid of the spot 4005a incident on the sensor 2321. By multiplying the deviation of the centroid of the spot by $1/100$, the deviation between the mask alignment mark 4007a and the wafer alignment mark 4007b, that is, between the mask 2 and the wafer 3 may be determined.

The gap information can be determined in the following manner in FIG. 40. The laser diode driver 4001 drives the semiconductor laser 2301 with the light output determined by the fine alignment focusing interface 4004, the light output is sufficiently large under the condition that the automatic focusing system 2322 is not saturated. The beam emitted from the semiconductor laser 2301 is transmitted through a collimator lens 3202, by which it is formed into a projection beam 2307. It is transmitted through the automatic focusing mark 4006, and is reflected by the wafer 3. The reflected beam 2308 is incident on the automatic focusing sensor 2322 as an automatic focusing spot 4005b. The focusing mark 4006 is formed as two grating lenses on the mask 2, and it produces deviation of the focusing spot 4005b by enlarging the surface space between the mask 2 and the wafer 3 multiplied by 15, for example. The output of the focusing sensor 2322 is amplified by the preamplifier 4002b and is transmitted to the signal processing station 4003. The signal processing station 4003 determines the position of the focusing spot 4005b incident on the focusing sensor 2322 using the centroids.

By multiplying the deviation of the focusing spot 4005b by $1/15$, for example, the distance between the mask focusing mark 4006 and the wafer 3, that is, between the mask 2 and the wafer 3 can be determined.

The signal processing station 4003 may be an analog circuit. Or, it can be of digital type wherein the outputs of the preamplifier 4002a and 4002b are digitalized by an unshown A/D converter and is supplied to a microcomputer or the like. The fine alignment and focusing interface is responsive to the instructions of the main assembly control unit 3902 to determine the alignment information and the gap information, and can transmit them to the control unit 3902 through the communication interface 3908b and the communication and focusing controlling section 3907. The block is constituted by a prefocusing system and a prealignment control system. The amount of light produced by the laser diode 2119 (FIG. 21) in the automatic prefocusing system is determined by a voltage applied to the laser diode driver 4102 instructed from the automatic prefocusing interface 4101. The position detector PSD 2124 (FIG. 21) receives the light reflected by the wafer 3. The output thereof is amplified in the sensor input section 4103. The automatic prefocusing interface 4101 transfers the gap corresponding to the wafer 3 position and corresponding to the output to output to the upper rank control unit 3902.

In the automatic prealignment control system, a light amount of the halogen lamp 4107 is determined in the prealignment interface 4104, and the lamp voltage is outputted from the halogen lamp driver 4106. The light from the halogen lamp 4107 is applied onto the wafer 3 through an optical fiber 2101 (FIG. 21), and an image of the prealignment mark 7503 or 7504 (FIG. 75) reflected by the wafer 3 is received by the black and white camera 2117. A video output from the black and the white camera 2117 is transmitted to the TV prealignment signal processing station 4105. Here, the central position of the prealignment mark is detected by processing the image with reference to the objective lens 2106. The central position is transferred to the control unit 3902 through the interface 4104.

Figure 42:
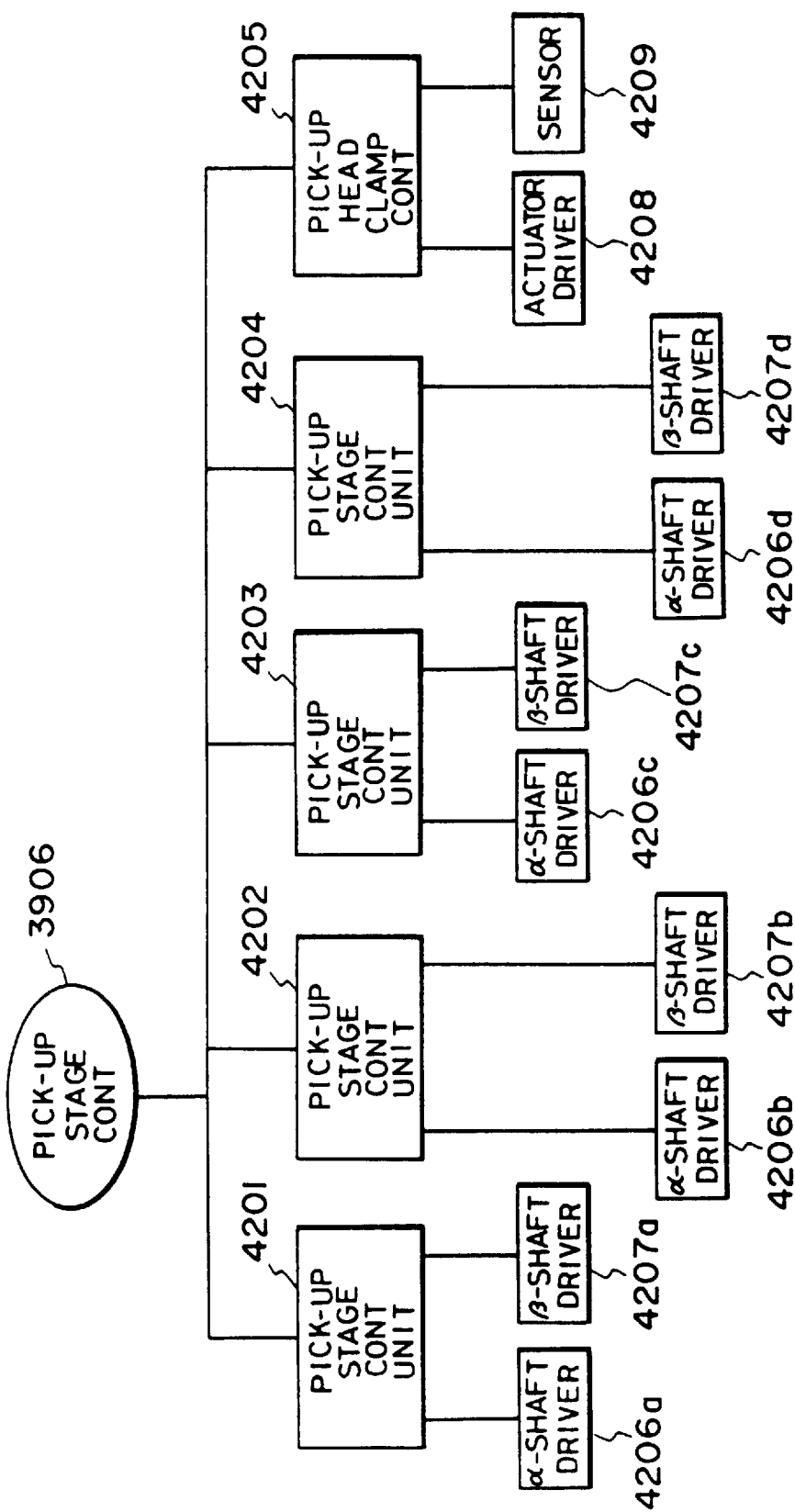
FIG. 42 is a block diagram of a pickup stage control system.

FIG. 42 shows an electric block for controlling an α direction actuator unit 2415 and a β direction actuator unit 2413 shown in FIG. 24 and an electric block for controlling mechanical cramp of the pickup devices 2401.

Referring back to FIG. 39 the pickup stage controlling section 3906 includes pickup stage controlling units 4201–4204 (four units) and a pickup head cramp controlling section 4205. The pickup stage controlling units 4201–4204 have a function of producing the number of pulses corresponding to the driving distance to the drivers 4206a–4206d and to the α drivers 4207a–4207d which are drivers for the a actuator unit 2415 and the β actuator unit 2413, and a function of producing a pattern of supplying the pulses in the form of a trapezoidal pattern from the target position instructed from the control unit 3902 so as not to impart a shock to the pickup devices 2401.

The α axis drivers 4206a–4206d and β axis drivers 4207a–4207d are drivers for DC motors, and it is possible that in response to the instructions from the main control unit 3902, its servo loop is shut off. The pickup head cramp controlling section 4205 includes a driver 4208 for an actuator for pressing the pickup device 2401 to the pickup reference surfaces 2401 in order to reduce the position control error by pitching and rolling of the pickup device 2401, and a sensor 4209 for confirming the pressing. In this embodiment, as described in conjunction with FIG. 24, only one electromagnetic valve (not shown) for compressed air operable to press the pickups 2401 is provided for four pickup stages 2411. However, the sensor (not shown) for confirmation of the pressed state is provided for each of the pickup stages, and therefore the sensor 4209 is provided with four channel inputs.

Figure 43:
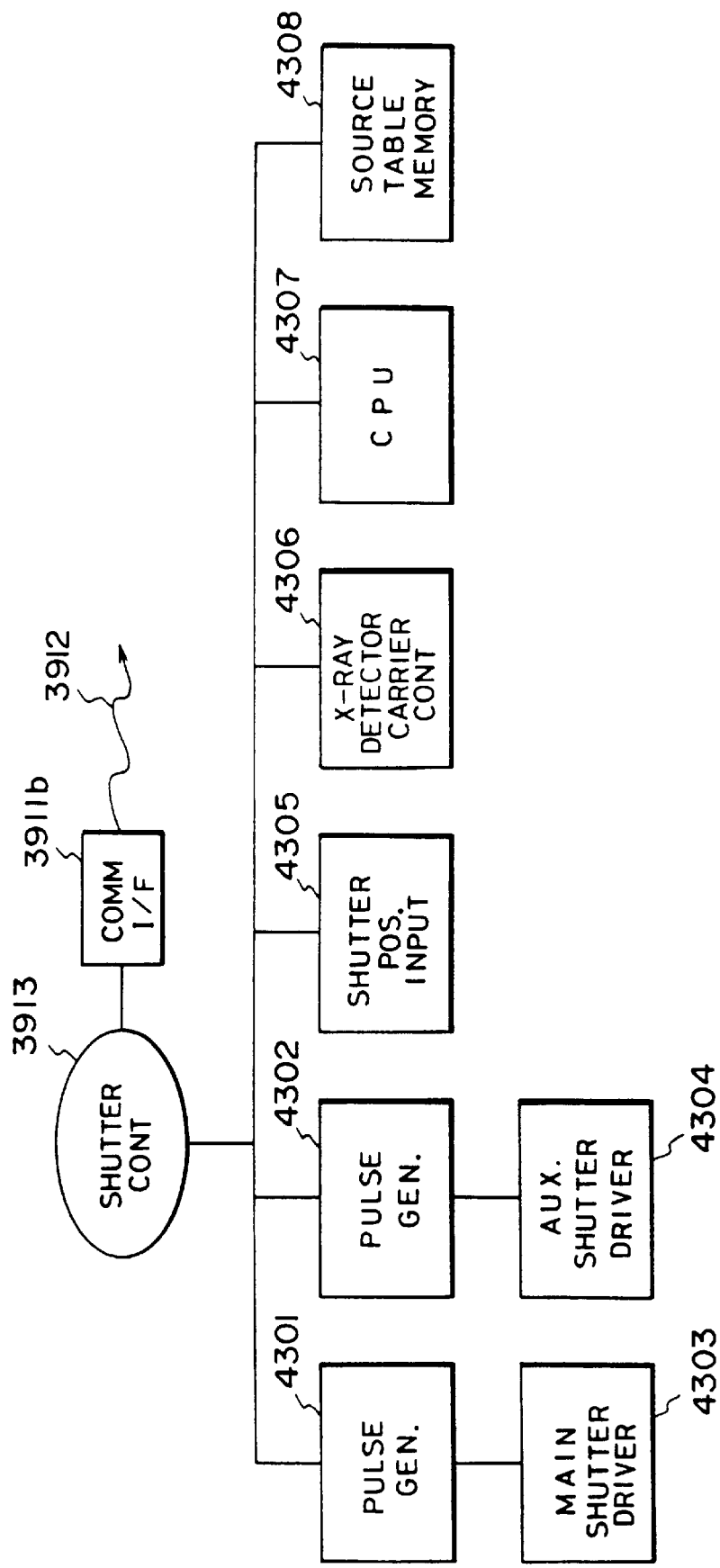
FIG. 43 is a block diagram of a shutter control system.

FIG. 43 is a block diagram for the control of the main shutter unit 1501, the auxiliary shutter unit 1502, and the actuator unit 1547 for positioning the carriage 1542 carrying the X-ray illuminometer 1541. The shutter controlling section 3913 is controlled through the communication interface 3911a and 3911b by the control unit 3902 shown in FIG. 39, and is provided with a CPU 4307 exclusively for the shutter controlling section 3913. To accomplish the uniform exposure, a shutter driving table is stored in a source table memory 4308. The CPU 4307 selects a proper one from the shutter driving table groups stored in the source table memory 4308 and transmit it to the driving table memory 4402 (FIG. 44) in the pulse generators 4301 and 4302. During the transmission, it is possible for the CPU 4307 to impart numerical processing to the shutter driving table. The pulse generator 4301 and the pulse generator 4302 are the same with the exception that the address arrangements seen from the CPU 4307 are different.

The shutter driving table now in the driving table memory 4402 of the pulse generators 4301 and 4302 starts to be read in response to starting instruction from the CPU 4307, by which output pulses with pulse intervals proportional to the stored data are supplied to the main shutter driver 4303 and the auxiliary shutter driver 4304 which are actuator drivers for the shutter apparatus. The intervals between the produced pulses correspond to the content of one word of the data stored in the driving table memory. Therefore, it is preferable that the pulses are not stagnated in the actuator drivers for the main shutter driver 4303 or the auxiliary shutter driver 4304. Therefore, the drivers are of a microstep pulse motor driver type or PLL DC motor driver type, for example. In this embodiment, a five phase microstep pulse motor is used as the actuator, and a five phase microstep pulse motor driver is used for the driver.

The shutter position signal input portion 4305 is an interface for receiving signals from the photointerruptor 1537, the timing sensor 1536 or the like shown in FIG. 15. By receiving those signals, the CPU 4307 knows the positions of the steel belt 1513 and 1517, and therefore, the possible error by slip occurred between the driving drums 1511 and 1515 and the associated steel belts 1513 and 1517 are not integrated.

The X-ray detector carrier controlling section 4306 is to control the actuator unit 1547 for controlling the position of the carriage 1542 carrying the X-ray illuminometer 1541 shown in FIG. 15.

Figure 4A:
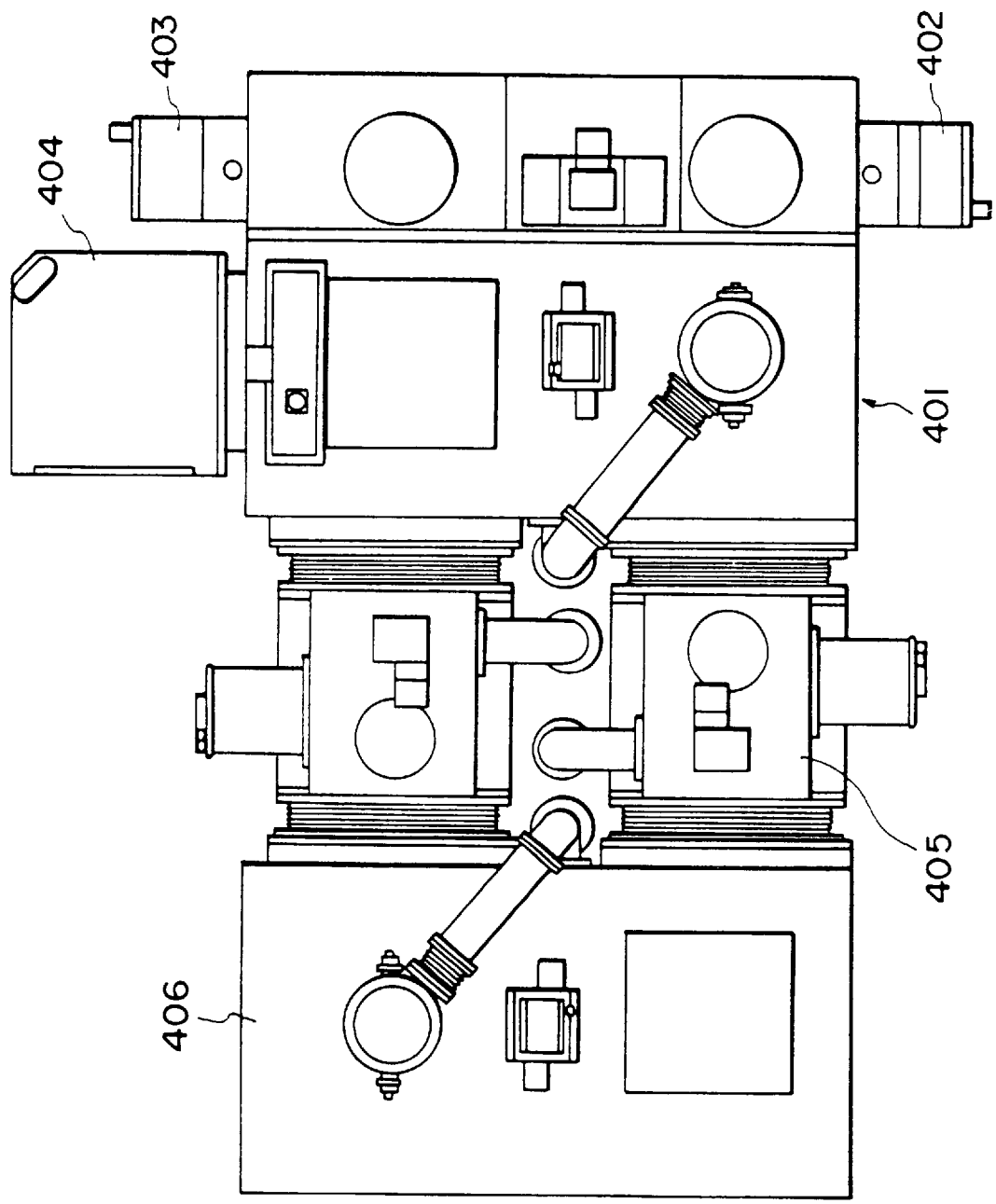
FIG. 4A is a top plan view of a conventional X-ray exposure apparatus.
Figure 4B:
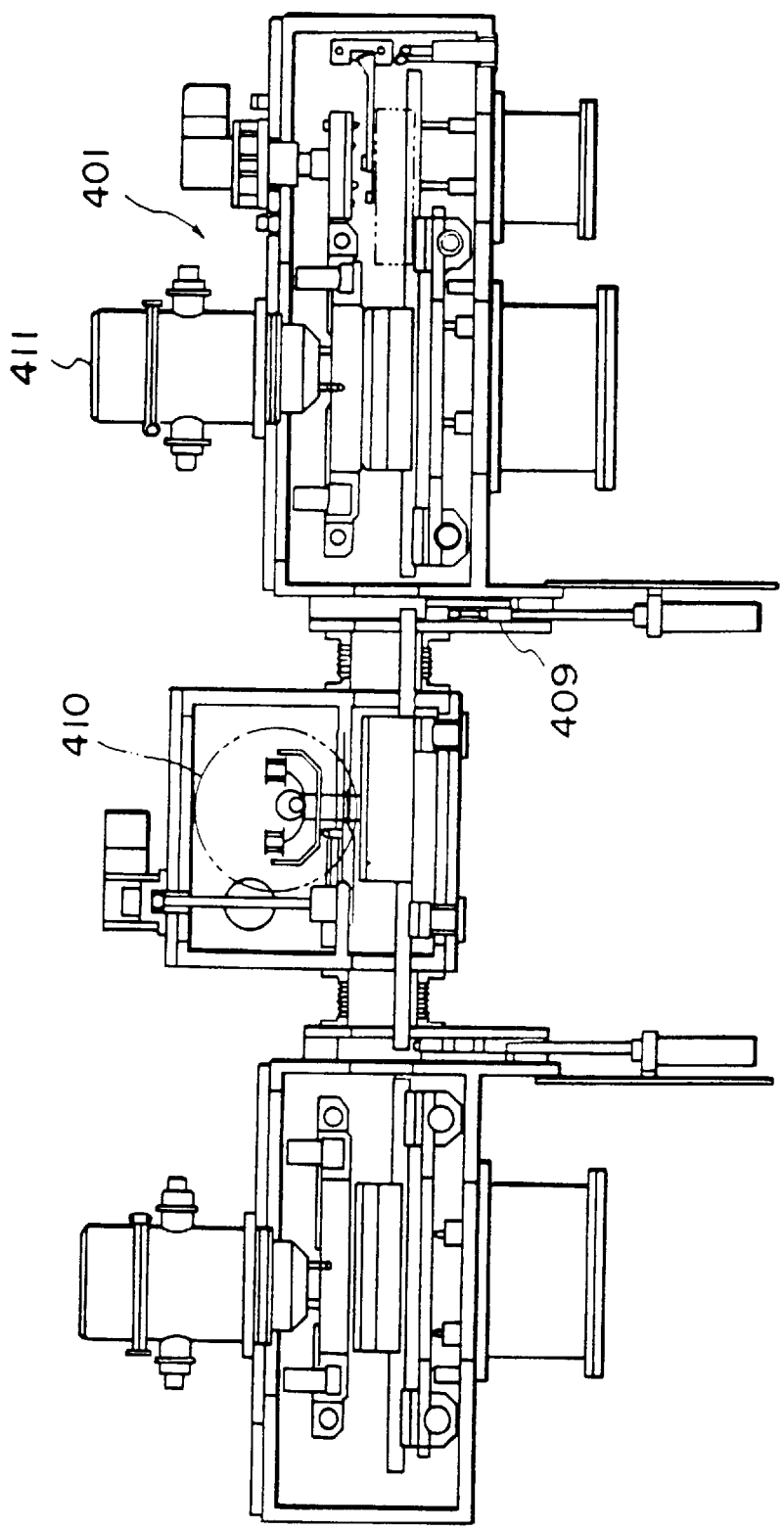
FIG. 4B is a sectional view of a conventional X-ray exposure apparatus.
Figure 5:
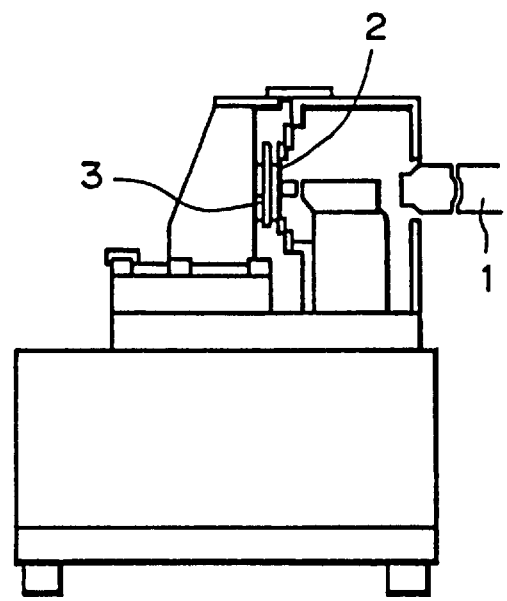
FIG. 5 is a side view of a conventional SOR X-ray exposure apparatus.
Figure 6A:
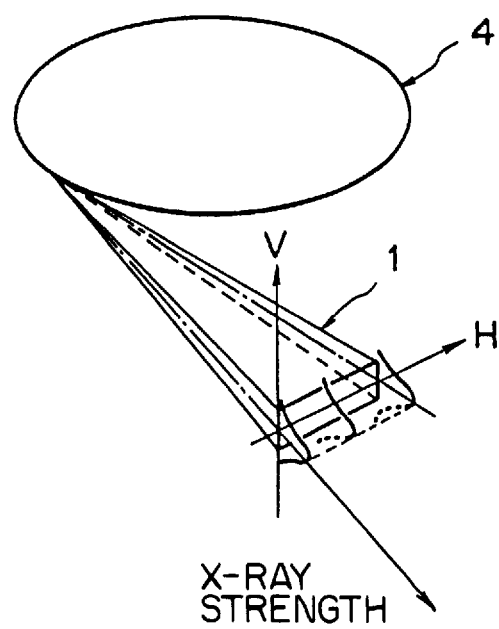
FIG. 6A is a perspective view of an SOR ring illustrating a property of the X-ray strength distribution.
Figure 6B:
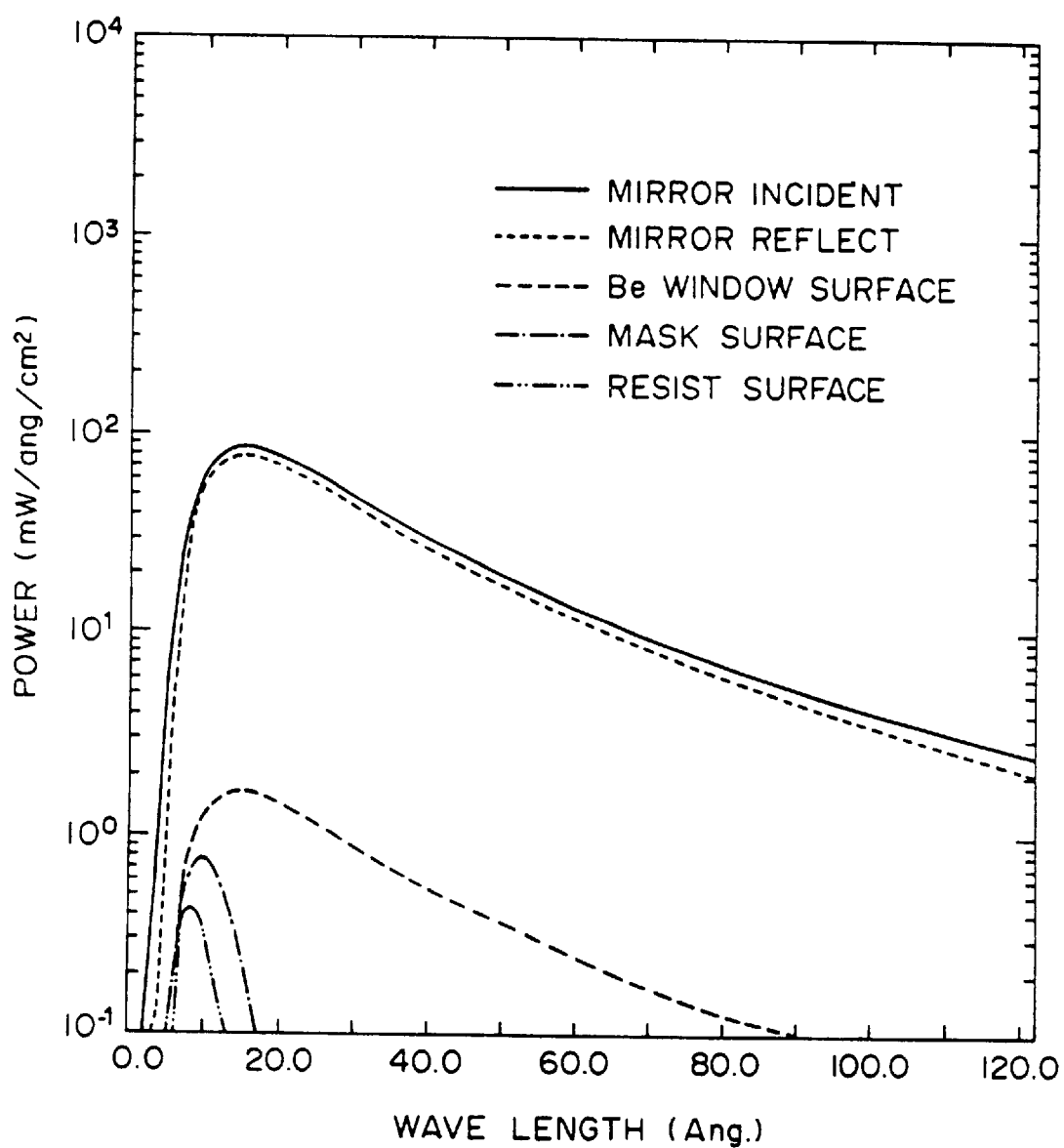
FIG. 6B is a graph of X-ray power vs. wavelength.
Figure 7A:
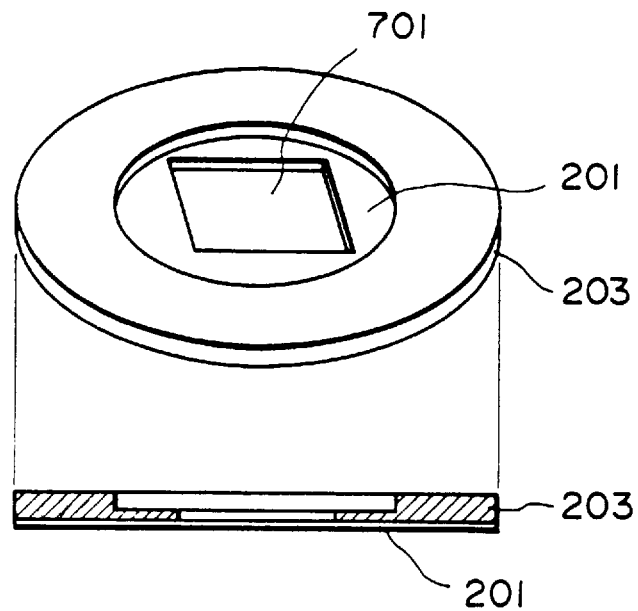
FIG. 7A is a perspective view of a mask using inorganic substrate material.
Figure 7B:
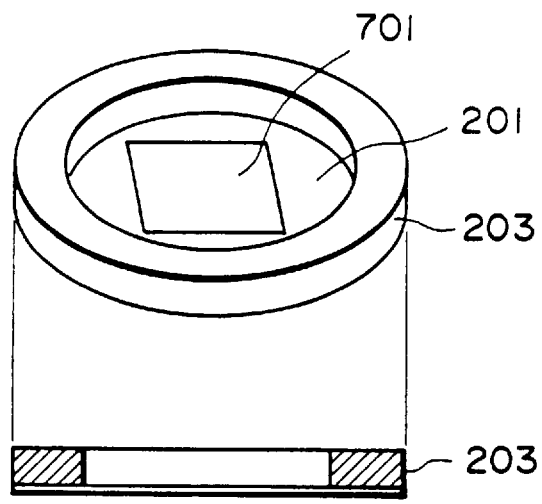
FIG. 7B is a perspective view of a mask using organic substrate material.
Figure 44:
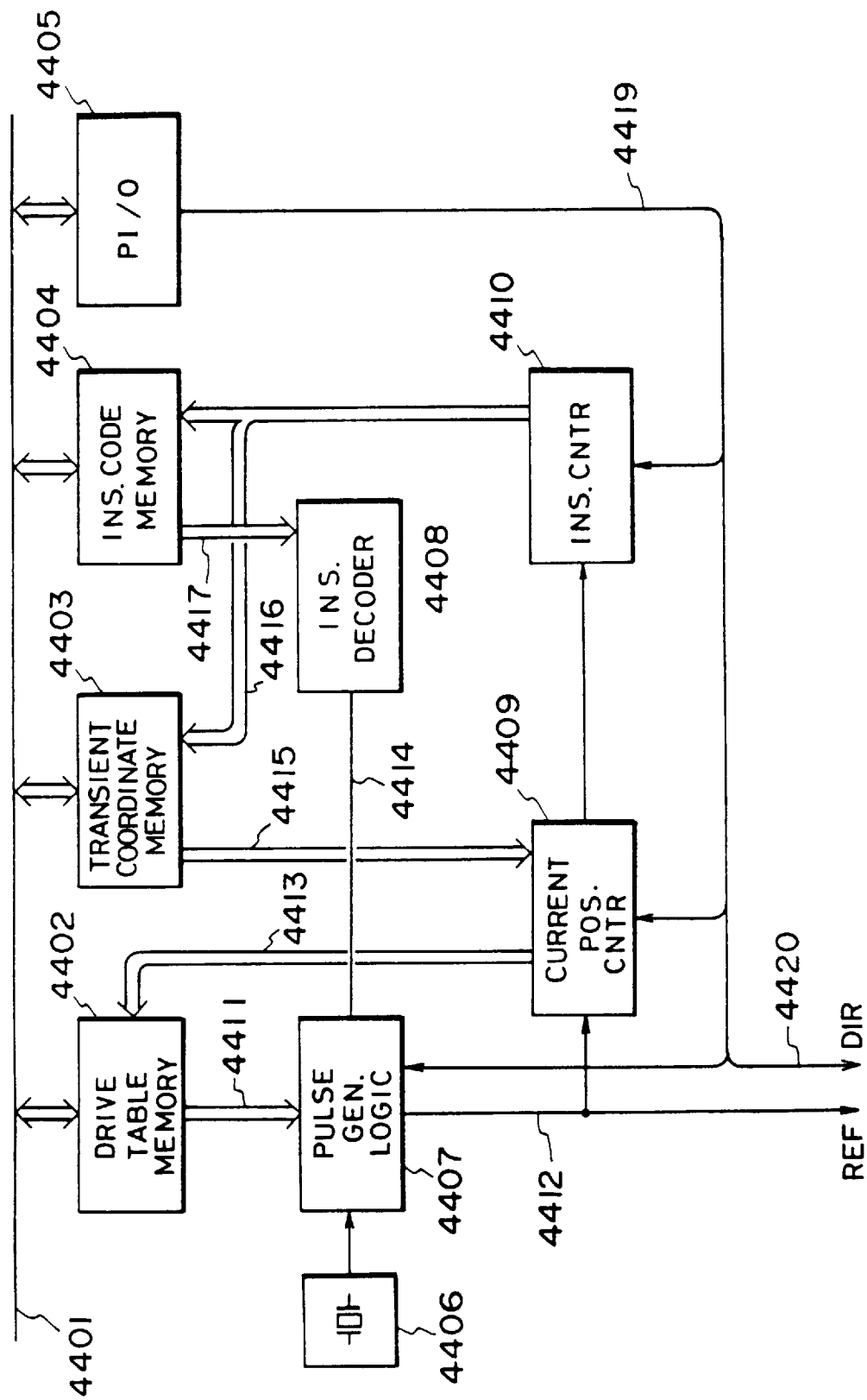
FIG. 44 is a block diagram of a pulse generator circuit.

FIG. 44 is a circuit block diagram of the pulse generator 4302 explained in conjunction with FIG. 4. The pulse generator 4302 shares the CPU (central processing unit) 4307 and a bus line 4401 in the shutter controlling section 3913. A driving table memory 4402 stores a shutter driving table transmitted from the source table memory 4308 by the CPU 4307. An instruction code memory 4404 programs the shutter driving table reading instruction operational mode such as stopping supply of the pulses, as instruction codes. In the instruction codes, a new one is accessed in response to a trigger supplied by the CPU 4307 through PI/O 4405, and an accord signal 4418 produced when the transient coordinate level stored in the transient coordinate memory 4403 is reached by the count of the current position counter. The instruction counter 4410 counts the trigger signal and the accord signal 4418, and supplies the count as an access address 4416 of the transient coordinate memory 4403 and the instruction code memory 4404. The instruction decoder 4408 decodes the instruction code 4417 produced from the instruction code memory 4404 and drives a control line 4414 for controlling a pulse generating logic 4407. The pulse generating logic 4407, in this embodiment, is constituted by a 16 bit down counter and a random logic. The oscillating circuit 4406 is used as a clock for the 16 bit down counter. When the down counter continues to decrement to zero, 16 bit shutter driving table data 4411 is loaded from the driving table memory, and simultaneously, REF signal 4412 to be supplied to the actuator driver is produced.

The current position counter 4409 counts the driving object on the basis of the REF signal 4412 produced by the pulse generating logic and a direction instruction signal (DIR signal) 4420 produced by the PI/O. The count is produced as a leading address 4413 for the driving table memory 4402, and is compared with transient coordinate data 4415 produced by the transient coordinate memory 4403 to produce accord/non-accord output 4418 as a count up clock 4418 of the instruction counter 4410. The output 4419 from the PI/O 4405 gives control lines for advancing the access address of the instruction code, for stopping the pulse output for emergency and for resetting the count of the instruction counter 4410 or the current position counter 4409. Also, through the input line of the PI/O 4405, the count of the current position counter 4409 or the instruction counter can be read into the CUP 4307, and it is also possible that the status of the pulse generating-logic 4407 is read into the CPU 4307 through the bus line 4010.

Figure 45B:
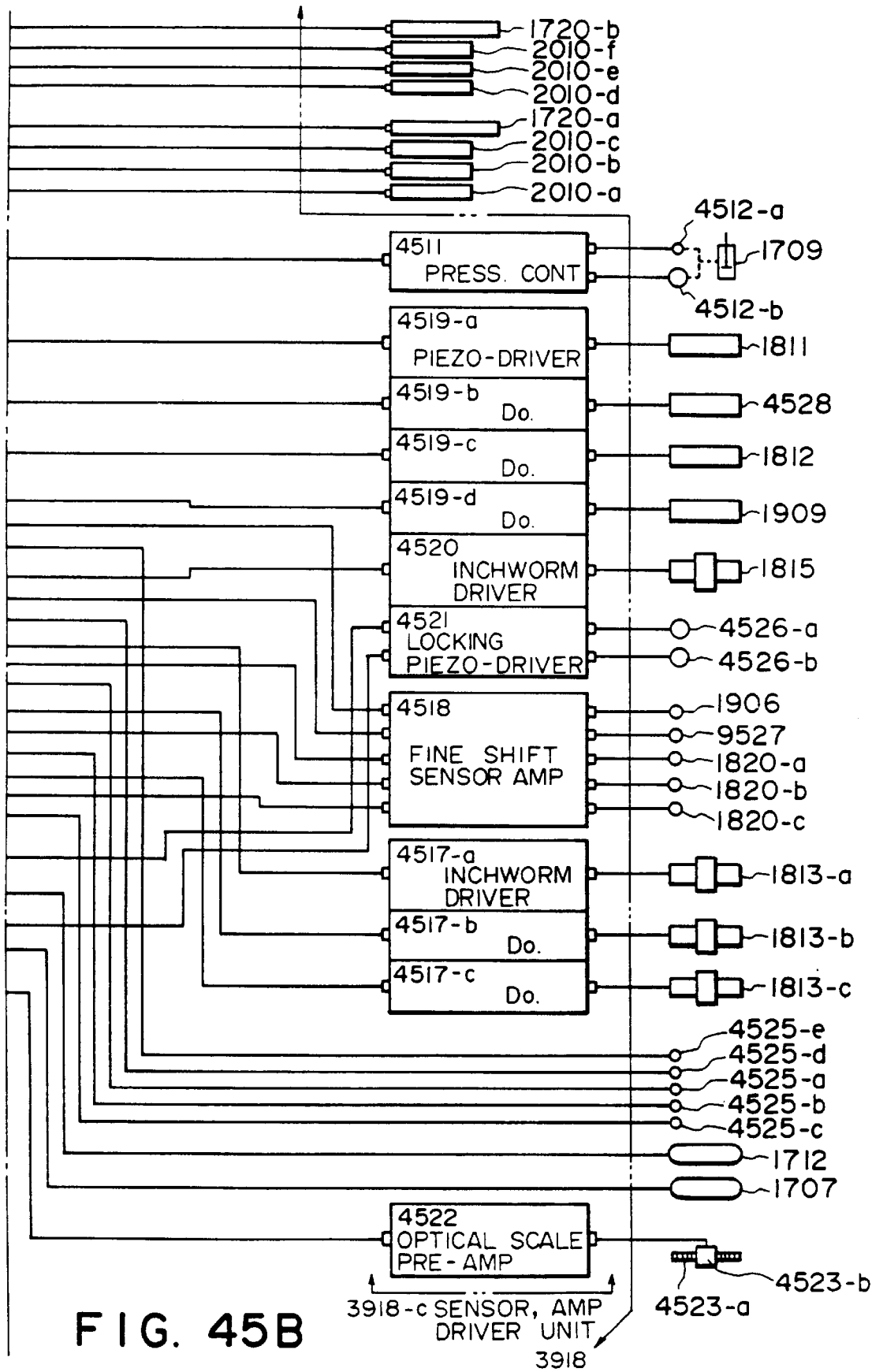
FIG. 45 is a block diagram of a stage control system.

FIG. 45 shows a stage controller 3918 which is to control the positioning of the stage unit shown in FIG. 17. It performs calculation for correction of the position and pose of the stage, processing for the control of the sequential operation, data processing and communication. The stage controlling section 3918 is comprised of a stage control unit 3918a, a compensating circuit unit 3918b and a sensor amplifier driver unit 3918c. The stage control unit 3918a comprises a communication interface 3916b (FIG. 39), an IEEE 488 interface 4504a, an IEEE 488 interface 4504b, a laser distance measuring interfaces 4506a and 4506b, coarse movement controllers 4507a and 4507b, pulse generators 4508a–4508d, servo controller 4509a, 4509b and 4509b and a pressure instructing board 4510 for the balancer. The communication interface 3916b is connected with the control unit 3902 through a communication path 3917 to transfer to and from data, command and status or the like. The interface 4504a is connected to a measurement computer 4505 for monitoring accuracy, timing and current position for positioning of axis of each of the stages. The interface 4504b is for communication of the initializing, data command status or the like of the distance measuring devices 4513a and 4513b. The interfaces 4506a and 4506b read from the distance measurement device 4513b the stage tilt components ωx and ωy. The coarse movement controllers 4507a and 4507b control and instruct the X cylinder 1712 and the Y cylinder 1707 (FIG. 17). The pulse generators 4508a–4508d control and instruct piezoelectric elements 1815 for Θ coarse movement inch worm and for Z tilt driving inch worm 1813(a, b, c) and mask Θ stage 1999. The servo controllers 4509a, 4509b and 4509c control positioning of the fine stage 1899. The instruction board 4510 serves to compensate the coarse stage 1805. The compensation circuit unit 3918b comprises DC motor drivers 4514a and 4514b, inch worm controllers 4515a–4515d and piezoelectric controllers 4516a, 4516b and 4516c. The drivers 4514a and 4514b drive the cylinders 1712 and 1707. The controllers 4514a–4515d effect position feedback control for the piezoelectric elements 1815 of the Θ coarse movement inchworm and the Θ tilt inch worm 1813(a, b, c) and the mask Θ stage 1999. The piezoelectric controllers 4516a and 4516b and 4516c include compensation circuits for controlling the fine movement stage 1899.

The driver unit 3918c comprises an optical scale preamplifier 4522, a fine displacement sensor amplifier 4518, inchworm drivers 4517a, 517b and 4517c, piezoelectric drivers, 4519a–4519d, an inchworm driver 4520, piezoelectric driver 4521 and a pressure controller 4511. The amplifier 4522 is operatively associated with an optical scale 4523 used when the laser beam for X-ray measurement system breaks down. The amplifier 4518 is for displacement sensors 1820 (*a, b, c*) for the Z tilt control, a displacement sensor 1906 for the mask Θ stage and for a displacement center 4527 for coarse Θ movement. The inch worm drivers 4517*a*, 4517*b* and 4517*c* drive Z tilt driving inchworm 1813*a*, 1813*b* and 1813*c*. The piezoelectric driver 4519*a*–4519*d* drives the piezoelectric elements 1811, 4528 and 1812 for fine movement stages for X, Y and Θ directions and the piezoelectric element 1909 for driving the mask Θ stage. The inch worm driver 4520 drives the piezoelectric elements 1814, 1815 and 1816 for coarse Θ inchworm. The piezoelectric driver 4521 drives the locking piezoelectric elements 4526*a* and 4526*b* for locking the coarse X and Y stages. The pressure controller 4511 transmits a signal to and receives a signal from the pressure sensor 4512*a* and the servo valve 4512*b* to control the air pressure of the balancer cylinder 1709.

The positioning in the X direction is controlled in the following manner. When moving instructions are given from the control unit 3902 through the communication interface 3916*b*, the CPU 4501 determines the current position through the servo controller 4509*a*, and the difference the current position from the target position is given to the X coarse controller 4507*a*. Simultaneously, the intermediate position instruction of the piezoelectric element is produced to the piezoelectric element controller 4516*a*. The X coarse controller 4507*a* produces instruction pulses in response to the acceleration and deceleration curves and movement speed corresponding to the movement distance to the DC motor driver 4514*a* to drive the X cylinder motor 1712. After the X cylinder driving motor 1712 stops, the servo controller 4509*a* instructs the difference to the piezoelectric element controller 4516*a*, by which a phase compensated output is applied, to the piezoelectric element driver 4519*a*. The piezoelectric element driver 4519*a* which is a high voltage amplifier amplifies the voltage to collapse or expand the X driving piezoelectric element 1811 to correctly position it in the X direction. The same thing applies in the Y direction. In the Θ direction, there is no coarse movement, but the fine movement by the piezoelectric element 1812 is the same.

In the Z tilt control, the distance measuring device 4513*b* uses the laser distance measuring interfaces 4506*a* and 4506*b*, and the output is used for the motor correcting the tilting component (ωx, ωy). When the amount of the Z tilt is determined, the CPU 4501 calculates out the amount of drive for each of the three inch worms 1813*a*, 1813*b* and 1813*c*, so that the three inch worms are simultaneously operated. Here, the drive of the inchworm 1813*a* will be described. The amount of drive calculated is converted to lines (number) pulses by the pulse generator 4508*a* and then is transmitted to the inchworm controller 4515*a*. The inch worm controller 4515*a* A/D converts the stage position input from the fine displacement sensor amplifier 4518 by the output of the Z tilt controlling displacement sensor 1820*a* output and compares it the count of the instruction pulses. Then, the pulses are produced corresponding to the difference and is supplied to the inch worm driver 4517*a* to drive the Z tilt driving inch worm 1813*a*. The photointerruptor 4525*a* is used to prevent mechanical overrunning and is incorporated in the inch worm controller 4515*a* as an interlock.

Figures 46, 46B:
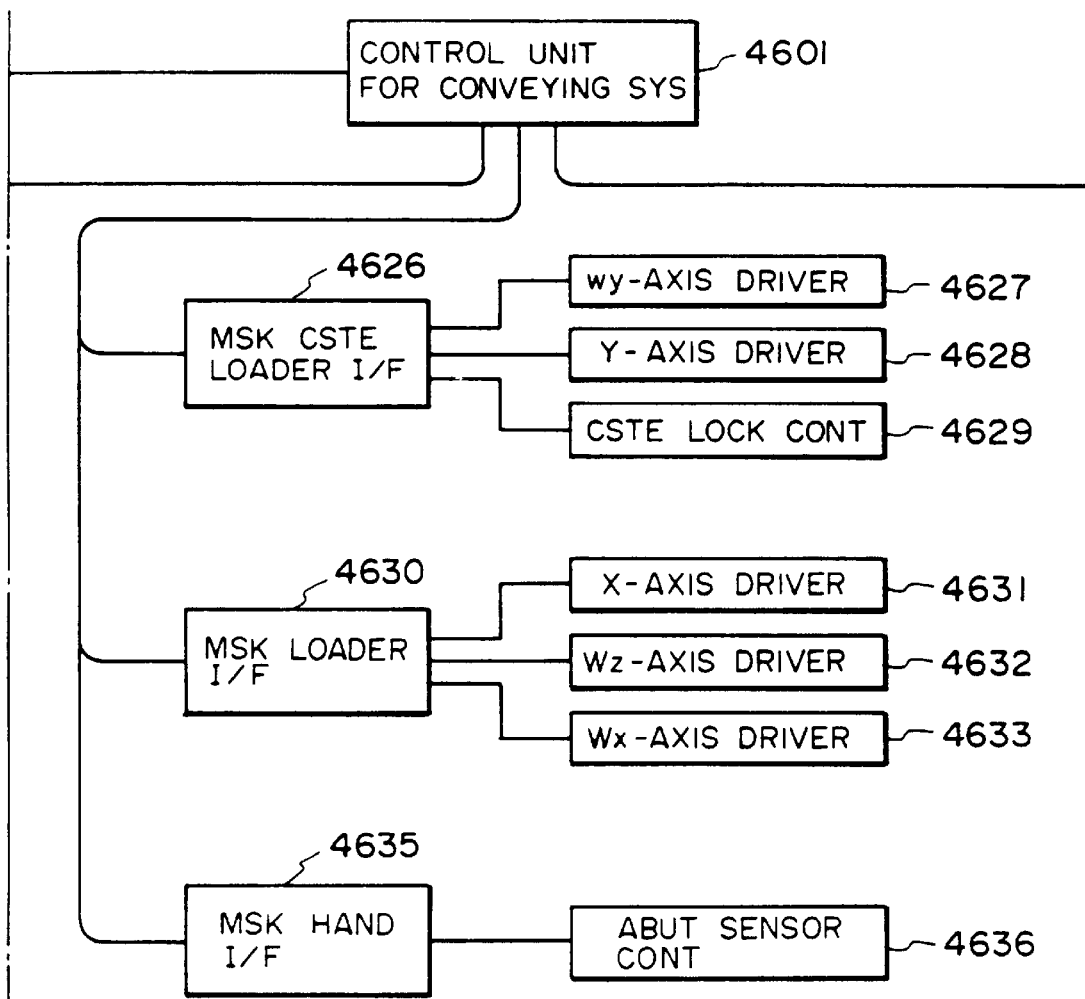
FIG. 46 is a block diagram of a conveyance control system.
Figure 46A:
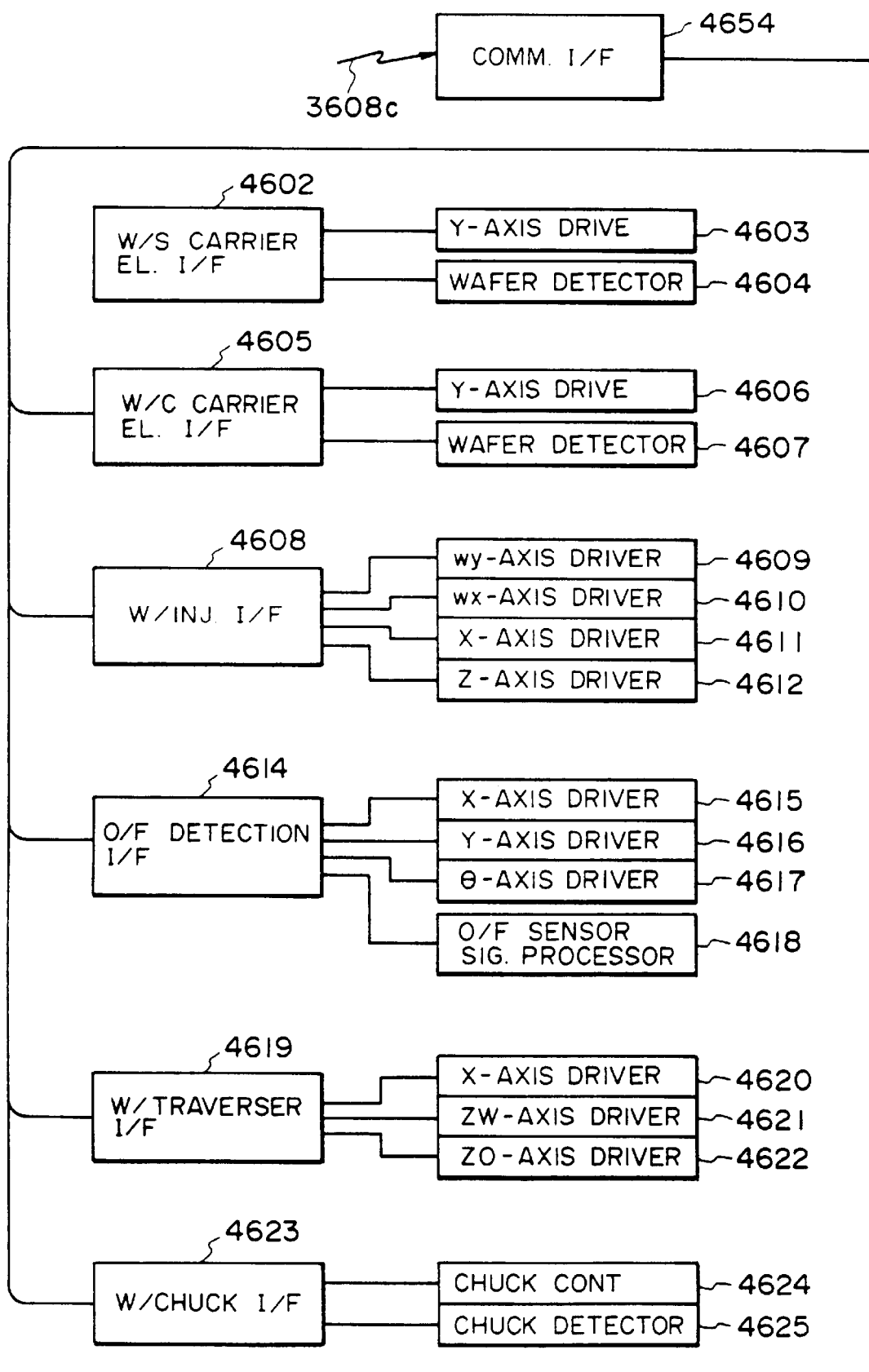
Figure 46C:
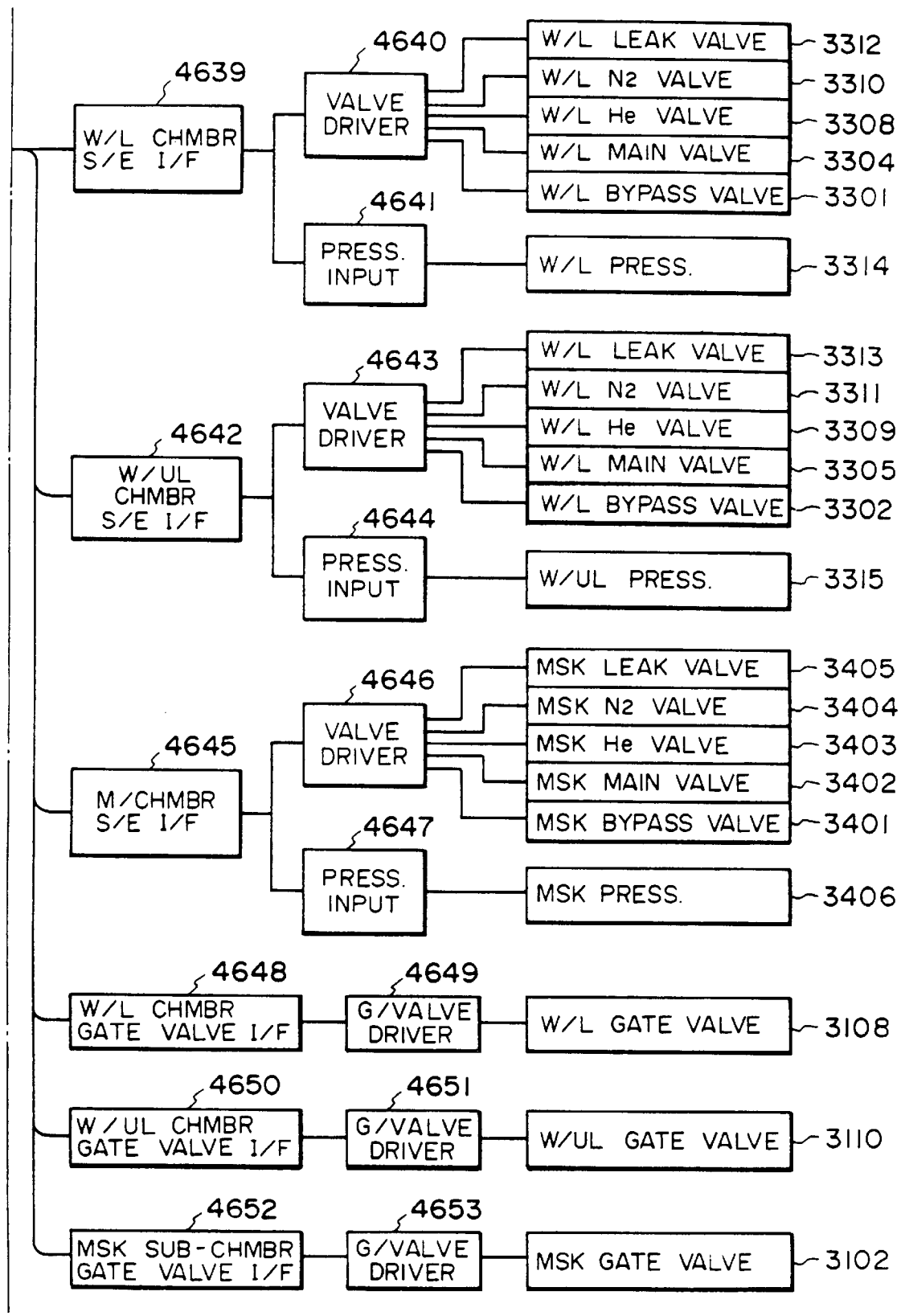

FIG. 46 shows an electric block diagram for control of the conveying unit 3603 (FIG. 36). The conveying unit 3603 controls the wafer conveying system, supply and discharge system for each of the wafer 3 and mask 2 sub-chambers and gate valves by a communication interface 4605 for data transmission to and from the upper rank main unit 3602 through the communication path 3608*c* and by a conveying system controlling unit 4601.

In the wafer conveying system, there are Y axis driver 4606 for driving an actuator for the supply elevator driver 2504 to convey wafer 3 out of the supply and take up carriers 2501 and 2502 and a wafer detector 4604 for detecting presence or absence of the wafer in the supply carrier 2501. To the wafer supply carrier elevator interface 4602, the Y axis driver 4603 controls driver amount of the actuator corresponding to the instructions from the conveying system control unit 4601, and also, the wafer detector 4604 interfaces it output signal as a sensor signal with the conveying system control unit 4601. In order to take up the wafers 3 after exposure into the carriers 2501 and 2502, there are a Y axis driver 4606 for driving an actuator for the collecting elevator driver 2509 and a wafer detector 4607 for detecting presence and absence of the wafer in the correcting carrier. Similarly to the wafer supplying side, through the wafer carrier elevator interface 4605, they control the drive amount of the actuator corresponding to the instructions from the conveying system control unit 4601 and interfaces the wafer presence or absence signal as a sensor signal with the conveying system control unit 4601.

The description will be made as to the injector 1304 (FIG. 13) which functions as conveying means for taking the wafer 3 out of the supply carrier 2501 and accommodating them back into the collecting carrier 2502. The injector 1304 comprises an ωy axis driver 4609, an ωx axis driver 4610, an X axis driver 4611, an injector Z and a Z axis driver 4612. The ωy axis driver 4609 drives an injector ωy driver 2515 which is an actuator for rotating relative to the opposed wafer supply carrier 2501 and the wafer collecting carrier 2502. The ωy axis driver 4610 drives the injector ωx driver 2514 which is an actuator for standing the wafer 3 from the laid down state by the injector hand 2512. The X axis driver 4611 drives the injector X driver 2518 which is an actuator for carrying the wafer 3 to the orientation detection chuck 2512 from the wafer supply or collection position. The injector Z functions as an actuator when the wafer 3 is supplied to the orientation flat detection chuck 2521 by the injector hand 2512 and when the wafer 3 on the orientation flat detection chuck 2521 is held by the injector hand 2512. The Z axis driver 4612 drives the driver 2519. The drivers are responsive to the conveying system control unit 4601, and the wafer injector interface 4608 controls the drive amount of each of the axes corresponding to the instruction level.

The orientation flat detecting interface 4614 comprises an X axis driver 4615 for driving the orientation flat detection X driver 2526 which is an actuator of the orientation flat detection X stage 2527, a Y axis driver 4616 for driving the orientation flat detector Y driver 2528 which is an actuator for the orientation flat detection Y stage 2529 and Θ axis driver 4617 for driving the orientation flat detection Θ driver 2522 which is an actuator for the orientation flat detection Θ stage 2523. That is, it comprises three axis drivers. The drivers are responsive to drive amount control signals provided by the orientation flat detection interface 4614. There is provided an orientational flat detection sensor signal processing station 4618 to process the line sensor 2525 output as a wafer 3 peripheral position information in the sequential operation by the orientation flat detection system 6802 for moving the wafer 3 to a predetermined reference position. Therefore, the orientation flat detection interface 4614 has, in addition to the drive amount control in the respective directions, transmission and reception of the signals corresponding to the wafer peripheral position from the orientation flat sensor signal processing station 4618.

The wafer 3 positioned by the orientation flat detection sequence is conveyed to the wafer stage 1899 by the wafer traverser 1306. A $Z_O$ axis driver 4621 drives the traverser $Z_O$ driver 2534 for the actuator for moving on the orientation flat detection chuck 2521 the loading hand 2530 and the unloading hand 2531 to hold the wafer 3 on the orientation flat detection chuck 2521 by the loading hand 2530 and to attract the wafer 3 on the unloading hand 2531 onto the orientational flat detection chuck 2521. A $Z_O$ axis driver 4622 drives the traverser $Z_W$ driver 2535 which is an actuator for moving the wafer 3 on the wafer chuck 1807 to support the wafer 3 by the loading hand 2530 or the unloading hand 2531. The X axis driver 4620 drives the traverser X axis driver 2530 which is an actuator for holding the wafer 3 placed on the wafer chuck 1807 or the orientational flat detection chuck 2521 on the loading hand 2530 or the unloading hand 2531 and for conveying it to the wafer chuck 1807 or to the orientational flat detection chuck 2521. Those drivers are provided with functions of receiving instruction data from the conveying system control unit 4601 by the wafer traverser interface 4619 and controlling the amounts of drives in each of the axes.

In order to hold the wafer 3 during the conveyance of the wafer 3, the vacuum attraction is used. In the wafer conveying system, the vacuum attraction is used in the injector hand 2512, the orientation flat detection chuck 2521, the loading hand 2530 and the unloading hand 2531, and in the wafer chuck 1807. The on and off of the vacuum attraction is controlled by the wafer chuck controller 4624 at the time of the wafer transfer or the like. Each of the wafer holding portions is provided with attraction detection function for detecting whether they hold the wafer 3 or not. Those are all detected by the attraction detecting portion 4625. Therefore, the wafer chuck interface 4623 is provided with functions of supplying control signals to the wafer chuck controlling section 4624 in accordance with the instructions from the conveying system control unit 4601 in accordance with the wafer conveying sequence and of receiving the detection signal from the attraction detecting portion 4625 and supplying the data to the conveying system control unit 4601.

The block diagram for the mask conveying system will be described. The reference will be made also to FIG. 28. In the mask conveying system, there are a Y axis driver 4628, an ωy axis driver 4627 and a cassette lock controller 4629. The Y axis driver 4628 drives the cassette elevator motor 2812 to place the mask cassette 1310 on a cassette table 2803 in the mask chamber 3103 and move the table 2806 connected with the main assembly 2801 of the cassette to a predetermined reference position. The ωy axis driver 4627 drives the indexer 2810 of an actuator to rotate the cassette main assembly 2801 to permit the mask hand 2602 to take a desired mask 2 out of the main assembly 2801 moved to the predetermined position. The cassette lock controller 4629 serves to separate the cassette cover 2802 from the main assembly 2801 of the mask cassette 1310 placed in the mask chamber 3103 and to lock the cassette main assembly 2801 with the table 2806. Therefore, the mask cassette loader interface 4626 effects the drive amount control to the Y axis driver 4627 and the ωy axis driver 4628 in accordance with the instruction from the conveying system control unit 4601, and the lock signal and lock releasing signal for the mask cassette main assembly 2801 required in this operation are produced.

The mask loader will be described. The reference will be also made to FIG. 26. In the mask loader, the mask 2 placed in the main assembly of the cassette 2801 in the mask chamber 3103 is set on the mask stage 1901 by the mask hand 2602 holding the mask 2 in the main assembly 2801 and by moving the traverse unit 2001. The mask loader includes an X axis driver 4631 and an ωz axis driver 4632 and an ωx axis driver 4633. The X axis driver 4631 drives the traverse motor 2605 which is an actuator for moving the traverse unit 2001. The ωz axis driver 4632 drives the arm rotating motor 2707 of an actuator for rotating the arm unit 2603 through 180 degrees after the traverse unit 2001 is moves to a predetermined position. The ωx axis driver 4633 drives a motor 20 for vertically moving the hand, which is an actuator for vertical movement of the mask hand 2602 when the mask hand 2602 grips the mask 2 in the main assembly 2801 and when the mask 2 is set on the mask stage 1901.

The amount of drives for the respective axes are controlled by the mask loader interface 4630, which effects controlling operation on the basis of the drive amounts instructed by the conveying system control unit 4601 for the respective axes of the mask loader.

In order to set the mask 2 always with a predetermined abutting force when the mask 2 is set on the mask stage 1901, or it is set in the cassette main assembly 2801, an abutment sensor 2705 (FIG. 27) is provided in the mask hand 2602. In order to control the amount of drive by the X axes driver 4631 on the basis of detection of the abutment force between the mask hand 2602 and the mask 2 when the mask hand 2602 catches the mask 2 on the mask stage 1901 or in the main assembly 2801 of the mask cassette, the abutment sensor 2705 includes an abutment sensor controlling section 4636 to monitor the sensor signal from the abutment sensor 2705 and produces the abutment signal as an electric signal to the mask hand interface 4635. Therefore, the mask hand interface 4635 has a function of transferring as data the abutment force signal from the abutment sensor controlling section 4636 to the conveying system control unit 4601.

Next, the description will be made as to the block diagram for the supply and discharge control for the wafer loading and unloading chambers 3109 and 3111 (FIG. 31). There are provided a wafer loading chamber supply and discharge interface 4639 and a wafer unloading chamber supply and discharge interface 4642. The two interfaces drive respective valves in accordance with instruction from the conveying system controlling unit 4601 and receives the data from the pressure gauges and transfer the data to and from the conveying system control unit 4601. The wafer loading chamber 3109 is provided with a valve driver 4640 and an input 4641 of the pressure gauge. For this chamber 3109, the wafer loading chamber leak valve 3312, the wafer load $N_2$ inlet valve 3310, the wafer load He inlet valve 3308, a wafer load main valve 3304 and wafer load bypass valve 3301 are on-off controlled. In the pressure gauge input 4614, the pressure in the wafer load chamber 3109 is measured by the wafer load pressure gauge 3314, and it is converted to an absolute pressure in the pressure gauge input 4641, and an electric signal corresponding to the converted pressure is supplied to the wafer loading chamber supply and discharge interface 4639. This is the same in the wafer unloading chamber 3111, and as shown in FIG. 33, there are valve driver 4646 and the pressure gauge input 4644. For this chamber 3111, the wafer unloading leak valve 3313, the wafer unloading $N_2$ inlet valve 3311, the wafer unloading He inlet valve 3309, the wafer unloading main valve 3305 and the wafer unloading bypass valve 3302 are on-off controlled. In the pressure gauge input 4644, the pressure of the wafer unloading chamber 3111 is measured by the wafer unloading gauge 3315, and it is converted to an absolute pressure in the pressure gauge input 4644, and an electric signal corresponding to the converted pressure is supplied to the wafer unloading chamber supply and discharge interface 4642.

Next, the description will be made as to the mask chamber 3103. The mask chamber 3103, similarly to the wafer chamber, is provided with a mask chamber supply discharge interface 4645. It has a function of controlling the valves in accordance with the instruction from the conveying system control unit 4601 and of transferring the data from the pressure gauge. The mask chamber 3103 is provided with a valve driver 4646 and a pressure gauge input 4647. The mask leak valve 3405, the mask $N_2$ inlet valve 3404, the mask He inlet valve 3403, the mask main valve 3402, the mask bypass valve 3401 shown in FIG. 34 are on-off controlled through the mask chamber supply and discharge interface 4645 and through the valve driver 4646. In the pressure gauge input 4647, the pressure in the mask chamber 3103 is measured by the mask pressure gauge 3406, and the pressure is converged to an absolute pressure in the pressure gauge input 4647, and an electric signal corresponding to the converged pressure is supplied to the mask chamber supply and discharge interface 4645.

The block diagram for the gate valve control for the wafer loading and unloading chambers 3109 and 3111 and the mask sub-chamber 3103. In the gate valve control for the wafer chambers, there are provided a wafer loading gate valve interface 4648 and a wafer unloading gate valve interface 4605, and the two interfaces produces control signals for on-off controlling the gate valve in response to the instruction from the conveying system control unit 4601, in response to which in the wafer loading chamber 3109 the driver 4649 on-off controls the wafer loading gate valve 3108. Similarly, in the wafer unloading chamber 3111, the gate valve on-off driver 4651 on-off-controls the wafer unloading gate valve 3110. In the drive of the mask sub-chamber gate valve, there is provided a mask sub-chamber gate valve interface 4625, which produces a control signal for on-off drive of the gate valve in accordance with the instructions from the conveying system controlling unit 4601. Therefore, the gate valve driver 4653 on-off-controls the mask gate valve 3102 through the mask sub-chamber gate valve interface 4652.

The discharging pump of the wafer loading chamber 3109, the wafer unloading chamber 3111 and the mask chamber 3103 includes the main discharging oil rotation pump 3307, the main discharge turbo molecule pump 3306 and the coarse discharge oil rotation pump 3303 which are common to those chambers. The pumps are controlled by an ambience controlling unit 3605.

FIG. 47 shows a block diagram for mirror control unit 3606. The block is generally divided into a mirror chamber supply and discharge controlling section 4703, a mirror chamber cooling and constant temperature controlling section 4708 and a mirror pose controlling section 4710. A mirror control unit 4702 controls the sequential operation of each of the above control sections and communicates with an upper main unit 3602 (FIG. 36) through a communication interface 4701 and a communication path 3608f. The mirror control unit 3606 will be described in detail. The reference will be made also to FIG. 14.

The mirror chamber supply and discharge controlling section 4703 is connected through a mirror chamber pressure gauge input portion 4704 functioning as an interface with a mirror chamber pressure gauge 4705 providing a degree of vacuum of the ultra high vacuum state of the mirror vacuum chamber 1408. The vacuum chamber 1408 is connected with a ultra high vacuum pump 4707 for providing the ultra high vacuum state with the vacuum chamber 1408 through the discharge port 1411. The mirror chamber supply and discharge controlling section 4703 produces an on-off signal to the mirror chamber pump driver 4706 to control the discharge.

The mirror chamber cooling and constant pressure controlling section 4708 is effective to remove the heat resulting from dosing the X-rays to the X-ray mirror 1401 to maintain a constant temperature. A liquid cooling medium is maintained at a predetermined temperature by water supply 4709 to the mirror chamber using an unshown temperature sensor and is supplied to the mirror vacuum chamber 1408. The liquid medium cools the X-ray mirror 1401 through the mirror supporting member 1402 by flowing through the liquid passage 1404. The cooling and constant temperature controlling section 4708 controls the temperature of the liquid medium, and if it is beyond tolerances, an error signal is supplied to the mirror control unit 4702.

The mirror position or pose controlling section 4710 moves the mirror pose adjusting device 1406, by which the X-ray mirror 1401 is aligned with the SOR axis, wherein the SOR axis is detected in position by the SOR detector 4713, and the mirror pose driving actuator 4712 built in the mirror pose adjusting device 1406 is driven by the mirror pose driver 4711 so that the position of the SOR spot is at a predetermined reference position. Thereafter, in the mirror pose controlling section 4710, the pose of the X-ray mirror 1401 is servo-controlled so that the SOR rays are kept at the above-described reference position.

The mirror pose controlling section 4710 has, in addition to the described above, the function of operating through the aperture driver 4714 the shutter driving actuator 1410 for driving the shutter 1409 to shut or transmit the SOR rays. The timing of the shutter drive is to be synchronized with the wafer 3 exposure sequence, more particularly, the interval between adjacent exposure shots, wafer exchanging operation, and/or a mask exchanging operation, for example, and therefore, it receives a driving signal from the main unit 3602 through the communication interface 4701.

Figure 48A:
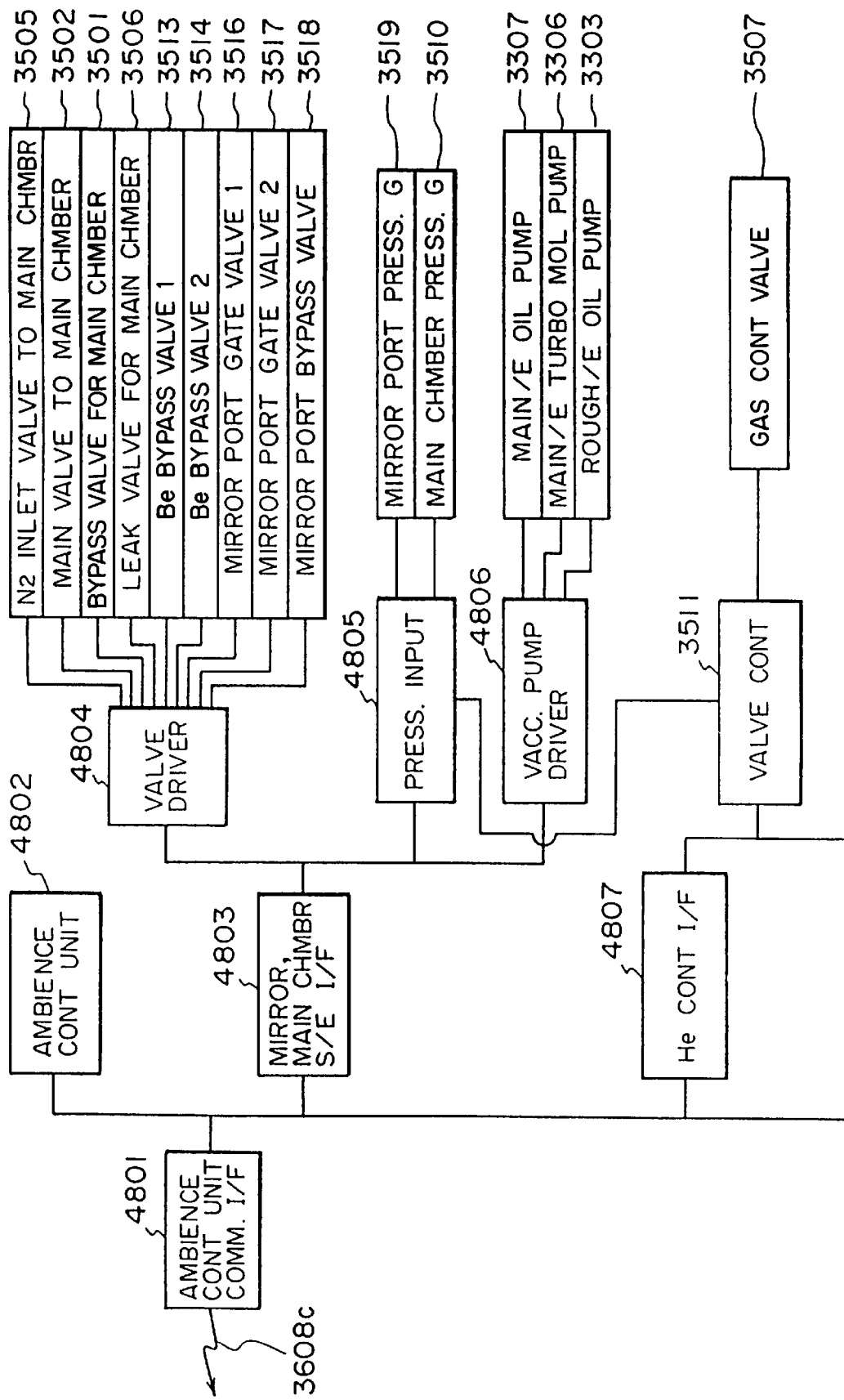
FIG. 48 is a block diagram for an ambience control system.

FIG. 48 is a block diagram of an ambience controlling unit 3605. The unit includes (1) a supply and discharge control system for the mirror port 3105 and the main chamber 3101, (2) a gas control system for controlling the He ambience and (3) a temperature control system for controlling temperature of the wafer chuck 1899 and the various parts in the chambers. A control unit 4802 operates the above control systems (1)–(3) in accordance with a program of sequences. The communication interface 4801 of the control unit 4802 is connected with the higher main unit 3602 through the communication path 3608e to transfer data to and from it.

The structures and operations of the control systems will be described. The supply and discharge control system for the mirror port 3105 and the main chamber 3101 supplies outputs to a valve driver 4804 and to a vacuum pump driver 4806 from the ambience control unit 4802 through mirror port and main chamber supply and discharge interface 4803 to a valve driver 4804 and to a vacuum pump driver 4806, and also, it receives an input from a pressure gauge input portion 4805. The valve driver 4804 is connected with a main chamber main valve 3502 and the main chamber bypass valve 3501 for supply and discharge operation of the main chamber 3101 (FIG. 35) and with the main chamber $N_2$ inlet valve 3503 and the main chamber leak valve 3506 opened and closed upon opening of the main chamber 3101. As regards the supply and discharge of the mirror port 3105, the control system is connected with a first Be bypass valve 3513 and the second Be bypass valve 3514 for communicating both sides of the beryllium window, the first mirror port gate valve 3516, the second mirror port gate valve 3517 and the mirror port bypass valve 3518 to control the opening and the closing.

The pressure gauge input portion 4805 receives the sensor output from the mirror port pressure gauge 3519 for measuring the pressure of the mirror port 3105 and a sensor output from the main chamber pressure gauge 3510 for measuring the pressure of the main chamber 3101, and it processes the outputs and transmits the data to the supply and discharge interface 4803. The vacuum pump driver 4806 is used commonly for the main chamber 3101, the wafer loading sub-chamber 3109, the wafer unloading sub-chamber 3111 and the mask sub-chamber 3103. It also on-off controls the coarse discharge oil rotation pump 3303 and the main discharge oil rotation pump 3307 and drives and monitors the state of operation of the main discharge turbo molecule pump 3306.

The He gas control system controls the He gas to provide constant pressure and purity in the main chamber 3101. This is done by changing a discharge flow rate of the main chamber 3101 against introduction of contamination gases. The control valve 3507 controls the discharge flow rate and is connected with a valve controller 3511 so that the opening of the control valve 3507 is controlled by the valve controller 3511. The opening of the valve is externally set by the He control interface 4807. The valve controller 3511 receives the pressure of the main chamber 3101 through the pressure gauge input 4805, and it includes a servo system to control the opening of the valve to provide a constant pressure in the main chamber 3101 in the valve controller 3511. A pump driver 4808 on-off controls the gas control oil rotation pump 3509 for discharging the main chamber for the gas control. A valve driver 4809 opens and closes the main chamber He inlet valve 3504 and the gas control main valve 3508. The pump driver 4808 and the valve driver 4809 are controlled by the control unit 4802 through the He control interface 4807.

In the temperature control system, water having a controlled constant temperature is storaged in the water supply 4813, and the wafer is supplied to the heat generating portions in the above-described chambers to effect heat transfer in the heat generating portions in which the temperature controlled water is circulated so as to maintain the predetermined pressure in the parts. A temperature sensor 4812 detects the temperature of the temperature controlled water, and the detected temperature is transmitted to the temperature controller 4811, where the set temperature in the water supply is controlled. In the temperature control interface 4810, the result of the discrimination whether the temperature is proper or not is transferred to permit the temperature control state to be monitored.

The wafer chuck temperature sensor input 4818 receives the measurement by the wafer chuck temperature sensor 4815 for measuring the temperature of the wafer chuck 1807 cooled by the temperature controlled water, and wafer the measurement is converted to the corresponding temperature, it is supplied to the control unit 4802 through the temperature control interface 4810 to control the temperature of the chuck.

Figures 49, 49C:
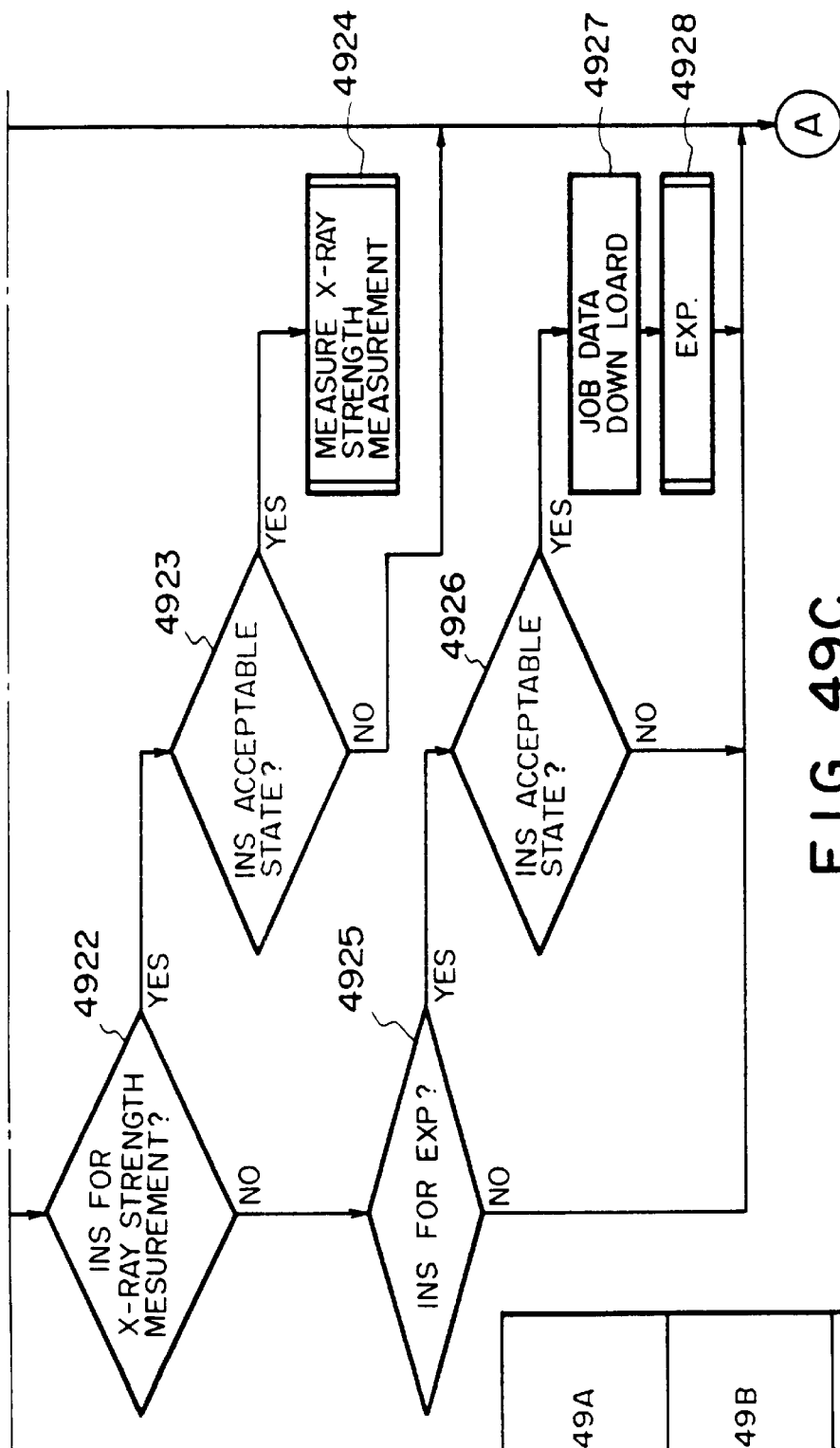
FIG. 49 is a flow chart illustrating an overall operation.
Figure 49A:
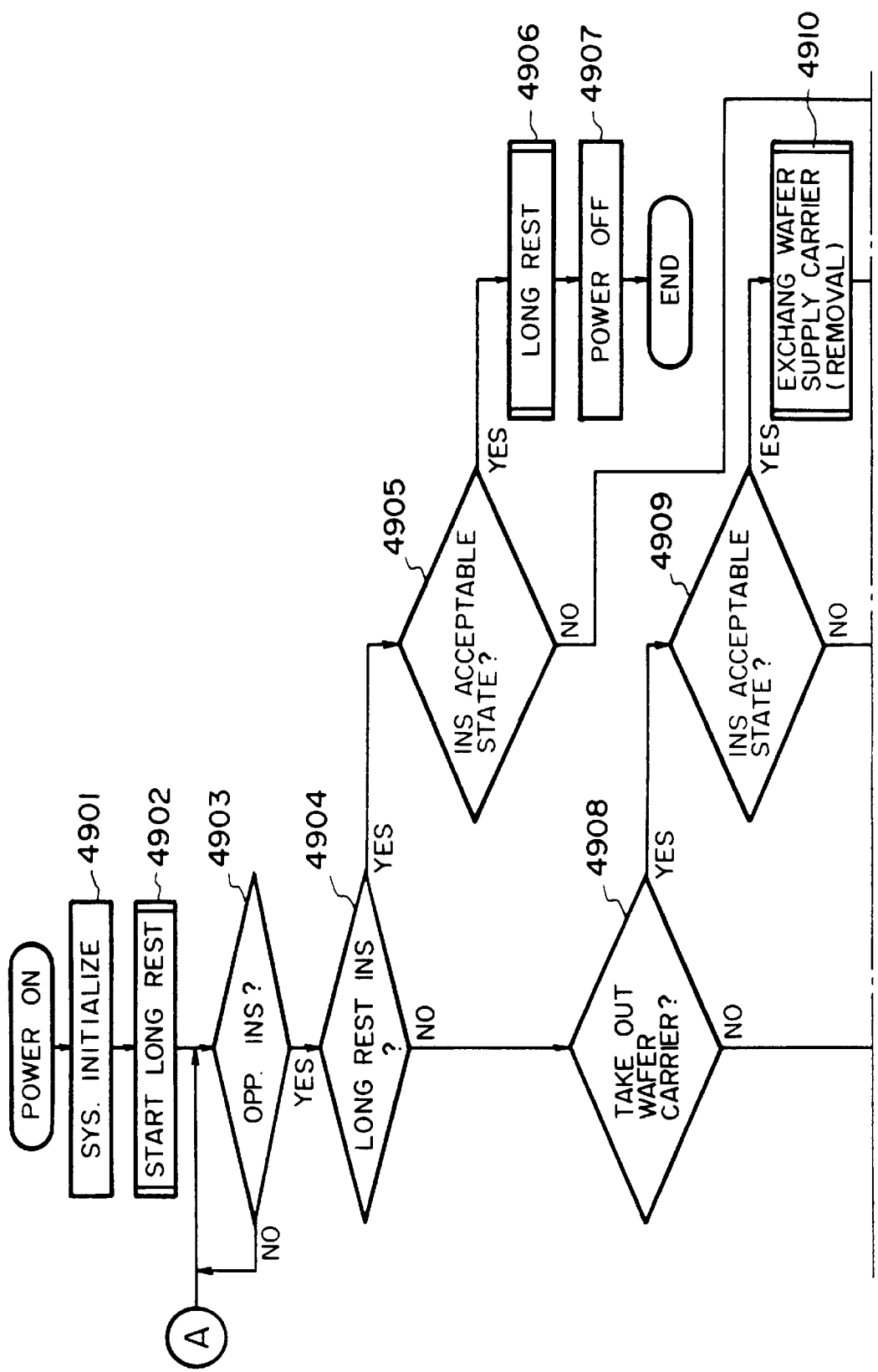
Figure 49B:
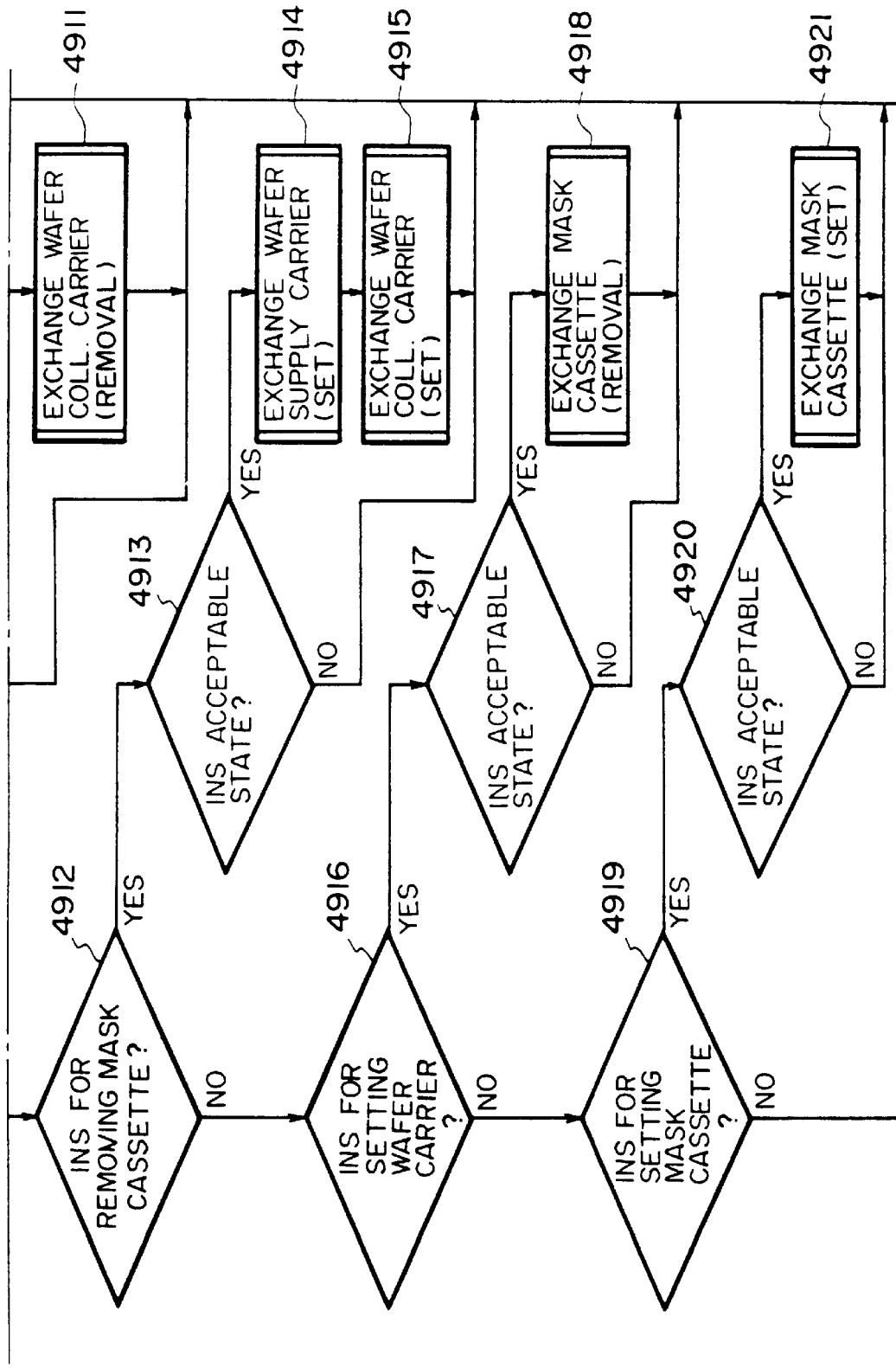
Figure 50:
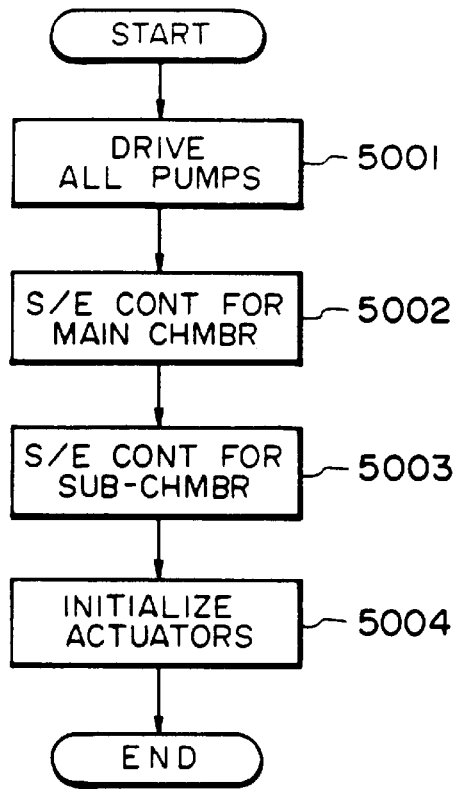
FIG. 50 is a flow chart for a start-up operation after a long rest.

FIG. 49 shows a flow chart for the control effecting the basic function of the apparatus. When the power source is actuated, the CPU, RA!4 and ROM or the like are checked for each of the units 3601, 3602, 3603, 3604, 3605 and 3606 (FIG. 36) at step 4901, and thereafter, the communication passage among the units are established. At step 4902, the starting at process after a long term rest is carried out to initialize the supply and discharge system and mechanical systems. At step 4903, the operation instructions are waited for from the panel switch 3802 of the main unit 3602 or from the terminal 3701 of the console unit 3601. When an operating instructions are given by the operator, the discrimination is made as to which functional process corresponds to the instructions by the steps 4904, 4908, 4912, 4916, 4919, 4922 and 4925. At steps 4905, 4909, 4913, 4917, 4920, 4923 and 4926, the discrimination is made as to whether the functional processing is currently possible or not. If so, the process is executed.

The basic operational instructions and the processing of the apparatus will be described. The long term shut off instructions (step 4914) is to execute the process for filling the main chamber 3101 and the sub-chambers 3103, 3109 and 3111 with $N_2$ gas to prevent introduction of dust or moisture into the apparatus during long rest of the apparatus, and for avoiding that the Be window 3512 is kept stressed. If the step 4904 discriminates that it is the long term shut off instructions, the sequence goes to the step 4905 where the discrimination is made as to whether the conditions for execution of the long term shut off process are satisfied. If so, the process is executed at step 4906, and thereafter, the power source for the mechanical driving system is shut off at step 4907.

Wafer carrier taking out instructions (step 4908) execute the process for providing the state in which the operator can take out and exchange the supply and/or collecting carrier 2501, 2502 set in the apparatus. If the step 4908 discriminates the wafer carrier taking out instructions, the step goes to 4909, where if the wafer carrier 2501 or 2502 is set, and if the conditions for execution of the wafer carrier taking out operations are satisfied, then the step 4910 for taking the wafer supply carrier out and the step 4911 for taking the wafer collecting carrier out are executed, by which the state in which the supply wafer carrier and the collecting wafer carrier can be taken out, and the sequence waits for the operational instructions at step 4903.

The wafer carrier setting instructions (step 4912) are to execute the operation opposite to the wafer carrier taking out instructions, more particularly, to set the outside supply and/or collecting carrier 2501, 2502 into the apparatus for exposure operation. If it is discriminated that the wafer carrier setting instructions are produced at the step 4912, the discrimination is made at step 4913 whether the wafer carrier is outside the apparatus or not and whether the conditions for executing the wafer carrier setting process are satisfied or not. If so, the wafer supply carrier setting process (4914) and the wafer collecting carrier setting process (step 4915) are executed. Then, the supply and collecting wafer carriers 2501 and 2502 are set in the apparatus for the exposure operation, the sequence returns to step 4903 where it is waiting for the operational instructions.

The mask cassette taking out instructions (step 4916) are to execute the process for taking the mask cassette set into the apparatus by the operator to establish exchangeable conditions. At step 4916, if the discrimination is made that the instructions are the mask cassette taking out instructions, the discrimination is made at step 4917 as to whether or not a mask cassette is currently set, and whether or not the conditions for execution of the mask cassette taking out processing are satisfied. If so, at step 4918 the mask cassette taking out process is executed. Then, the mask cassette 1310 can be taken out, and the sequence goes back to the step 4913.

The mask cassette setting instructions (step 4919) are opposite to the mask cassette taking out instructions, more particularly, it is to execute the process for setting the outside mask cassette 1310 into the apparatus for exposure operation. If it is discriminated at step 4919 that the instructions are the mask cassette set instructions, the discrimination is made at step 4920 whether or not the mask cassette 1310 is outside the apparatus and whether or not the conditions for execution of the mask cassette setting process are satisfied. If so, at step 4921, the mask cassette setting process is executed. Then, the mask cassette 1310 is set. The sequence goes back to step 4903 where it is waiting for the operational instructions. The X-ray strength profile measurement instructions (step 4922) are to execute the process for producing shutter driving data for assuring uniform X-ray exposure amount over the entire exposure area against change in the X-ray strength profile due to electron injection into the SOR ring 4, exchange of the Be window 3512, X-ray mirror 1401 adjustment or the like. If it is discriminated at step 4922 that the X-ray strength profile measurement instructions are produced, the sequence goes to step 4922 where the discrimination is made as to whether the conditions for execution of the X-ray strength profile measurement are satisfied. If so, the X-ray strength profile measurement process is executed at step 4924 with the use of the X-ray detector 1551 (FIG. 15), and then the sequence goes back to the step 4903.

The exposure instructions (step 4925) are to execute the step and repeat exposure of the mask 3 to the pattern of the X-rays with a designated dose of the X-ray after the shot area of the wafer 3 is aligned with the mask 2. If the exposure instructions are discriminated at stop 4925, the sequence goes to the step 4926 where the discriminations are made as to whether or not the supplying carrier 2501 and the correcting carrier 2502 are set, as to whether or not the mask cassette 1310 is set and whether job data are prepared or not, and as to the other conditions for the exposure operations. After that, the job data necessary for the exposure operation is downloaded at step 4927, and the exposure operation is executed at step 4928. After termination of the processing, the sequence goes to step 4903 where it is waiting for the instructions by the operator. Referring to FIG. 49 together with FIGS. 50–53 and FIGS. 32–35, the sequence operation 4902 is for starting the apparatus up after a long term rest. First, each of the pumps RORP 3303, MNTMP 3306, MNRP 3307, GCRP 3509 are started at step 5001.

Figure 51:
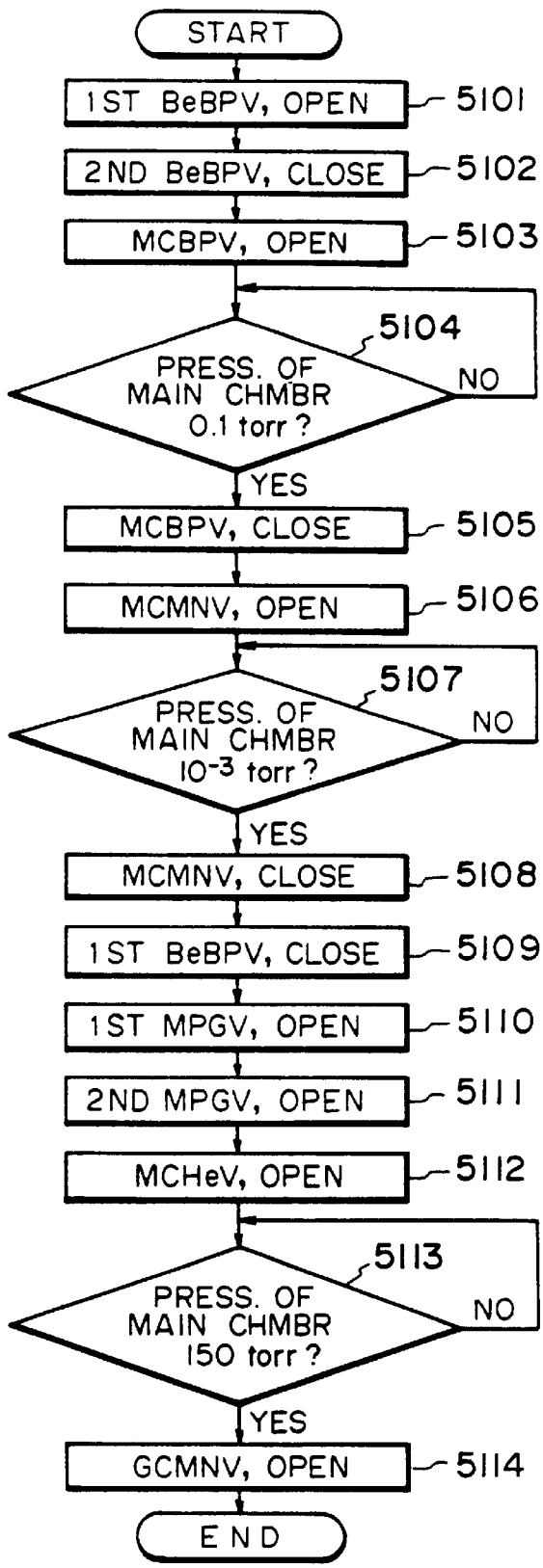
FIG. 51 is a flow chart of the operation of a gas supply and discharge operation for the main chamber at a start-up operation after a long rest.
Figure 52:
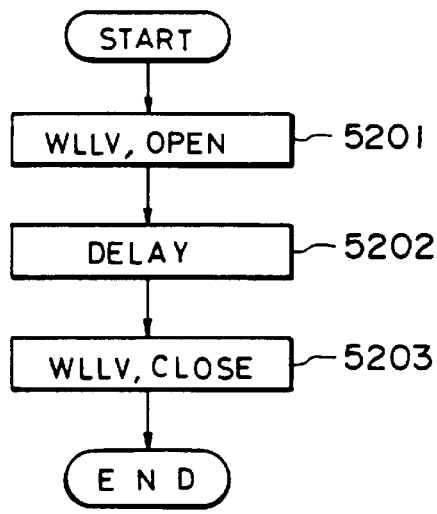
FIG. 52 is a similar flow chart for a wafer loading chamber.

Next, the supply and discharge process is executed to the main chamber 3101 at step 5002. This is shown in FIG. 51 in detail. First, the first BeBPV 3513 is opened, and the second BeBPV 3514 is closed at step 5101 and 5102. Then, the MCBPV 3501 is opened to discharge the $N_2$ gas having been introduced when the long term shut off operations (at step 5103) when the pressure gauge 3510 of the main chamber 3101 reaches 0.1 Torr, the result of the discrimination at the step 5104 is affirmative, so that the MCBPV 3501 is closed at step 5105. Subsequently, MCMNV 3502 is opened to further discharge the chamber at step 5106. When the pressure gauge 3510 reaches $10^{-3}$ Torr, the discrimination at the step 5107 is affirmative, so that the MCMNV 3502 and the first BeBVP 3513 is closed at steps 5108 and 5109. The first MPGV 3516 and the second MPGV 3517 are opened at steps 5110 and 5111 to establish fluid communication with the mirror unit 101. Subsequently, the MCHeV 3504 is opened to introduce the He gas at step 5112. When the pressure gauge 5310 reaches 150 Torr, the discrimination at step 5113 is affirmative, and GCMNV 3508 is opened to start the gas control at step 5114.

After the gas discharge and supply process is completed for the main chamber 3101, the gas supply and discharge operation is executed to the respective sub-chambers such as wafer loading chamber 3109 at step 5003.

The wafer loading chamber 3109 is taken as an example. As shown at steps 5201 and 5203 in FIG. 52, the pressure of the chamber is balanced with the atmospheric pressure by opening the WLLV 3312 and closing it after a predetermined period of time. As for the wafer unloading chamber 3111 and the mask chamber 3103, the WULV 3313 and MKLV 3405 are opened and closed similarly, the pressures in the chamber are made equal to the atmospheric pressure. By this, it becomes easy to open the chamber doors when the wafer carriers 2501 and 2502 and the mask cassette 1310 are set in the chamber.

Figure 53:
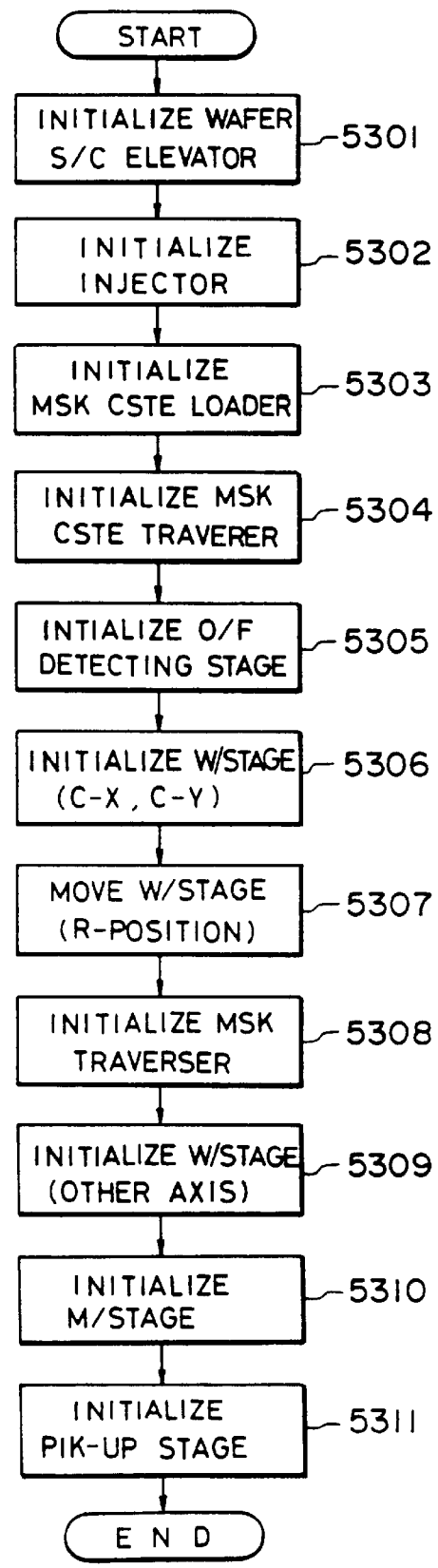
FIG. 53 is a flow chart for initializing various actuators at a start up operation after a long rest.
Figure 54:
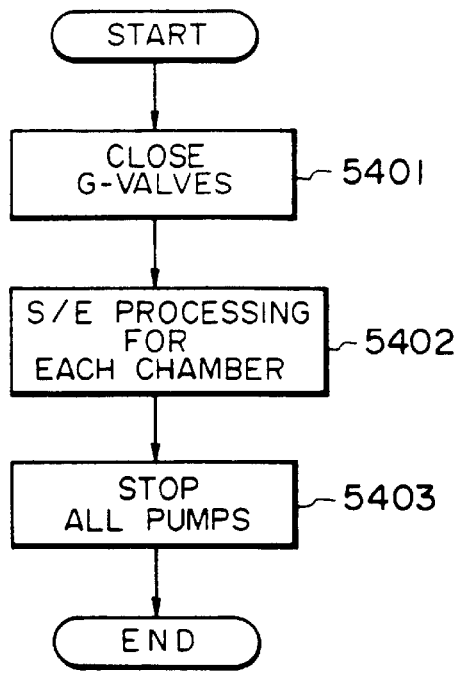
FIG. 54 is a flow chart for the operations for shutting off the apparatus for a long period.

Next, the actuators for the stages and the conveying systems are reset at step 5004, as shown in FIG. 53 in detail, wherein the wafer supplying elevator 1303b and the wafer collecting elevator 1303a are reset at step 5301, and the respective carrier tables 2503 and 2508 are shifted to the positions where the carrier can be exchanged. Next, the injector 1304 is reset as step 5302. As shown in FIG. 25, the axes of the injector 1304 are moved to the home positions. The mask cassette loader is then reset at step 5303, and the table 2806 is moved to the home position which is the bottommost position by the mask cassette elevator 2805 (FIG. 28), and the indexer 2810 is rotated so that the positioning pin 2901 is at a predetermined position (FIG. 29). Subsequently, the wafer traverser 1306 is reset at step 5304, and the loading hand 2527 and the unloading hand 2528 are moved to the positions where they are crossed each other. The two traverser Z drivers 2534 and 2535 are moved to the home positions closer to the SOR source 4. Next, the orientation flat direction stage 1305 is initialized at step 5305, and the Θ stage 2519, X-stage 2521 and Y-stage 2523 are moved to the respective home positions. Then, the coarse movement X axis and the coarse movement Y axis of the wafer stage 1899 are initialized at step 5306 to move them to retracted positions not interfering with the operation of the mask traverser 1311 at step 5307. The mask traverser is then reset at step 5308, and the traverse unit 2601 is moved to the home position, that is, the center of the stroke, and the alarm unit 2603 is rotated toward the mask cassette loader (FIG. 27). Next, the other axes of the wafer stage are reset at step 5309 to determine the point of origin of the laser interferometer. Finally, the mask stage 1901 is reset at step 5310, and the pickup stages 2411 are reset at step 5311.

Referring to FIGS. 54–57 together with FIG. 49 and FIGS. 32–36, the sequential operation for the long term shut off 4906 will be described. At first, in order to separate the sub-chambers such as the wafer loading chamber 3109 from the main chamber 3101, each of the gate valves is closed at step 5401.

Figure 55:
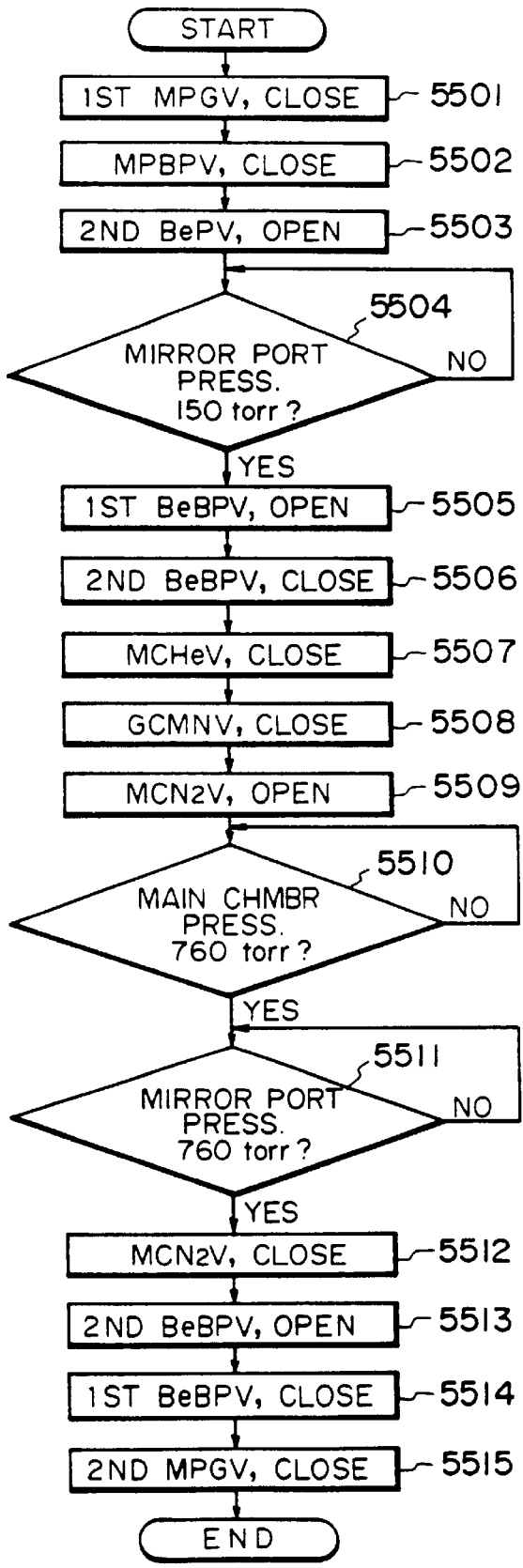
FIG. 55 is a flow chart illustrating gas supplying and discharging operations for shutting off the apparatus for a long term rest.

That is, the WLGV 3108, the WUGV 3110 and the MKGV 31 02 are closed. The gas supply and discharge processing is effected for each of the chambers at step 5402. In the main chamber 3101, in order to release the difference pressure applied to the Be window 3512 as shown in FIG. 55, the first MPGV 3516 and MPBPV 3518 are closed, whereas the second BeVPB 3514 is opened at steps 5501–5503. The He gas flows into the mirror port 3105 from the main chamber 3101 through the conductance pipe 3515. When the pressure in the mirror sport 3505 reaches 150 Torr which is the pressure in the main chamber 3101, which is measured by the mirror port pressure gauge 3519, the discrimination in the step 5504 is affirmative, so that the first BeBVP 3513 is opened, and the second BeBVP 3514 is closed at steps 5505 and 5506. Then, the MCHeV 3504 and the GCMNV 3508 are closed to stop the gas control at steps 5507 and 5508. Then, the MCN2V 3505 is opened to introduce the N2 gas at step 5509. When the reading of the pressure gauge 3510 of the main chamber 3101 and the pressure gauge 3519 of the mirror port 3505 both become 760 Torr, the discriminations at the steps 5501 and 5511 are affirmative, so that the second MCN$_2$V is closed at step 5512. Finally, the second BeBPV 3514 is reopened, and the first BeBPV 3513 is closed, at steps 5513 and 5514. By closing the second MPGV 3517, the mirror unit 101 is isolated from the mirror port 3505 at step 5515.

Figure 56:
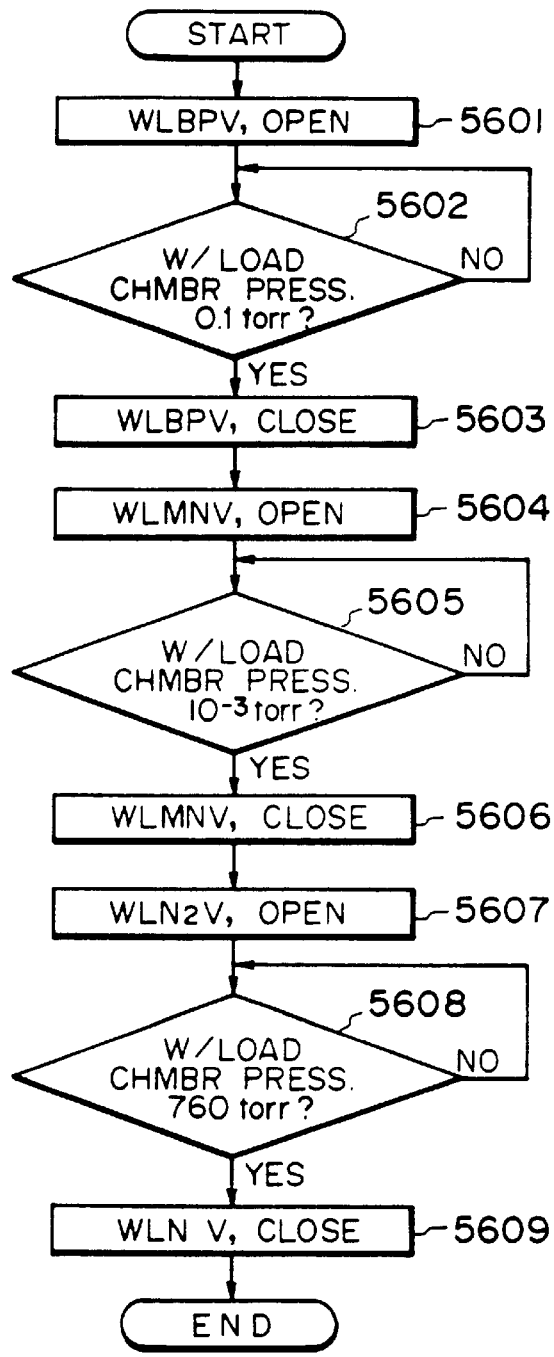
FIG. 56 is a similar flow chart for the wafer loading chamber.

Next, in the wafer loading chamber 3109, as shown in FIG. 56, the WLBPV 3301 is opened at step 5601 to discharge the He gas. When the pressure gauge 3314 reaches 0.1 Torr, the discrimination at the step 5602 is affirmative, so that the WLBPV 3301 is closed, whereas the WLMNV 3304 is opened at steps 5603 and 5604. When the pressure gauge reaches $10^{-3}$ Torr, the discrimination at the step 5605 is affirmative, so that the WLMNV 3304 is closed at step 5606. Next, the WLN$_2$V 3310 is opened to introduce the N2 gas at step 5607. When the pressure in the chamber reaches 760 Torr, the discrimination at the step 5608 is affirmative. The WLN$_2$V 3310 is closed to terminate the introduction of the N$_2$ gas at step 5609. Since the gas supply and discharge process for the wafer unloading chamber 3111 is the same, detailed description is omitted for simplicity.

Figure 57:
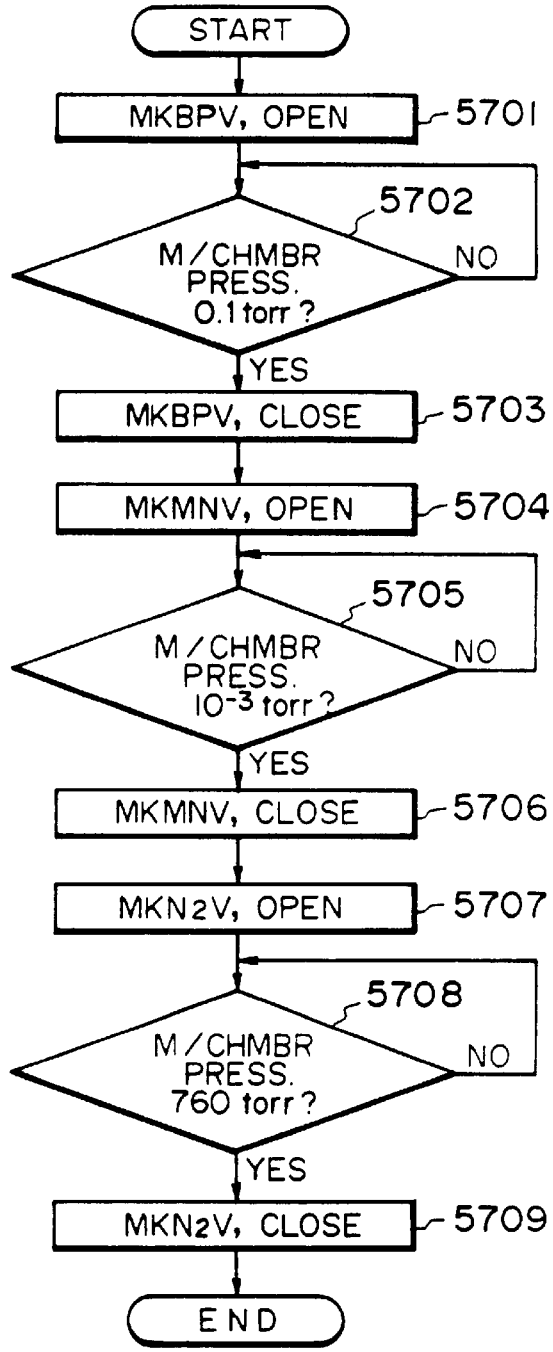
FIG. 57 is the similar flow chart for the mask chamber.
Figure 58:
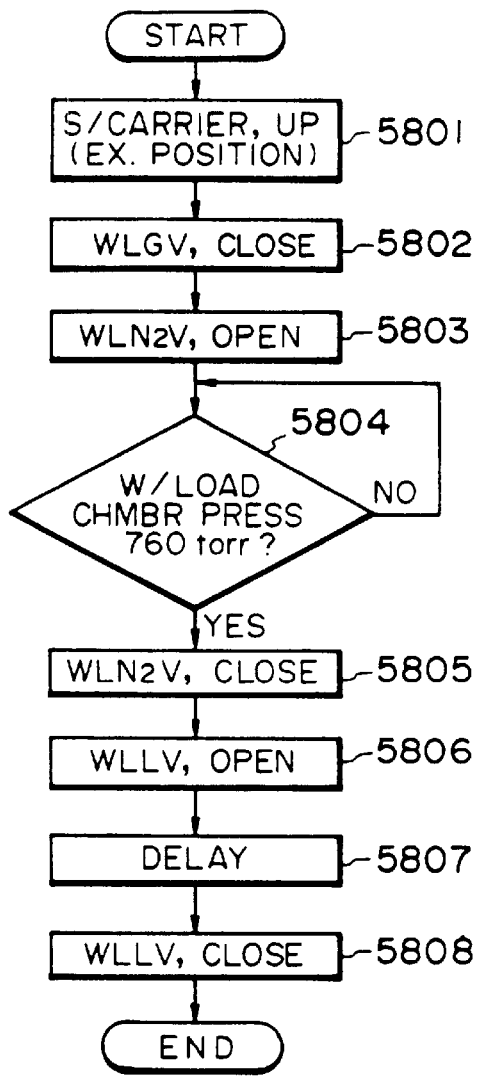
FIG. 58 is a flow chart for taking out a wafer supplying carrier.
Figure 59:
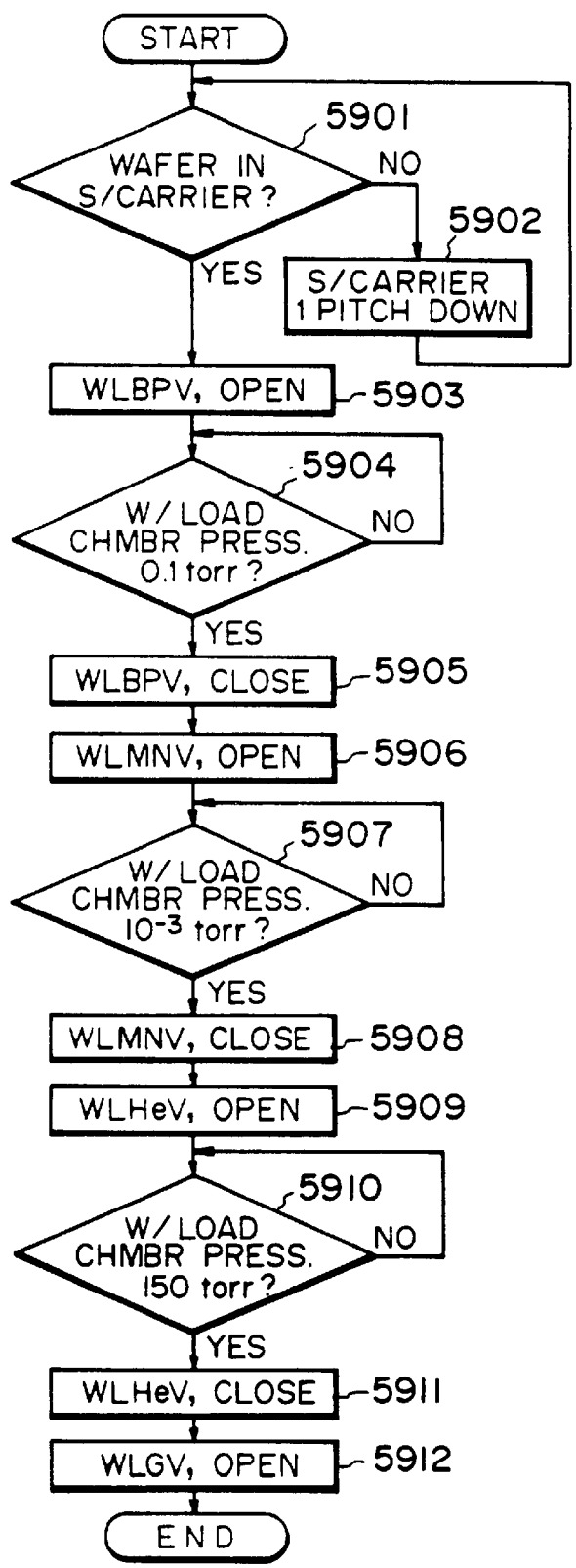
FIG. 59 is a flow chart illustrating a wafer supplying carrier setting.

Next, in the mask chamber, as shown in FIG. 57, the MRBPV 3401 is opened, and the He gas is discharged until the pressure gauge 3406 reaches 0.1 Torr, and then the MKBPV 3401 is closed at steps 5701–5703. Further, the MKMNV 3402 is opened to discharge until $10^{-3}$ Torr is reached, and then the MKMNV 3402 is closed at steps 5704–5706. Finally, the MKMN$_2$V 3404 is opened, and the N2 gas is introduced until the pressure gauge reaches 760 Torr. Then, the MKN$_2$V is closed at steps 5707–5709. When the gas supply and discharge treatment for each of the chambers (step 5402 in FIG. 54) is terminated, the RORB 3303, the MNTMP 3306, MNRP 3307 and the GCRP 3509 (pumps) are stopped at step 5403. This is the end of the sequential operation for shutting off the apparatus for long time rest.

Next, referring to FIG. 58 and FIG. 49 and FIGS. 25 and 33, the sequential operation for the wafer supply carrier taking out process 4910 will be described. At first, the supply carrier 2501 is lifted to the carrier exchanging position by the supply elevator driver 2504 at step 5801. Next, the WLGV 3108 is closed at step 5802, and the wafer loading chamber 3109 is isolated from the wafer injector chamber 3107. Then, the WLN$_2$ 3310 is opened to introduce the nitrogen gas at step 5803. When the pressure gauge 3314 of the wafer loading chamber reaches 760 Torr, the discrimination at the step 5804 is affirmative, so that the WLN2V is closed at step 5805. Finally, the WLLV 3312 is opened for a predetermined period of time at steps 5806–5808, by which the pressure in the chamber is balanced with the atmospheric pressure to make the opening of the chamber door easier.

The sequence for the wafer collecting carrier taking out process 4911 in FIG. 49 is similar, and detailed description is omitted for simplicity.

Referring to FIG. 59 and FIG. 49 and FIGS. 25 and 33, the sequential operation for the wafer supply carrier setting process 4914 will be described. It is assumed that the supply carrier is already placed on the supply carrier table 2503. When the door of the wafer loading chamber 3109 is closed, and the sequence starts, the discrimination is first made as to whether there is a wafer or not by the supply wafer detector 2507. If there is no wafer, the discrimination at step 5901 is negative, so that the supply carrier is moved down through one pitch by the supply elevator driver 2504 at step 5902. This is repeated until the wafer is detected (steps 5901 and 5902). This is to cover the case when the wafer is placed only at the upper portions of the carrier. If there is a wafer, the discrimination at the step 5901 is affirmative, so that the gas supply and discharge process starts. First, the WLBPV 3301 is opened to discharge the gas in the chamber at step 5903. When the pressure gauge 3314 of the wafer loading chamber reaches 0.1 Torr, the discrimination at the step 5904 is affirmative, so that the WLBPV 3301 is closed at step 5905. Next, the WLMNV 3304 is opened to further discharge at step 5906. When the pressure gauge reaches $10^{-3}$ Torr, the discrimination at a step 5907 is affirmative so that the WLMNV 3304 is closed at step 5908. Then, the WLHeV 3308 is opened so that the He gas is introduced at step 5909. When the pressure gauge reaches 150 Torr, the discrimination at the step 5910 is affirmative, and the WLHeV 3308 is closed at step 5911. Finally, the WLGV 3108 is opened to establish communication between the wafer loading chamber and the wafer injector chamber 3107 at step 5912.

The sequential operations for the wafer collecting carrier setting process 4915 in FIG. 49 is the same, and detailed description thereof is omitted for the sake of simplicity.

Referring to FIG. 60 and FIG. 19 and FIGS. 28–30 and 34, the sequential operation for the mask cassette taking out process 4918 will be described. First, in order to align the main assembly of the cassette 2801 with the cassette cover 2802 in the ωy direction, the indexer 2810 is rotated to its point of origin at step 6001. Then, the MKGV 3102 is closed to isolate the mask chamber 3103 from the main chamber 3101 at step 6002 to supply and discharge gas. First, the MRBPV 3401 is opened to discharge the He gas at step 6003. When the pressure gauge 3406 of the mask chamber reaches 0.1 Torr, the discrimination at the step 6004 is affirmative, so that the MKBPV 3401 is closed at step 6005. Then, the MKN$_2$V 3404 is opened to introduce the N2 gas at step 6006. When the pressure gauge reaches 760 Torr, the discrimination at step 6007 is affirmative so that the MKN$_2$V 3404 is closed at step 6008. Then, the mask cassette elevator 2805 is driven, by which the main assembly 2801 of the cassette is moved down from the position for engagement with the boss 2904 to the position for engagement with the cassette cover 2802, at step 6009. Here, the lever 3007 drives the cover locking pawl 3005 and the table locking pawl to separate the-main assembly from the table 2806, and is engaged with the cassette cover at step 6010. Subsequently, the mask cassette elevator is driven to move the table down to the bottommost position which is the home position at step 6011. Finally, the MRLV 3405 is opened for a predetermined period of time at steps 6012–6014, by which the pressure in the mask chamber 3103 is balanced with the atmospheric pressure to facilitate opening of the door of the chamber.

Referring to FIG. 49 together with FIG. 61 and FIGS. 28–30 and 34, the sequential operation of the mask cassette setting process 4921 will be described. It is assumed that the mask cassette 1304 is placed and locked on the cassette table 2803 by the cover locking unit 2804, and that it is placed at a predetermined position in the mask chamber 3103. When the door of the chamber is closed, and the sequence starts, the mask cassette elevator 2805 is driven to lift the table 2806 until it is abutted to the main assembly 2801 of the cassette at step 6101. Then, the lever 3007 drives the cover locking pawl 3005 and the table locking pawl 3006, to separate the main assembly from the cassette cover 2802, and is engaged with the table at step 6102. Then, the mask cassette elevator is driven to lift the main assembly of the cassette to be engaged with the boss 2904 at step 6103. Then, the gas supply and discharge operation is executed. At first, the MKBPV 3401 is opened to discharge the gas chamber at step 6104. When the pressure gauge 3406 for the mask chamber reaches 0.1 Torr, the discrimination is at the step 6105 is affirmative so that the MKBPV 3401 is closed at step 6106. Then, the MKMNV 3402 is opened to further discharge the chamber at step 6107. When the pressure gauge reaches $10^{-3}$ Torr, the discrimination at a step 6108 is affirmative so that the MKMNV 3402 is closed at step 6109. Subsequently, the MKHeV 3403 is opened, by which the He gas is introduced at step 6110. When the pressure gauge 150 Torr, the discrimination at step 6111 is affirmative so that the MKHeV 3403 is closed at step 6112. Finally, the MKGV 3102 is opened, so that the mask chamber 3103 and the main chamber 3101 are communicated with each other at step 6113.

Figure 62:
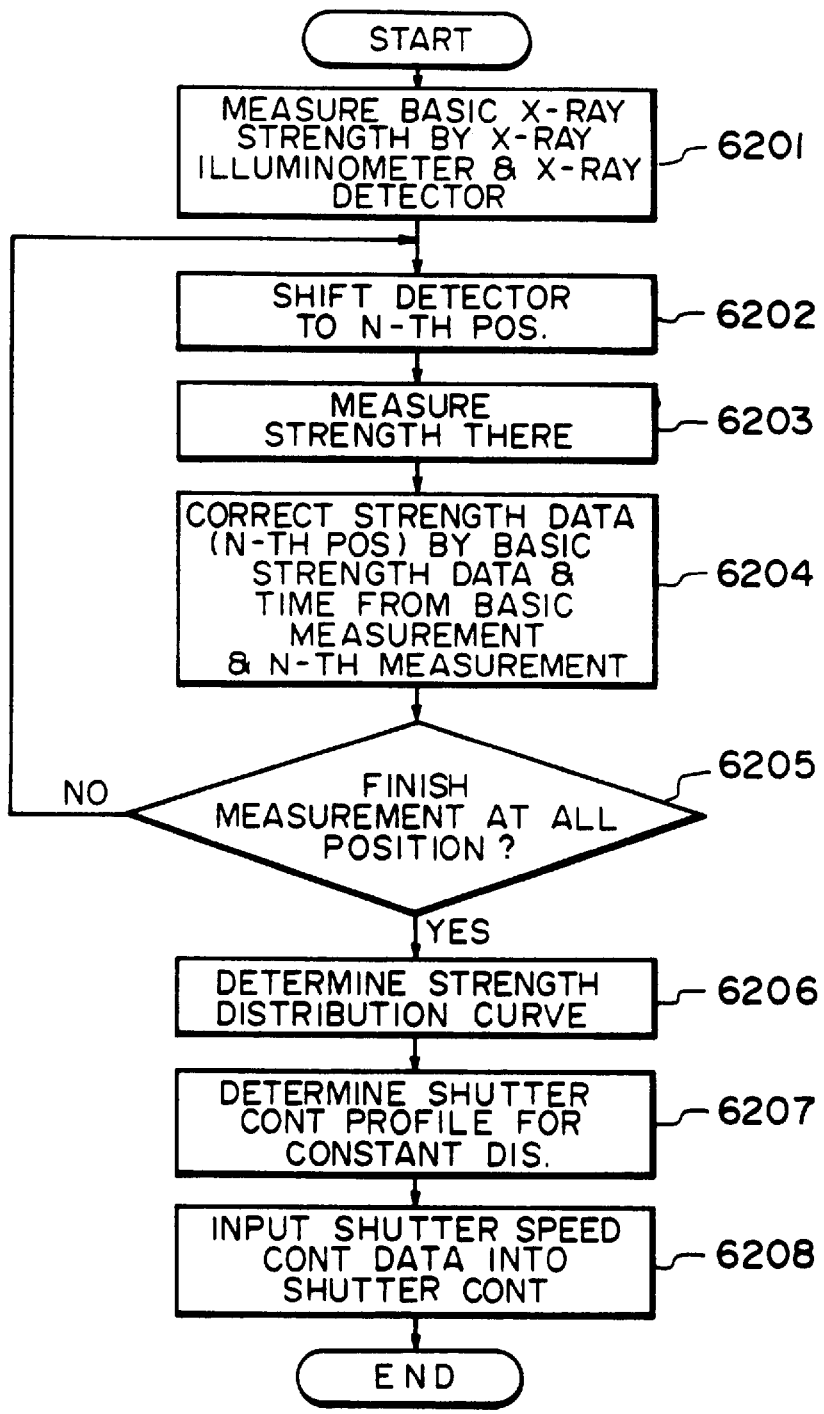
FIG. 62 is a flow chart illustrating X-ray strength profile measurement.

FIG. 62 is a flow chart illustrating the X-ray strength profile measurement process. Referring to FIGS. 15 and 67, too, the process will be described in detail.

At step 6201, the X-ray strength is measured which is the base of the measurement afterwards by the X-ray illuminometer 1541 for measuring the X-ray strength during exposure operation and the X-ray detector 1551 disposed on the wafer stage 1899 which is movable in the X and Y directions for measurement of the X-ray strength profile. During the measurement, the X-ray detector 1551 is placed at the same Y direction position as the X-ray illuminometer 1541. In this process, the X-ray strength determined by the X-ray illuminometer 1541 is called "DXSB" whereas the X-ray strength determined by the X-ray detector 1551 will be called "DSB". At step 6202, the X-ray detector 1551 is moved to the X-ray strength profile measuring positions (Psm) (FIG. 63) by moving the wafer stage 1899 in the Y direction. At step 6203, the X-ray strength at the measuring position is measured by the X-ray detector 1551. A datum of the X-ray strength detected at the position is expressed by "DSn", hereinafter. At step 6204, the data DSn obtained at the step 6203 is corrected by the attenuated amount of the strength of the X-ray from the SOR ring 4 due to the time delay from the point of time at which the basic data DSB is measured at step 6201 to a point of time at which the data DSn is obtained. The corrected data will be called "DSn'". The series of process from the step 6202 to the step 6204 provides the data DSn' of the X-ray strength at each of the measuring positions PSn having been corrected with the attenuation.

The process from the step 6202 to the step 6205 is repeated until the measurements cover all of the measurement positions PS1–PSn, at step 6205. When all the data DS1'–DSn' for all the measurement points are obtained, the sequence goes to the step 6206. At the step 6206, the data DS1'–DSn' after correction with attenuation are corrected on the basis of the relation between the DSB and the DXSB, and thereafter they are converter to values on the basis of the DXB replacing the DXSB, the DXB being a reference X-ray strength which has been separately determined with respect to the X-ray illuminometer 1541. This will be described referring to FIG. 64. The X-ray strength profile over the entire exposure area is determined by the X-ray strength data DX1–DXn at the measurement positions which have been converted on the basis of the DXB.

At step 6207, a shutter driving table determined so as to apply to the entire exposure area surface a separately determined uniform reference X-ray exposure amount when the X-ray strength by the X-ray illuminometer 1541 is DXB, is calculated on the basis of the X-ray strength profile determined at the step 6206. At stop 6208, the shutter driving data table determined at the step 6207 is set in the source table memory 4308 in the shutter controlling section 3913. This is the end of the X-ray strength profile measurement process.

Figure 63:
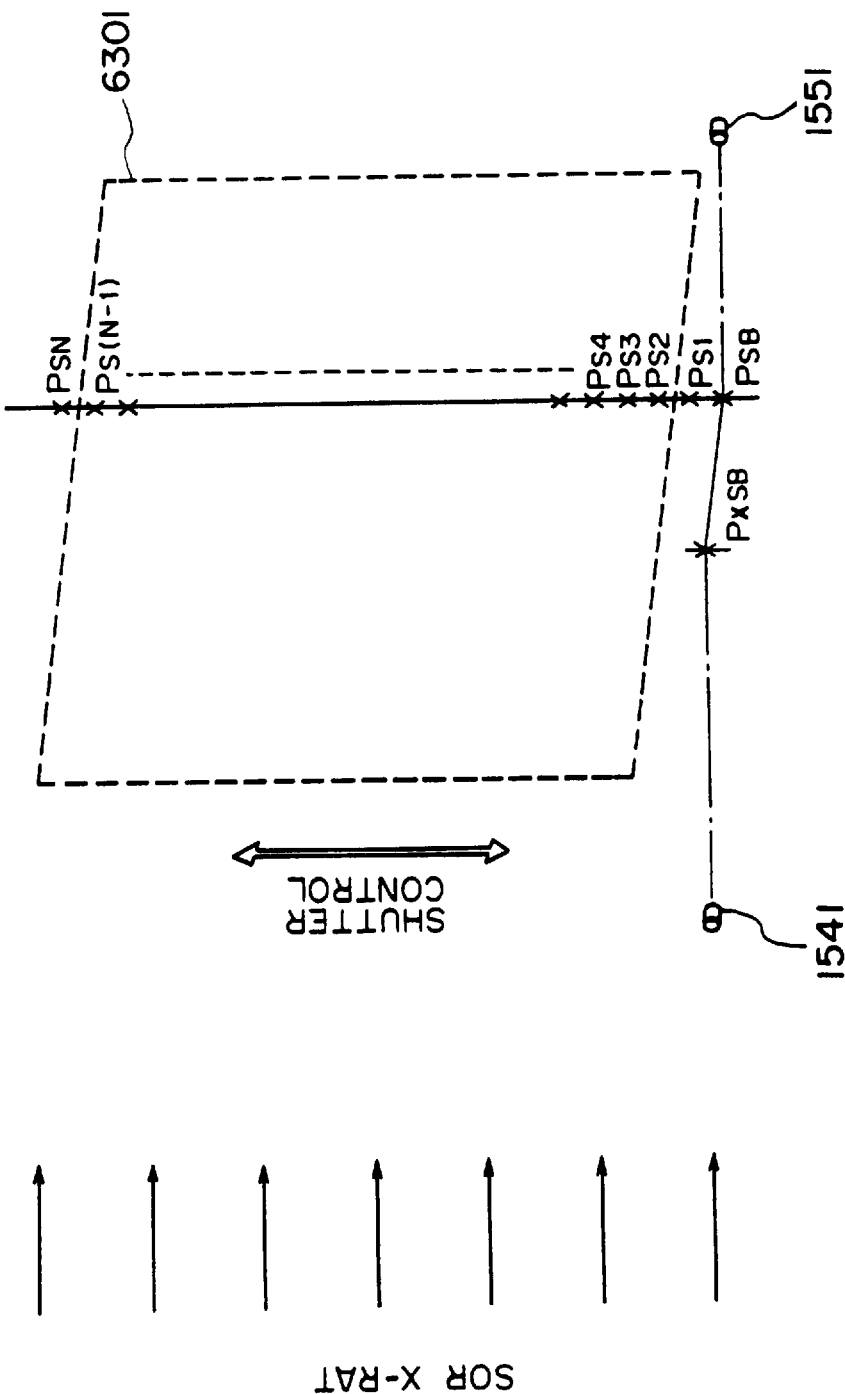
FIG. 63 illustrates a measurement position for the X-ray strength profile measurement position.

FIG. 63 shows schematically the measurement positions PSn when the X-ray strength profile is determined, wherein reference numeral 1541 designates an X-ray illuminometer, and 1551 designates the X-ray detector disposed on the wafer stage 1899 and movable in the X and Y directions. A broken line 6301 indicates the exposure area. Designated by the reference PXSB indicates the position of measurements by the X-ray illuminometer 1541 for DXSB, and the references PSB and PS1–PSn designate measurement points for DSB, DS1–DSn by the X-ray detector 1551. The positions PXSB and PSB may be at any position if they are the same in the shutter control direction (Y direction).

Figure 64:
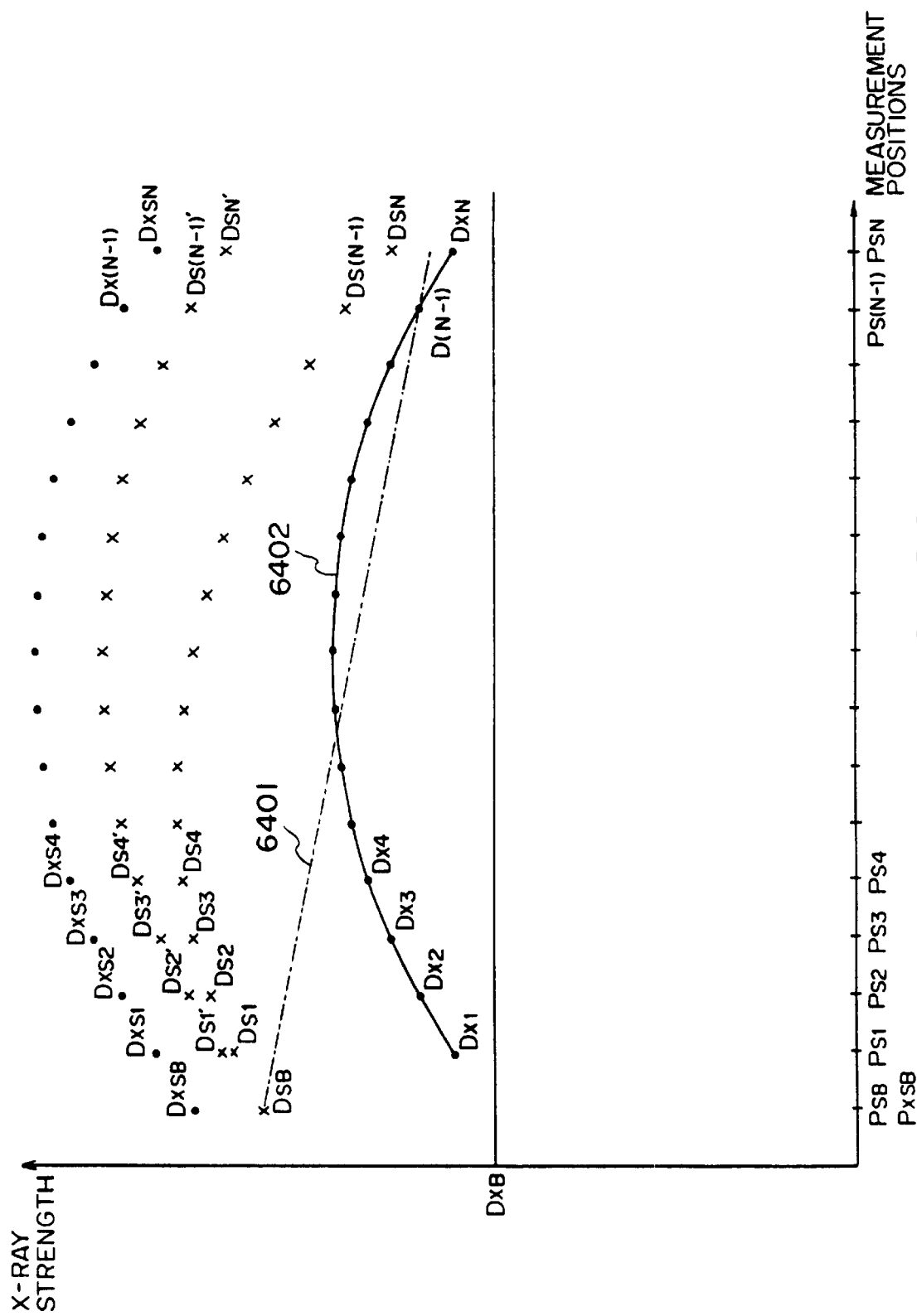
FIG. 64 is a graph of X-ray strength vs. measurement positions.

FIG. 64 is a graph illustrating the process of obtaining the X-ray strength profile from the X-ray strength measurements DSn at the measurement positions PSn. At each of the measurement positions PS1–PSn, the X-ray strength measurements DS1–DSn obtained by the X-ray detector 1551 are corrected by the attenuation of the X-ray strength shown by the X-ray strength attenuation carve 6401 to provide the phantom measurements DS1'–DSn' assuming no change of the X-ray strength. The data DS1'–DSn' are corrected by the difference between the X-ray basic strength measurements DXSB by the X-ray illuminometer 1541 and the X-ray basic strength measurement DSB by the X-ray detector 1551 to provide data DXS1–DXSn as a converted data of the X-ray illuminometer 1541 at the respective measurement positions. Therefore, the data DXS1–DXSn can be deemed as measurement data by the X-ray illuminometer 1541 at the positions PS1–PSn when the DXSB is measured by the X-ray illuminometer 1541. Further, the converted X-ray strength DX1–DXn at the measurement points when the DXSB is replaced with the reference X-ray strength DXB by the X-ray illuminometer 1541, are obtained to obtain an X-ray strength profile 6402 on the exposure surface relative to the DXB by the X-ray illuminometer 1541.

FIG. 65 illustrates the process for obtaining the shutter driving data from the X-ray strength profile, wherein reference numeral 6501 designates an exposure period curve which is determined from the above described X-ray strength profile 6402 so that the reference X-ray exposure amount separately determined can be provided on the exposure area surface in its entirety. The curve 6501 indicates the exposure period until each point in the exposure area is exposed to a reference amount of exposure when the X-ray having the reference X-ray strength DXB is applied to the X-ray illuminometer 1541.

After the shutter steel belt 1513 speed curve is so determined that the exposure period at each point on the entire exposure area determined as the period from passage of the leading edge 1531 of the aperture 1530 of the main shutter 1501 to the passage of the trailing edge 1532 is equivalent to the exposure period carve 6501, the shutter drive data is calculated as a data table of the time required for movement through a small constant distance.

Referring also to FIG. 66, in the determination of the shutter movement curve, the speed in the constant speed region is determined on the basis of the minimum exposure period $t_{MIN}$ in the exposure period curve 6501 and the distance 1 from the leading edge 1531 to the trailing edge 1532 of the shutter; and the exposure period region from the position $P_{MIN}$ providing the minimum exposure period to the shutter movement starting side a difference Δta at each point is corrected by the leading edge 1531 of the shutter, whereas the period region from the position $P_{MIN}$ to the end side of the shutter, the different tab at each point is corrected by the trailing edge 1532; more particularly those corrections are provided by the movement speed of the leading and trailing edges 1531 and 1532 of the shutter by determining the starting curve during the transient period before the constant speed region and the ending curve during the transient region after the constant speed period.

Figure 68:
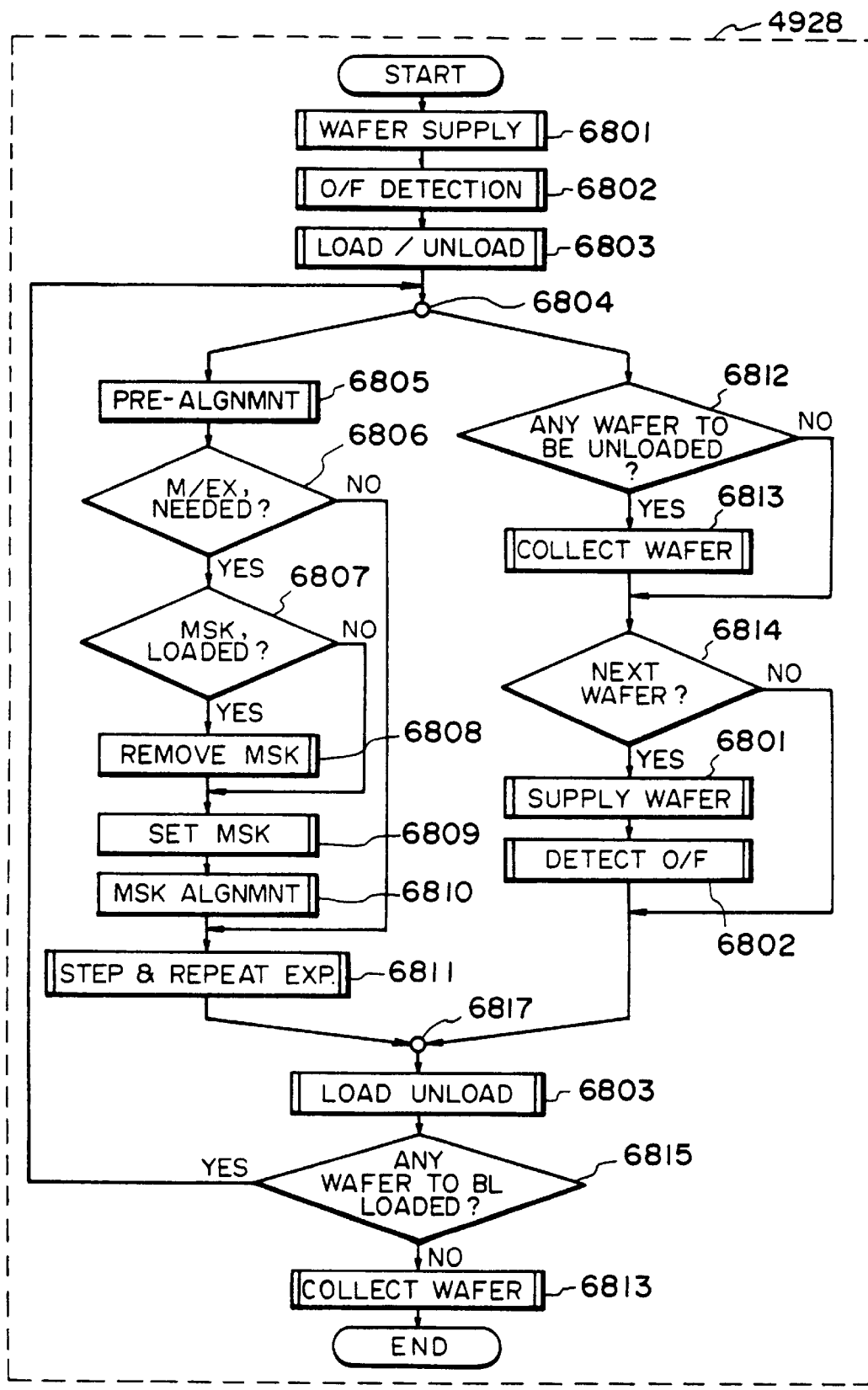
FIG. 68 is a flow chart for an exposure process.

FIG. 68 is a flow chart showing the wafer exposure sequential operation step 4928 for the wafer 3 in the supply carrier 2501 set in the apparatus, among the entire sequential operation of the apparatus of this embodiment described in conjunction with FIG. 49. It is assumed that all the job data necessary for the exposure operation have been downloaded to the main assembly of the apparatus, and that the supply/collecting carriers 2501 and 2502 and the mask cassette 1310 are correctly set in the apparatus in the manner described with FIG. 49.

The process from the step 6801 to the step 6803 peculiar to the first wafer in the supply carrier 2501, and the steps from 6804 to 6815 inclusive are executed simultaneously to the two wafers present simultaneously in the apparatus, that is the wafer on the process of the exposure and the wafer in the process of conveyance. The processings are executed concurrently.

At stop 6801, the first wafer 3 in the supply carrier 2501 is attracted and held by the injector hand 2512 and is conveyed to the orientation flat detection stage 1305 and is transferred to the orientation flat detection chuck 1521. At this time, the direction of the orientation flat of the wafer 3 is not known by the apparatus. Next, at step 6802, the eccentricity of the wafer 3 chucked on the orientation flat detection chuck 1521 is removed (X and Y directions), and the orientation flat is directed in the predetermined direction. When the direction of the orientation flat is determined within the tolerance from the target direction, the wafer 3 is attracted by the loading hand 2530 at step 6803, and is transferred to the wafer chuck 1807 in the main assembly.

The wafer 3 chucked by the wafer chuck 1807 is thereafter introduced into the exposure processing. On the other hand, the next wafer 3 is concurrently conveyed since the orientational detection chuck 2521 and the loading hand 2530 are now free. Step 6804 is the start of this concurrent processing. The description will be made at first as to the exposure process of the wafer 3 on the wafer chuck 1807 from the step 6805 to the step 6811. Thereafter, the wafer collecting and the next wafer supplying process will be described along the steps 6812–6802.

The wafer 3 on the wafer chuck 1807 is aligned with the apparatus by the prealignment system 1307 and step 6805. Then, at step 6806, the discrimination is made as to whether or not the mask 2 on the mask chuck 1903 is the correct mask for the wafer which is going to be exposed. If so, the sequence goes to the step and repeat exposure processing operation. If not, or if no mask is on the mask chuck 1903, it goes to the step 6807 where if another mask 2 is on the mask chuck 1903, it goes to step 6808, if not it directly goes to step 6809 for mask setting. At step 6808, the mask 2 chucked by the mask chuck 1903 is taken by the mask hand 2606 and is returned to a predetermined cassette stage 3001 in the cassette main assembly 2801. After the mask chuck 1903 becomes empty, the desired mask 2 in the main assembly of the cassette 2801 is conveyed by the mask hand 2602 and is loaded into the mask chuck 1903, at step 6809. The information of the desired mask is included in the job data downloaded before the start of the exposure sequence.

At step 6810, the alignment is effected between the main assembly of the apparatus and the mask 2 now loaded on the mask chuck 1903.

After the wafer 3 on the wafer chuck 1807 and the mask 2 on the mask chuck 1903 are aligned with the respective references, the step and repeat exposure process is executed at step 6811. At the step 6811, the alignment operation is effected between each of the exposure shot (a pattern 8201 on the wafer) on the wafer 3 and the pattern 8202 on the mask, and then the wafer is exposed through the pattern; and the series of the operations is repeated. Upon completion of a predetermined number of shots or all shots, the operation is synchronized with the wafer collecting and supply processing which will be described hereinafter, and then the next steps are executed.

The wafer collecting and supplying process from step 6812 to step 6802 will be described. First, at step 6812 the discrimination is effected as to whether there is a wafer 3 conveyed by the unloading hand 2531 or not, that is, whether the wafer in the exposure process is the first wafer or the second subsequent wafer. If the second or subsequent wafer after exposure is conveyed by the unloading hand 2531, the wafer is conveyed and accommodated into the collecting carrier 2502 by the injector hand 2512 through the orientation flat detection stage, at step 6813. At step 6814, the discrimination is made as to whether or not the wafer to be exposed next is present in the supply carrier. If so, the above-described wafer supply (step 6801) and orientational flat detection (step 6802) are carried out in the same manner as described above, so that as soon as completion of the exposure processing of the currently processed wafer, the next wafer can be transferred to the exposure position. The next wafer is waiting for the completion of the preceding wafer exposure operation.

Step 6817 expresses the synchronization between the concurrent exposure process and wafer collection-supply process. After completion of those processes, the exposed wafer (the wafer on the wafer chuck 1807) and the non-exposed wafer (the wafer on the orientation flat detection chuck 2521) are conveyed to the orientational flat detection chuck 2521 by the unloading hand 2531 and to the wafer chuck 1807 by the loading hand 2530, respectively, at step 6803. Then, at step 6815, the sequence goes back to the step 6804 where the exposure process and the wafer collection/supply process are performed concurrently if the earlier wafer supply discrimination at step 6814 is affirmative. If not, that is, the wafer is not supplied at step 6814, further in other words, if the wafer on the orientational flat detection chuck 2521 after being exposed is the last wafer, the next step 6813 is executed, and the wafer is accommodated into the collection carrier, and the sequential operation ends.

Figure 69:
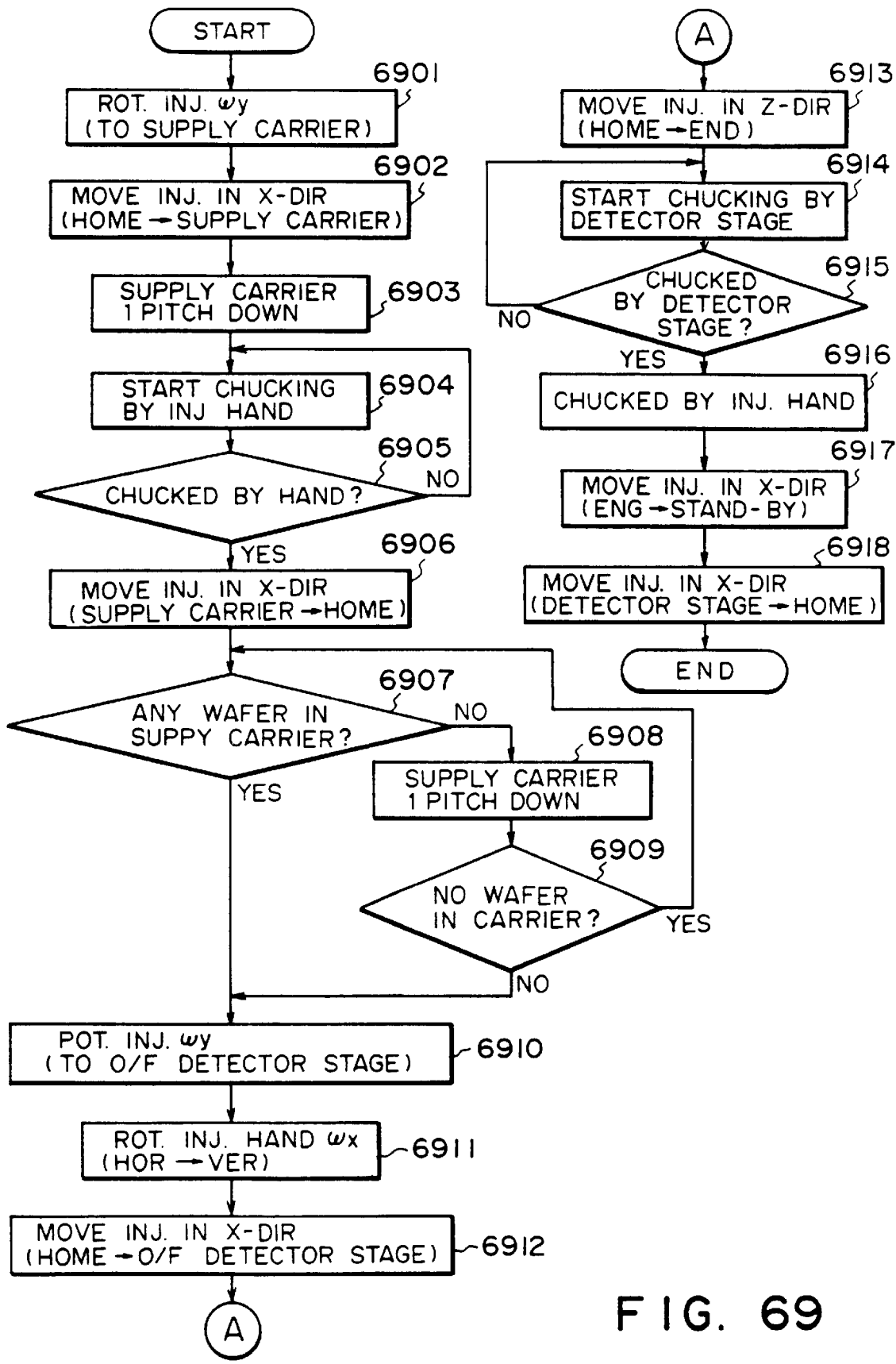
FIG. 69 is a flow chart of a wafer supply operation.

Referring to FIG. 69 and FIG. 25, the sequence of the wafer supply process 6801 shown in FIG. 68 will be described. First, by the injector ωy driver 2515, the injector 1304 is rotated to oppose the injector hand 2512 to the supply carrier 2501 at step 6901. Then, the injector X-stage 2517 is moved so that the injector hand 2515 comes under the wafer 3 in the supply carrier 2501 at step 6902. The supply elevator driver 2504 then moves down the supply carrier 2501 by one pitch of the carrier at step 6906, and the vacuum attraction by the injector hand 2512 starts at step 6904. When the wafer 3 is attracted by the hand 2515, the discrimination at the step 6905 is affirmative, so that the injector X stage 2517 retracts the injector hand 2515 to the original position at step 6906.

Here, the discrimination is made as to whether there is a wafer 3 to be supplied next, by the supply wafer detector 2507 at step 6907. If there is no wafer 3, the supply carrier is moved down by one pitch similarly to the step 6903, at step 6908. At step 6909, the discrimination is made as to whether the wafer supply is completed or not depending on the count of the supply wafer counted by the conveying system control unit 4601. If not, the step 6907 is executed again. If it is discriminated that there is a supply wafer at step 6907, the injector 1304 is rotated opposite to the direction in the step 6901, at step 6910, so that the injector hand 2515 is detected to the orientation flat detection stage 1305. Then, the injector ωx driver 2514 rotates the injector hand 2512 carrying the wafer 3 from its horizontal state to a vertical state, at step 6911. Then, the injector X stage 2517 is moved to the position where the back side of the wafer is opposed to the orientation flat detection chuck 2521, at step 6912. Subsequently, the injector Z stage 2520 is moved so that the back surface of the wafer is contacted to the surface of the orientation flat detection chuck, at step 6913, and the vacuum chucking of the orientation flat detection chuck 2512 is started at step 6914. When the wafer 3 is attracted by the orientational flat detection chuck 2521, the discrimination at step 6915 is affirmative so that the attraction by the injector hand 2515 is stopped at step 6916. Subsequently, the injector Z stage 2520 is moved to assure the clearance between the injector hand 2515 and the back surface of the wafer at step 6917. Finally, the injector X-stage 2517 is moved to the home position, and the injector hand 2515 is moved away from the orientational flat detection stage 1305 at step 6918.

Figure 70:
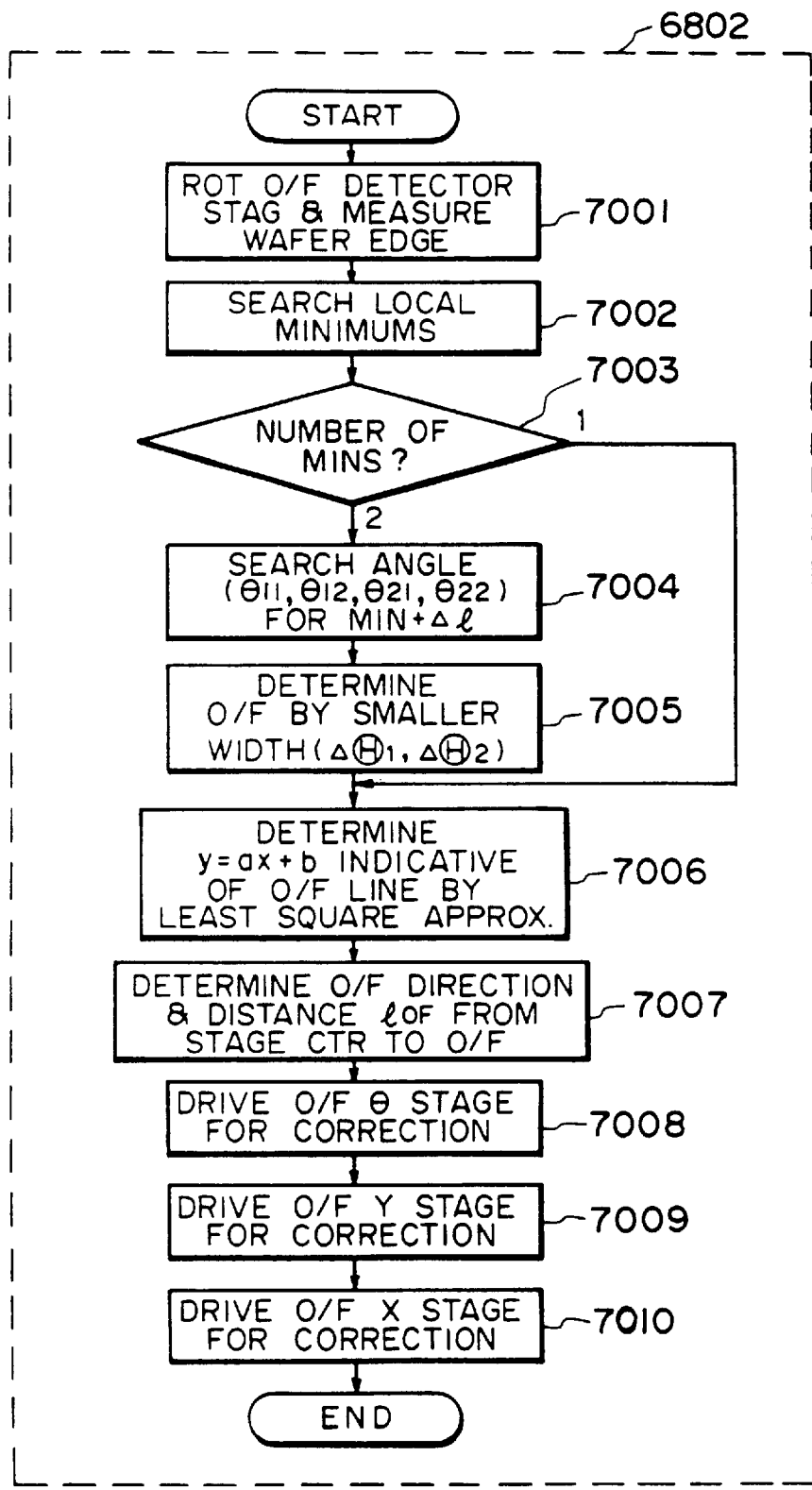
FIG. 70 is a flow chart for orientation flat detection.

FIG. 70 is a flow chart showing the sequential operation of the orientational flat detection step 6802 in the exposure process of the apparatus.

At the time when the orientational flat detection starts, the wafer 3 is attracted by the orientation flat detection chuck 2521 shown in FIG. 25, and the orientation flat faces in an unknown direction, and the center of the wafer 3 and the center of the orientation flat detection Θ stage 2523 which will hereinafter be called "stage center" in the description of this sequence, are deviated resulting from the error during the execution of the wafer supplying sequence 6801 shown in FIG. 68. The orientation flat detection X stage 2527 and the orientation flat detection Y stage 2529 are at measuring positions.

In the step 7001 in FIG. 70, the Θ axis driver 4617 is driven to the orientation flat detection interface 4614 shown in FIG. 46, and the orientation flat detection Θ stage 2523 is rotated at a constant speed, during which the wafer edge positions are determined at regular angular intervals for one full rotation of the wafer. The measuring method at one point is such that the line sensor illumination system 2524 projects a beam for a predetermined period of time to the line sensor 2525 disposed at the same level as the center of the stage, and the charge accumulated on the line sensor 2525 during illumination is transmitted to the orientation flat detection sensor signal processing station 4618, and the wafer edge position is produced as an output. From the output and the mounting position of the line sensor 2525 from the stage center, the distance from the stage center to the wafer edge can be obtained. The angle through which the orientation flat detection Θ stage 2523 rotates from completion of measurement of one full turn of the wafer to the stoppage of the stage 2523 is memorized as an overrun rotation, and it is fed back during correcting drive.

Figure 71:
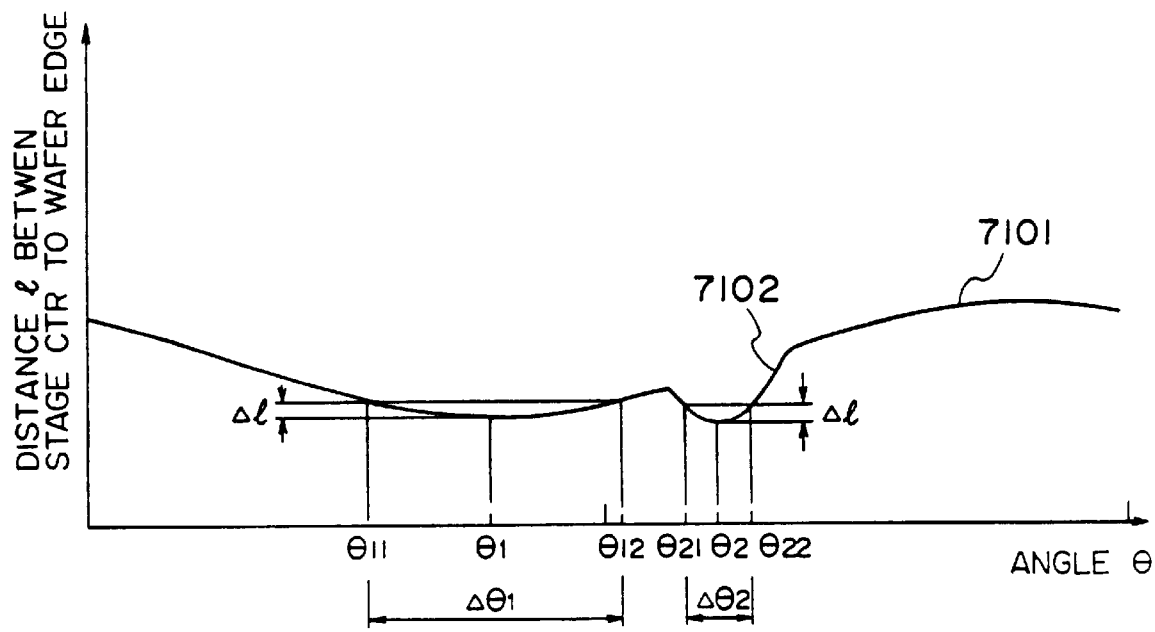
FIG. 71 is a graph illustrating orientation flat detection.

FIG. 71 is a graph of a distance 1 from the stage center to the wafer edge relative to the angular position of the orientational flat Θ stage 2523. Designated by reference 7101 is a curve showing change of the distance 1, and when there is no eccentricity between the stage center and the wafer center, the portion of the circle appears as a rectilinear line. A line 7102 is a curve showing the change of distance 1 corresponding to the orientation flat.

From the step 7002 to the step 7007, the data obtained by measurements are processed to discriminate the position of the orientation flat. At step 7002, the series of data 1 is scanned to find the minimum, and the minimum distance 1 and the angle providing it are memorized. The number of minimum can be one or two depending on the eccentricity and the direction of the orientation flat. If it is one, it corresponds to the orientation flat. However, if it is two, discrimination is required as to which represents the orientation flat. At step 7003, the discrimination is made as to the necessity of discriminating the orientation flat depending on the number of minimums. If it is not necessary, the sequence goes to step 7006.

If the number of minimums is two, the fact that the change of the series of data 1 is steeper in the portion corresponding to the orientation flat than in the portion not corresponding to the orientation flat, and the discrimination is effected in the following manner. At step 7004, the data series 1 is scanned from the minimum toward left and right to search a rotational angle ($\Theta 11$, $\Theta 12$, $\Theta 21$, $\Theta 22$ in FIG. 71) giving 1=minimum+$\Delta 1$, where $\Delta 1$ is small enough. The small distances $\Delta 1$ is selected so that during the scan the maximum between two minimums is skipped. As an example of selection, $\Delta 1$ may be determined as a difference between the smaller one of the maximums and the larger one of the minimums. At step 7005, $$\Delta\Theta 1 = \Theta 12 - \Theta 11$$

$$\Delta\Theta 2 = \Theta 22 - \Theta 21$$

The smaller one of $\Delta\Theta 1$ and $\Delta\Theta 2$ is deemed as corresponding to the orientation flat.

At step 7006, from a set of measurement point ($\Theta i$, 1) corresponding to the orientation flat, the wafer edge coordinates (xi, yi) on the coordinates having the point of origin coincident with the stage center is obtained as $$xi = 1i \cos \Theta i$$

$$yi = 1i \sin \Theta i,$$

and a formula y=ax+b representing the edge of the orientation flat is obtained by least square approximation. The points of measurement have to be on the orientation flat edge, and are determined depending on the wafer diameter, the length of the orientation flat and the maximum possible eccentricity.

Figure 72:
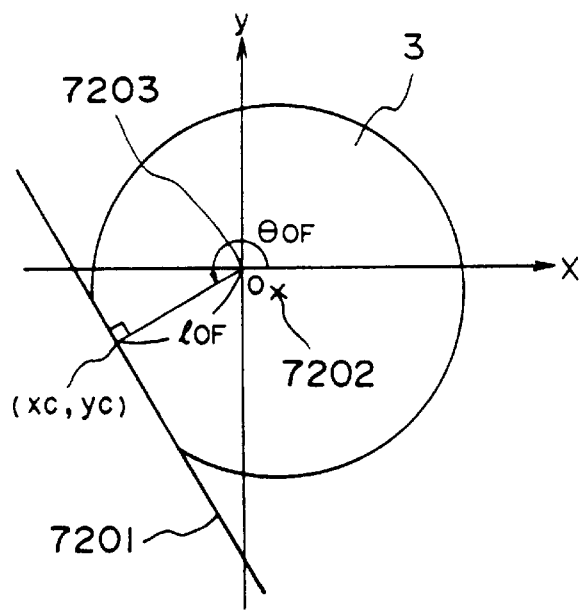
FIG. 72 is a top plan view of a wafer in coordinates of the stage.

FIG. 72 is a view of a wafer on the coordinates having the point of origin coincident with the stage center. In this Figure, the wafer 3 has a center 7202, and the orientation flat thereof is on a line 7201 on the coordinates having the point of origin 7203 which is coincident with the stage center. At step 7007, on the basis of the line represented by y=ax+b obtained at step 7006, an angle formed between the X axis and a line passing through the stage center 7203 and perpendicular to the line 7201, that is, the direction of the orientation flat $1_{OF}$ and the length $\Theta_{OF}$ of the perpendicular line, that is, the distance from the stage center 7203 to the orientational flat are obtained by the following equations.

$$\Theta_{OF} = \tan^{-1}(-1/a)$$

-continued
$$l_{OF} = \sqrt{x_c^2 + y_c^2} = |b|/\sqrt{a^2 + 1}$$

where ($x_c$, $y_c$) are coordinates of the point of intersection between the line 7201 and the perpendicular line. Since the angle $\Theta_{OF}$ is determined by $\tan^{-1}$, and therefore −90 degrees<$\Theta_{OF}$<90 degrees. Therefore, the correction should be made to provide 0 degree<$\Theta_{OF}$<360 degrees from the coordinates ($x_c$, $y_c$). From the step 7008 to the step 7010, the correcting drive is effected on the basis of the calculation to the position of transferring the wafer to the loading hand 2530. At step 7008, the amount of correcting drive is calculated so as to direct the orientation flat in consideration of the amount of overrun during measurement, and the $\Theta$ axis driver 4617 drives it through the orientation flat detection interface 4614 so that the orientation flat detection stage 2523 is rotated in the direction of smaller amount of drive. In order to remove the possible backlash, it is finally abutted in one direction. At step 7009, the distance between the stage center and the orientation flat determined at step 7007 is used to drive the Y axis driver 4616 through the orientation flat detection interface 4614 to move the orientation flat detection Y stage 2529 so that the height of the orientation flat is the height at the time of the X direction abutment. At step 7010, the line sensor 2515 and the illuminating system 2524 for the line sensor are used, and the X axis driver 4615 is driven through the orientation flat detection interface 4614 while detecting the wafer edge position through the orientation flat detection sensor signal processing station 4618, so that the orientation flat detection X stage 2527 is moved to bring the wafer to the design position in one direction abutment.

Figure 73A:
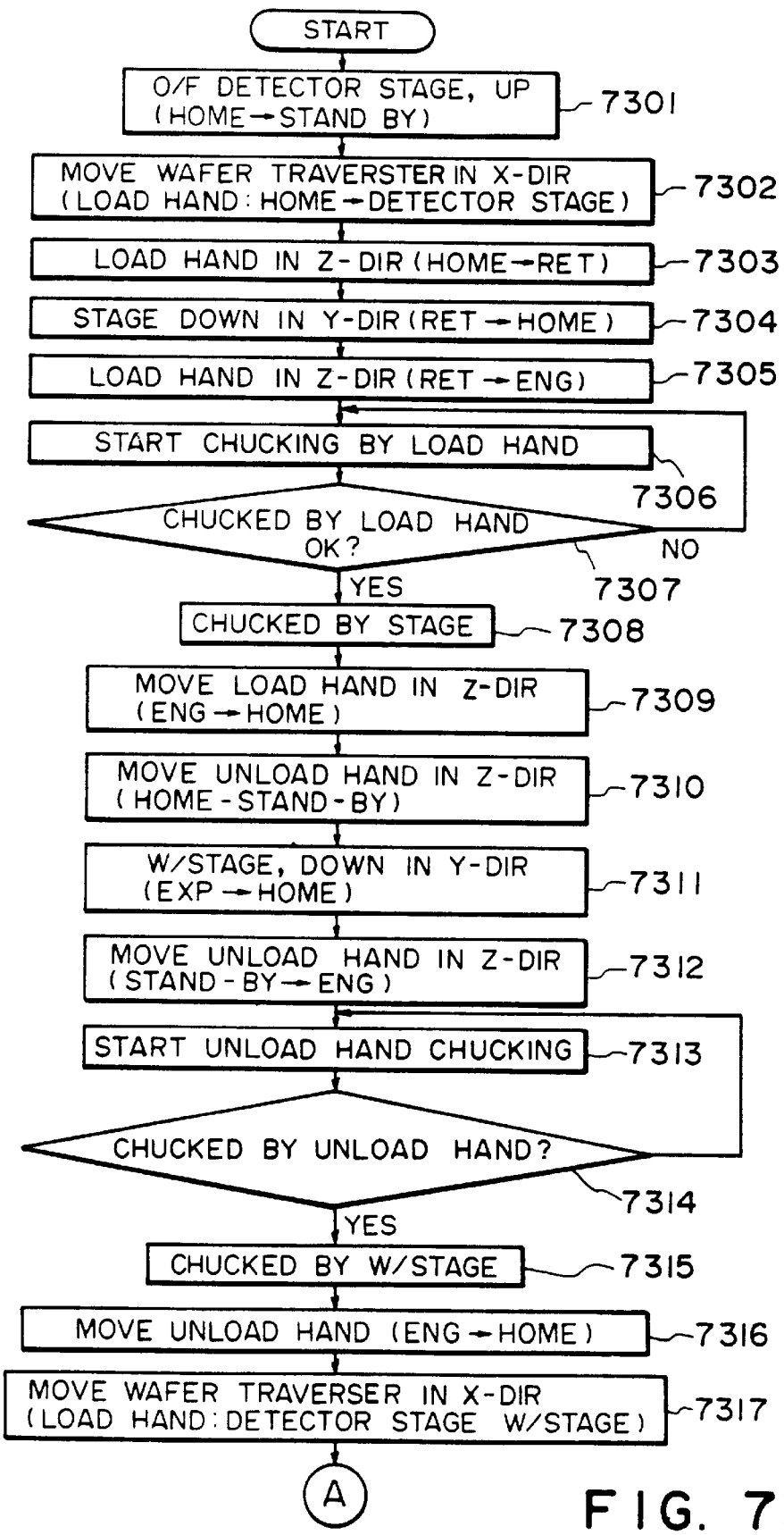
FIGS. 73A and 73B are flow charts illustrating loading and unloading operations.
Figure 73B:
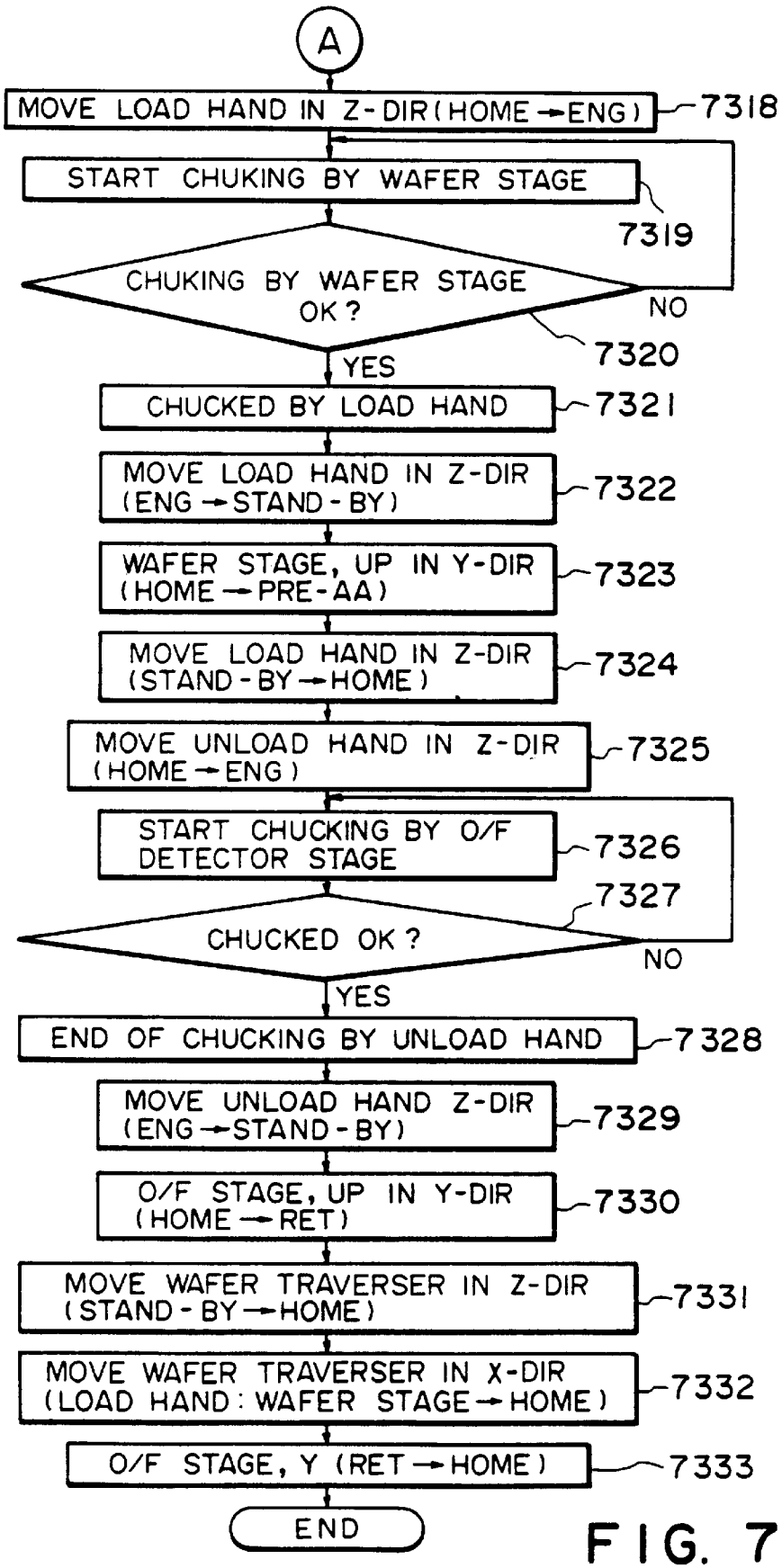

Referring to FIG. 73, FIG. 68 and FIG. 24, the sequential operation of loading/unloading operation 6803 will be described.

First, the orientation flat detection Y stage 2529 is moved upwardly to move the wafer at a retracted position so that the loading hand 2530 of the wafer traverser 1306 can be inserted under the back surface of the wafer on the orientation detection chuck 2521 at step 7301. Next, the traverser X driver 2538 moves the loading X stage 2536 and the unloading X stage 2537 placed at the form position which is intermediate of the stroke so that the loading hand 2530 comes to the orientation flat detection stage 1305 side, and the unloading hand 2531 is at the wafer stage side, at step 7302. Next, the loading $Z_0$ stage 2532 is moved, so that the loading hand 2530 is brought to the back side of the supply wafer on the orientation detection chuck 2521, at step 7303. Then, the orientation flat detection Y stage 2529 is moved down to its original position, at step 7304. The load $Z_0$ stage 2530 is then moved to contact the loading hand 2530 to the back side of the wafer at step 7305, and the vacuum attraction of the loading hand 2530 is started, at step 7306. When the supply wafer 3 is attracted to the loading hand 2530, the discrimination at a step 7307 is affirmative so that the attraction by the orientation flat detection chuck 2521 is stopped at step 7308. Then, the loading $Z_0$ stage 2532 is moved to return the loading hand 2530 attracting the supply wafer to the original position (a home position of the loading $Z_0$ stage) at step 7309.

On the other hand, the unloading hand 2531 is moved at step 7310 by the unloading $Z_W$ stage 2533 so that it is brought under the backside of the wafer to be corrected (the wafer having been exposed) on the wafer chuck 1807. At step 7311, the wafer stage 1899 is moved downwardly to a wafer transfer position from the exposure position. Next, the unloading $Z_W$ stage 2533 is moved so that the unloading hand 2531 is contacted to the backside of the wafer to be collected, at step 7312, and the vacuum attraction of the unloading hand 2531 is started at step 7313. When the unloading hand 2531 attracts the wafer to be collected, the discrimination at a step 7312 is affirmative so that the vacuum attraction by the other wafer chuck 1807 is stopped, at step 7315. Then, the unloading $Z_W$ stage 2533 is moved, and the unloading hand 2533 attracting the wafer to be collected is returned to the original position (a home position of the unloading $Z_W$ stage) at step 7316.

Next, the traverser X driver 2538 moves the loading X stage 2536 and the unloading X stage 2537 so that the loading hand 2530 is at the wafer stage side, and the unloading hand 2531 is at the orientation flat detection stage side at step 7317. Subsequently, the loading $Z_0$ stage 2532 is operated to contact the supply wafer attracted and held on the loading hand 2530 to the surface of the wafer chuck 1807 at step 7318, and the vacuum attraction by the wafer chuck 1807 is started at step 7319. When the supply wafer is attracted by the wafer chuck 1807, the discrimination at step 7320 is affirmative so that the attraction by the loading hand 2530 is stopped, at step 7321. The loading $Z_0$ stage 2532 is then moved, and the clearance between the loading hand 2530 and the backside of the supply wafer is assured at step 7322.

Next, the wafer stage is moved upwardly to the automatic prealignment position at step 7323, the loading hand 2530 is returned to the original position which is a home position of the loading $Z_0$ stage at step 7324. On the other hand, the unloading hand 2531 contacts the wafer to be collected on the surface of the original flat detection chuck 2521 by movement of the unloading $Z_W$ stage 2533 at step 7325, the vacuum attraction by the orientation flat detection chuck 2521 is started at step 7326. When the collected wafer is attracted to the orientation flat detection chuck 2521, the discrimination at step 7327 is affirmative so that the attraction by the unloading hand 2531 is stopped at step 7328. Subsequently, the unloading $Z_W$ stage 2533 is moved to assure the clearance between the unloading hand 2531 and the back surface of the collected wafer at step 7329. The orientation flat detection Y stage 2529 is then moved upwardly to place the collected wafer to a retracted position at step 7330, and the unloading hand is returned to the original position (the home position of the unloading ZW stage), at step 7331. Subsequently, the traverser Z driver 2538 moves the loading X sage 2536 and the unloading X stage 2537 at step 7332 so that the loading hand 2530 and the unloading hand 2531 are at the home positions between the strokes. Finally, the orientation flat detection Y stage is returned to the original position at step 7333.

When there is no wafer to be supplied, the steps 7301, 7303–7309 and 7318–7324 are not executed. Similarly when there is no wafer to be collected, the steps 7310–7316, 7325–7331 and 7333 are not executed.

Figure 74:
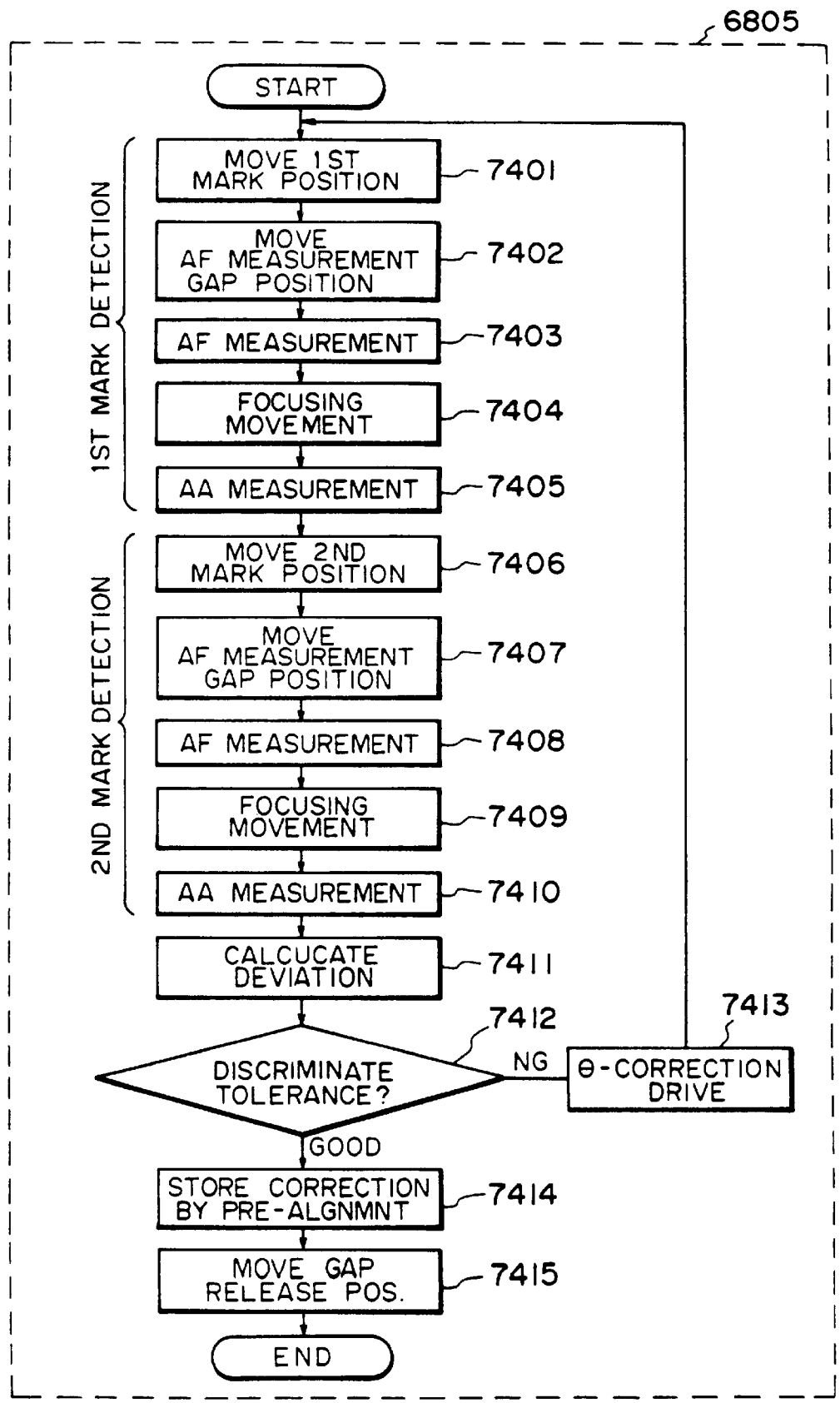
FIG. 74 is a flow chart illustrating a prealignment operation.
Figure 75:
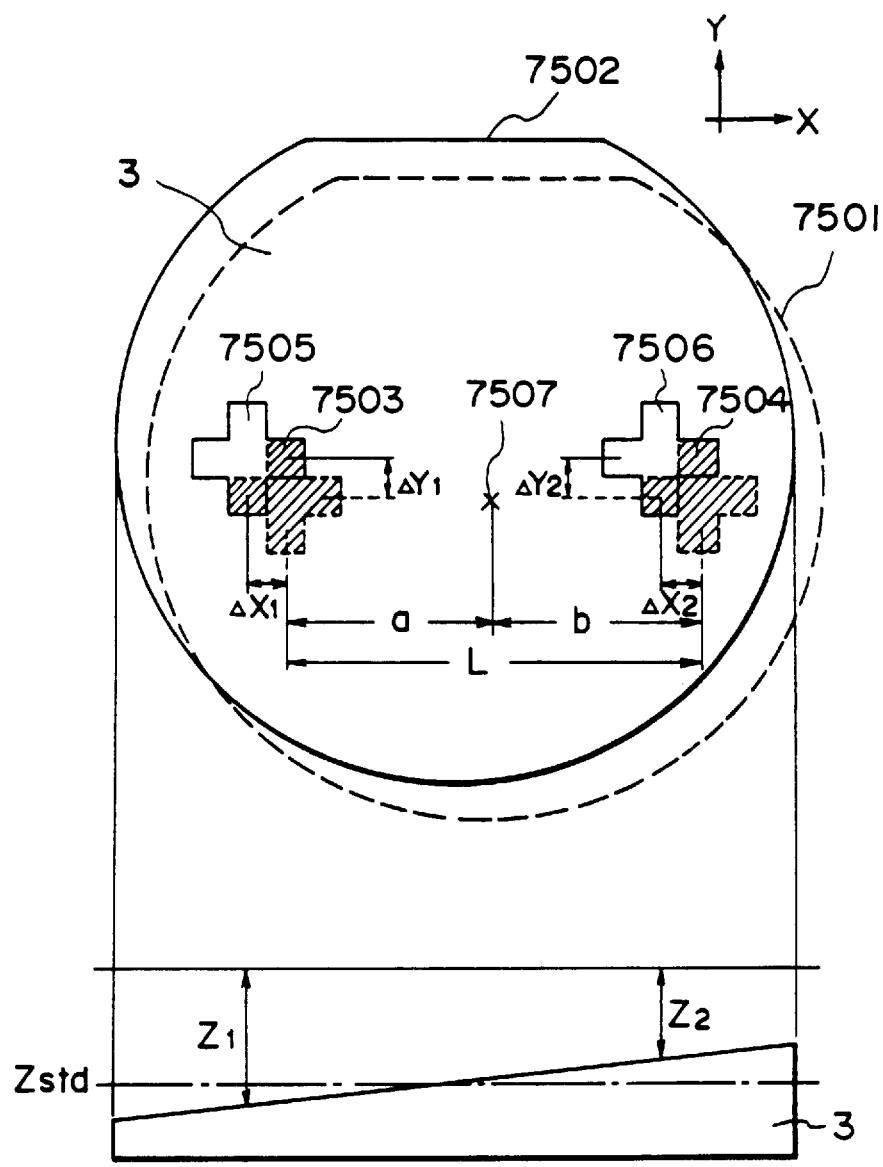
FIG. 75 is a top plan view illustrating positions of prealignment mark.
Figure 76:
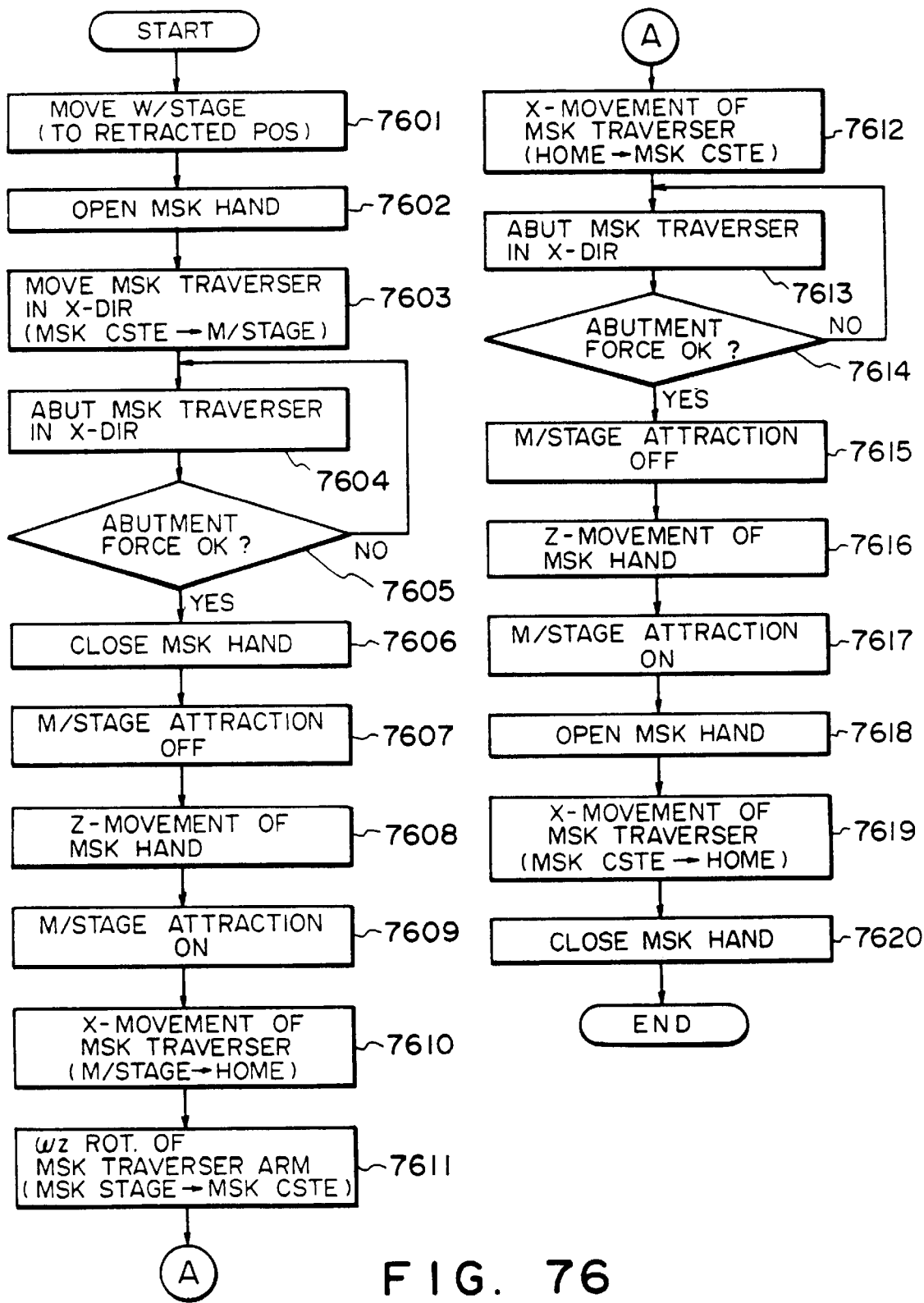
FIG. 76 is a flow chart for a mask taking up operation.
Figure 77:
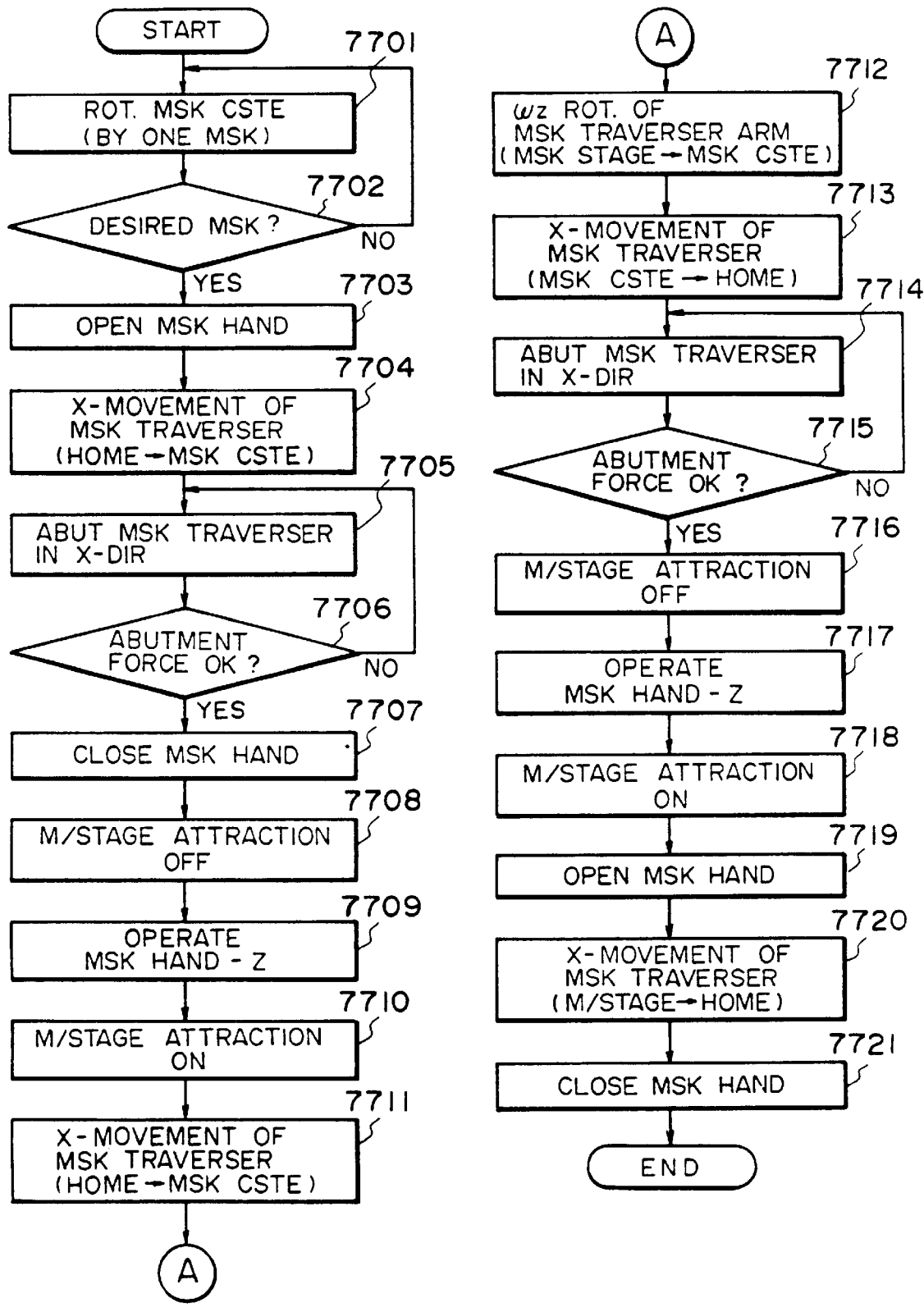
FIG. 77 is a flow chart illustrating a mask setting operation.

FIG. 74 is a flow chart showing the sequential operation in the step 6805 of the wafer prealignment operation among the exposure processing by this apparatus described with FIG. 68. In the flow chart, there is shown a prealignment operation for a wafer 3 to be processed for the second or subsequent layer, that is, the wafer 3 having the alignment mark. When the wafer prealignment starts, the wafer 3 is not aligned with the target position 7501 of the wafer chuck 1807 as shown in FIG. 75 due to the orientation flat detection error and the wafer loading error during the previous sequence, and therefore, the wafer 3 is shown as being deviated in the X and Y and rotational directions (7502). Also, the thickness of the wafer is not uniform and the nonuniform thickness involves, particularly, a wedge shaped component. At first, at step 7401, the X coarse movement stage 1710 and the Y coarse movement stage 1705 shown in FIG. 17 are driven in order to permit observation of the first mask, so that the objective lens 2106 of the prealignment optical system (FIG. 21) and the target position of the first mark 7503 are opposed. Next, at step 7402, the Z tilt driving inch worm 1813 (FIG. 18) drives the Z tilt stage 1805, during which, the drive by the inch worm 1813 is controlled on the basis of the output of the Z tilt control displacement sensor 1820, and the Z tilt stage 1805 moves through a distance corresponding to a reference gap Zstd which is predetermined. By this, the detection of the wafer 3 position in the Z direction (gap in the Z direction) can be performed by the automatic prefocusing system 2119–2124, the wafer 3 being on the Z tilt stage 1805.

At step 7403, the output from PSD 2124 shown in FIG. 21 is processed by the automatic prealignment and prefocusing controlling section 3907 shown in FIG. 39 to determine the gap Z1. At step 7404, the correction drive amount is calculated from the actual gap Z1 obtained and the target gap Zstd as$\Delta$Z1=Zstd-Z1. The Z tilt driving inch worm 1813 is actuated to move the Z tilt stage 1805 so that the gap of Zstd is provided to the currently measured wafer surface. Thus, the focusing is accomplished in the automatic prealignment optical system (FIG. 21). At step 7405, the output of the camera sensor 2117 shown in FIG. 21 is processed by the automatic prealignment and prefocusing controlling section 3910 to determine the deviations of $\Delta$X1 and $\Delta$Y1 between the target position 7503 and the actual position 7505 of the first mark. Through the above-described steps 7401 to 7405, the thickness deviation Z1 from an ideal wafer at the first mark position and the deviations $\Delta$X1 and $\Delta$Y1 of the first mark from the target position may be determined. Through steps 7406 to 7410, the same operations are performed to the second mark to provide the thickness deviation $\Delta$Z2 (=Zstd-Z2) and the deviations $\Delta$X2 and $\Delta$Y2 between the target position 7504 and the actual position 7506.

At step 7411, a rotational deviation $\Delta\Theta$1 of the wafer 3 is calculated out of the deviations of the two marks. Hereinafter, "i" in the form of subscript represents the number of iteration of the correcting movement loop. At step 7412, the calculated $\Delta\Theta$i is compared with a predetermined tolerable rotational deviation, and if it is outside the tolerance, the $\Theta$ coarse stage 1806 is actuated by the $\Theta$ coarse mechanisms 1814–1816 shown in FIG. 18 to correct only the rotational deviation $\Delta\Theta$i at step 7413, and the sequence goes to the step 7401 to repeat the operation from the detection of the first mark deviation, at step 7413. If, on the other hand, the deviation is within the tolerable range, the thickness deviation $\Delta$Zpa, the deviations $\Delta$Xpa and $\Delta$Ypa from the target position and $\Theta$pa obtained by the prealignment sequence is memorized at step 7414 which can be used in the exposure process. Or, they are immediately corrected. Finally, at step 7415, the Z tilt stage 1803 is moved down to move the chucked wafer 3 away from the objective lens 2106 of the prealignment optical system.

The foregoing description has been made as to the wafer to be processed for the second or subsequent layer. If the wafer 3 is for the first layer formation, there is no mark on the wafer to be detected for the purpose of alignment, and therefore, the detection at the step 7405 and 7410, the focusing drive at steps 7404 and 7409, the error evaluation at step 7412, and the $\Theta$ correction driver at step 7413 are not necessary. Therefore, in this case, the prealignment sequence is performed to determine the wafer thickness deviation $\Delta$Zpa which is used in the exposure operation.

Referring to FIG. 75, the calculation of the amount of correction during the prealignment operation will be described. Using the X, Y direction deviations ($\Delta$X1, $\Delta$Y1) and ($\Delta$X2, $\Delta$Y2) determined at the above-described steps 7405 and 7410, the X and Y deviations of the entire wafer 3 are obtained as the average:

$$\Delta Xi = (b\Delta X1 + a\Delta X2)/L$$

$$\Delta Yi = (b\Delta Y1 + a\Delta Y2)/2$$

where a is a distance in X direction from the wafer center 7507 to the first mark target position 7503, b is an X direction distance from the wafer center 7507 to the second mark target position 7504, L is a distance between marks (a+b).

The subscript "i" indicates the number of iteration of the correction driving loop in the flow chart described above. The rotational deviation is obtained by $$\Delta\Theta i = (\Delta Y2 - \Delta Y1)/L$$

Here, the Y direction deviation is calculated using the Y direction deviation, because as shown in this Figure, the first and second marks are arranged in left-right direction with the wafer center 7507 interposed between. If the marks are arranged in the up-down direction with the wafer center interposed therebetween, the rotation is obtained by the X direction deviations. The amount of deviations are for the i-th iteration, and the overall deviation in the entire sequence including the preceding loops is renewed as $$\Delta X = \Delta X + \Delta Xi$$

$$\Delta Y = \Delta Y + \Delta Yi$$

Finally, at step 7414 the correction amount by the prealignment is calculated as $$\Delta Zpa = (b\Delta Z1 + a\Delta Z2)/L$$

$$\Delta Xpa = \Delta X$$

$$\Delta Ypa = \Delta Y$$

$$\Delta\Theta pa = \Delta\Theta i$$

where $\Theta$pa is the rotational deviation which could not be removed although the deviation is within the tolerance. The deviation is corrected by converging it into the X and Y directions components for the respective exposure shots.

Referring to FIG. 76, FIGS. 27–29 and FIG. 17, the sequence of the mask collecting operation 6808 shown in FIG. 68 will be described.

First, the wafer stage 1899 is moved to a position not interfering with operation of the mask conveying system, that is, the upper left side from the exposure center as seen from the SOR ring 4, at step 7601. Then, the mask hand 2602 is opened at step 7602, and the traverse unit 2601 is moved from the stand-by position adjacent to the mask cassette to the position near he mask stage at step 7603. Then, the traverse unit 2601 abuts the mask hand 2602 to the mask 2 attracted and held on the mask stage 1999 at step 7604. At this time, the abutment force is detected by the sensor 2705, and the discrimination is made as to whether the predetermined abutment force is provided at step 7605. If the force is not sufficient, the discrimination is negative and the sequence goes back to the step 7604. If the abutment force is the predetermined one, the result of discrimination is affirmative so that the mask hand is closed at step 7606.

Next, the chuck magnet of the mask stage 1999 is energized reversely to destroy the attracting force to the mask at step 7607, and the mask hand 2602 is moved in the Z detection by the mask hand elevating motor 2706, so that the mask 2 is separated from the mask stage 1901 at step 7608. Then, the reverse energization to the mask stage chuck magnet is stopped at step 7609. Then, the traverse unit 2601 is moved to a home position which is the center between the mask stage 1901 and the mask cassette 1301 where the arm unit 2603 is rotatable, at step 7610. The motor 2707 then rotates the arm unit 2603 so that the mask hand 2602 is directed to the mask cassette from the mask stage side, at step 7611. Subsequently, the traverse unit 2601 is moved from the home position to the mask cassette side at step 7612. Then, the mask hand holding the mask 2 is abutted to the cassette stage 3001 by the traverse unit 2601 at step 7613.

Similar to the step 7605, if the predetermined abutment force is detected, the discrimination at step 7614 is affirmative. Then, the mask chuck 3002 is reversely energized to destroy the attracting force at step 7615, and the mask hand elevating motor 2706 moves the mask hand 2602 in the set direction, so that the mask 2 is contacted to the cassette stage surface at step 7616. The reverse energization of the mask chuck 3002 is stopped, and the mask 2 is attracted and held 10 by the mask chuck 3002 at step 7617. Finally, the mask hand 2602 is opened at step 7618, and the traverse unit 2601 is moved to the home position at step 7619, and the mask hand 2602 is closed at step 7620.

Referring to FIG. 76, FIGS. 27–29 and FIG. 17, the sequence of the mask setting operation 6809 shown in FIG. 68 will be described. First, the indexer 2810 is driven to rotate the main assembly 2801 of the cassette is rotated with increment of one mask at step 7701, during which the discrimination is performed as to whether or not the mask is for the next use at step 7702. If the mask is one designated for the next use, the result of the discrimination at step 7702 is affirmative. Then, the mask hand 2602 is opened at step 7707, and the traverse unit 2601 is moved from the home position which is the center between the mask stage 1999 and the mask cassette 1310 to the mask cassette side at step 7704. The traverse unit 2601 abuts the mask hand to the mask 2 attracted and held on the cassette stage 3001 at step 7705. At this time, the abutment force is detected by the sensor 2705, and the discrimination is made as to whether or not the predetermined abutment force is provided at step 7706. If the abutment force is not sufficient, the discrimination at this step is negative, so that the sequence goes back to the step 7705. If the abutment force is the predetermined force, the discrimination is affirmative so that the mask hand 2602 is closed at step 7707.

Next, the chuck magnet of the cassette stage 3001 is reversely energized to destroy the attraction force to the mask 2 at step 7708, and the mask hand is moved in the Z direction by the mask hand elevating motor 2706, so that the mask 2 is separated from the cassette stage 3001 at step 7709. Subsequently, the reverse energization of the cassette stage chuck magnet is stopped at step 7710.

Then, the traverse unit 2601 is moved to the home position where the arm unit 2603 is rotatable, at step 7711. The motor 2707 rotates the arm unit so that the mask hand 2602 is directed from the mask cassette detection to the mask stage detection at step 7712. Next, the traverse unit 2601 is moved from the home position to the mask stage side at step 7713. By the traverse unit 2601, the mask hand 2602 holding the mask 2 is abutted to the mask positioning V block 1905 on the mask stage 1901 at step 7714.

Similarly to the step 7706, if the predetermined abutment force is provided, the result of discrimination at a step 7715 is affirmative. Next, the chuck magnet of the mask stage 1999 is reversely energized to destroy the attraction force at step 7716, and the mask hand elevating motor 2706 moves the mask hand 2602 in the Z direction so that the mask 2 is contacted to the mask stage surface at step 7717. The reverse energization of the chuck magnet is stopped, so that the mask 2 is attracted and retained by the chuck magnet at step 7718. Finally, the mask hand 2602 is opened at step 7719, and the traverse unit 2601 is moved to the stand-by position near the mask cassette at step 7720, and then the mask hand is closed at step 7721.

Figure 78:
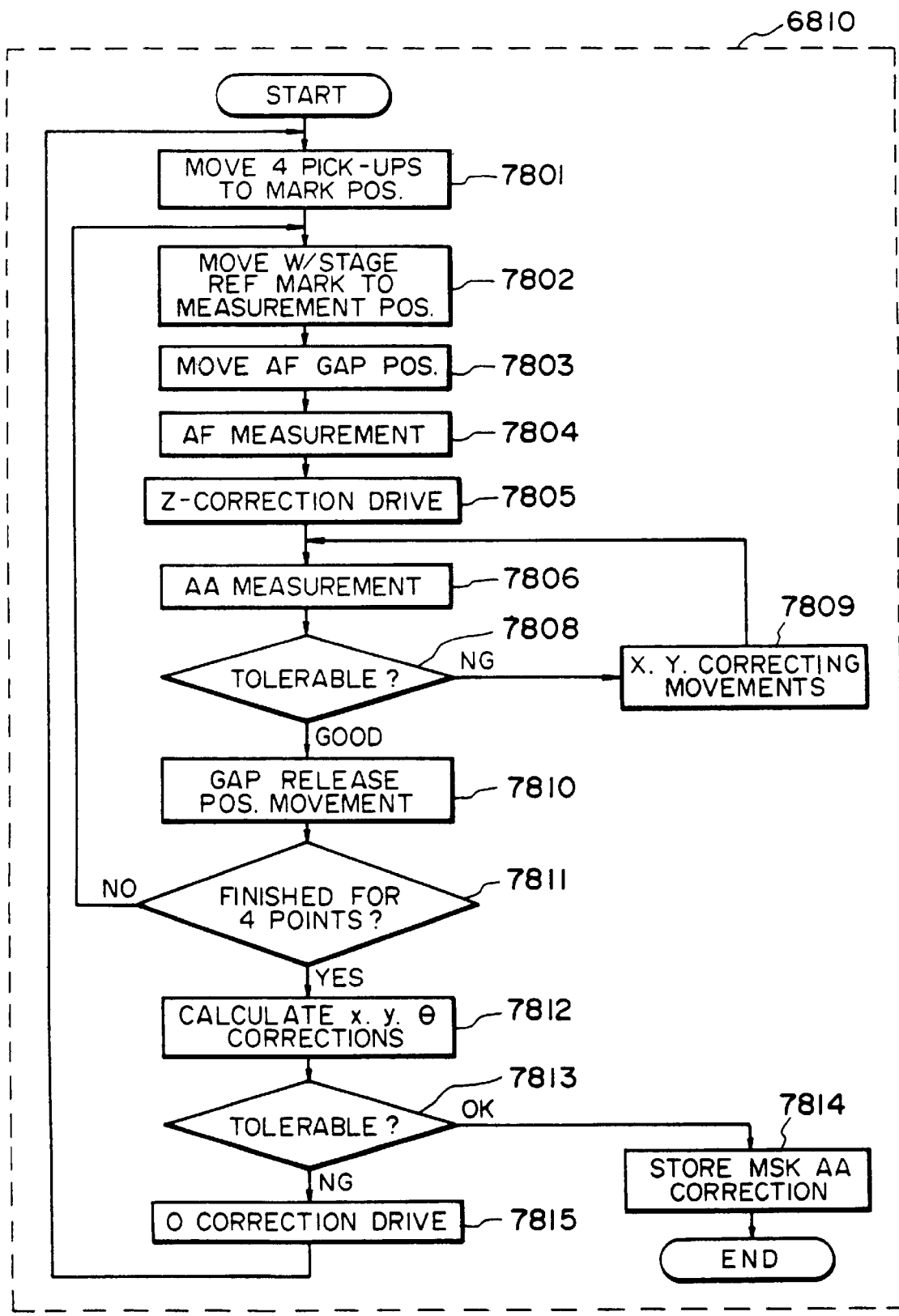
FIG. 78 is a flow chart illustrating a mask alignment operation.
Figure 79:
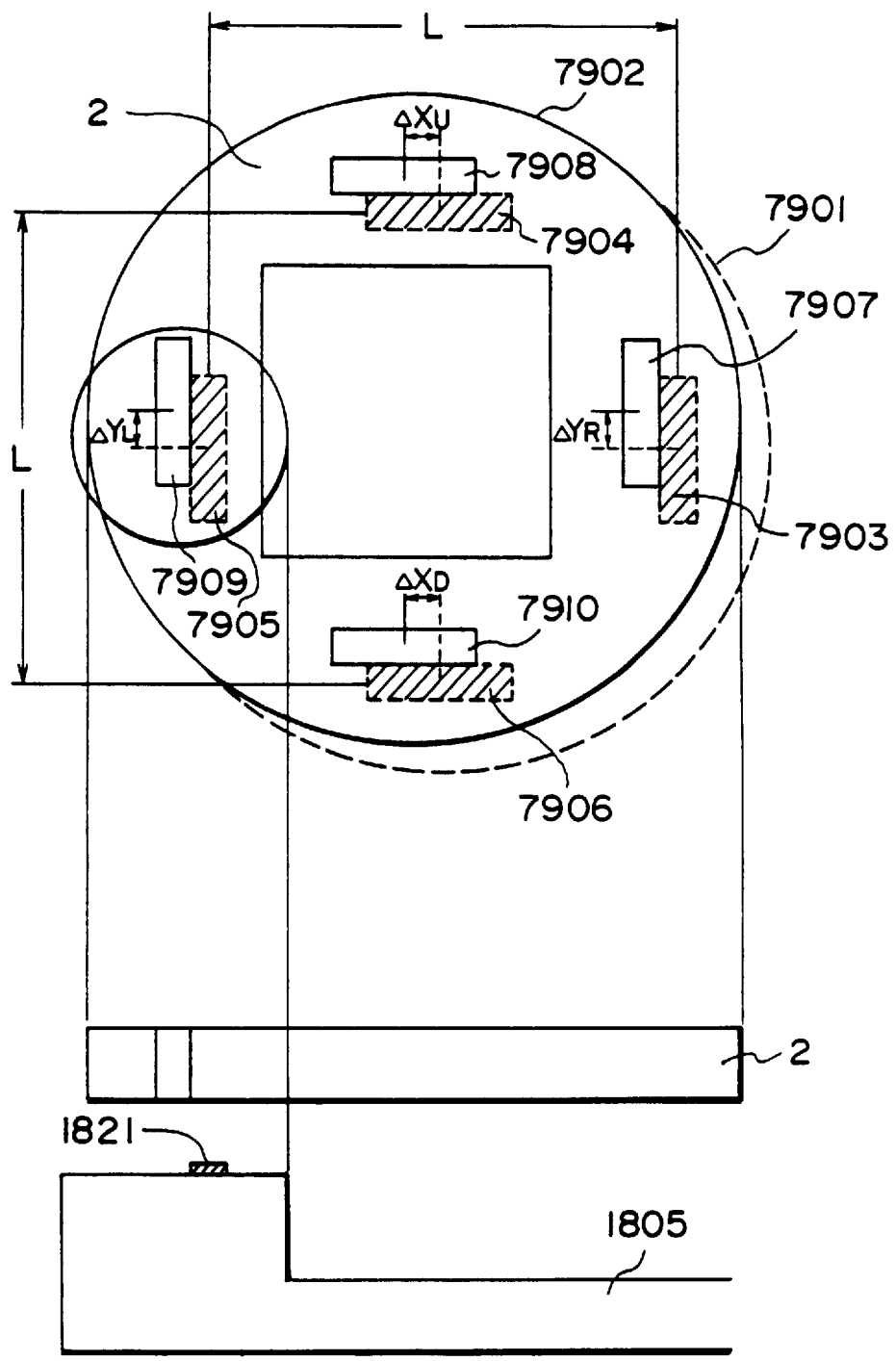
FIG. 79 is a side view illustrating a mask alignment mark position.

FIG. 78 is a flow chart illustrating the sequence of the mask alignment (step 6810) in the exposure operation of the apparatus according to this embodiment described in conjunction with FIG. 68. When the mask alignment is started, the mask 2 is not chucked at the target position 7901 of the mask chuck 1903, but is deviated in the X direction, Y direction and rotational direction due to the accuracy of the chucking during the previous mask setting sequence, and therefore, the actual chucking position 7902 is shown in FIG. 79 with those deviations. Therefore, the mask automatic alignment mark ($Y_R$ mark, $Y_L$ mark, $X_U$ mark and $X_D$ mark) to be detected are at the actual positions 7907–7910 which is a deviation from the target positions 7903–7906.

At step 7801, the four pickup devices 2401 are moved opposed to the mark target positions 7903–7906 which are to be detected by the respective pickup devices 2404, by driving the pickup stage 2411. As described hereinbefore, the coordinate reference mark 1821 (FIG. 18) used for the mask alignment is at only one position on the Z tilt stage 1805, and therefore it is not possible to detect the four marks simultaneously. For this reason, it is not possible to detect four marks simultaneously, and therefore, in this embodiment, the coordinate reference mark 1821 is sequentially faced to the respective marks, and the detection is effected sequentially.

A series of steps from 7802 to 7811 to be explained covers one mark detection, and the series is repeated four times to complete one deviation detecting operation. At step 7802, Y coarse movement stage 1705 and the X coarse movement stage 1710 are driven so that the coordinate reference mark 1821 on the Z tilt stage 1805 is brought to a position where the mark 1821 is opposed to the target or design position of the mask alignment mark which is going to be detected, for example, the mark 7903. At step 7803, the Z tilt stage 1805 is moved by driving the Z tilt driving inch worm 1713 to a position where the gap between the mask 2 and the coordinate reference mark 1821 can be carried out using pickup 2401 shown in FIG. 23. At step 7804, the output of an automatic focusing sensor 2332 shown in FIG. 23 is processed by the automatic fine alignment and focusing controlling section 3910 shown in FIG. 39, by which a focusing signal $Z_R$ (the mask alignment mark 7903) is produced.

At step 7805, a correcting drive amount is calculated from the measured $Z_R$ and the predetermined gap ZMA for mask alignment as $\Delta Z_R = Z_{MA} \, Z_D$, tilt driving inch worm 1813 is driven to move the Z tilt stage 1805 so that the gap between the mask 2 and the coordinate reference mark 1821 is equal to the predetermined gap $Z_{MA}$ thereafter, at step 7806, the output of the automatic alignment sensor 2321 shown in FIG. 23 is processed by the fine automatic alignment and focusing controlling section 3910, by which an alignment signal $\Delta Y_R$ (mask alignment mark 7903 is produced). The signal results from the deviation between the coordinate reference mark 1821 and the mask alignment mark the coordinate reference mark 1821 is practically at the design position because of the precision of the stage 1899 movement. Therefore, the deviation is the deviation of the mask alignment mark from the design or the target position.

At step 7808, the discrimination is made as to whether or not the measured is within the tolerance for sufficiently precise measurement. If not, the stage 1899 is driven for correction corresponding to the measured deviations in the X direction and/or Y direction, and the coordinate reference mark 1821 is brought close to the actual mask alignment mark, and the sequence goes back to the step 7806. The amount of drive at this time is added to the mark deviation. If the deviation is within the tolerance at step 7808, the detection is completed for one mark, and at step 7810, the Z tilt stage 1805 is driven in the direction that the coordinate reference mark 1821 is away from the mask 2, so that preparation is made for the coordinate reference mark 1821 to move for facing another mask alignment mark. At step 7811, discrimination is made as to whether or not the detections has been completed for all of the four marks. If not, the sequence goes back to the step 7802, and the coordinate reference mark 1821 is opposed to the design position, for example 7904 of the next mask alignment mark, and the above described steps 7802–7810 are repeated.

If the four point measurements are completed, the deviations $\Delta Xi$, $\Delta Yi$ and $\Delta\Theta i$ from the designed positions of the entire mask 2 is obtained at step 7812 from the four obtained data $\Delta Y_R$, $\Delta X_D$, $\Delta Y_L$, $\Delta X_U$. Here, the subscripts "i" represent the number of iteration of the correcting drive loop. At step 7813, the thus obtained deviations are compared with a predetermined tolerance, if it is within the tolerance, the amounts of deviations determined at the step 7812 is memorized so as to be used at the time of exposure operation, and the mask alignment sequence is completed. If, on the other hand, the amounts of deviations are beyond the tolerances, the mask plate 1912 is driven to correct the $\Delta\Theta$ at step 7815, and the sequence goes back to the step 7801 for four mark detections. In the step 7801 to which the sequence returns, the pickup 2401 is moved again, because the mask 2 has been moved. In addition, the position of the coordinate reference mark 1821 at the repeated step 7802 is not the design positions 7903–7806 of the mask alignment mark as adopted in the first detection loop, but it is the position calculated at the step 7812, that is, the position in consideration of the $\Delta Xi$, $\Delta Yi$ and $\Delta\Theta i$.

Referring to FIG. 79, the actual calculation equations for obtaining the mask alignment correction amount will be described, from the deviations $\Delta Y_R$, $\Delta X_D$, $\Delta Y_L$ and $\Delta X_U$ in the X and Y directions of the four marks obtained by the previous step 7806, the deviations of the entire mask 2 in the X and Y directions from the design position is $$\Delta Xi = (\Delta X_D + \Delta X_U)/2$$

$$\Delta Yi = (\Delta Y_R + \Delta Y_L)/2$$

Those are averages. The subscript "i" indicates the number of iterations of the correcting drive loops in the previous flow chart. It is considered that the design positions 7903–7906 of the mask alignment marks as equidistant from the center of the mask 2. Next, the rotational deviation is determined on the basis of the distance between the opposing marks in each of the X and Y directions, and the X direction and Y direction, as follows:

$$\Delta\Theta_L = n\Delta\Theta_Y + (1-n)\Delta\Theta_{X1} \quad 0 \leq n \leq 1$$

where $$\Delta\Theta_Y = (\Delta Y_L - \Delta Y_R)/L$$

$$\Delta\Theta_X = (\Delta X_U - \Delta X_D)/L$$

It will be understood that $\Delta y$ and $\Delta x$ are rotational deviation obtained from the Y direction deviation, and the rotational deviation obtained from X direction deviation, respectively, and that i is a linear combination of $\Delta\Theta_Y$ and $\Delta\Theta_X$. If n=0.5, $\Delta\Theta i$ is an average of $\Delta\Theta_Y$ and $\Delta\Theta_X$.

If a measurement error occurs for a certain mark, for example, $\Delta X_U$, it is still possible that the deviation of the entire mask can be obtained by substituting in the following manner:

$$\Delta Xi = \Delta X_U$$

$$\Delta\Theta i = \Delta\Theta_Y$$

The deviation with the subscript "i" means the deviation obtained in the present iteration, and the overall deviation in the entire sequential operations are $$\Delta X_{MA} = \Delta X_{MA} + \Delta Xi$$

$$\Delta Y_{MA} = \Delta X_{MA} + \Delta Yi$$

$$\Delta\Theta_{MA} = \Delta\Theta_{MA} + \Delta\Theta i$$

The amount of correction memorized at step 781Z for the subsequent exposure operation is the above final set of deviations. The deviation $\Delta\Theta_{MA}$ is to be fed back to the mask $\Theta$ plate 1912, and the deviations $\Delta X_{MA}$ and $\Delta Y_{MA}$ are to be fed back to the wafer X coarse movement stage 1710 and a wafer Y coarse movement stage 1705.

FIG. 80 is a flow chart showing the sequence of the step and repeat exposure operation step 6811 of the exposure operation of the apparatus described in conjunction with FIG. 68. Similarly to the prealignment sequential operation, the flow chart is for the wafer 3 for the second layer processing, that is, the wafer 3 already has alignment marks.

When the step and repeat exposure starts, the wafer 3 has been subjected to the prealignment operation 6805, and is attracted on the wafer chuck 1807, and the mask 2 has been subjected to the mask alignment operation 6810 and is chucked on the mask chuck 1903 without mask $\Theta$ deviation ($\Delta\Theta MA$).

Figure 82:
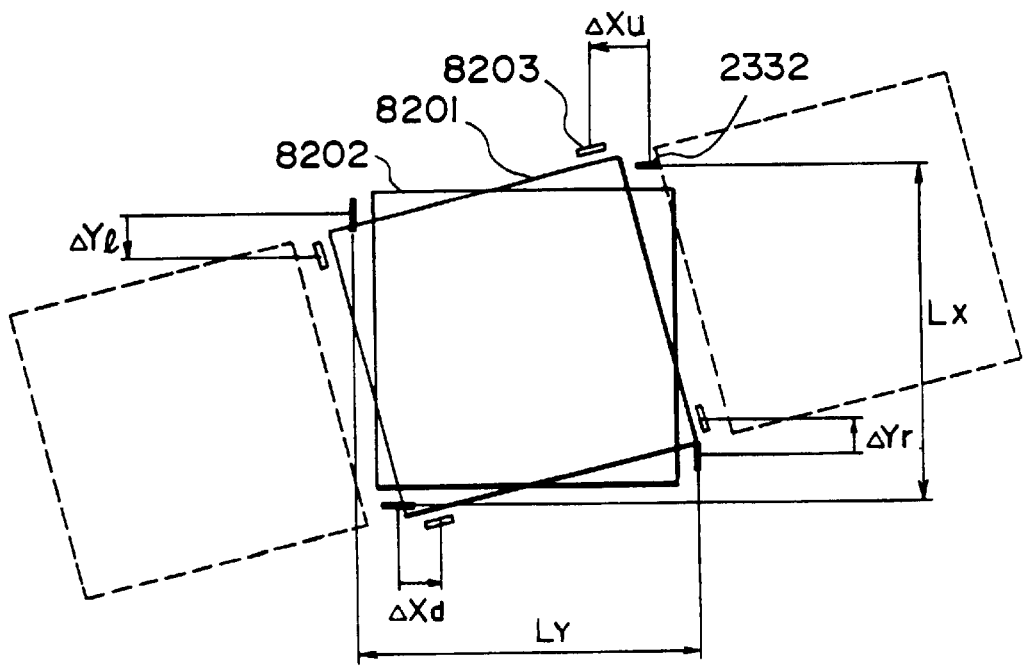
FIG. 82 is a side view illustrating an automatic wafer alignment.

At step 8001, for permission of detection of the alignment mark, four pickup devices 2401 are driven through a pickup stage controlling section 3906 so that the projection beam 2307 for alignment is projected onto the respective alignment marks 2332 on the mask, as shown in FIG. 23. At step 8002, the X coarse movement stage 1710 and the Y coarse movement stage 1705 are driven through the stage controlling section 3918, so that the pattern 8201 on the wafer to be exposed is opposed to the mask pattern 8202, as shown in FIG. 82. At step 8003, the Z tilt stage 1805 is driven through the stage controlling section 3918 to move it to a position where the distance between the wafer 3 and the mask 2 can be measured by the pickup 2401 (focusing gap detection position) at step 8004, the outputs of the focusing sensors 2332 of the four pickup devices 2401 are processed by the fine alignment 20 and focusing controlling section 3910 shown in FIG. 39, by which the gaps Z1, Z2, Z3 and Z4 between the mask 2 and the wafer 3 are measured at four mark positions. At step 8005, the correction drive amounts $\Delta Z$, $\Delta\omega w$, $\Delta\omega y$ are calculated from the above four point gaps so that the deviation Zexp of the alignment measurement shot exposure gap position is smallest as the entire shot area which is going to be exposed, and in accordance with which the stage controller section 3918 moves the Z tilt stage 1805. With this stage, the automatic focus is completed, so that the gap between the mask 2 and the wafer 3 are substantially uniform.

At step 8006, the output from the four alignment sensors 2331 (FIG. 23) are processed by the fine alignment and focusing controller 3910, whereby the deviations in the X and Y directions, ΔXu, ΔXd, ΔY1 and ΔYr between the mask alignment mark 2332 and the wafer alignment marks 8203 at the four mark positions. At step 8007, the deviation between the mask pattern 8202 and the wafer pattern 8201 at the shot center, ΔX, ΔY and ΔΘ are calculated from the four point deviations in the previous step. At step 8008, the thus calculated deviations, ΔX, ΔY and ΔΘ are discriminated whether they are within the tolerable range or not. If not, the stage controller 3918 drives the X coarse stage 1710, the Y fine stage 1803, Y coarse stage 1705 and Y fine stage 1802 at step 8009 to correct the X and y direction deviations by the wafer stage side, on the other hand, the mask Θ plate 1912 is driven to correct the Θ deviation by the mask stage side, and the sequence goes back to the step 8006.

If at step 8008, the deviations in the X, Y and Θ directions are within the tolerance, one shot exposure is effected at step 8010. Here, the current strength of X-rays is detected by the X-ray illuminometer 1541, and the exposure period is determined on the basis of the required exposure amount in the manner described above. The exposure period and the amount of attenuation of the X-rays 1 (data for correction of the profile) are supplied to the shutter controller 3913. The main shutter unit 1501 is driven so that the X-rays 1 are applied on the entire exposure shot area with uniformity.

After the exposure is completed, the Z tilt stage 1805 is driven to the gap releasing position through the stage controller 3918 to move the wafer 3 away from the mask 2.

At step 8012, the discrimination is made as to whether or not there is a shot to be exposed. If not, the sequence terminates. If so, the sequence goes back to the step 8002 for the next shot exposure. The foregoing explanation has been made with respect to a wafer for the second or subsequent layer processing. When the wafer is for the first layer processing, there is no mark on the wafer to be detected for alignment, and therefore, the steps 8006–8009 (alignment detection, deviation calculation, tolerance discrimination and correcting movement) are eliminated. Therefore, the step and repeat exposure sequence has the purpose of eliminating to the exposure, the non-uniform thickness of the wafer 3 and the strain or deformation of the wafer 3.

Figure 81:
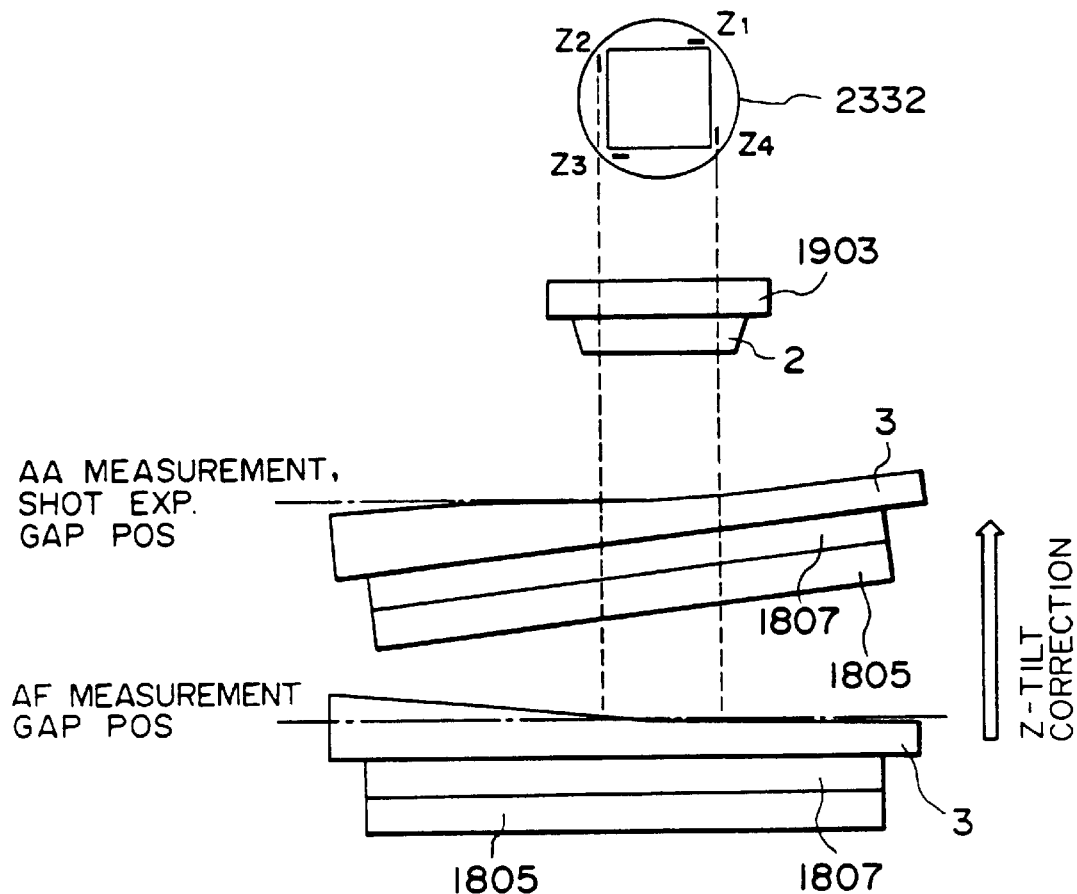
FIG. 81 is a schematic view illustrating an automatic wafer focusing operation.

Referring to FIG. 81, the calculation of the Z tilt correction amount determination will be described. The gaps between the mask 2 and the wafer 3 at the four mark positions measured at the step 800 wherein the wafer 3 is close to the focus measurement detecting position, the exposure area is approximated to a flat surface. Theoretically, the wafer 3 has a flat surface, actually, however, the thickness is not uniform, and deformation occurs with advancement of the process, and therefore it is preferable that the gaps are corrected such that the deviation from the alignment measurement shot exposure gap position is minimum as the entirety of the exposure shot area. The coordinates of the four measurement points and the detected gaps at the respective positions are expressed three dimensionally as $$(x_i, y_i, z_i)\ i=1-4$$

Parameters (a, b, c) are obtained which satisfy the following plain equation:

$$ax_i+by_i+cz_i=1\ i=1-4$$

On the basis of least square approximation.

Next, the Z tilt correction amount is obtained from the approximated surface. The vector of the plane ($\vec{v}$=a, b, c) is regulated, and therefore, $\vec{v}n$=(an, bn, cn), $\|\vec{v}n\|$= $\sqrt{an^2+bn^2+cn^2}=1$. The vector normal to the plane is $\vec{u}$=(0, 0, 1).

And therefore, the tilt correction at the center of the shot area, that is, the amount of correction about the X axis Δωx, the amount of correction about the Y axis Δωy are $$\Delta\omega x = \tan^{-1}(bn/cn)$$
$$\Delta\omega y = \tan^{-1}(an/\sqrt{bn^2+cn^2})$$

On the other hand, the amount of correction ΔZ in the Z direction is calculated from the above flat plane equation is $$\Delta Z = Z_{0-z}\ \exp$$

where $Z_0$ is a gap with the approximate surface at the shot center $(x_0, y_0)$ $$Z_0=(1-ax_0-by_0)/C$$

and Zexp is alignment measurement shot exposure gap position. By supplying the Z tile correction amount ΔZ, Δωx and Δωy are supplied to the stage controller 3918, which drives the Z tilt stage 1805 so that the wafer surface of the exposure shot area is substantially placed at the alignment measurement shot exposure gap position.

Referring to FIG. 82, the description will be made as to the equations for obtaining X, Y and Θ correction amounts. From the deviations ΔXu, ΔXd, ΔY1 and ΔYr at the four mark positions obtained at the step 8006 are the amount of deviation at the center of the shot area to be exposed in the X, Y and Θ directions. By each of the marks, either the deviation in the X direction or the deviation in the Y direction is detected between the mask mark 2332 and the wafer mark 8203, and therefore, the deviation in the X and Y directions at the center of the shot area is an average of opposing marks, as follows:

$$\Delta X=(\Delta Xu+\Delta Xd)/2$$
$$\Delta Y=(\Delta Yl+\Delta Yr)/2$$

From the distances LX and LY between opposite mark and the deviation at the respective marks, the deviation in the Θ direction is $$\Delta\Theta=n\Delta\Theta Y+(1-n)\Delta\Theta X,\ 0\leq n\leq 1$$
$$\Delta\Theta Y=(\Delta Yl-\Delta Yr)/LY$$
$$\Delta\Theta X=(\Delta Xu-\Delta Xd)/LX$$

The rotational deviations ΔΘY and ΔΘX are rotational deviation obtained from Y deviation information and a rotational deviation obtained from Y direction information, respectively, and ΔΘ is a linear combination of ΔY and ΔX. If n=0.5, the ΔΘ is an average of ΔΘY and ΔΘX. If an error occurs with a certain mark, so that ΔXu is not obtained, or if the exposure shot area is at such an end portion that ΔXu cannot be measured, the deviation between the mask pattern 8202 and the wafer pattern 8201 can still be obtained by the following substitution $$\Delta X=\Delta Xu$$
$$\Delta\Theta=\Delta\Theta Y$$

The deviations ΔX, ΔY and ΔΘ are fed back to the stage controller 3918, and the deviations ΔX and ΔY are corrected by the wafer stage side, and the deviation ΔΘ is corrected by the mask stage side, as described hereinbefore.

Figure 83:
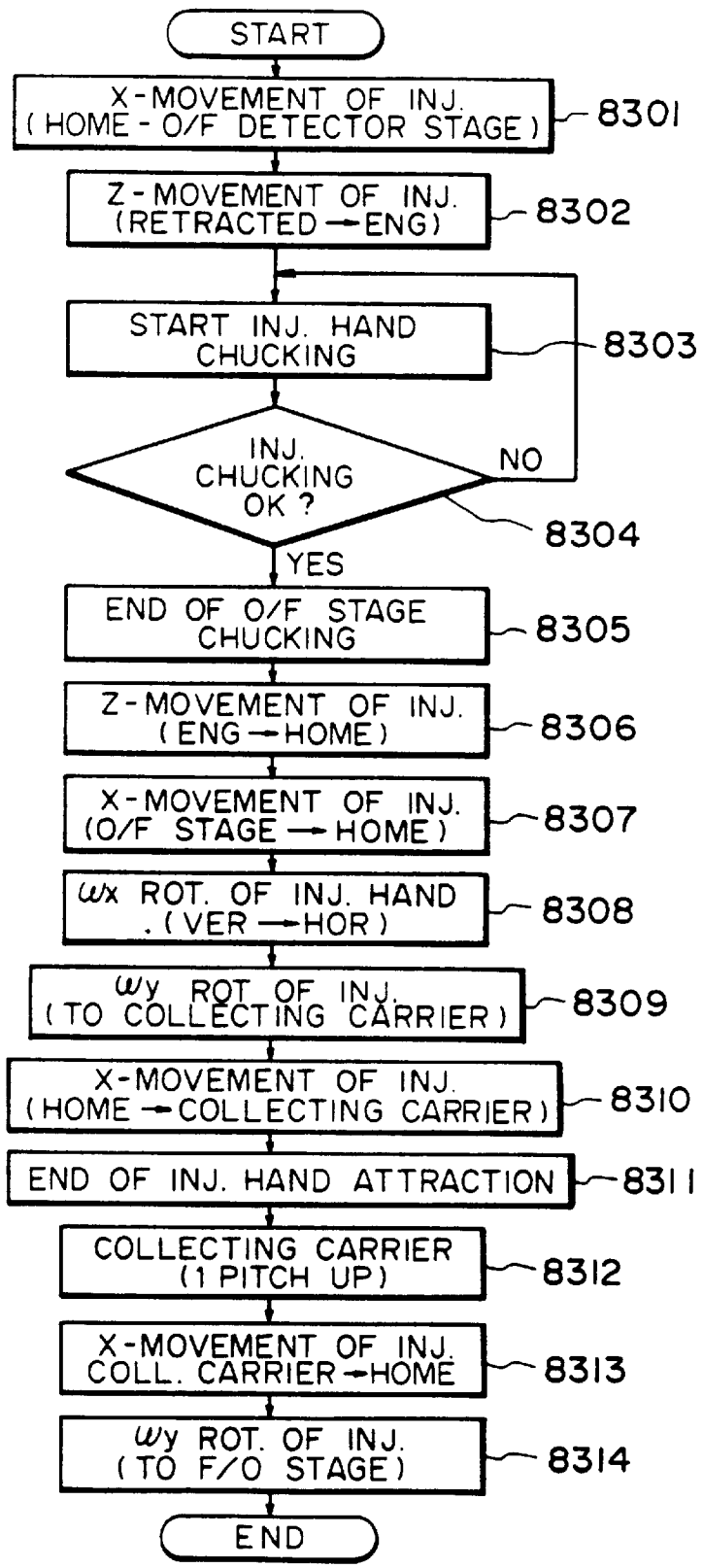
FIG. 83 is a flow chart illustrating a wafer taking up operation.

Referring to FIG. 83, FIG. 66 and FIG. 25, the sequence of the wafer collecting operation 6813 shown in FIG. 63 will be described. At step 8301, the injector X stage 2517 is moved from the home position so that the injector hand 2515 is brought to the back side of the wafer to be corrected chucked on the orientation flat detection chuck 2521. Next, the injector Z stage 2520 is moved, and the injector hand 2512 is contacted to the back surface of the wafer at step 8302, and the injector hand 2512 starts its vacuum attraction operation at step 8303.

When the wafer to be collected is attracted by the injector hand 2512, the result of discrimination at step 8304 is affirmative so that the attraction by the orientation flat detecting chuck is stopped at step 8305. Then, the injector Z stage 2520 is moved, so that the injector hand 2512 holding the wafer to be corrected is moved away from the orientation flat detection chuck surface at step 8306.

Next, the injector X stage 2517 is moved, so that the injector hand 2512 is returned to the home position (the position before the execution of the step 6902 in FIG. 69), at step 8307. The injector a)x driver 2514 then rotates the injector hand 2512 from its vertical state to the horizontal state at the step 8308. Subsequently, the injector ωy driver 2515 rotates the injector 1204 to oppose the injector hand 2512 to the collecting carrier at step 8309. Then, the injector X stage 2517 is moved so that the wafer to be corrected on the injector hand 2512 is placed into the collecting carrier.

After the attraction by the injector hand 2512 at step 8311, the collecting elevator driver 2509 moves the collecting carrier by one pitch at step 8312. Next, the injector hand 2512 is returned to the original position by the injector X stage 2512 at step 8313, and the injector 1304 is rotated in the opposite direction to the direction at step 8309, at step 8314 to take the FIG. 25 position.

FIG. 84 shows a front sectional view of a side sectional view of the exposure unit 102. In this Figure, the wafer 3 is vacuum attracted on the wafer chuck 1807 which is in turn mounted on the X coarse movement stage 1710 to be movable on the X coarse movement guiding bar 1711. The X coarse movement guide bar 1711 is fixed on the Y coarse movement stage 1705 which travels on the Y coarse guide bar 1706. The Y coarse movement guide bar 1706 is fixed on the main frame 1701. The mask 2 is mounted to an automatic alignment frame 2604 fixed rigidly onto the main frame 1701.

The main frame 1701 is connected to the main chamber 3101 at three points. At an upper point, they are rigidly connected, and at the other upper point, the movement in the Y direction only is confined by an absorption mechanism 8415, and at the lower one point, a movement only in the Z direction is confined by an absorption mechanism 8416. The absorption mechanisms 8415 and 8416 are mounted so as to avoid transmittance to the main frame 1701, of the deformation of the main chamber 3101 due to vacuum discharge and due to thermal deformation by difference in the material of the structure of members. The main chamber 3101 is connected with a vibration suppressing base 8405 at three points. At the upper one point, the connection is rigid; at the other upper point, the movement only in the Y direction is confined by absorption mechanism 8413; and at the lower one point, the movement in the Z direction only is confined by absorption mechanism 8414. The absorption mechanisms 8413 and 8414 are mounted to avoid transmission of the influence, to the main chamber 3101, the influence of the static deformation of the vibration suppressing base 8405 and the influence of thermal deformation due to difference in the material of the structural members.

In the exposure unit 102, the mast 2 having a fine pattern and a wafer 3 having a photosensitive material layer applied thereto are opposed, and the fine pattern of the mask 2 is transferred onto the wafer 3 by X rays 1. The deviation in the relative position between the mask and the wafer 3 give rise to the decrease of the pattern transfer performance. The primary characteristic frequency of the mechanical parts (the main assembly of the exposure apparatus) mounted to the main frame 1701 is approximately 100 Hz, if a vibration containing such a high frequency component is transmitted thereto, a resonance can occur which will cause positional deviation between the mask 2 and the wafer 3. Therefore, it is preferable that the vibration suppressing measurement is given to the vibration suppressing base 8405. The vibration of the main assembly of the exposure apparatus is suppressed by being supported by three air suspensions 8402, 8403 and 8404 disposed on the vibration suppressing frame 8401 fixed on the floor. The three air suspensions 8402 and 8404 are connected with three air lines 2412.

The exposure step is performed with a proximity gap 10–50 microns, a tilt or positional deviation between the axis of the X-rays 1 and the axis of the mask and/or the axis of the wafer 3 is attributable to a misregistration of the pattern, thus degrading the pattern transfer performance. Therefore, it is preferable that the position and the angle of the mask 2 and the wafer 3 surfaces are maintained relative to the optical axis of the X-rays 1. The main assembly of the exposure apparatus has a characteristic frequency of a different order than that of the air suspension, and therefore, by driving the vibration suppressing base 8405 in the X, Y, Z, ωx, ωy and ωz directions, by which the mask and the wafer 3 can be moved integrally. Since the X-rays 1 move in a negligible amount relative to the floor, there is no relative movement between the floor and the vibration suppressing frame 8401.

The three air suspensions 8402–8404 on the vibration suppressing frame 8401 are provided with three displacement sensors 8406, 8408 and 8410. Correspondingly, the vibration suppressing base 8405 has targets 8407, 8409 and 8411 associated with the sensors, so that the relative position of the vibration suppressing base 8405 relative to the vibration suppressing frame 8401 is measured. On the basis of the measurement signal, the three air suspensions 8402–8404 are feed-back controls, so that six axes control is effected with the air suspensions 8402–8404 acting as actuators.

Referring to FIG. 84, there is shown an electric block diagram for the pose controlling mechanism shown in FIG. 84. Drivers 8501–8503 controls opening of unshown solenoid valve for actuating the air suspensions 8402–8404. The drivers 8501–3 are operated by the analog signals given from the CPU 8510 through a D/A converter 8507. The displacement sensors 8406, 8408 and 8510 are an electrostatic capacity sensor are an eddy current sensor. The signal from the displacement sensors 8406, 8408 and 8410 is converged to a DC voltage signal proportional to the measurement data. The A/D converter 8508 is effective to digitalize the DC voltage signal to supply the digitalized signals into the bus 8507. The CPU 8510 supplies a control signal to the driver 8501–8503 on the basis of the signal transmitted from the A/D converter 8508 and therefore a soft servo mechanism is constituted.

The CPU 8510 is capable of communication with the upper main assembly control unit 3902 through a communication interface 3903b with respect to the instruction coordinate or the current position coordinate.

While the invention has been described with reference to the structures disclosed herein, it is not confined to the details set forth and this application is intended to cover such modifications or changes as may come within the purposes of the improvements or the scope of the following claims.

Although the foregoing explanation has been made with respect to semiconductor manufacturing, the present invention is applicable to apparatus for other manufacturing if orbit radiation is used, for example, and if a fine pattern is to be transferred.

What is claimed is:

1. A synchrotron exposure system comprising:

a synchrotron radiation source for generating a synchrotron radiation beam;

a radiation detector for detecting intensity of the radiation beam generated by the synchrotron radiation source;

an exposure unit including a mask stage for holding a mask and a wafer stage for holding a wafer, wherein the interior of the exposure unit is maintained at a predetermined reduced pressure ambience;

a pressure sensor for detecting pressure information in the exposure unit;

a temperature sensor for detecting temperature information in the exposure unit;

a beam port for directing the radiation beam to the exposure unit, wherein the interior of the beam port is maintained at an ultra high vacuum condition;

a pressure sensor for detecting pressure information in the beam port;

a radiation window through which the synchrotron radiation beam is transmitted from the beam port to the exposure unit, the radiation window functioning as an isolating wall between the ultra high vacuum in the beam port and the predetermined reduced pressure ambience in the exposure unit;

a mirror unit including a mirror for reflecting the radiation beam;

a pre-alignment system for aligning the wafer relative to the wafer stage;

a fine-alignment system for aligning the wafer held by the wafer stage relative to the mask held by the mask stage;

a mask storage apparatus for storing the mask;

a wafer storage apparatus for storing the wafer;

a mask conveying apparatus, including a mask load-locking mechanism, for conveying the mask between the mask storage apparatus and the mask stage in the exposure unit, while the predetermined reduced pressure ambience in the exposure unit is maintained;

a wafer conveying apparatus, including a wafer load-locking mechanism, for conveying the wafer between the wafer storage apparatus and the wafer stage in the exposure unit, while the predetermined reduced pressure ambience in the exposure unit is maintained;

a main control unit for controlling the alignment and the exposure;

a conveying control unit for controlling the conveyance of the mask and the wafer;

an ambience control unit for controlling ambience in the exposure unit;

a network controller for relaying and exchanging communication among said main control unit, said conveying control unit and said ambience control unit, in order to control overall operation of said system; and a console unit for displaying controlling information.

2. A system according to claim 1, further comprising a temperature controlling unit for controlling the temperature at least in the exposure unit.

3. A system according to claim 1, further comprising detecting means for detecting rotational positional information of the wafer.

4. A system according to claim 1, further comprising a shutter unit for controlling exposure of the mask and the wafer with the radiation beam.

5. A system according to claim 1, wherein the predetermined reduced pressure ambience is helium ambience.

* * * * *

UNITED STATES PATENT AND TRADEMARK OFFICE
CERTIFICATE OF CORRECTION

PATENT NO. : 5,822,389

DATED : October 13, 1998

INVENTORS : SHUNICHI UZAWA, ET AL.

It is certified that error appears in the above-identified patent and that said Letters Patent is hereby corrected as shown below:

ON THE COVER PAGE

In item [57], "ABSTRACT", line 4, "waver," should read --wafer,--.

COLUMN 1:

line 52, "have" should read --has--;
    line 58, the right margin should be closed up; and
    line 59, the left margin should be closed up.

COLUMN 3:

line 46, "brmsstrahlung" should read --bramsstrahlung--.

COLUMN 4:

line 2, "FIG." should read --Figure,--; and
    line 14, "20-10" should read --10-20--.

UNITED STATES PATENT AND TRADEMARK OFFICE
CERTIFICATE OF CORRECTION

PATENT NO. : 5,822,389

DATED : October 13, 1998

INVENTORS : SHUNICHI UZAWA, ET AL.

It is certified that error appears in the above-identified patent and that said Letters Patent is hereby corrected as shown below:

COLUMN 11:

line 3, "N2" should read --$N_2$--;
    line 38, "is" should read --are--;
    line 57, "z," should read --Z,--; and
    line 61, "position-" should read --position--.

COLUMN 12:

line 8, "(($\omega y$)" should read --($\omega y$)--;
    line 17, "vacuum," should read --a vacuum,--; and
    line 47, "s the" should read --the--.

COLUMN 13:

line 47, "wafer" should read --the wafer--.

COLUMN 14:

line 3, "Xrays" should read --X-rays--; and
    line 22, "heating" should read --heat--.

COLUMN 15:

line 27, "is" should read --are--.

UNITED STATES PATENT AND TRADEMARK OFFICE
CERTIFICATE OF CORRECTION

PATENT NO. : 5,822,389

DATED : October 13, 1998

INVENTORS : SHUNICHI UZAWA, ET AL.

It is certified that error appears in the above-identified patent and that said Letters Patent is hereby corrected as shown below:

COLUMN 16:

line 21, "position-is" should read --position is--.

COLUMN 17:

line 43, "shut" should read --shutter--.

COLUMN 18:

line 1, "Which" should read --which--.

COLUMN 19:

line 30, "from-the" should read --from the--.

COLUMN 20:

line 10, "a" should read --θ--;
line 22, "is" should read --are--; and
line 36, "the-mask" should read --the mask--.

COLUMN 22:

line 28, "20" should be deleted.

UNITED STATES PATENT AND TRADEMARK OFFICE
CERTIFICATE OF CORRECTION

PATENT NO. : 5,822,389

DATED : October 13, 1998

INVENTORS : SHUNICHI UZAWA, ET AL.

It is certified that error appears in the above-identified patent and that said Letters Patent is hereby corrected as shown below:

COLUMN 23:

line 5, "a focal," should read --afocal,--.

COLUMN 24:

line 8, "1C" should be deleted.

COLUMN 25:

line 9, "e" should read --$\theta$-- and "a" should read --$\alpha$--; and
    line 53, "operation," should read --operation--.

COLUMN 27:

line 61, "25" should be deleted.

COLUMN 28:

line 10, "and" (second occurrence) should read --an--;
    line 30, "feeding" should read --feed--; and
    line 47, "account to date" should read --accommodate--.

UNITED STATES PATENT AND TRADEMARK OFFICE
CERTIFICATE OF CORRECTION

PATENT NO. : 5,822,389

DATED : October 13, 1998

INVENTORS : SHUNICHI UZAWA, ET AL.

It is certified that error appears in the above-identified patent and that said Letters Patent is hereby corrected as shown below:

COLUMN 31:

line 16, "provide" should read --provides--; and
    line 42, "is" should read --are--.

COLUMN 32:

line 16, "t he" should read --the--.

COLUMN 33:

line 37, "system," should read --system;--; and
    line 66, "N2" should read --$N_2$--.

COLUMN 34:

line 12, "the pre" should read --3315 to--; and
    line 51, "N2" should read --$N_2$--.

COLUMN 36:

line 13, "Oc" should read --of--; and
    line 36, "Oc" should read --of--.

UNITED STATES PATENT AND TRADEMARK OFFICE
CERTIFICATE OF CORRECTION

PATENT NO. : 5,822,389

DATED : October 13, 1998

INVENTORS : SHUNICHI UZAWA, ET AL.

It is certified that error appears in the above-identified patent and that said Letters Patent is hereby corrected as shown below:

COLUMN 37:

line 26, "20" should be deleted.

COLUMN 38:

line 55, "20" should be deleted; and
    line 66, "by,an" should read --by a--.

COLUMN 40:

line 38, "a" should read --$\alpha$--.

COLUMN 41:

line 3, "transmit" should read --transmits--.

COLUMN 43:

line 21, "difference" should read --difference,--;
    line 22, "position" should read --position,--;
    line 37, "thing" should be deleted;
    line 50, "lines" should read --line--; and
    line 55, "it the" should read --it to the--.

UNITED STATES PATENT AND TRADEMARK OFFICE
CERTIFICATE OF CORRECTION

PATENT NO. : 5,822,389

DATED : October 13, 1998

INVENTORS : SHUNICHI UZAWA, ET AL.

It is certified that error appears in the above-identified patent and that said Letters Patent is hereby corrected as shown below:

COLUMN 44:

line 3, "are" should read --are a--; and
    line 11, "it" should read --the--.

COLUMN 46:

line 9, "moves" should read --moved--; and
    line 25, "axes" should read --axis--.

COLUMN 47:

line 23, "diagram" should read --diagram is--;
    line 28, "produces" should read --produce--; and
    line 45, "includes" should read --include--.

COLUMN 49:

line 41, "storaged" should read --stored--;
    line 57, "wafer" should read --after--;
    line 64, "RA!4" should read --RAM--; and
    line 67, "are" should read --is--.

UNITED STATES PATENT AND TRADEMARK OFFICE
CERTIFICATE OF CORRECTION

PATENT NO. : 5,822,389

DATED : October 13, 1998

INVENTORS : SHUNICHI UZAWA, ET AL.

It is certified that error appears in the above-identified patent and that said Letters Patent is hereby corrected as shown below:

COLUMN 50:

line 1, "at" should be deleted;
    line 5, "an" should be deleted; and
    line 14, "is" should read --are--.

COLUMN 51:

line 30, "stop" should read --step--.

COLUMN 52:

line 29, "are crossed" should read --cross--.

COLUMN 53:

line 1, "MCN2V" should read --$MCN_2V$--;
    line 2, "N2" should read --$N_2$--;
    line 19, "N2" should read --$N_2$--; and
    line 51, "WLN2V" should read --$WLN_2V$--.

COLUMN 54:

line 37, "N2" should read --$N_2$--; and
    line 46, "the-main" should read --the main--.

UNITED STATES PATENT AND TRADEMARK OFFICE
CERTIFICATE OF CORRECTION

PATENT NO. : 5,822,389

DATED : October 13, 1998

INVENTORS : SHUNICHI UZAWA, ET AL.

It is certified that error appears in the above-identified patent and that said Letters Patent is hereby corrected as shown below:

COLUMN 55:

line 6, "is at the" should read --at the--; and
    line 56, "converter" should read --converted--.

COLUMN 56:

line 2, "stop" should read --step--;
    line 3, "carve" should read --curve--; and
    line 57, "carve" should read --curve--.

COLUMN 57:

line 27, "stop" should read --step--.

COLUMN 58:

line 10, "pattern;" should read --pattern,--.

COLUMN 60:

line 18, "fact" should read --fact is--; and
    line 26, "distances" should read --distance--.

COLUMN 62:

line 45, "sage" should read --stage--.

UNITED STATES PATENT AND TRADEMARK OFFICE
CERTIFICATE OF CORRECTION

PATENT NO. : 5,822,389

DATED : October 13, 1998

INVENTORS : SHUNICHI UZAWA, ET AL.

It is certified that error appears in the above-identified patent and that said Letters Patent is hereby corrected as shown below:

COLUMN 64:

line 56, "he" should read --the--.

COLUMN 65:

line 31, "cassette is rotated with" should read --cassette, which is rotated with an--.

COLUMN 66:

line 55, "ZMA" should read --$Z_{MA}$--; and
    line 65, "mark the" should read --mark. The--.

COLUMN 67:

line 4, "measured" should read --measured value--;
    line 18, "has" should read --have--;
    line 58, "as" should read --are--; and
    line 63, "$\Delta\theta_L = n\Delta\theta_Y + (1-n)\Delta\theta_{X1}$ $0 \leq n \leq 1$" should read --$\Delta\theta_i = n\Delta\theta_Y + (1-n)\Delta\theta_X$, $0 \leq n \leq 1$--.

COLUMN 68:

line 2, "$\Delta y$ and $\Delta x$" should read --$\Delta\theta_y$ and $\Delta\theta_x$--; and
    line 5, "i" should read --$\Delta\theta_i$--.

UNITED STATES PATENT AND TRADEMARK OFFICE
CERTIFICATE OF CORRECTION

PATENT NO. : 5,822,389
DATED : October 13, 1998
INVENTORS : SHUNICHI UZAWA, ET AL.

It is certified that error appears in the above-identified patent and that said Letters Patent is hereby corrected as shown below:

COLUMN 70:

line 14, "equation is" should read --equation as--.

COLUMN 71:

line 23, "a)x" should read --ωx--.

COLUMN 72:

line 6, "X rays" should read --X-rays--;
line 50, "controls" should read --control the--; and
line 55, "are" should read --and--.

Signed and Sealed this

Thirteenth Day of July, 1999

Attest:

Q. TODD DICKINSON

*Attesting Officer*   Acting Commissioner of Patents and Trademarks